United States Patent [19]
Takashima

[11] Patent Number: 6,151,242
[45] Date of Patent: Nov. 21, 2000

[54] SEMICONDUCTOR MEMORY DEVICE

[75] Inventor: Daisaburo Takashima, Yokohama, Japan

[73] Assignee: Kabushiki Kaisha Toshiba, Kawasaki, Japan

[21] Appl. No.: 09/343,510

[22] Filed: Jun. 30, 1999

[30] Foreign Application Priority Data

Jun. 30, 1998 [JP] Japan .................................. 10-198123

[51] Int. Cl.$^7$ .................................................. G11C 11/22
[52] U.S. Cl. ...................... 365/145; 365/149; 365/230.03
[58] Field of Search ..................................... 365/145, 149, 365/230.03, 63

[56] References Cited

U.S. PATENT DOCUMENTS

| | | | |
|---|---|---|---|
| 5,424,976 | 6/1995 | Cuppens | 365/145 |
| 5,903,492 | 5/1999 | Takashima | 365/149 |
| 5,966,318 | 10/1999 | Ramer et al. | 365/145 |

*Primary Examiner*—Huan Hoang
*Attorney, Agent, or Firm*—Oblon, Spivak, McClelland, Maier & Neustadt, P.C.

[57] ABSTRACT

A semiconductor memory device comprises a block unit wherein a plurality of nonvolatile memory cells formed by connecting cell transistors and ferroelectric capacitors in parallel are connected in series, an amplifying circuit having an input end connected to one end of the block unit and an output terminal connected to a bitline, in which the block unit and the amplifying circuit constitute a cell block, and a plurality of cell blocks are disposed to constitute a memory cell array.

15 Claims, 100 Drawing Sheets

EQUIVALENT CIRCUIT

SECTIONAL VIEW

PLATE DRIVING METHOD

⟹ SLOW SPEED

1/2 Vdd PLATE METHOD

⟹ REFRESHMENT IS REQUIRED

COMPARISON OF FERROELECTRIC MEMORY HAVING SELF-AMPLIFYING FUNCTION

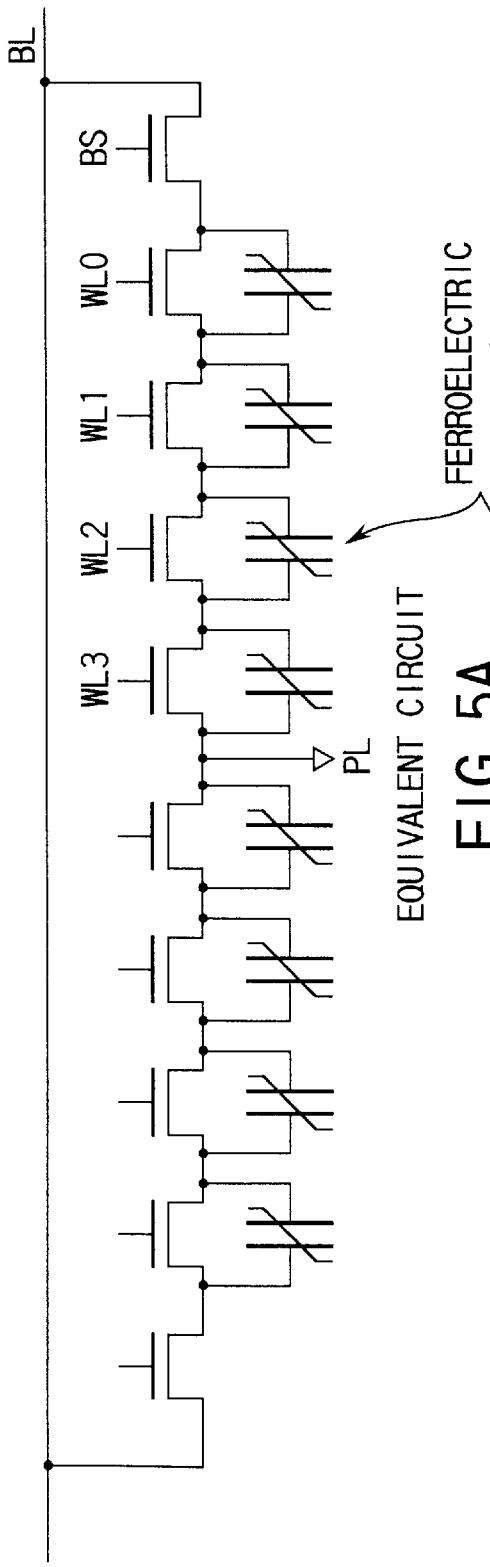
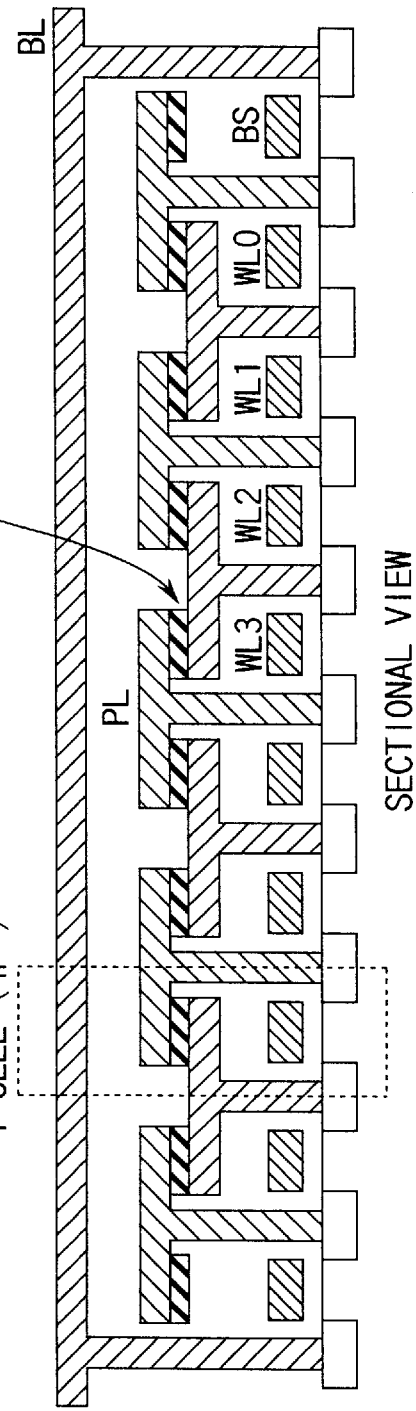
FIG. 5A EQUIVALENT CIRCUIT
FIG. 5B SECTIONAL VIEW

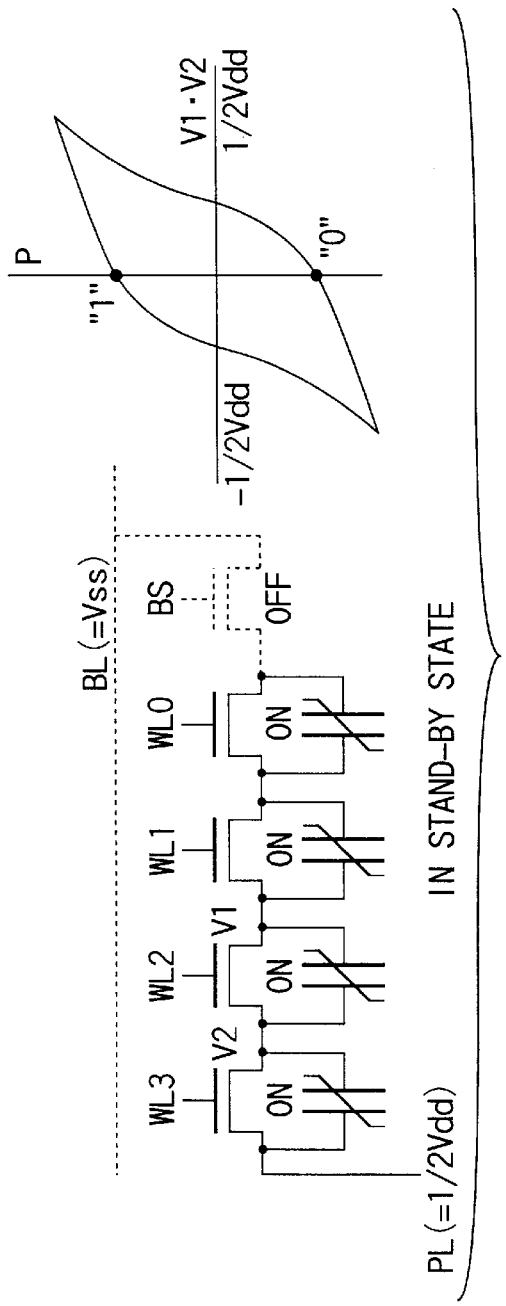
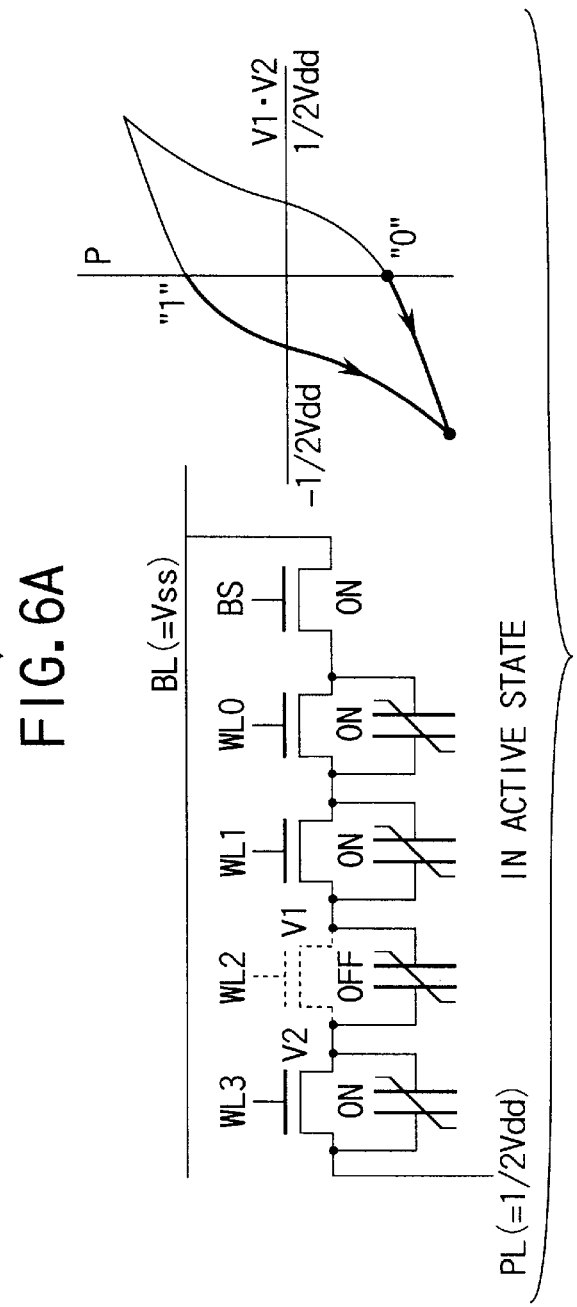
FIG. 6A IN STAND-BY STATE
FIG. 6B IN ACTIVE STATE

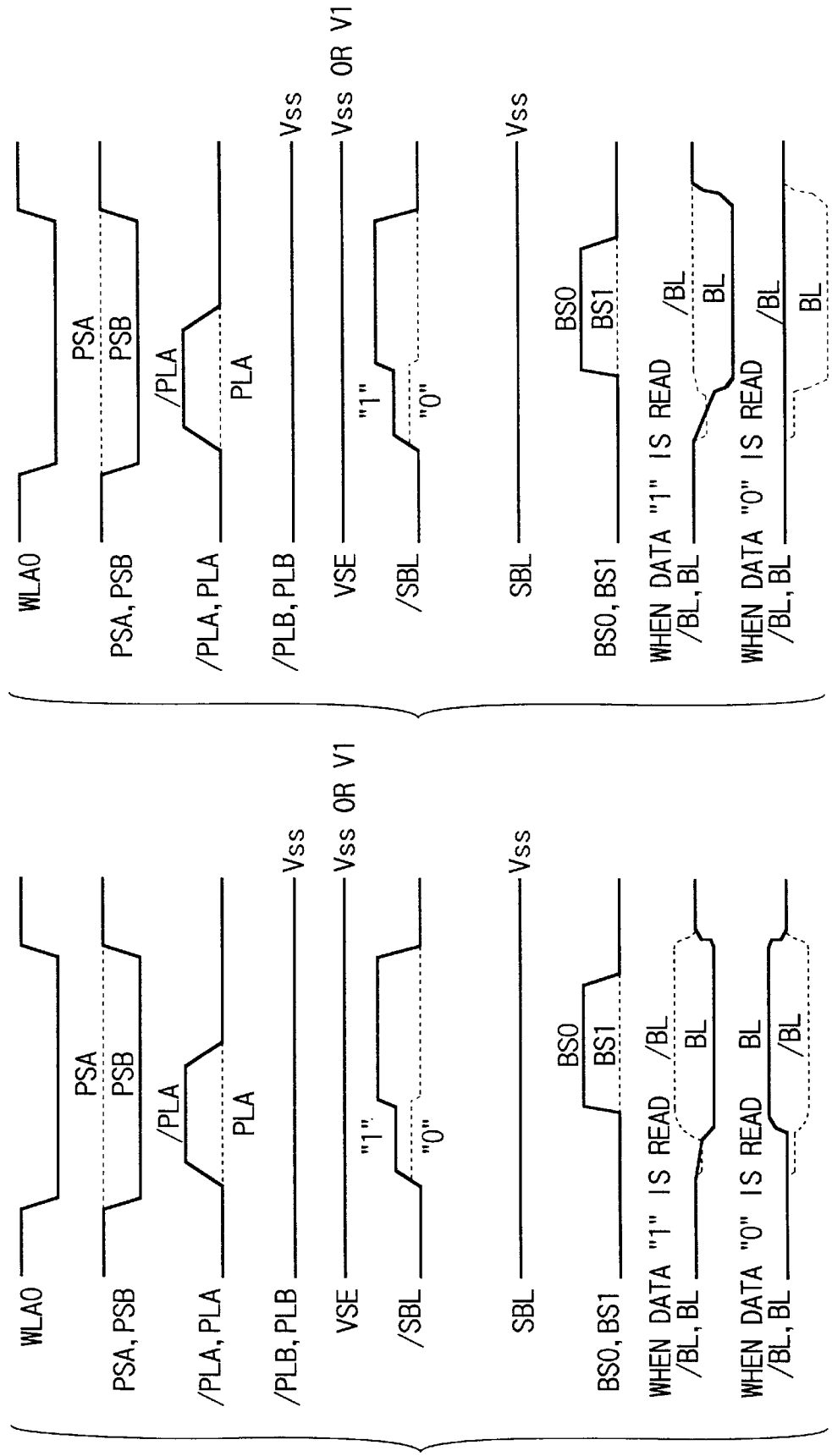

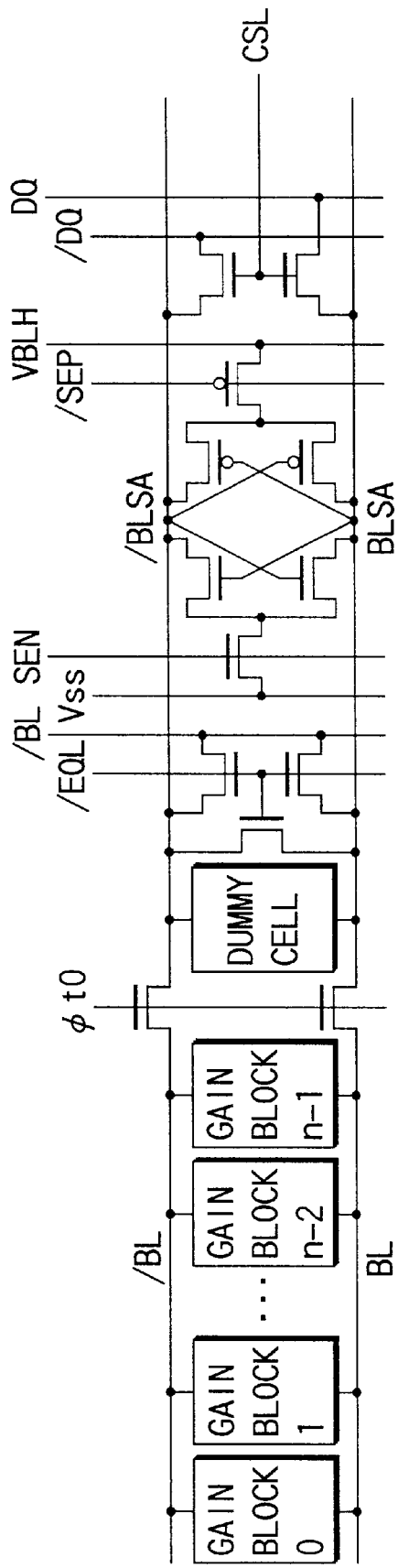
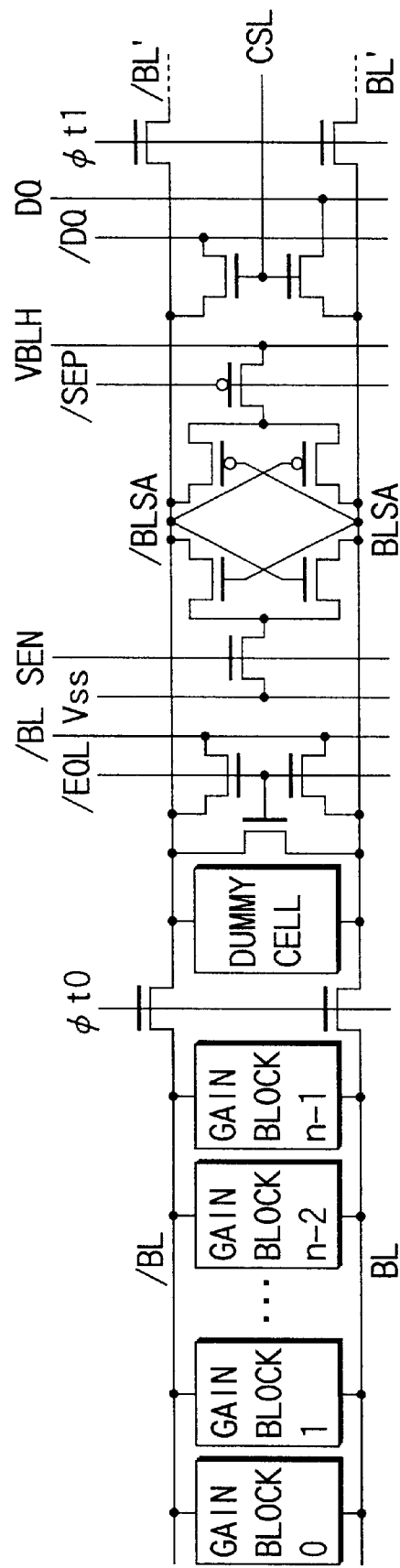
FIG. 16A
FIG. 16B

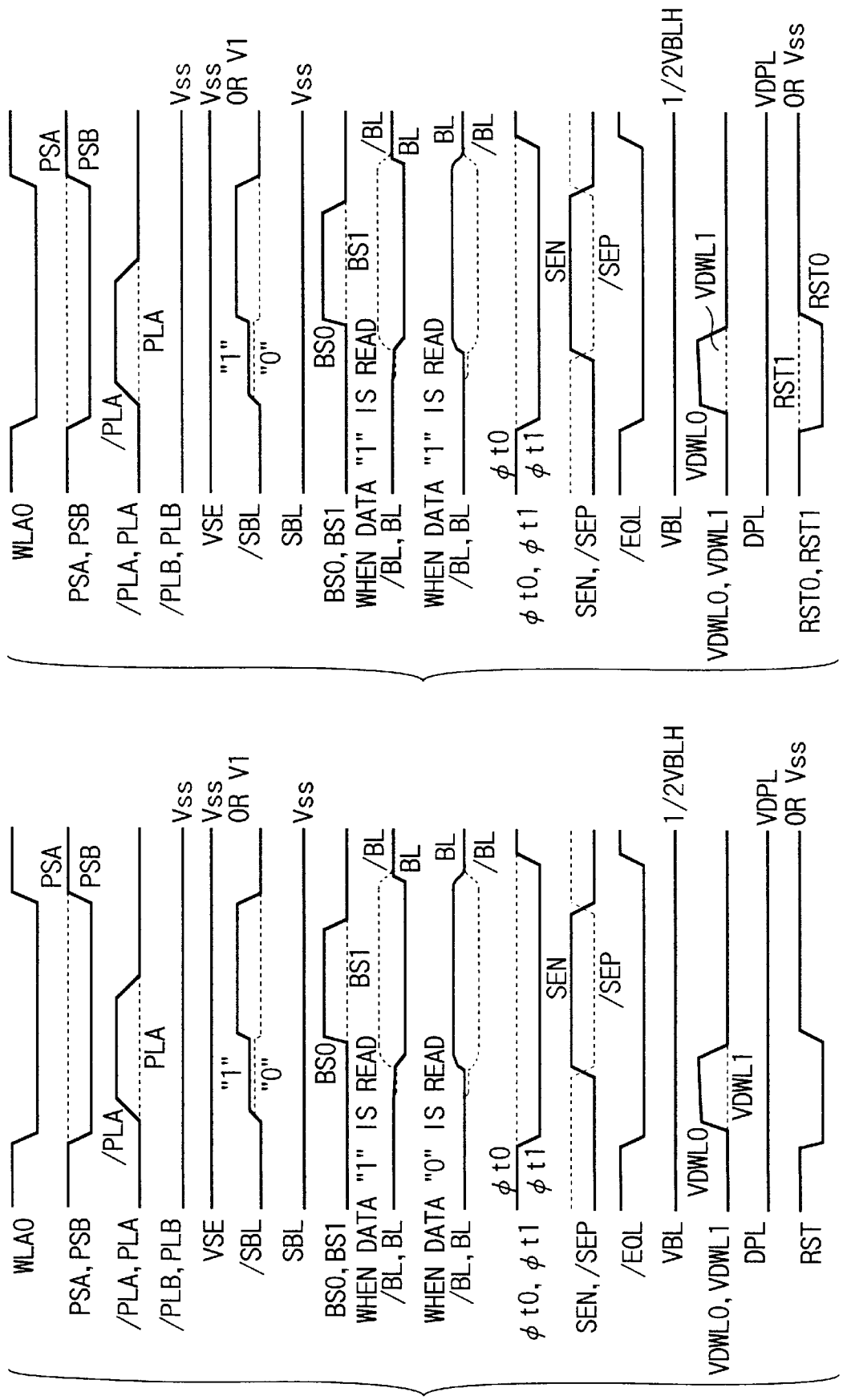

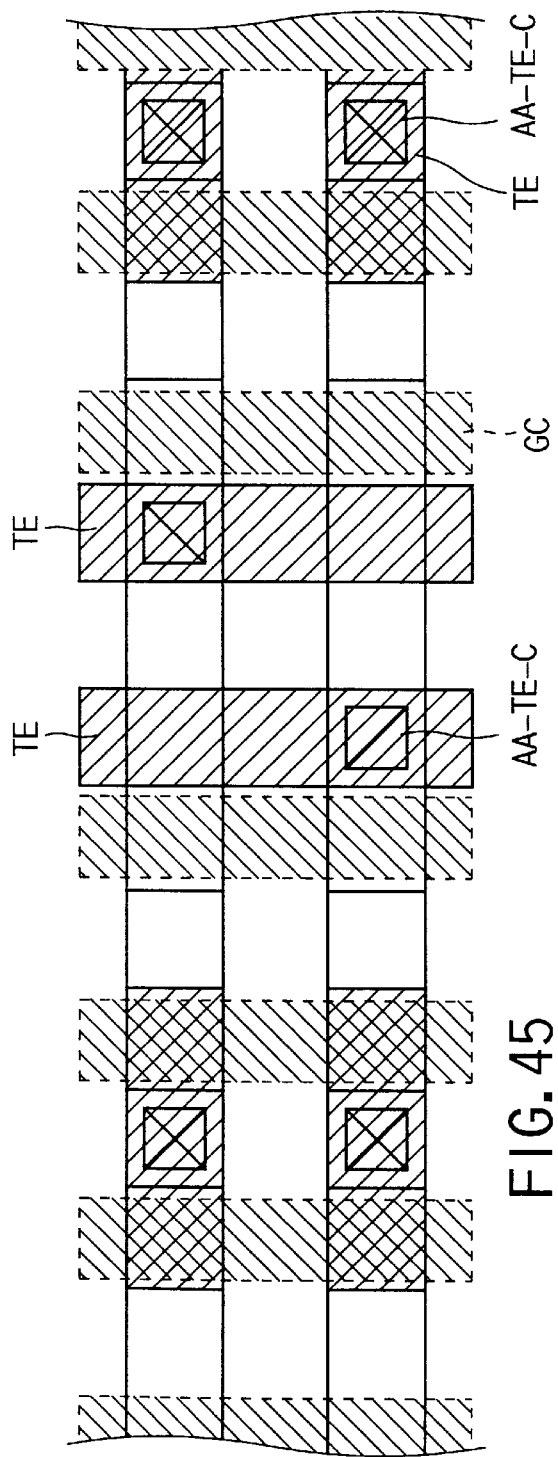
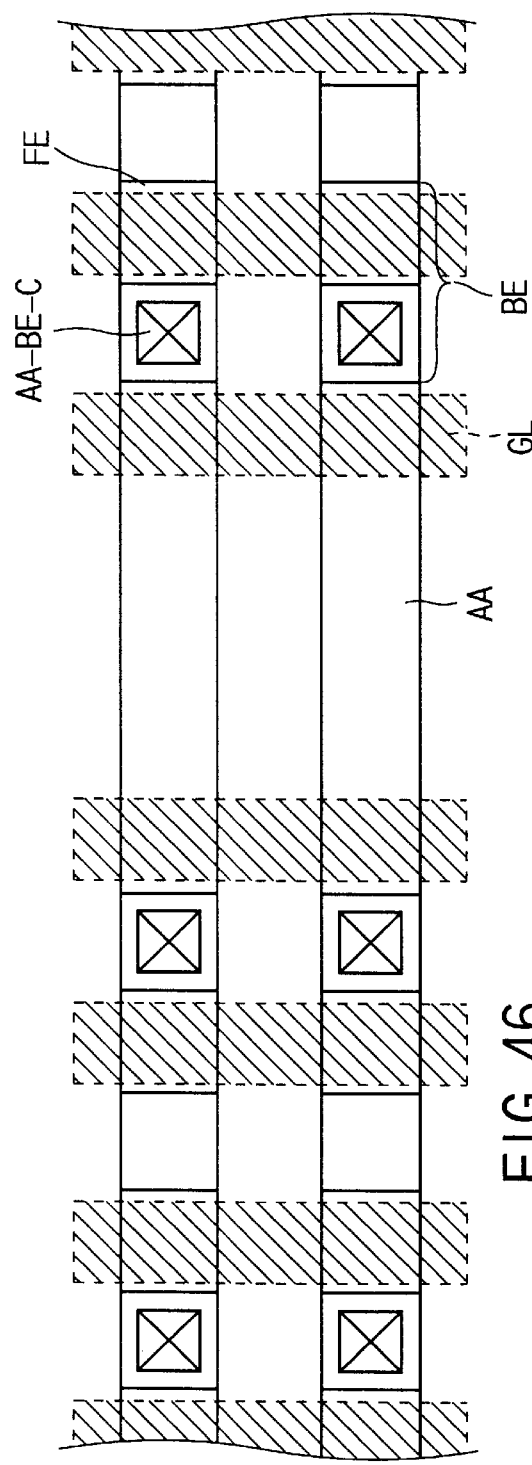
FIG. 45
FIG. 46

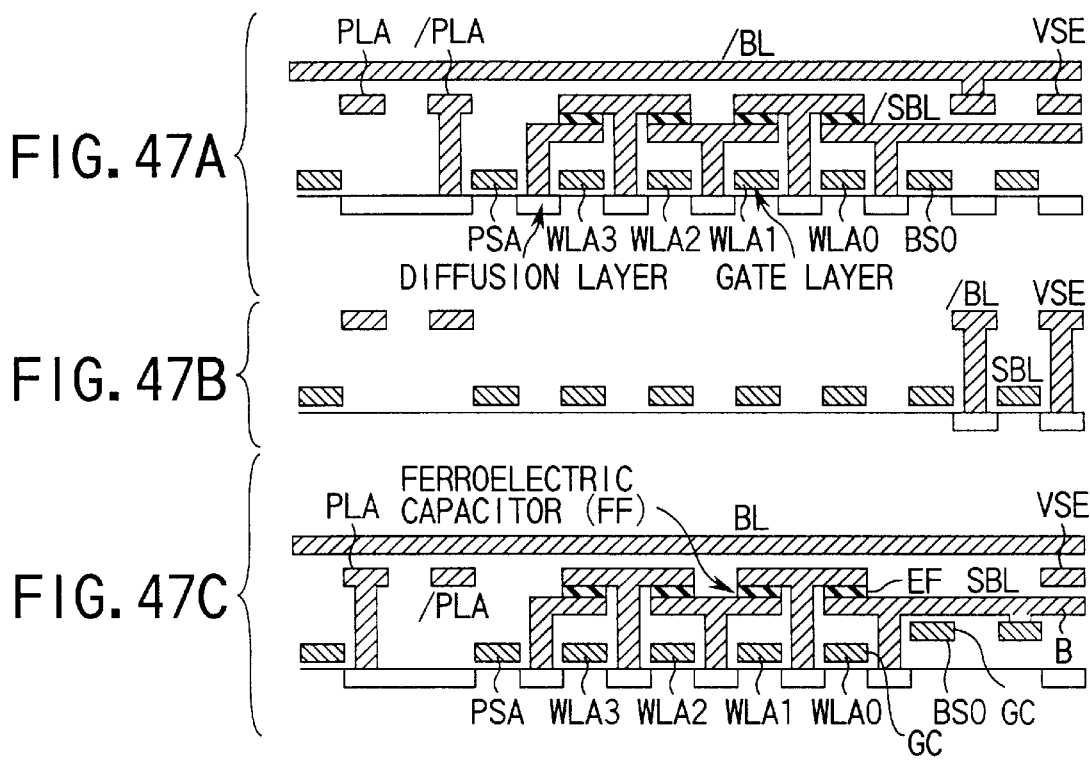
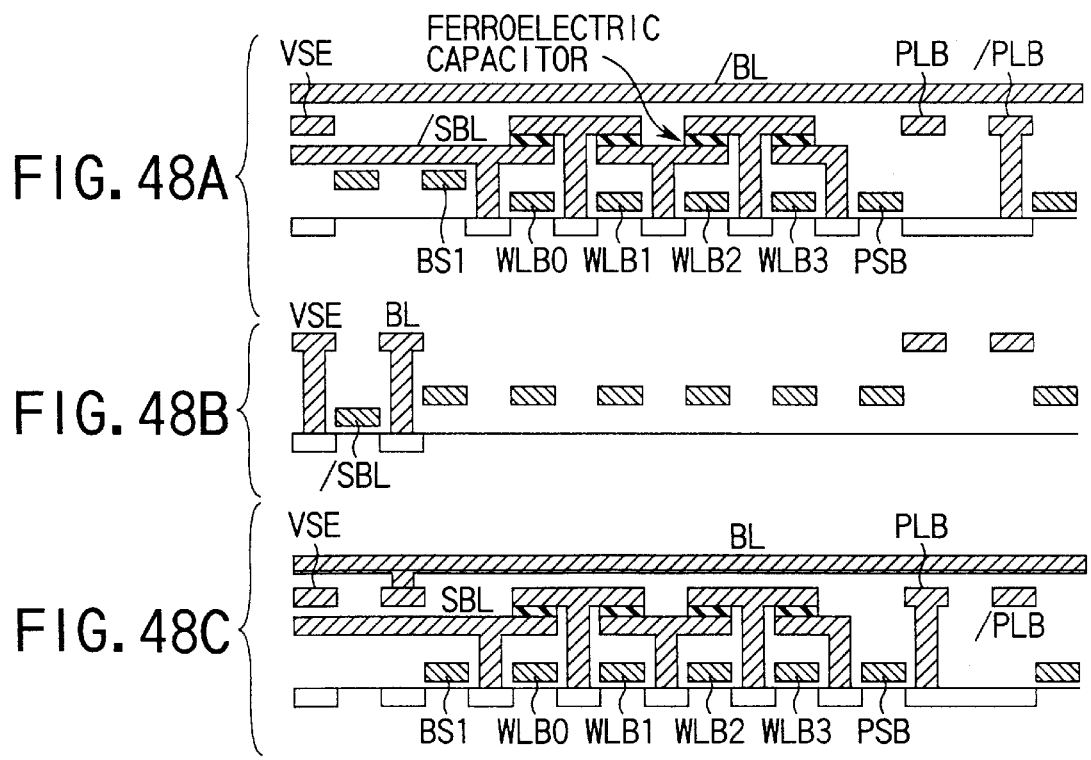

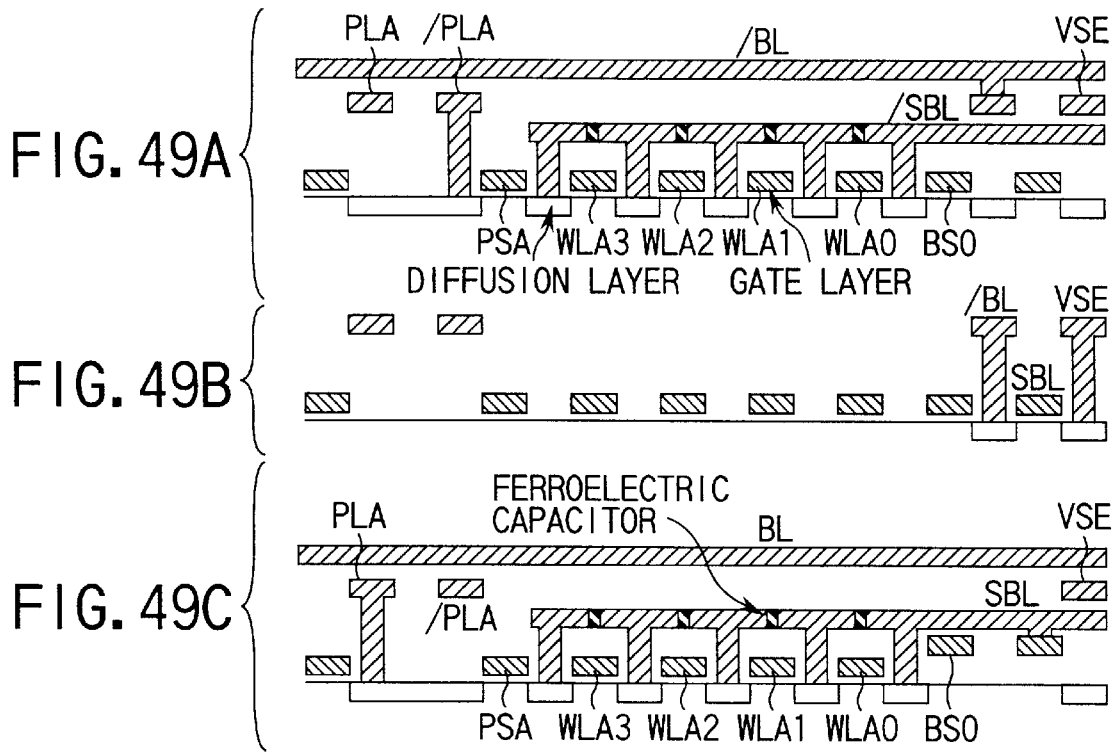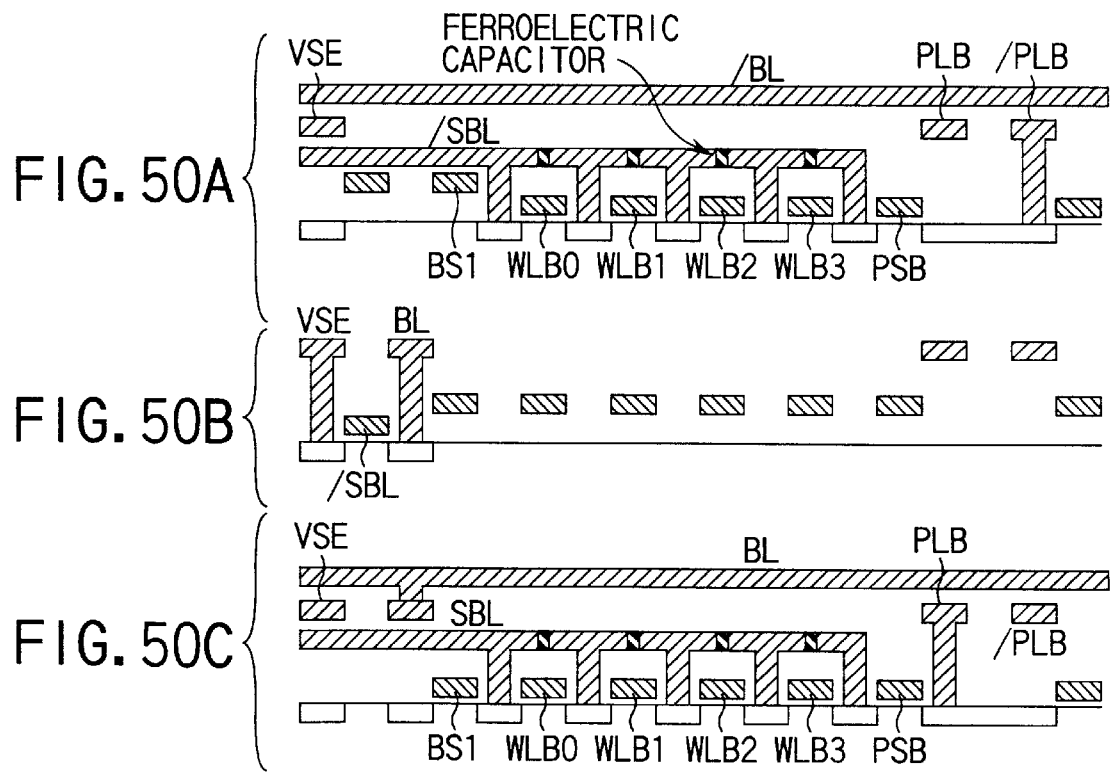

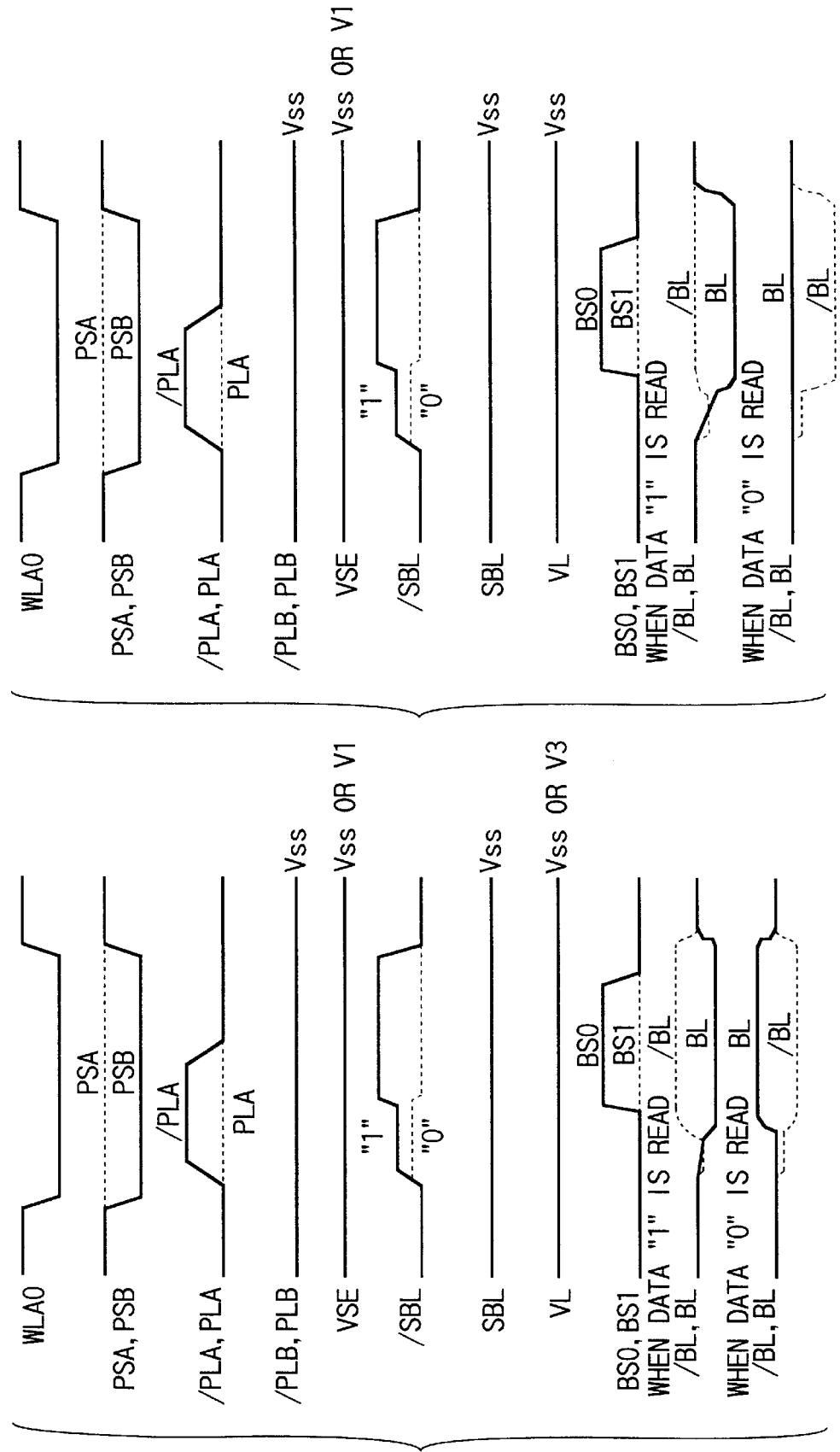

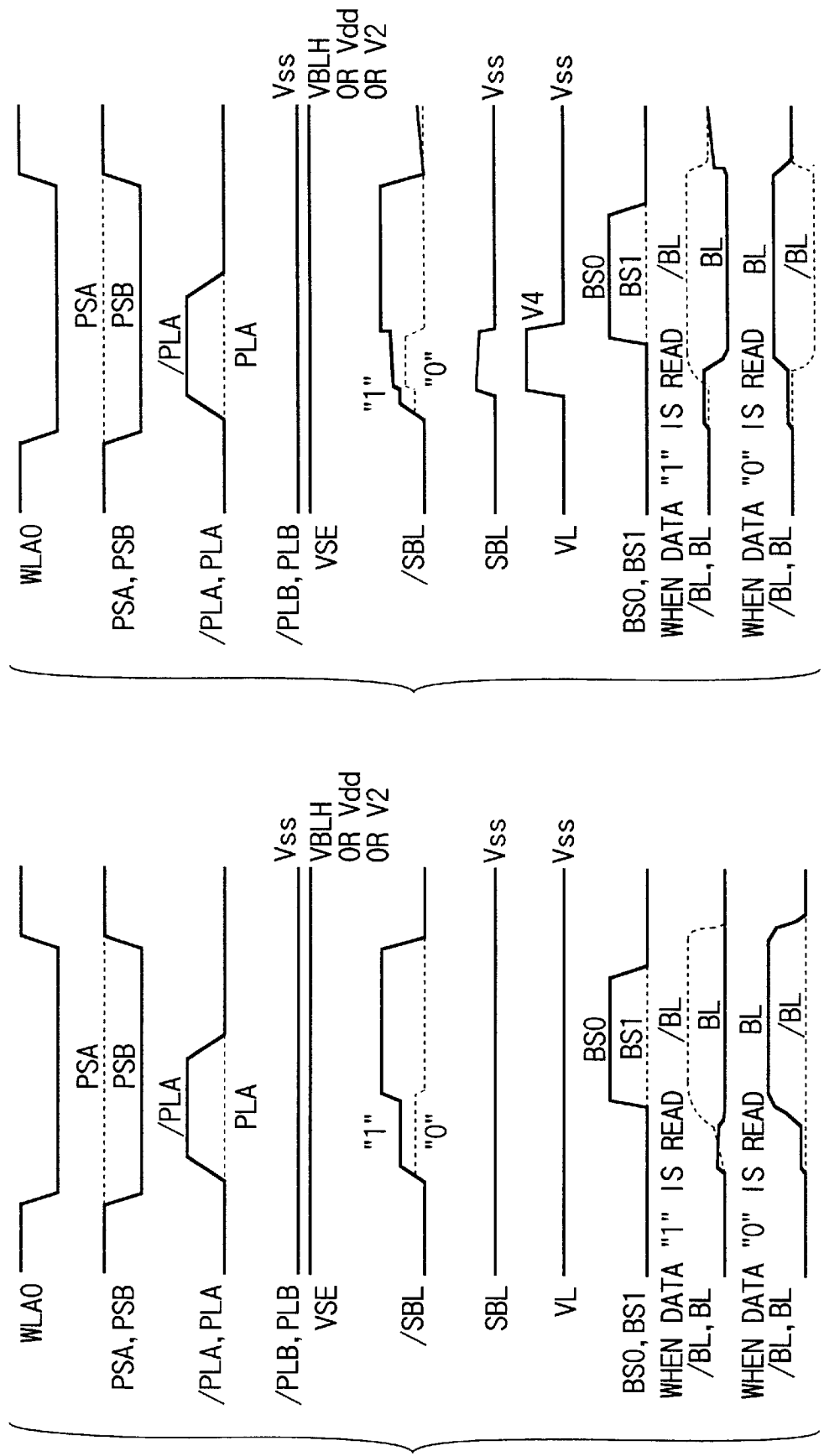

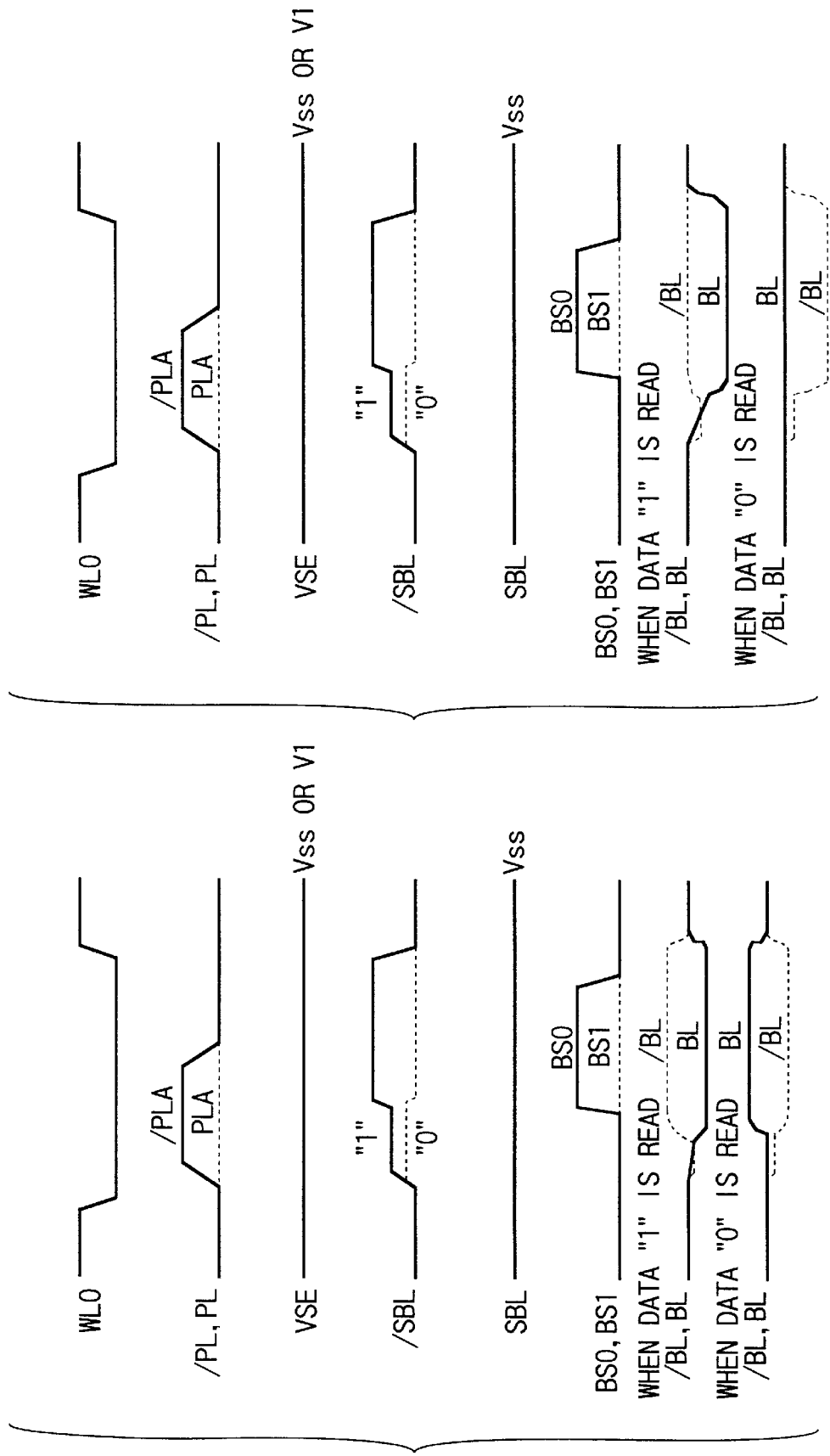

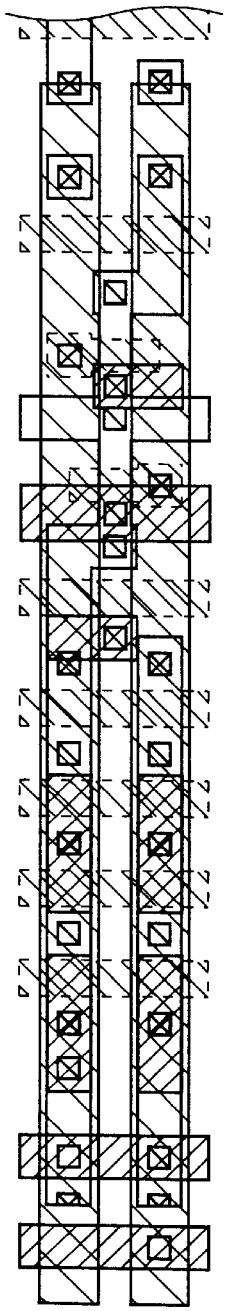
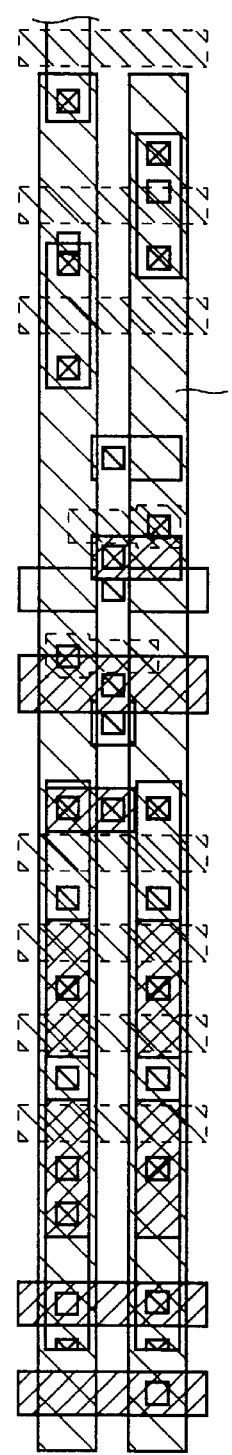
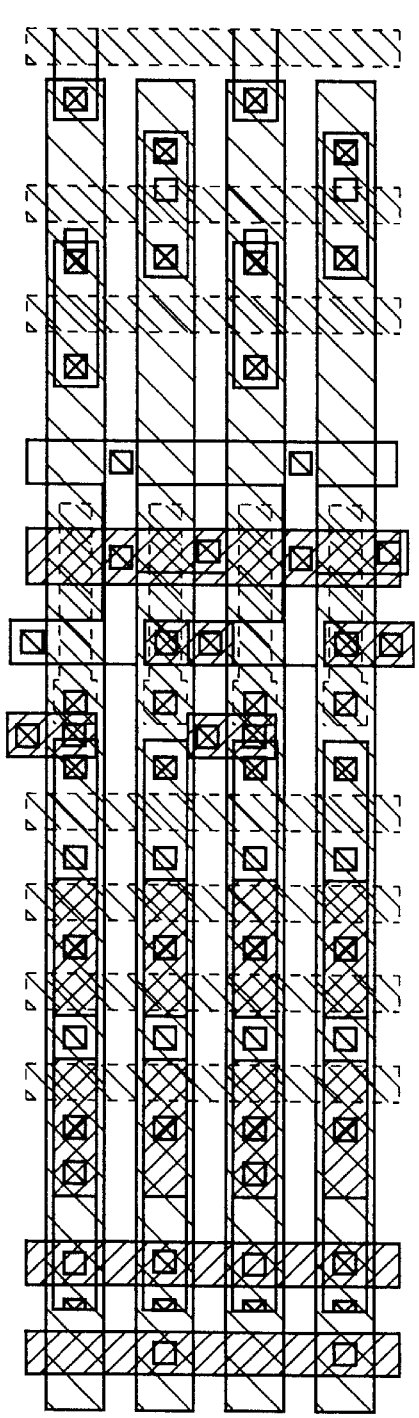
FIG. 70A
FIG. 70B
FIG. 70C

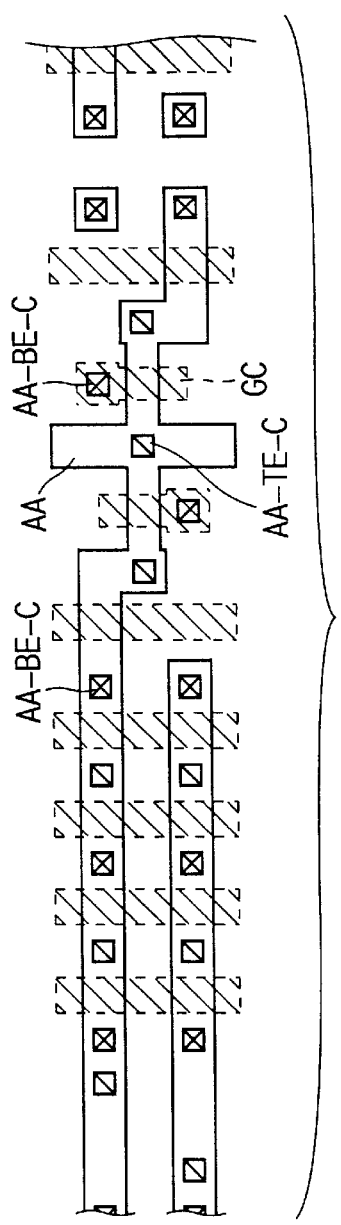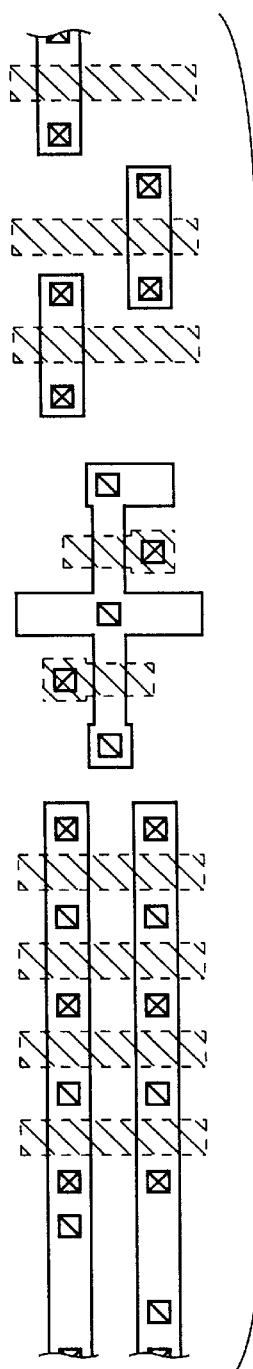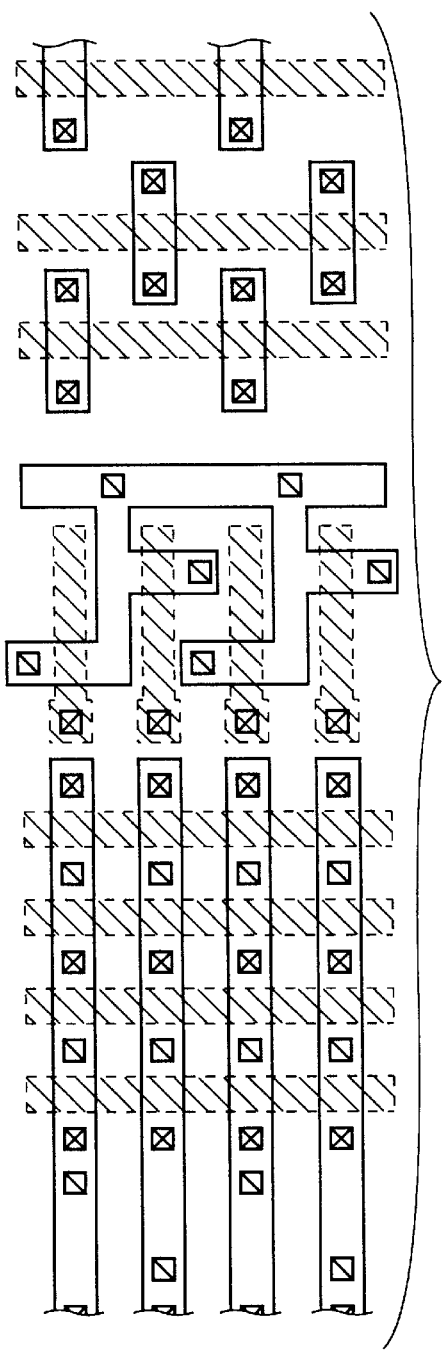
FIG. 71A
FIG. 71B
FIG. 71C

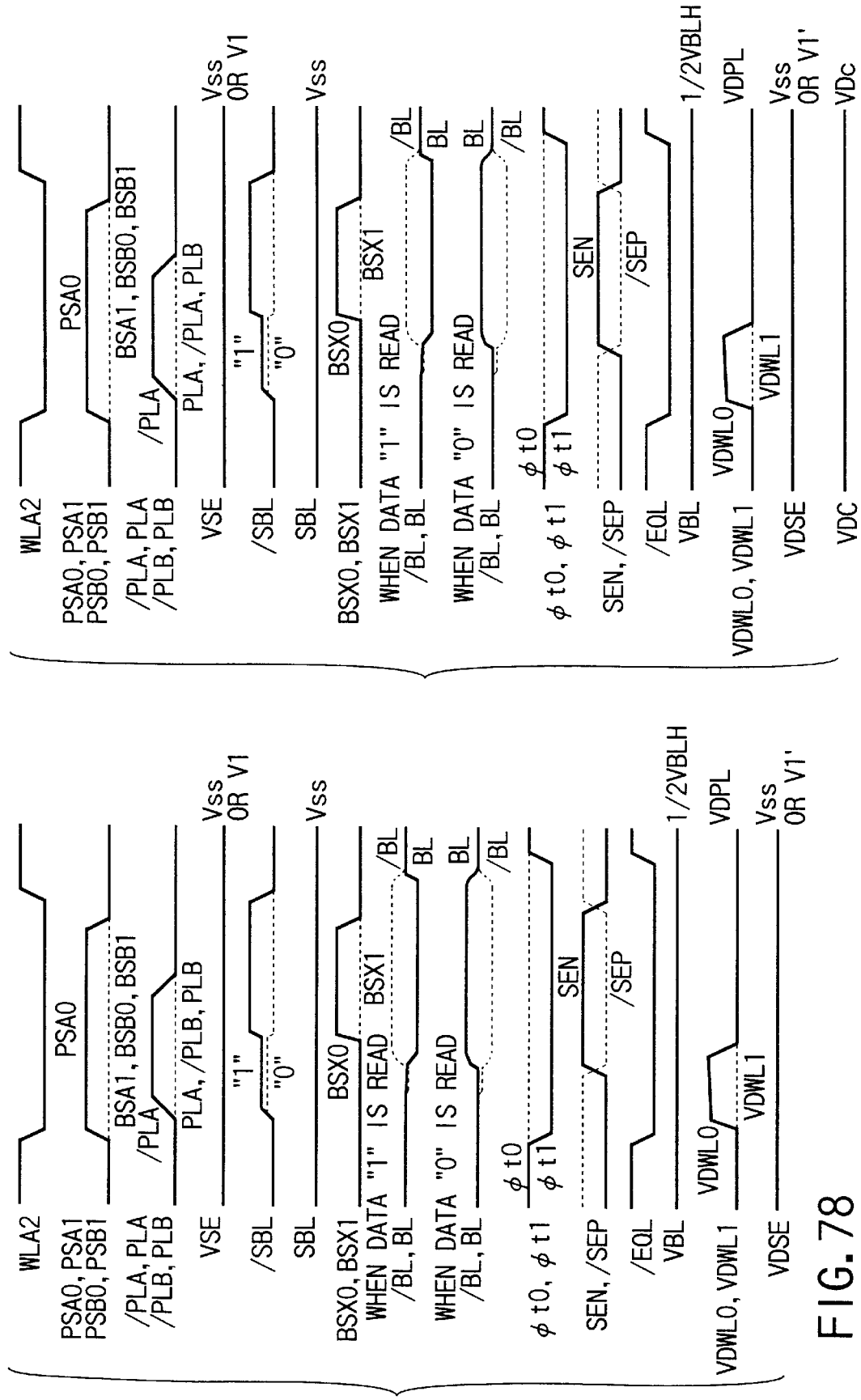

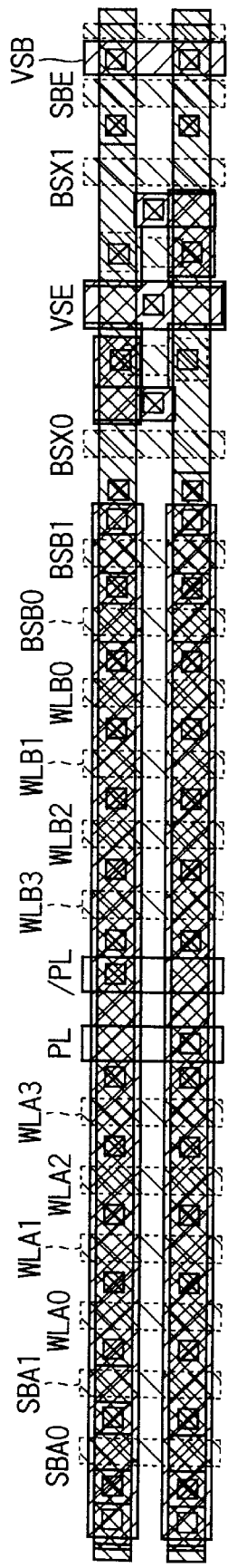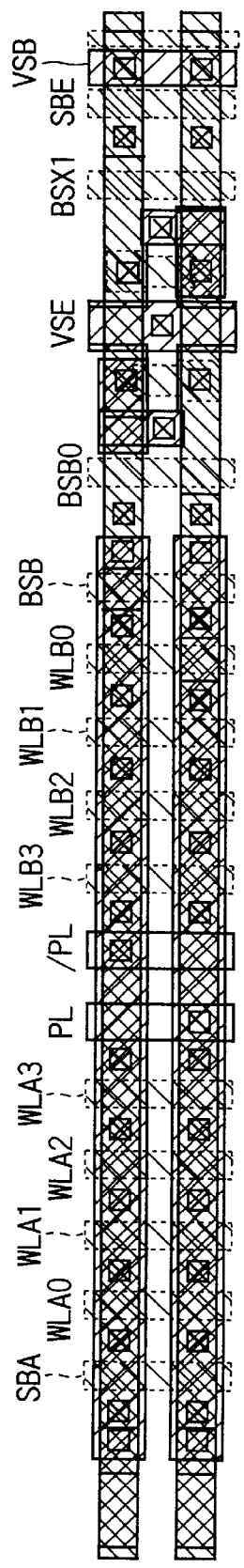

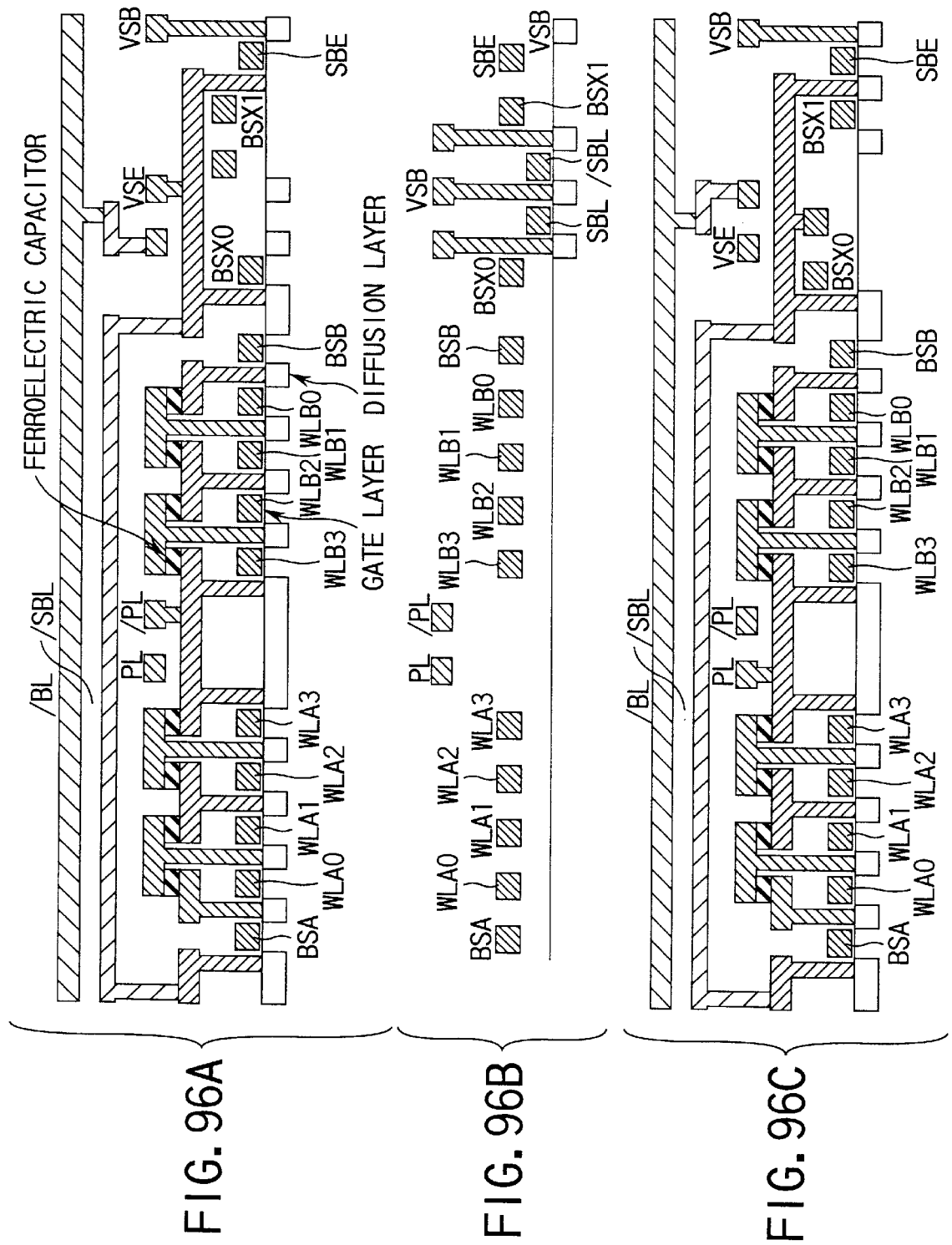

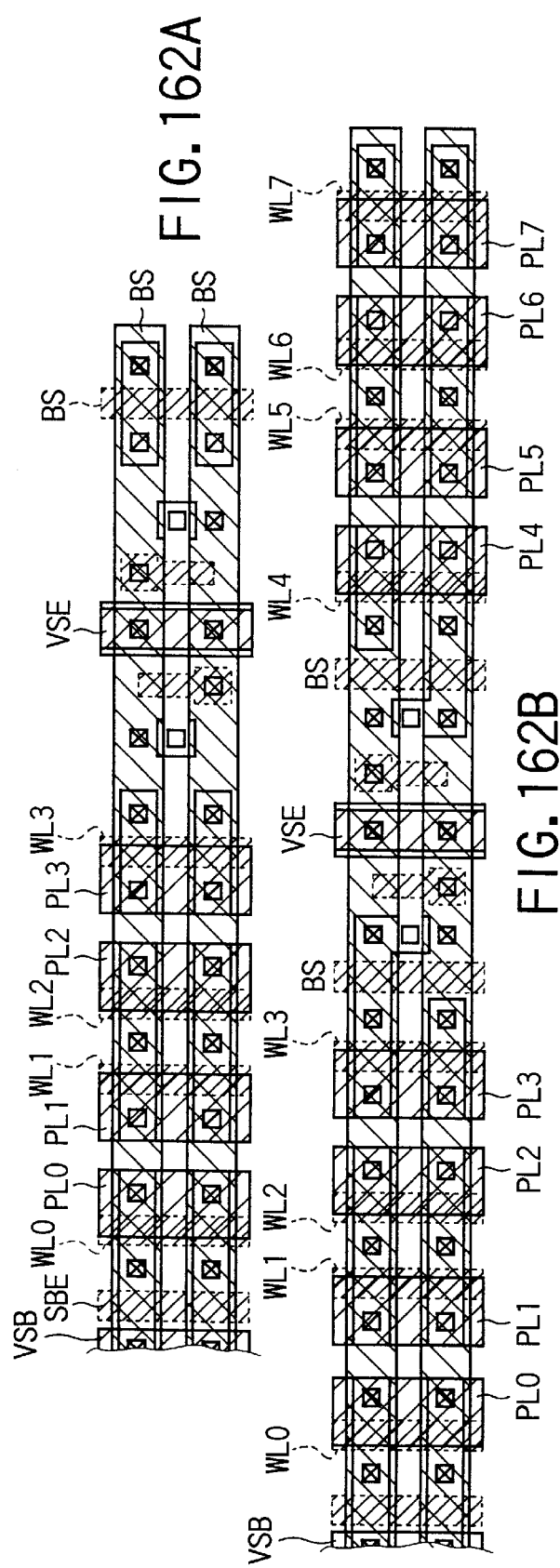
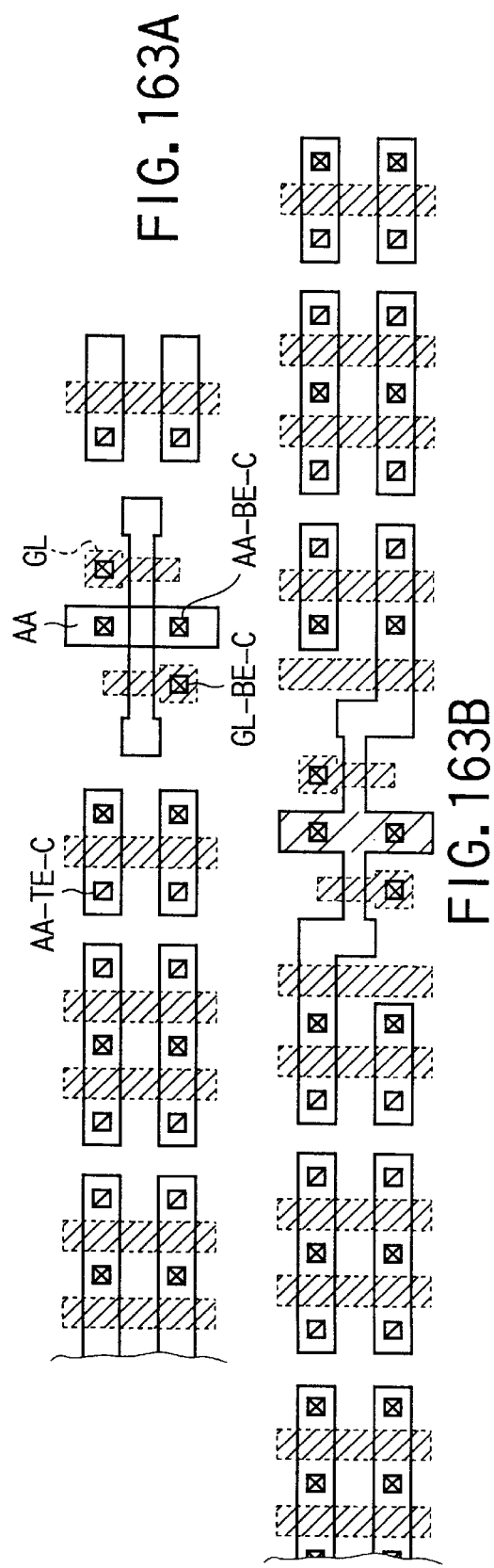

SEMICONDUCTOR MEMORY DEVICE

BACKGROUND OF THE INVENTION

The present invention relates to a semiconductor memory device, and more particularly to a nonvolatile semiconductor memory device incorporating a ferroelectric capacitor.

These days, semiconductor memories are widely used to serve as main memories of large-scale computers, personal computers, home electric appliances, portable telephones and the like. The types of the semiconductor memories include volatile DRAM (Dynamic RAM), SRAM (Static RAM), nonvolatile MROM (Mask ROM) and EEPROM (Electrically Erasable Programmable ROM) and the like. In particular, the DRAM has advantages of a low cost characteristic (the area of the cell is ¼ of that of the SRAM) and high speed (as compared with the EEPROM). Therefore, the DRAM, at present, commands the substantially overall share of the market though the DRAM is a volatile memory.

Although the rewritable nonvolatile EEPROM permits shutoff of the power supply because it is the nonvolatile memory, the EEPROM suffers from an undesirably small rewriting number of times (the number of W/E) of about $10^6$. Moreover, writing requires a long time of about a microsecond and a high voltage (12V to 22V) must be applied to perform writing. The foregoing problems result in that the obtained market is smaller than that obtained by the DRAM.

On the other hand, the nonvolatile memory FRAM (Ferroelectric RAM) incorporating a ferroelectric capacitor (Ferroelectric Capacitor) suggested in 1980 has the following advantages: the FRAM is a nonvolatile memory. Moreover, the rewriting number of times is $10^{12}$, time required to read/write data is substantially the same as that required for the DRAM and required operating voltage of 3V to 5V. Therefore, there is possibility that the foregoing memory is substituted for the overall memory market. Therefore, a multiplicity of manufacturers is developing the FRAM. At present, 1 Mb FRAM is disclosed at the academic level (H. Koike et al., 1996 IEEE Internal Solid-Stable Circuit Conference Digest of Technical Paper, pp. 368–369, Feb. 1996). The cell size of the developed FRAM cell is reduced from a developed size of the SRAM+SM (Shadow Memory) structure to a 2-transistor+2-capacitor structure. Thus, the simplification and fining of the cell structure has caused the cell size to be reduced.

FIG. 1A shows an equivalent circuit of a memory cell of a conventional FRAM having a 1-transistor+1-capacitor structure. The memory cell having the 1-transistor+1-capacitor structure is similar to the 1-transistor+1-capacitor structure of the DRAM in which the transistor and the capacitor are connected to each other in series. The DRAM incorporates a paraelectric capacitor as the capacitor thereof, while the FRAM incorporates a ferroelectric capacitor having a hysteresis characteristic. Therefore, a cell array structure similar to that of the DRAM is employed, that is, a folded BL structure is employed. As shown in FIG. 1B, which is a sectional view, the minimum cell size is 2F×4F= $8F^2$. The foregoing size cannot easily be reduced. Note that symbol F represents a minimum machining size.

As an example of forcible realization of $4F^2$ size, structures for realizing the $4F^2$ size by using a stacked-type transistor or a stacked-type TFT (Thin Film Transistor) exist. The foregoing structure cannot easily be manufactured. A structure is suggested in which cell transistors are connected to one another in series. Moreover, a capacitor is connected each of the cell transistors and the plate electrode. Thus, a size similar to the $4F^2$ size is realized (a NAND cell). The foregoing structure has suffered from poor general versatility because random access cannot be performed.

As described above, the conventional FRAM cell has a first problem in that the following three requirements cannot simultaneously be met: (1) obtaining a memory cell having a small size of $4F^2$; (2) obtaining a planar transistor which can easily be manufactured; and (3) realizing a random access function having general versatility.

As for the operating method, the DRAM is structured such that a plate electrode disposed at one end of the capacitor is fixed to (½)Vdd. The FRAM is structured such that variation between 0V to Vdd is performed. The two types of the memories are different from each other in only the foregoing fact. The foregoing structure is changed from the method of varying the plate electrode as shown in FIG. 1C (T. Sumi et al., 1994 IEEE International Solid-State Circuit Conference Digest of Technical Paper, pp. 268–269, Feb, 1994 and the like) to the structure as shown in FIG. 1D in which fixation to (½)Vdd is performed (H. Koike et al., 1996 IEEE international Solid-State Circuit Conference Digest of Technical Paper, pp. 368–369, Feb, 1996 and K. Takeuchi et al, IEICE Trans, Electron., Vol. E79-C, No. 2, Feb, 1996).

The method of driving the plate electrode from 0V to Vdd suffers from an excessively long driving time because a number of memory cells are connected to the plate electrode and, therefore, a great load capacity is required. As compared with the conventional DRAM, the operation speed in both of the access time and the cycle time is reduced under present circumstances. The method of fixing the plate to (½)Vdd is not required to drive the plate having a large load capacity. Therefore, access time and cycle time similar to those obtained from the DRAM can be realized.

The conventional FRAM memory cell has a structure similar to that of the DRAM such that the transistor and the ferroelectric capacitor are connected to each other in series. Therefore, as shown in FIG. 1D which is a circuit diagram, the storage node (SN) is floated at the time of standby after the power is turned on. Therefore, data "1" is stored in the SN, the SN is lowered to Vss owning to a junction leak of the pn-junction of the cell transistor. It leads to fact that information in the cell is destroyed when the plate electrode is fixed to (½)Vdd. Therefore, the (½)Vdd cell plate method is required to perform a refreshing operation similar to that for the DRAM. Thus, there arise problems in that greater power is required and a severer specification is required to prevent leakage from the cell. As a result, manufacture cannot easily be performed.

As described above, the conventional FRAM has a second problem in that both of the high-speed operation (fixation of the PL potential) and elimination of the refreshing operation cannot simultaneously be realized.

To overcome the first and second problems, the inventors of the present invention has suggested a semiconductor memory device which is a nonvolatile ferroelectric memory which is capable of realizing the following three requirements (1) obtaining a memory cell having a small size of $4F^2$; (2) obtaining a planar transistor which can easily be manufactured; and (3) realizing a random access function having general versatility. Moreover, the semiconductor memory device is able to hold data even during standby while a high-speed operation is being maintained, that is, the PL potential is fixed. In addition, the foregoing semiconductor memory device does not require the refreshing operation. Another semiconductor memory device is suggested which is capable of realizing a high-speed operation even if the PL operation method is employed.

All of the conventional FRAM and the apparatuses suggested by the inventors of the present invention suffers from reduction in the polarization of the ferroelectric capacitor per memory cell if the area of each ferroelectric capacitor of the memory cell is reduced owning to raising of the density. As a result, there arises a critical problem in that reduction in the voltage for reading a signal results in increase in the capacity and raising of the density being made to be difficult. Also the foregoing problem arises with the DRAM or the like. In particular, the foregoing problem becomes serious for the FRAM because it has the intrinsic problems as shown in FIGS. 2A to 2C.

FIG. 2A shows a ferroelectric capacitor. FIG. 2B shows a capacitor incorporating a ferroelectric film having a thickness, which is a half of the thickness of the film of the capacitor shown in FIG. 2A. FIG. 2C shows hysteresis characteristics of the two ferroelectric capacitors. The residual polarization of a ferroelectric material is not changed if the film thickness is reduced. In this case, the voltage resistance is lowered by a degree corresponding to the reduction in the film thickness because the coercive electric field is constant. The foregoing fact is satisfactory to realize a low-voltage operation. However, a structure having a high density and encountered reduction in the area of the capacitor of the memory cell raises a problem in that the polarization of the cell is reduced. At present, the following ferroelectric materials have been suggested: PZT, SBT and Stained BST and the like. The residual polarization is fixed to 7 to 30 $\mu C/cm^2$ for each material. A material of a type having a larger polarization has not been found at present. At present, only a method is effective which improves the material, for example, a method of forming the material into a single-crystal structure.

FIG. 3 is a graph in which an abscissa axis stands for design rules and an ordinate axis stands for a capacity of bitline of a FRAM and residual polarization for each cell. An assumption is made in the foregoing case that the capacity of the bitline is 512 WL/BL. The capacity is slightly reduced owning to fining of the structure (reduction in the design rule). A line indicating amount Pr of polarization required for the conventional structure indicates a minimum amount Pr of polarization required for each cell from equation as Vs=Pr/Cb on an assumption that the voltage Vs for reading a signal is 110 mV. In proportion to reduction in the capacity Cb of bitline, reduction occurs owning to fining of the structure. However, the reduction is restrained.

An assumption is made that the residual polarization of the ferroelectric material is 20 $\mu C/cm^2$. In this case, residual polarization, which can be obtained by a planar capacitor of a design rule of, are indicated with a line of a planar Cap. Residual polarization which can be obtained when the aspect ratio AR of the base and the height of a solid capacitor is made to be 1 to 0.7 are indicated with solid Cap (AR=1 to 0.7). Residual polarization which can be obtained when the aspect ratio of the base and the height of a solid capacitor is made to be 2 to 1.4 is indicated with solid CAP (AR=2 to 1.4). In the foregoing cases, the area of the base of the ferroelectric capacitor is $3F^2$ (F is a design rule).

As described above, the residual polarization for each cell, which can actually be obtained, is reduced in proportion to the square of the design rule. Therefore, the reduction in the design rule causes the residual polarization to rapidly be reduced. The foregoing graph shows a fact that there is a limitation at 256 Mb FRAM of the 0.2 $\mu m$ rule when the ferroelectric capacitor is formed into a planar structure. The polarization of the ferroelectric capacitors usually has anisotropy and axiality. Therefore, a satisfactory large residual polarization cannot be obtained from the solid capacitor. There has not been any report showing realization of the foregoing residual polarization by using the solid capacitor. Even if the solid cap is able to realize the foregoing residual polarization, there are limits at 1 Gb FRAM and 4 Gb FRAM, as shown in FIG. 3. The foregoing structures correspond to the conventional FRAM capable of realizing the maximum area of the base of $3F^2$. A cell size of $4F^2$, which is 50% of the conventional structure, can be realized. However, a bottom area of the base of the capacitor of $F^2$ can be realized. The invention suggested by the inventors has a further unsatisfactory result.

Also the conventional DRAM has the cell storage amount of charges Qs which is defined such that Qs=Cs×($\frac{1}{2}$)Vdd= $\epsilon \times S \div T \times$($\frac{1}{2}$)Vdd, where $\epsilon$ is a dielectric constant, S is the area of the capacitor and T is the thickness of an insulating film of the capacitor. The reduction in the power supply voltage and that in the area of the capacitor causes the cell storage amount of charges Qs be rapidly reduced. When the power supply voltage is moderately reduced regardless of reduction in the design rule, the ratio of reduction in the cell storage amount of charges Qs is equivalent to the ferroelectric memory shown in FIG. 3 in a case where T is constant. The DRAM has merit of increase in the capacity by a quantity corresponding to the reduction in the film thickness. Since the solid Cap can be realized by a BST film or the like, an expectation can be made that the structures of about 1 Gb DRAM and about 4 Gb DRAM can be realized.

However, the BST film has a limit at a thickness of about 10 nm (converted into the thickness of an oxide film of 0.1 nm). The reason for this lies in that the reduction in the thickness has a limitation and the reduction in the thickness make the dependency of the capacity on the bias voltage to be conspicuous. Specifically, the reduction in the thickness causes the capacity to be increased at low voltages. However, the capacity is not satisfactorily increased at the operating bias voltage. In an operation of reading data from cells of the DRAM, the capacity in a range for the operating point from 1/Vdd to the potential Vs for reading a signal is effective. Even if the capacity in a portion not higher than Vs is increased owning to the reduction in the thickness, there is no merit. As described above, also the conventional DRAM has a limit at 1 Gb to 4 Gb DRAM.

If the aspect ratio is increased considerably in a forcible manner, a larger capacity can be realized. However, increase in the cost and difficulty in the manufacturing process inhibits practical use. IF PZT is used instead of the BST, the lower limit cannot considerably be lowered. Basically, the high dielectric material and the ferroelectric material belong to the same material group in which atoms are moved so that the ferroelectricity is imparted or the dielectric constant is increased. Therefore, the movement of atoms has a limit. Therefore, even the high dielectric material is reduced and polarized maximally, the limit is made to be the same as that for the ferroelectric material.

To realize data retention for 10 years for the conventional EEPROM or the like, an oxide film having a thickness of about 8 nm is required because penetration of stored charges through the oxide film must be prevented. Therefore, fining of the structure has a limitation. Also a multi-level technique is employed for the EEPROM, there is a limit at 1 Gb flash memory.

To overcome the problems of the conventional FRAM, a variety of memory cells each having a self-amplifying function is suggested, as shown in FIG. 4. FIG. 4 shows correspondences of memory cells having four types of self-amplifying functions including (a), (b), (c) and (d) and the four types of problems and comparison of the cell sizes.

The memory cell shown in FIG. 4 (a) is that for a 1-transistor MFSFET transistor or a MF(M)ISFET transistor. The MFSFET transistor is a transistor incorporating gate insulating film which is a ferroelectric film. Since the foregoing transistor has the structure that the lattice constant of the ferroelectric film and that of the Si substrate are different from each other, manufacture cannot easily be performed. The MFISFET transistor is a transistor incorporating a gate insulating film which is a ferroelectric film and a buffer film made of a paraelectric material and formed at the interface with the Si substrate. The MFMISFET transistor is a transistor incorporating a ferroelectric film serving as the gate insulating film. Moreover, a conductor and a buffer film made of a paraelectric material are formed at the interface with the Si substrate. Also the foregoing transistor cannot easily be manufactured. What is worse, there are problems of the coupling ratio, leakage, erroneous writing and the like. Thus, there are a multiplicity of problems which must be overcome when the foregoing transistor is put into practical use.

The problem of the coupling ratio is caused from a fact that the dielectric constant of the ferroelectric film is usually considerably larger than that of the paraelectric film. Even if the thickness of the paraelectric film is reduced, the capacity of the ferroelectric film is undesirably increased as compared with that of the paraelectric film as shown in an equivalent circuit shown in the upper right portion of FIG. 4. Even if voltage is applied to the gate in order to write data, a major portion of the writing voltage is undesirably applied to the paraelectric film having a smaller capacity. As a result, high voltage of 7V to 15V is required to write data as compared with the FRAM capable of being operated at low voltage.

The problem of the leak is a critical problem. For example, a state of the transistor is shown in a lower right figure shown in FIG. 4. The foregoing state is realized after voltage is applied to the gate of the MFMISFET to invert the polarization of the ferroelectric film, followed by returning the voltage of the gate to 0V. Inversion of the polarization of the ferroelectric film causes positive charges to be collected to the gate portion, while negative charges are collected to a portion of the conductor disposed between the ferroelectric film and the paraelectric film adjacent to the ferroelectric film. Thus, the principle of conservation of charge in the conductor realizes a state as if the excess positive charge individually exists in the conductor. The foregoing positive charge induces a negative charges to the channel portion through the paraelectric film. The induction and non-induction of the negative charge changes the threshold voltage of the transistor so that the transistor serves as a non-destructive read enabled memory cell.

Although the foregoing function can be obtained in an ideal state, the positive charges in the conductor actually raises the potential of the inner node of the conductor. Thus, an electric field is generated between the conductor and the gate and between the conductor and the channel. If electrons are introduced into the conductor through either the ferroelectric film or the paraelectric film, there arises a problem in that information in the cell is destroyed. The preservation of data in a cell (data retention) is required for 10 years for the nonvolatile memory. The foregoing requirement can be met by a gate oxide film having a thickness of 8 nm with difficulty. The ferroelectric film or the high ferroelectric film having a small barrier height cannot meet the insurance for 10 years. As a result of previous measurements, tens of seconds have been realized at room temperature. That is, 10 years at high temperatures cannot easily be insured.

The problem of erroneous writing arises when data is written on a selected cell. In this case, also the potential of the bitline which is connected to the unselected cell inevitably varies. Depending on the method, at least ⅓ to ½ of the potential of the selected cell is undesirably applied to the drain terminal of the unselected cell. As a result, erroneous writing occurs. Also the flash memory encounters a similar problem. In the case of the flash memory, electric currents caused from the F-N tunneling and hot carriers are changed exponentially with respect to the applied voltage. Therefore, a critical problem does not arise. However, the ferroelectric transistor in which the polarization is inverted linearly with respect to the applied voltage encounters a critical problem.

The memory cell shown in FIG. 4A is able to theoretically realize the $4F^2$ size. The well potential must be controlled when data is written. In actual, the connection between the bitline and the well causes the size to be larger than the $4F^2$ size. At present, cells having a $6F^2$ size have been suggested.

A circuit shown in FIG. 4 (b) is a 2-transistor type memory cell in which the ferroelectric transistor shown in FIG. 4 (a) is connected to the bitline through a selected transistor. Among the problems of the coupling ratio, leakage, manufacturing easiness and erroneous writing, the problem of erroneous writing can be overcome by turning the selected transistor off. However, the problems of coupling ratio, leakage and manufacturing easiness cannot be overcome. What is worse, the area of the cell is $8F^2$ or larger, which is similar to that realized by the conventional FRAM.

A circuit shown in FIG. 4 (c) does not employ the ferroelectric FET but employs a usual transistor and a ferroelectric capacitor to overcome the problems of the leakage and the manufacturing easiness. As the transistors, a write transistor and amplified read transistors are provided. When the write transistor is turned on to apply voltage between PL-BL so as to invert the polarization. When the write transistor is turned off, writing is completed. Reading is performed by driving the PL to invert the polarization. A fact that the gate voltage of the read transistor varies depending on data "1" and "0" is used, the gate voltage is amplified by the transistor so as to read it to the bitline. The foregoing structure in which the capacity of the ferroelectric capacitor is larger than the capacity of the gate cannot, however, overcome the problem of the coupling ratio. What is worse, the size of the cell is $12F^2$ or larger, which is larger than that of the conventional FRAM.

A circuit shown in FIG. 4 (d) is structured such that a paraelectric capacitor is connected to the circuit shown in FIG. 4 (c). The foregoing load capacity facilitates polarization inversion reading and thus an operation free from a problem can be expected. However, a paraelectric capacitor having a capacity equal to or more than that of the ferroelectric capacitor is required. Therefore, an area larger than $16F^2$ is required. As a result, practical use cannot be expected because of the problem of large cost.

As described above, the conventional memory cells having the self-amplifying function have the problem in that both of the normal operation and the high density cannot be realized. Although the cell having the self-amplifying function may be applied to the DRAM, also the 2-transistor+1-capacitor structure or larger structure is required in the foregoing case. Therefore, the foregoing structure has a problem in that the size is larger than the conventional DRAM.

As described above, the conventional FRAM and the structures suggested by the inventors of the present invention have the following problem. That is, when the area of each ferroelectric capacitor of the memory cell is reduced owning to raising of the density, the residual polarization cannot be increased even if the film thickness is reduced. Therefore, the polarization of the ferroelectric capacitor for each memory cell is undesirably reduced. As a result, the voltage for reading a signal is lowered, causing increase in the capacity and raising of the density to encounter difficulties. Therefore, the FRAM has a limit of 256 Mb FRAM in a planar capacitor and a 1 Gb to 4 Gb FRAM in a solid capacitor.

Also the DRAM or the like having a limit of reduction in the thickness of the insulating film has a similar problem. The DRAM has a limit at 1 Gb to 4 Gb DRAM. The other flash memories have a limit of reduction in the thickness of the oxide film. Thus, a limit exists at a 1 Gb flash memory. That is, the conventional semiconductor memories capable of reading and writing data have the problem of the limit at 1 Gb to 4 Gb.

Also the conventional ferroelectric memories having the self-amplifying function have the essential problems of the coupling ration, leakage, manufacturing easiness and erroneous writing. To overcome the abovementioned problems, another critical problem arises in that the required area of a cell becomes $16F^2$ or larger.

BRIEF SUMMARY OF THE INVENTION

An object of the present invention is to provide a semiconductor memory device which enables a nonvolatile ferroelectric memory to maintain sufficiently high voltage for reading a signal such that increase in the sizes of the cell and chip is prevented and software error is prevented even if the density is raised, the area of the ferroelectric capacitor is reduced and the polarization of the ferroelectric capacitor of the memory cell is reduced to enable a stable operation of the memory.

Another object of the present invention is to provide a semiconductor memory device which is capable of obtaining the foregoing effect such that a high density, manufacturing easiness and a high-speed random access function are realized.

Another object of the present invention is to provide a semiconductor memory device which enables also a dynamic semiconductor memory to maintain sufficiently high voltage for reading a signal to perform a stable operation of the memory such that increase in the sizes of the cell and the chip is prevent and, a software error is prevented though data retention cannot be improved if the density is raised, the polarization of the ferroelectric capacitor of the memory cell is reduced.

To achieve the foregoing object, the present invention employs the following structures.

(1) A semiconductor memory device comprising:
a block unit wherein a plurality of nonvolatile memory cells formed by connecting cell transistors and ferroelectric capacitors in parallel are connected in series;
an amplifying circuit having an input end connected to one end of the block unit and an output terminal connected to a bitline, wherein
the block unit and the amplifying circuit constitute a cell block, and
a plurality of cell blocks are disposed to constitute a memory cell array.

(2) A semiconductor memory device according to claim 1, wherein the amplifying circuit has an amplifying transistor, and the amplifying transistor has a gate terminal connected to one end of the block unit and a drain terminal connected to the bitline.

(2-1) The bitline is the same as the bitline for writing data on a cell block.

(2-2) The bitline is another bitline which forms a bitline pair in association with the bitline for writing data on the cell block.

(2-3) The drain terminal of the amplifying transistor is connected to the bitline through the write transistor.

(2-4) The gate of the cell transistor is connected to the word line.

(2-5) The drain and source terminals of the cell transistor are 0V in a case of standby.

(2-6) The bitline varies between 0V and VBLH in an active state and precharged to (½)VBLH in a standby state.

(2-7) One memory cell stores one bit information.

(2-8) Two memory cells store one bit information.

(2-9) The memory cell array includes a dummy cell, the dummy cell includes a dummy unit constituted by at least one or more transistors connected in series, one end of the dummy unit is connected to the bitline, another end is connected to a grounded power supply line or an internal power supply line, the gate voltage of the transistor constituting the dummy unit is controlled so that an electric current which flows in the dummy unit is smaller than an electric current which flows in the amplifying transistor when data "1" is read and larger than the electric current which flows in the amplifying transistor when data "0" is read.

(3) A semiconductor memory device according to claim 2, further comprising a write transistor having a source terminal connected to one end of the block unit and a drain terminal connected to the bitline.

(3-1) Another end of the block unit is connected to the plate line.

(3-2) Another end of the block unit is connected to the plate line through the select transistor.

(3-3) A ferroelectric capacitor different from the ferroelectric capacitor of the memory cell or a paraelectric capacitor is connected between one end of the block unit and the internal power supply line.

(3-4) The gate of the cell transistor is connected to the word line.

(3-5) The drain and source terminals of the cell transistor are 0V in a case of standby.

(3-6) The bitline varies between 0V and VBLH in an active state and precharged to (½)VBLH in a standby state.

(3-7) One memory cell stores one bit information.

(3-8) Two memory cells store one bit information.

(3-9) A cell signal read from the memory cell is amplified by the amplifying transistor so as to be read to the bitline, and writing of data from the bitline to the memory cell is performed through the write transistor.

(3-10) The memory cell array includes a dummy cell, the dummy cell includes a dummy unit constituted by at least one or more transistors connected in series, one end of the dummy unit is connected to the bitline, another end is connected to a grounded power supply line or an internal power supply line, the gate voltage of the transistor constituting the dummy unit is controlled so that an electric current which flows in the dummy unit is smaller than an electric current which flows in the amplifying transistor when data "1" is read and larger than the electric current which flows in the amplifying transistor when data "0" is read.

(4) A semiconductor memory device comprising:
first and second block units in which a plurality of nonvolatile memory cells in which cell transistors and ferroelectric capacitors are connected in parallel are connected in series;

a first amplifying transistor having a gate terminal connected to one end of the first block unit and a drain terminal connected to a second bitline;

a first write transistor having a source terminal connected to one end of the first block unit and a drain terminal connected to a first bitline;

a second amplifying transistor having a gate terminal connected to one end of the second block unit and a drain terminal connected to the first bitline; and a second write transistor having a source terminal connected to one end of the second block unit and a drain terminal connected to the second bitline, wherein the first and second block units, the first and second amplifying transistors and the first and second write transistors constitute a cell block, and a plurality of cell blocks are disposed to constitute a memory cell array.

(4-1) The first and second bitlines form a pair which is connected to the same sense amplifying circuit.

(4-2) Another end of each of the first and second block units is connected to the plate line.

(4-3) Another end of the first block unit is connected to the plate line through the first select transistor, and another end of the second block unit is connected to the plate line through the second select transistor.

(4-4) Another end of the first block unit is connected to the first plate line, another end of the second block unit is connected to the second plate line.

(4-5) Another end of the first block unit is connected to the first plate line through the first select transistor, and another end of the second block unit is connected to the second plate line through the second select transistor.

(4-6) A ferroelectric capacitor different from the ferroelectric capacitor of the memory cell or a paraelectric capacitor is connected between one end of the first block unit and the internal power supply line, a ferroelectric capacitor different from the ferroelectric capacitor of the memory cell or a paraelectric capacitor is connected between one end of the second block unit and the internal power supply line.

(4-7) The gate of the cell transistor is connected to the word line.

(4-8) The drain and source terminals of the cell transistor are 0V in a case of standby.

(4-9) The first and second bitlines varies between 0V and VBLH in an active state and precharged to (½)VBLH in a standby state.

(4-10) A signal read from the memory cell is amplified by the first amplifying transistor so as to be read to the second bitline and/or amplified by the second amplifying transistor so as to be read to the first bitline.

(4-11) Writing of data from the first bitline to the memory cell is performed through the first write transistor, and writing of data from the second bitline to the memory cell is performed through the second write transistor.

(4-12) One memory cell stores one bit information.

(4-13) Two memory cells store one bit information.

(4-14) The memory cell array includes a dummy cell, the dummy cell includes a dummy unit constituted by at least one or more transistors connected in series, one end of the dummy unit is connected to the first bitline or the second bitline, another end is connected to a grounded power supply line or an internal power supply line, the gate voltage of the transistor constituting the dummy unit is controlled so that an electric current which flows in the dummy unit is smaller than an electric current which flows in the amplifying transistor when data "1" is read and larger than the electric current which flows in the amplifying transistor when data "0" is read.

According to the inventions of (1) to (4), the ferroelectric capacitor and the cell transistor are connected in parallel with each other to constitute one cell. A plurality of cells are connected in series so as to constitute a block unit. Thus, a cell having a high density of $4F^2$ size can be realized, manufacture of the planar transistor is facilitated and a higher random access function is permitted. One end of the block unit is input to the gate of the amplifying transistor to connect the drain terminal to the bitline. Thus, polarization inversion reading of the memory cell enables data read to one end of the block unit to be amplified so as to be transmitted to the bitline.

Even if the density is raised and thus the area of the ferroelectric capacitor of the cell is reduced and the polarization of the ferroelectric capacitor of the memory cell is reduced, the load capacity at one end of the block unit can be reduced to correspond to the reduction. As a result of the foregoing effect, the charge read to one end of the block unit is reduced. However, a sufficiently high voltage for reading a signal can be maintained. The signal is amplified by the amplifying transistor. The drain terminal of the amplifying transistor is connected to the bitline. Thus, discharge of the potential of the bitline having the large load capacity enables a normal operation of the memory to be realized. When the write transistor is turned on after the amplifying process, rewriting of data can easily be realized.

When the conventional memory cell having the self-amplifying function is attempted to be stably and normally operated, there arises a problem in that the area of the memory cell is excessively increased. According to the present invention, a plurality of memory cells are able to share the amplifying transistor and the write transistor as the number of cells in one block unit is increased. Thus, the overhead of the cell size can be reduced. When the number of cell blocks connected to the bitline is increased considerably, a signal to be read to the bitline can be maintained basically if time permits. Therefore, an effect can be obtained in that the number of sense amplifier circuits can considerably be reduced. Thus, the increase in the chip size can be prevented such that contrivance of the design enables the chip size to be reduced to be smaller than that realized by the suggestion by the inventors of the present invention.

Although the intensity of the signal read to one end of the block unit is maintained, the charge is reduced. In the foregoing state, a software error made when reading is performed raises a problem. The foregoing problem becomes critical for the conventional memory cell having the self-amplifying function. The present invention is arranged to add a large load capacity to one end of the block unit in a state in which the design rule is relaxed and a software error is in a severe state so that the foregoing problem is overcome. Also the foregoing load capacity can be shared by a plurality of cells. Therefore, the overhead can be prevented. Thus, reduction is permitted as the design rule is reduced and the software error rate is lowered.

As described above, the present invention enables even a planar ferroelectric capacitor, which can easily be manufactured, to perform a high-density and ferroelectric memory operation.

(5) A semiconductor memory device comprising:
  first, second, third and fourth block units in which a plurality of nonvolatile memory cells in which cell transistors and ferroelectric capacitors are connected in parallel are connected in series;
  a first amplifying transistor having a gate terminal connected to a first terminal commonly connected to the first and third block units and a drain terminal connected to a second bitline;
  a first write transistor having a source terminal connected to the first terminal commonly connected to the first and third block units and a drain terminal connected to a first bitline;
  a second amplifying transistor having a gate terminal connected to a second terminal commonly connected to the second and fourth block units and a drain terminal connected to a first bitline; and
  a second write transistor having a source terminal connected to the second terminal commonly connected to the second and fourth block units and a drain terminal connected to a second bitline, wherein
  the first, second, third and fourth block units, the first and second amplifying transistors and the first and second write transistors constitute a cell block, and
  a plurality of cell blocks are disposed to constitute a memory cell array.

(5-1) The first and second bitlines form a pair which is connected to the same sense amplifying circuit.

(5-2) Another end of the first block unit is connected to the first plate line, and another end of the second block unit is connected to the second plate line.

(5-3) Another end of the first block unit is connected to the first plate line through the first select transistor, another end of the second block unit is connected to the first plate line through the second select transistor, another end of the third block unit is connected to the second plate line through the third select transistor, and another end of the fourth block unit is connected to the second plate line through the fourth select transistor.

(5-4) Another end of the first block unit is connected to the first plate line, another end of the second block unit is connected to the second plate line, another end of the third block unit is connected to the third plate line, and another end of the fourth block unit is connected to the fourth plate line.

(5-5) Another end of the first block unit is connected to the first plate line through the first select transistor, another end of the second block unit is connected to the second plate line through the second select transistor, another end of the third block unit is connected to the third plate line through the third select transistor, and another end of the fourth block unit is connected to the fourth plate line through the fourth select transistor.

(5-6) A ferroelectric capacitor different from the ferroelectric capacitor of the memory cell or a paraelectric capacitor is connected between one end of the first block unit and the internal power supply line, a ferroelectric capacitor different from the ferroelectric capacitor of the memory cell or a paraelectric capacitor is connected between one end of the second block unit and the internal power supply line.

(5-7) The gate of the cell transistor is connected to the word line.

(5-8) The drain and source terminals of the cell transistor are 0V in a case of standby.

(5-9) The first and second bitlines varies between 0V and VBLH in an active state and precharged to (½)VBLH in a standby state.

(5-10) A signal read from the memory cell is amplified by the first amplifying transistor so as to be read to the second bitline and/or amplified by the second amplifying transistor so as to be read to the first bitline.

(5-11) Writing of data from the first bitline to the memory cell is performed through the first write transistor, and writing of data from the second bitline to the memory cell is performed through the second write transistor.

(5-12) One memory cell stores one bit information.

(5-13) Two memory cells store one bit information.

(5-14) The memory cell array includes a dummy cell, the dummy cell includes a dummy unit constituted by at least one or more transistors connected in series, one end of the dummy unit is connected to the first bitline or the second bitline, another end is connected to a grounded power supply line or an internal power supply line, the gate voltage of the transistor constituting the dummy unit is controlled so that an electric current which flows in the dummy unit is smaller than an electric current which flows in the amplifying transistor when data "1" is read and larger than the electric current which flows in the amplifying transistor when data "0" is read.

(6) A semiconductor memory device comprising:
  first and second block units in which a plurality of nonvolatile memory cells in which cell transistors and ferroelectric capacitors are connected in parallel are connected in series;
  an amplifying transistor having a gate terminal connected to a terminal connected a common node of the first and second block units and a drain terminal connected to a bitline; and
  a write transistor having a source terminal connected to the terminal connected the common node of the first and second block units and a drain terminal connected to the bitline, wherein
  the first and second block units, the amplifying transistor and the write transistor constitute a cell block, and
  a plurality of cell blocks are disposed to constitute a memory cell array.

(6-1) Another end of the first block unit is connected to the first plate line, and another end of the second block unit is connected to the second plate line.

(6-2) Another end of the first block unit is connected to the first plate line through the first select transistor, and another end of the second block unit is connected to the second plate line through the second select transistor.

(6-3) A ferroelectric capacitor different from the ferroelectric capacitor of the memory cell or a paraelectric capacitor is connected between one end of the first block unit and the internal power supply line.

(6-4) The gate of the cell transistor is connected to the word line.

(6-5) The drain and source terminals of the cell transistor are 0V in a case of standby.

(6-6) The bitline varies between 0V and VBLH in an active state and precharged to (½)VBLH in a standby state.

(6-6) The first and second bitlines varies between 0V and VBLH in an active state and precharged to (½)VBLH in a standby state.

(6-7) A cell signal read from the memory cell is amplified by the amplifying transistor so as to be read to the bitline, and writing of data from the bitline to the memory cell is performed through the write transistor.

(6-8) A signal read from the memory cell is amplified by the first amplifying transistor so as to be read to the second bitline and/or amplified by the second amplifying transistor so as to be read to the first bitline.

(6-9) Writing of data from the first bitline to the memory cell is performed through the first write transistor, and writing of data from the second bitline to the memory cell is performed through the second write transistor.

(6-10) One memory cell stores one bit information.

(6-11) Two memory cells store one bit information.

(6-12) The memory cell array includes a dummy cell, the dummy cell includes a dummy unit constituted by at least one or more transistors connected in series, one end of the dummy unit is connected to the bitline, another end is connected to a grounded power supply line or an internal power supply line, the gate voltage of the transistor constituting the dummy unit is controlled so that an electric current which flows in the dummy unit is smaller than an electric current which flows in the amplifying transistor when data "1" is read and larger than the electric current which flows in the amplifying transistor when data "0" is read.

According to the inventions of (5) and (6), an effect can be obtained in addition to the effects obtained from (1) to (4). The effect is an effect that the overhead for each cell can be reduced since the two block units share the amplifying transistor and the write transistor. Inventions of (1) to (4) have a problem in that the load capacity at one end of the block unit excessively varies depending on the position of the selected memory cell in the selected block unit. To perform a stable operation, an excessive load capacity must be added. The present invention is arranged such that the internal capacity of another block unit is made to be the load capacity when either block unit is selected. Therefore, a more stable operation can be performed as compared with that realized by the structures in (1) to (4). Moreover, the necessity of adding the excess load capacity can be eliminated. As a result, the stable operation and prevention of the overhead of the cell size can be realized.

Although the intensity of the signal read to one end of the block unit is maintained, the charge can be reduced. To overcome the problem of increase in the software error, the number of series-connected cells in the block unit is increased in a state in which the design rule is relaxed and the software error is in a severe state. As a result, the load capacitor can automatically be maintained. The polarization of the cell is reduced with the square as the design rule is reduced and the reading charge is reduced. As the software error rate is lowered, the number of series connections is reduced to maintain the signal which is read to the end of the block unit. Thus, when the number of series-connected cells is selected while the lower limit of the software error is being considered, the problem of the software error can be overcome.

As described above, the present invention enables even a planar ferroelectric capacitor, which can easily be manufactured, to realize a high-density ferroelectric memory operation.

(7) A semiconductor memory device comprising:

a nonvolatile memory cell in which cell transistors each having a gate terminal to which a word line is connected and ferroelectric capacitors are connected in parallel;

a plurality of cell blocks in which a block unit having the plurality of the memory cells connected in series and at least one select transistor are connected in series:

a cell segment incorporating the plural cell blocks, a sub-bitline connected to one end of each of the cell blocks and an amplifying circuit having an input end connected to the sub-bitline and an output terminal connected to a bitline; and a memory cell array in which the plural bitlines and the plural cell segments connected to the plural bitline are disposed along a direction of the word line.

(8) A semiconductor memory device comprising:

a nonvolatile memory cell in which cell transistors each having a gate terminal to which a word line is connected and ferroelectric capacitors are connected in parallel;

a plurality of first cell blocks and a plurality of second cell blocks in which a block unit having the plurality of the memory cells connected in series and at least one select transistor are connected in series:

a cell segment incorporating the first and second cell blocks, a first sub-bitline connected to one end of each of the first cell blocks, a second sub-bitline connected to one end of each of the second cell blocks, a first amplifying transistor having a gate terminal connected to the first sub-bitline and a drain terminal connected to a second bitline, a first write transistor having a source terminal connected to the first sub-bitline and a drain terminal connected to the first bitline which forms a pair with the second bitline, a second amplifying transistor having a gate terminal connected to the second sub-bitline and a drain terminal connected to the first bitline and a second write transistor having a source terminal connected to the second sub-bitline and a drain terminal connected to the second bitline; and a memory cell array in which a plurality pair of first and second bitlines and the plural cell segments connected to the plural bitline pairs are disposed along a direction of the word line.

(8-1) The cell segment includes a first recharge transistor in which the drain terminal is connected to the first sub-bitline and the source terminal is connected to the ground line or the internal power supply line and a second recharge transistor in which the drain terminal is connected to the second sub-bitline and the source terminal is connected to the ground line or the internal power supply line.

(8-2) In a cell array, the first bitline and the second bitline are connected to the same sense amplifier, and a plurality of sense amplifiers are disposed along the direction of the word line.

(8-3) Another end of the cell block is connected to the plate electrode.

(8-4) A signal in the memory cell read to the first sub-bitline is amplified by the first amplifying transistor so as to be read to the second bitline, a signal in the memory cell read to the second sub-bitline is amplified by the second amplifying transistor so as to be read to the first bitline.

(8-5) Writing of data from the first bitline to the memory cell is performed through the first write transistor, and writing of data from the second bitline to the memory cell is performed through the second write transistor.

(8-6) The first and second bitlines varies between 0V and VBLH in an active state and precharged to (½)VBLH in a standby state.

(8-7) Either of the first sub-bitline or the second sub-bitline in the selected cell segment or both varies from 0V to VBLH in an active state and precharged to 0V in a standby state.

(8-8) One memory cell stores one bit information.

(8-9) Two memory cells store one bit information.

(8-10) The drain terminal of the first amplifying transistor is connected to the second bitline through the first read transistor, and the drain terminal of the second amplifying transistor is connected to the first bitline through the second read transistor.

(8-11) The memory cell array includes a dummy cell, the dummy cell includes a dummy unit constituted by at least one or more transistors connected in series, one end of the dummy unit is connected to the first bitline or the second bitline, another end is connected to a grounded power supply line or an internal power supply line, the gate voltage of the transistor constituting the dummy unit is controlled so that an electric current which flows in the dummy unit is smaller than an electric current which flows in the amplifying transistor when data "1" is read and larger than the electric current which flows in the amplifying transistor when data "0" is read.

(9) A semiconductor memory device comprising:

a nonvolatile memory cell in which cell transistors each having a gate terminal to which a word line is connected and ferroelectric capacitors are connected in parallel;

a plurality of first cell blocks and a plurality of second cell blocks in which a block unit having the plurality of the memory cells connected in series and at least one select transistor are connected in series:

a cell segment incorporating the first and second cell blocks, a first sub-bitline connected to one end of each of the first cell blocks, a second sub-bitline connected to one end of each of the second cell blocks, a first amplifying transistor having a gate terminal connected to the first sub-bitline and a drain terminal connected to a first bitline, a first write transistor having a source terminal connected to the first sub-bitline and a drain terminal connected to the first bitline, a second amplifying transistor having a gate terminal connected the second sub-bitline and a drain terminal connected to the second bitline which forms a pair with the first bitline and a second write transistor having a source terminal connected to the second sub-bitline and a drain terminal connected to the second bitline; and a memory cell array in which a plurality pair of first and second bitlines and the plurality of the cell segments connected to the plural bitline pairs are disposed along a direction of the word line.

(9-1) The cell segment includes a first recharge transistor in which the drain terminal is connected to the first sub-bitline and the source terminal is connected to the ground line or the internal power supply line and a second recharge transistor in which the drain terminal is connected to the second sub-bitline and the source terminal is connected to the ground line or the internal power supply line.

(9-2) In a cell array, the first bitline and the second bitline are connected to the same sense amplifier, and a plurality of sense amplifiers are disposed along the direction of the word line.

(9-3) Another end of the cell block is connected to the plate electrode.

(9-4) A signal in the memory cell read to the first sub-bitline is amplified by the first amplifying transistor so as to be read to the first bitline, a signal in the memory cell read to the second sub-bitline is amplified by the second amplifying transistor so as to be read to the second bitline.

(9-5) Writing of data from the first bitline to the memory cell is performed through the first write transistor, and writing of data from the second bitline to the memory cell is performed through the second write transistor.

(9-6) The first and second bitlines varies between 0V and VBLH in an active state and precharged to (½)VBLH in a standby state.

(9-7) Either of the first sub-bitline or the second sub-bitline in the selected cell segment or both varies from 0V to VBLH in an active state and precharged to 0V in a standby state.

(9-8) One memory cell stores one bit information.

(9-9) Two memory cells store one bit information.

(9-10) The drain terminal of the first amplifying transistor is connected to the first bitline through the first read transistor, and the drain terminal of the second amplifying transistor is connected to the second bitline through the second read transistor.

(9-11) The memory cell array includes a dummy cell, the dummy cell includes a dummy unit constituted by at least one or more transistors connected in series, one end of the dummy unit is connected to the first bitline or the second bitline, another end is connected to a grounded power supply line or an internal power supply line, the gate voltage of the transistor constituting the dummy unit is controlled so that an electric current which flows in the dummy unit is smaller than an electric current which flows in the amplifying transistor when data "1" is read and larger than the electric current which flows in the amplifying transistor when data "0" is read.

The inventions of (7) to (9) is arranged such that one cell is constituted by connecting the ferroelectric capacitor and the cell transistor in parallel with each other. A plurality of cells are connected in series. Moreover, the cells are connected to the sub-bitline through select transistor to constitute a cell block. Thus, a cell having a high density of $4F^2$ is realized, the manufacture of the planar transistor can be facilitated and a higher-sped random access function can be realized. A cell segment is constituted by a device including the sub-bitline, the plural cell blocks connected to the sub-bitline and the amplifying transistor having the sub-bitline input to the gate and the drain terminal connected to the bitline. Thus, polarization inversion reading of the memory cell enables data read to the sub-bitline to be amplified so as to be transmitted to the bitline.

Even if raising of the density causes the area of the ferroelectric capacitor of the cell to be reduced and the polarization of the ferroelectric capacitor of the memory cell to be reduced, decrease in the number of cell blocks in one cell segment enables sufficiently high reading-signal voltage to be maintained in spite of reduction in the charge which is read to the sub-bitline. The signal voltage is amplified by the amplifying transistor, and the drain terminal of the transistor is connected to the bitline. When the potential of the bitline having a large load capacity is discharged, a normal memory operation can be realized. After the amplifying operation, the write transistor is turned on to facilitate rewriting of data from the bitline to the sub-bitline and to the memory cell.

When the conventional memory cell having the self-amplifying function is attempted to be stably and normally operated, there arises a problem in that the area of the cell is excessively increased. According to the present invention, a plurality of memory cells are able to share the amplifying transistor and the write transistor as the number of cell blocks in one cell segment is increased. Thus, the overhead of the cell size can be reduced. Even if the number of cell blocks connected to the bitline is increased considerably, a signal to be read to the bitline can be maintained basically if time permits. Therefore, an effect can be obtained in that the number of sense amplifier circuits can considerably be reduced. Thus, increase in the chip size can be prevented.

To overcome the problem of increase in the software error, the number of cell blocks in the cell segment is increased in a state in which the design rule is relaxed and the software error is in a severe state. As a result, the load capacity can automatically be maintained. The polarization of the cell is reduced with the square as the design rule is reduced and the reading charge is reduced. As the software error rate is lowered, the number of cell blocks is reduced to maintain the signal to be read to the sub-bitline. Thus, when the number of cells in the cell segment is selected while the lower limit of the software error is being considered, the problem of the software error can be overcome.

As described above, the present invention enables even a planar ferroelectric capacitor, which can easily be manufactured, to realize a high-density ferroelectric memory operation.

(10) A semiconductor memory device comprising:
a nonvolatile memory cell incorporating a cell transistor having a gate terminal connected to a word line and a drain terminal connected to a sub-bitline and a ferroelectric capacitor having one end connected to the source terminal of the cell transistor and another end connected to a plate line;
a cell segment incorporating the sub-bitline, the plural memory cells connected to the sub-bitline and an amplifying circuit having an input end connected to the sub-bitline and an output terminal connected to the bitline; and
a memory cell array in which a plurality of bitline and a plurality of cell segments connected to the bitlines are disposed along a direction of the word line.

(11) A semiconductor memory device comprising:
a nonvolatile memory cell incorporating a cell transistor having a gate terminal connected to a word line and a drain terminal connected to a sub-bitline and a ferroelectric capacitor having one end connected to the source terminal of the cell transistor and another end connected to a plate line;
a cell segment incorporating a first and second sub-bitlines; a plurality of memory cells connected to the first sub-bitlines; a plurality of memory cells connected to the second sub-bitline; a first amplifying transistor having a gate terminal connected to the first sub-bitline and a drain terminal connected to the second bitline; a first write transistor having a source terminal connected to the first sub-bitline and a drain terminal connected to the first bitline which forms a pair with the second bitline; a second amplifying transistor having gate terminal connected to the second sub-bitline and a drain terminal connected to the first bitline; and a second write transistor having a source terminal connected to the second sub-bitline and a drain terminal connected to the second bitline; and
a memory cell array in which a plurality pair of first and second bitlines and a plurality of cell segments connected to the bitline pairs are disposed along a direction of the word line.

(11-1) The cell segment includes a first read transistor in which the drain terminal is connected to the first sub-bitline and the source terminal is connected to the ground line or the internal power supply line and a second read transistor in which the drain terminal is connected to the second sub-bitline and the source terminal is connected to the ground line or the internal power supply line.

(11-2) In a cell array, the first bitline and the second bitline are connected to the same sense amplifier, and a plurality of sense amplifiers are disposed along the direction of the word line.

(11-3) A signal in the memory cell read to the first sub-bitline is amplified by the first amplifying transistor so as to be read to the second bitline, a signal in the memory cell read to the second sub-bitline is amplified by the second amplifying transistor so as to be read to the first bitline.

(11-4) Writing of data from the first bitline to the memory cell is performed through the first write transistor, and writing of data from the second bitline to the memory cell is performed through the second write transistor.

(11-5) The first and second bitlines varies between 0V and VBLH in an active state and precharged to (½)VBLH in a standby state.

(11-6) Either of the first sub-bitline or the second sub-bitline in the selected cell segment or both varies from 0V to VBLH in an active state and precharged to 0V in a standby state.

(11-7) One memory cell stores one bit information.

(11-8) Two memory cells store one bit information.

(11-9) The drain terminal of the first amplifying transistor is connected to the second bitline through the first read transistor, and the drain terminal of the second amplifying transistor is connected to the first bitline through the second read transistor.

(11-10) The memory cell array includes a dummy cell, the dummy cell includes a dummy unit constituted by at least one or more transistors connected in series, one end of the dummy unit is connected to the first bitline or the second bitline, another end is connected to a grounded power supply line or an internal power supply line, the gate voltage of the transistor constituting the dummy unit is controlled so that an electric current which flows in the dummy unit is smaller than an electric current which flows in the amplifying transistor when data "1" is read and larger than the electric current which flows in the amplifying transistor when data "0" is read.

(12) A semiconductor memory device comprising:
a nonvolatile memory cell incorporating a cell transistor having a gate terminal connected to a word line and a drain terminal connected to a sub-bitline and a ferroelectric capacitor having one end connected to the source terminal of the cell transistor and another end connected to a plate line;
a cell segment incorporating first and second sub-bitlines; a plurality of memory cells connected to the first sub-bitlines; a plurality of memory cells connected to the second sub-bitline; a first amplifying transistor having a gate terminal connected to the first sub-bitline and a drain terminal connected to the first bitline; a first write transistor having a source terminal connected to the first sub-bitline and a drain terminal connected to the first bitline; a second amplifying transistor having a gate terminal connected to the second sub-bitline and a drain terminal connected to the second bitline forming a pair with the first bitline; and a second write transistor having a source terminal connected to the second sub-bitline and a drain terminal connected to the second bitline; and
a memory cell array in which a plurality pair of first and second bitlines and a plurality of cell segments connected to the bitline pairs are disposed along a direction of the word line.

(12-1) The cell segment includes a first read transistor in which the drain terminal is connected to the first sub-bitline and the source terminal is connected to the ground line or the internal power supply line and a second read transistor in which the drain terminal is connected to the second sub-bitline and the source terminal is connected to the ground line or the internal power supply line.

(12-2) In a cell array, the first bitline and the second bitline are connected to the same sense amplifier, and a plurality of sense amplifiers are disposed along the direction of the word line.

(12-3) A signal in the memory cell read to the first sub-bitline is amplified by the first amplifying transistor so as to be read to the first bitline, a signal in the memory cell read to the second sub-bitline is amplified by the second amplifying transistor so as to be read to the second bitline.

(12-4) Writing of data from the first bitline to the memory cell is performed through the first write transistor, and writing of data from the second bitline to the memory cell is performed through the second write transistor.

(12-5) The first and second bitlines varies between 0V and VBLH in an active state and precharged to (½)VBLH in a standby state.

(12-6) Either of the first sub-bitline or the second sub-bitline in the selected cell segment or both varies from 0V to VBLH in an active state and precharged to 0V in a standby state.

(12-7) One memory cell stores one bit information.

(12-8) Two memory cells store one bit information.

(12-9) The drain terminal of the first amplifying transistor is connected to the first bitline through the first read transistor, and the drain terminal of the second amplifying transistor is connected to the second bitline through the second read transistor.

(12-10) The memory cell array includes a dummy cell, the dummy cell includes a dummy unit constituted by at least one or more transistors connected in series, one end of the dummy unit is connected to the first bitline or the second bitline, another end is connected to a grounded power supply line or an internal power supply line, the gate voltage of the transistor constituting the dummy unit is controlled so that an electric current which flows in the dummy unit is smaller than an electric current which flows in the amplifying transistor when data "1" is read and larger than the electric current which flows in the amplifying transistor when data "0" is read.

According to the inventions of (10) to (12), similarly to the conventional ferroelectric memory, one cell is constituted by connecting the ferroelectric capacitor and the cell transistor in series. The cell segment is constituted by a device including the sub-bitline, the plural memory cells connected to the sub-bitline and the amplifying transistor having the sub-bitline input to the gate and the drain terminal connected to the bitline. Thus, polarization inversion reading of the memory cell enables data read to the sub-bitline to be amplified so as to be transmitted to the bitline.

Even if raising of the density causes the area of the ferroelectric capacitor of the cell to be reduced and the polarization of the ferroelectric capacitor of the memory cell to be reduced, decrease in the number of cells in one cell segment enables sufficiently high reading signal voltage to be maintained in spite of reduction in the charge which is read to the sub-bitline. The signal is amplified by the amplifying transistor, and the drain terminal of the transistor is connected to the bitline. When the potential of the bitline having a large load capacity is discharged, a normal memory operation can be realized. After the amplifying operation, the write transistor is turned on to facilitate rewriting of data from the bitline to the sub-bitline and to the memory cell.

When the conventional memory cell having the self-amplifying function is attempted to be stably and normally operated, there arises a problem in that the area of the cell is excessively increased. According to the present invention, a plurality of memory cells are able to share the amplifying transistor and the write transistor as the number of cells in one cell segment is increased. Thus, the overhead of the cell size can be reduced. Even if the number of cell blocks connected to the bitline is increased considerably, a signal to be read to the bitline can be maintained basically if time permits. Therefore, an effect can be obtained in that the number of sense amplifier circuits can considerably be reduced. Thus, increase in the chip size can be prevented.

To overcome the problem of increase in the software error, the number of cells in the cell segment is increased in a state in which the design rule is relaxed and the software error is in a severe state. As a result, the load capacity can automatically be maintained. The polarization of the cell is reduced with the square as the design rule is reduced and the reading charge is reduced. As the software error rate is lowered, the number of cells is reduced to maintain the signal to be read to the sub-bitline. Thus, when the number of cells in the cell segment is selected while the lower limit of the software error is being considered, the problem of the software can be overcome.

As described above, the present invention enables even a planar ferroelectric capacitor, which can easily be manufactured, to realize a high-density ferroelectric memory operation.

(13) A semiconductor memory device comprising:

a volatile memory cell incorporating a cell transistor having a gate terminal connected to a word line and a drain terminal connected to a sub-bitline and a paraelectric capacitor having one end connected to the source terminal of the cell transistor and another end connected to a plate line;

a cell segment incorporating the sub-bitline, a plurality of memory cells connected to the sub-bitline and an amplifying circuit having an input end connected to the sub-bitline and an output terminal connected to the bitline; and a memory cell array in which a plurality of bitline and a plurality of cell segments connected to the bitlines are disposed along a direction of the word line.

(14) A semiconductor memory device comprising:

a volatile memory cell incorporating a cell transistor having a gate terminal connected to a word line and a drain terminal connected to a sub-bitline and a paraelectric capacitor having one end connected to the source terminal of the cell transistor and another end connected to a plate line;

a cell segment incorporating first and second sub-bitlines; a plurality of memory cells connected to the first sub-bitlines; a plurality of memory cells connected to the second sub-bitlines; a first amplifying transistor having a gate terminal connected to the first sub-bitline and a drain terminal connected to the second bitline; a first write transistor having a source terminal connected to the first sub-bitline and a drain terminal connected to the first bitline forming a pair with the second bitline; a second amplifying transistor having a gate terminal connected to the second sub-bitline and a drain terminal connected to the first bitline and a second write transistor having a source terminal connected to the second sub-bitline and a drain terminal connected to the second bitline; and a memory cell array in which a plurality pair of first and second bitlines and a plurality of cell segments connected to the paired bitline are disposed along a direction of the word line.

(14-1) The cell segment includes a first read transistor in which the drain terminal is connected to the first sub-bitline and the source terminal is connected to the ground line or the internal power supply line and a second read transistor in which the drain terminal is connected to the second subbitline and the source terminal is connected to the ground line or the internal power supply line.

(14-2) In a cell array, the first bitline and the second bitline are connected to the same sense amplifier, and a plurality of sense amplifiers are disposed along the direction of the word line.

(14-3) A signal in the memory cell read to the first sub-bitline is amplified by the first amplifying transistor so as to be read to the second bitline, a signal in the memory cell read to the second sub-bitline is amplified by the second amplifying transistor so as to be read to the first bitline.

(14-4) Writing of data from the first bitline to the memory cell is performed through the first write transistor, and writing of data from the second bitline to the memory cell is performed through the second write transistor.

(14-5) The first and second bitlines varies between 0V and VBLH in an active state and precharged to (½)VBLH in a standby state.

(14-6) Either of the first sub-bitline or the second sub-bitline in the selected cell segment or both varies from 0V to VBLH in an active state and precharged to 0V in a standby state.

(14-7) One memory cell stores one bit information.

(14-8) Two memory cells store one bit information.

(14-9) The drain terminal of the first amplifying transistor is connected to the second bitline through the first read transistor, and the drain terminal of the second amplifying transistor is connected to the first bitline through the second read transistor.

(14-10) The memory cell array includes a dummy cell, the dummy cell includes a dummy unit constituted by at least one or more transistors connected in series, one end of the dummy unit is connected to the first bitline or the second bitline, another end is connected to a grounded power supply line or an internal power supply line, the gate voltage of the transistor constituting the dummy unit is controlled so that an electric current which flows in the dummy unit is smaller than an electric current which flows in the amplifying transistor when data "1" is read and larger than the electric current which flows in the amplifying transistor when data "0" is read.

(15) A semiconductor memory device comprising:
a volatile memory cell incorporating a cell transistor having a gate terminal connected to a word line and a drain terminal connected to a sub-bitline and a paraelectric capacitor having one end connected to the source terminal of the cell transistor and another end connected to a plate line;
a cell segment incorporating first and second sub-bitlines; a plurality of memory cells connected to the first sub-bitline; a plurality of memory cells connected to the second sub-bitlines; a first amplifying transistor having a gate terminal connected to the first sub-bitline and a drain terminal connected to the first bitline; a first write transistor having a source terminal connected to the first sub-bitline and a drain terminal connected to the first bitline; a second amplifying transistor having a gate terminal connected to the second sub-bitline and a drain terminal connected to the second bitline forming a pair with the first bitline; and a second write transistor having a source terminal connected to the second sub-bitline and a drain terminal connected to the second bitline; and
a memory cell array in which a plurality pair of first and second bitlines and a plurality of cell segments connected to the bitline pairs are disposed along a direction of the word line.

(15-1) The cell segment includes a first read transistor in which the drain terminal is connected to the first sub-bitline and the source terminal is connected to the ground line or the internal power supply line and a second read transistor in which the drain terminal is connected to the second sub-bitline and the source terminal is connected to the ground line or the internal power supply line.

(15-2) In a cell array, the first bitline and the second bitline are connected to the same sense amplifier, and a plurality of sense amplifiers are disposed along the direction of the word line.

(15-3) A signal in the memory cell read to the first sub-bitline is amplified by the first amplifying transistor so as to be read to the first bitline, and a signal in the memory cell read to the second sub-bitline is amplified by the second amplifying transistor so as to be read to the second bitline.

(15-4) Writing of data from the first bitline to the memory cell is performed through the first write transistor, and writing of data from the second bitline to the memory cell is performed through the second write transistor.

(15-5) The first and second bitlines varies between 0V and VBLH in an active state and precharged to (½)VBLH in a standby state.

(15-6) Either of the first sub-bitline or the second sub-bitline in the selected cell segment or both varies from 0V to VBLH in an active state and precharged to 0V in a standby state.

(15-7) One memory cell stores one bit information.

(15-8) Two memory cells store one bit information.

(15-9) The drain terminal of the first amplifying transistor is connected to the first bitline through the first read transistor, and the drain terminal of the second amplifying transistor is connected to the second bitline through the second read transistor.

(15-10) The memory cell array includes a dummy cell, the dummy cell includes a dummy unit constituted by at least one or more transistors connected in series, one end of the dummy unit is connected to the first bitline or the second bitline, another end is connected to a grounded power supply line or an internal power supply line, the gate voltage of the transistor constituting the dummy unit is controlled so that an electric current which flows in the dummy unit is smaller than an electric current which flows in the amplifying transistor when data "1" is read and larger than the electric current which flows in the amplifying transistor when data "0" is read.

According to the inventions of (13) to (15), similarly to the conventional DRAM, one cell is constituted by connecting the paraelectric capacitor and the cell transistor in series. The cell segment is constituted by a device including the sub-bitline, the plural memory cells connected to the sub-bitline and the amplifying transistor having the sub-bitline input to the gate and the drain terminal connected to the bitline. Thus, data read from the memory cell to the sub-bitline can be amplified so as to be transmitted to the bitline.

Even if raising of the density causes the area of the capacitor of the cell to be reduced and the amount of capacity stored in the memory cell to be reduced, decrease in the number of cells in one cell segment enables sufficiently high reading signal voltage to be maintained in spite of reduction in the charge to be read to the sub-bitline. The signal is amplified by the amplifying transistor, and the drain terminal of the transistor is connected to the bitline. When the potential of the bitline having a large load capacity is discharged, a normal memory operation can be realized. After the amplifying operation, the write transistor is turned on to facilitate rewriting of data from the bitline to the sub-bitline and to the memory cell.

When the conventional memory cell having the self-amplifying function is attempted to be stably and normally operated, there arises a problem in that the area of the memory cell is excessively increased. According to the present invention, a plurality of memory cells are able to share the amplifying transistor and the write transistor as the number of cells in one cell segment is increased. Thus, the overhead of the cell size can be reduced. When the number of cell blocks connected to the bitline is increased considerably, a signal to be read to the bitline can be maintained basically if time permits. Therefore, an effect can be obtained in that the number of sense amplifier circuits can considerably be reduced. Thus, increase in the chip size can be prevented.

To overcome the problem of increase in the software error, the number of cells in the cell segment is increased in a state in which the design rule is relaxed and the software error is in a severe state. As a result, the load capacity can automatically be maintained. The polarization of the cell is reduced with the square as the design rule is reduced and the reading charge is reduced. As the software error rate is lowered, the number of cells is reduced to maintain the signal to be read to the sub-bitline. Thus, when the number of cells in the cell segment is selected while the lower limit of the software error is being considered, the problem of the software error can be overcome.

The pn-junction area is reduced to correspond to the reduction in the area of the cell owning to the reduction in the capacity of the cell. Therefore, while the data retention is being maintained, the tREFmax (data retention time) cannot be increased two times for each generation as the conventional DRAM. However, the foregoing problem can be overcome by realizing a structure for lowering the defect density and a structure, such as SOI, for improving the data retention.

As described above, according to the present invention, the nonvolatile ferroelectric memory is able to maintain sufficiently high reading signal voltage and perform a stable memory operation while increase in the cell size and the chip size is prevented and a software error is prevented even if raising of the density causes the area of the ferroelectric capacitor of the cell to be reduced and the polarization of the ferroelectric capacitor of the memory cell to be reduced.

Another object is to realize a semiconductor memory device having the foregoing effects while (1) raising of the density, (2) facilitation of manufacture and (3) a high-speed random access function are maintained. As described above, according to the present invention, even a planar capacitor, which can easily be manufactured, is able to realize 16 Gb to 64 Gb FRAM. A solid capacitor is able to realize 256 Gb FRAM or higher-density FRAM.

Furthermore, in the dynamic semiconductor memory, even if raising of the density causes the polarization of the ferroelectric capacitor of the memory cell to be reduced, sufficiently high reading signal voltage can be maintained and stable memory operation can be performed while increase in the cell size and the chip size is prevented and while a software error is prevented in spite of a fact that the data retention cannot be improved.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 5A and 5B are a circuit diagram and a sectional view showing the structure of a ferroelectric memory previously suggested by the inventors of the present invention;

FIGS. 6A and 6B are diagrams showing an example of the operation of the ferroelectric memory previously suggested by the inventors of the present invention;

FIG. 10 is a signal waveform showing an example of a specific operation of the ferroelectric memory shown in FIG. 9;

FIG. 11 is a signal waveform showing another example of a specific operation in FIG. 9;

FIGS. 16A and 16B are circuit diagrams showing the structures of a sense amplifier and blocks of a cell array according to a fourth embodiment;

FIG. 21 is a signal waveform showing an example of the operation of the dummy cell shown in FIG. 19B;

FIG. 22 is a signal waveform showing an example of the operation of the dummy cell shown in FIG. 19C;

FIG. 45 is a diagram showing a layer layout of a portion of the layout shown in FIG. 44;

FIG. 46 is a diagram showing a layer layout of a portion of the layout shown in FIG. 44;

FIGS. 47A to 47C are sectional views showing the block structure of a ferroelectric memory according to a fourteenth embodiment;

FIGS. 48A to 48C are sectional views showing the block structure of the ferroelectric memory according to the fourteenth embodiment;

FIGS. 49A to 49C are sectional views showing the block structure of the ferroelectric memory according to the fourteenth embodiment;

FIGS. 50A to 50C are sectional views showing the block structure of the ferroelectric memory according to the fourteenth embodiment;

FIG. 52 is a signal waveform showing an example of a specific operation of FIG. 51;

FIG. 53 is a signal waveform showing an example of a specific operation of FIG. 51;

FIG. 55 is a signal waveform showing an example of a specific operation of FIG. 54;

FIG. 56 is a signal waveform showing an example of a specific operation of FIG. 54;

FIG. 62 is a signal waveform showing an example of a specific operation of FIG. 61;

FIG. 63 is a signal waveform showing an example of a specific operation of FIG. 61;

FIGS. 70A to 70C are plan views showing the layout of the block structure of a ferroelectric memory according to a twenty-second embodiment;

FIGS. 71A to 71C are diagrams showing the layout of a portion of layers of the layouts shown in FIGS. 70A to 70C;

FIG. 78 is a signal waveform showing an example of the specific operation of FIG. 75;

FIG. 79 is a signal waveform showing an example of the specific operation of FIG. 75;

FIGS. 91A to 91C are plan views showing a layout of a gain cell block structure of a ferroelectric memory according to a thirty-first embodiment;

FIGS. 96A to 96C are sectional views showing the gain cell block structure of a ferroelectric memory according to a thirty-second embodiment;

FIG. 119 is a circuit diagram showing the gain cell block structure of a DRAM according to a forty-fifth embodiment;

FIG. 120 is a signal waveform showing an example of the specific operation of FIG. 119;

FIG. 121 is a signal waveform showing an example of the specific operation of FIG. 119;

FIG. 122 is a circuit diagram showing the gain cell block structure of a DRAM according to a forty-sixth embodiment;

FIG. 123 is a circuit diagram showing the gain cell block structure of a DRAM according to a forty-seventh embodiment;

FIG. 124 is a signal waveform showing an example of the specific operation of FIG. 123;

FIG. 125 is a circuit diagram showing the gain cell block structure of a DRAM according to a forty-eighth embodiment;

FIG. 126 is a circuit diagram showing the gain cell block structure of a DRAM according to a forty-eighth embodiment;

FIG. 127 is a circuit diagram showing the gain cell block structure of a DRAM according to a forty-ninth embodiment;

FIG. 128 is a plan view showing the layout of the memory cell structure of a ferroelectric memory according to a fiftieth embodiment;

FIG. 129 is a diagram showing a portion of layout layers shown in FIG. 128 which is a plan view;

FIG. 130 is a diagram showing a portion of layout layers shown in FIG. 128 which is a plan view;

Figure 131:
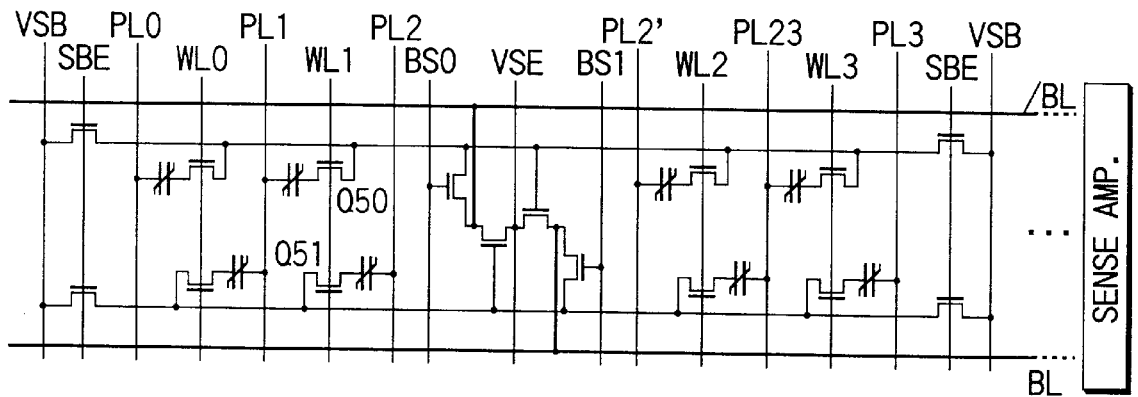
Figure 132:
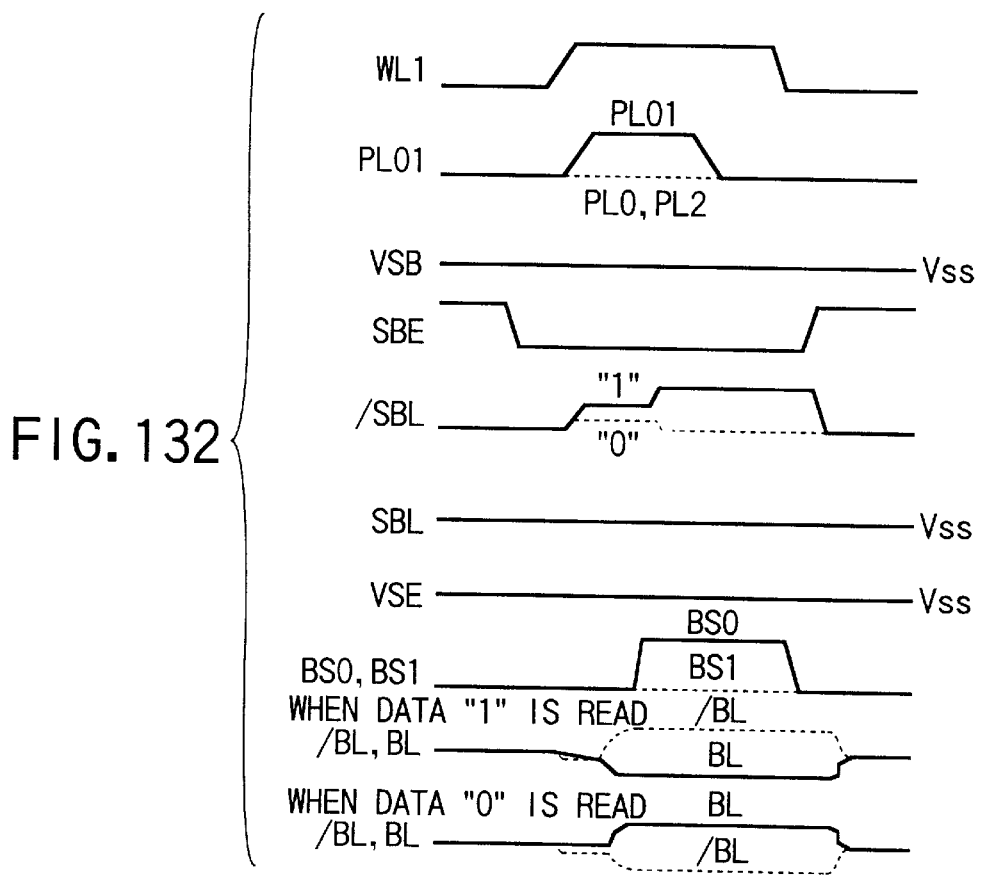
Figure 133:
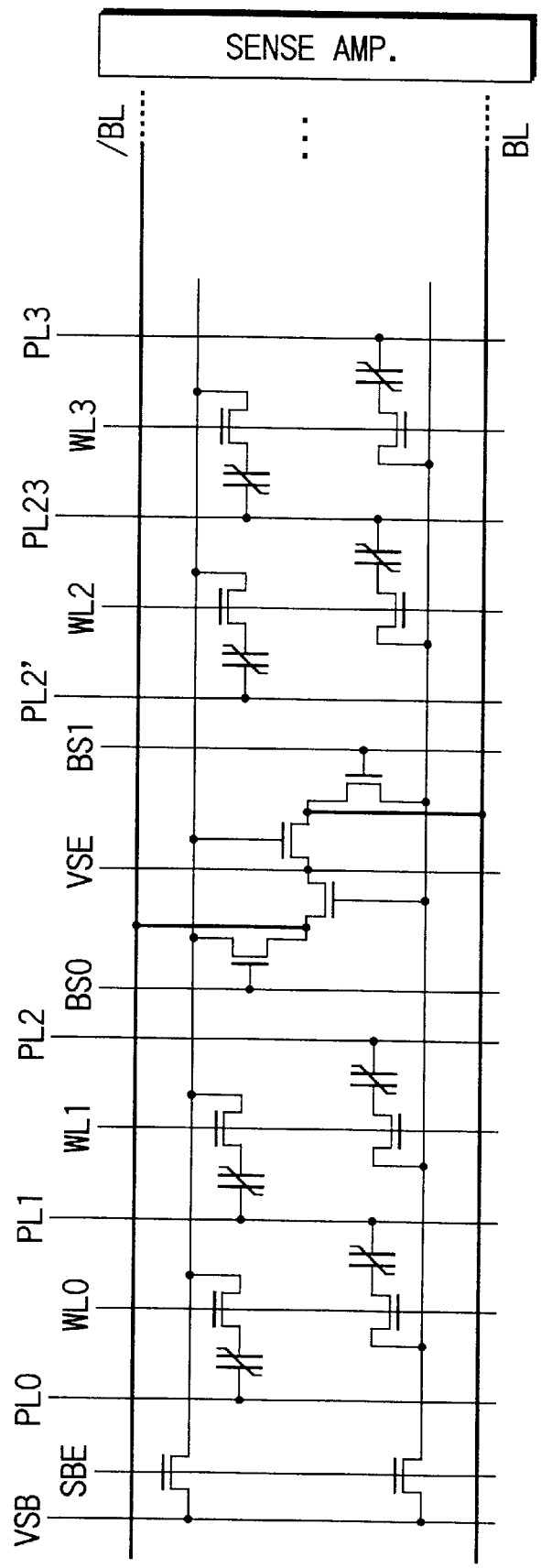
Figure 134:
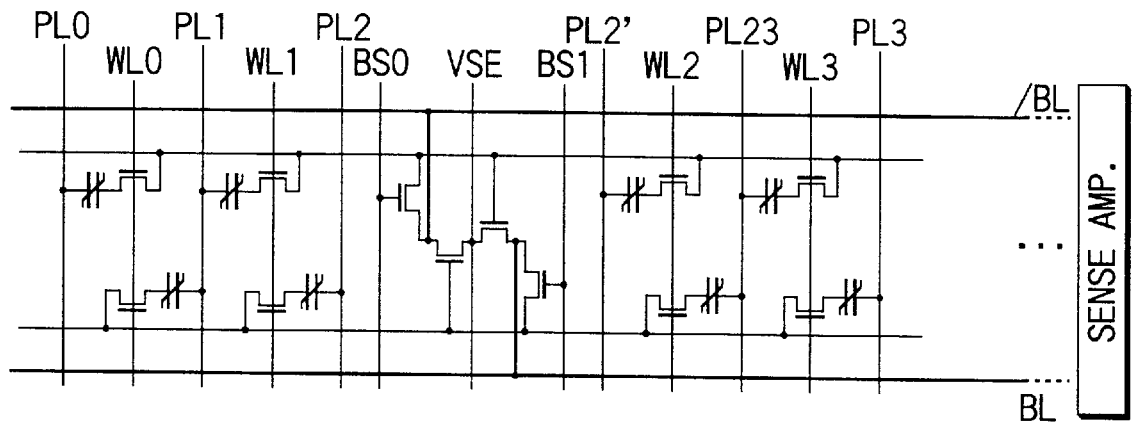
Figure 135:
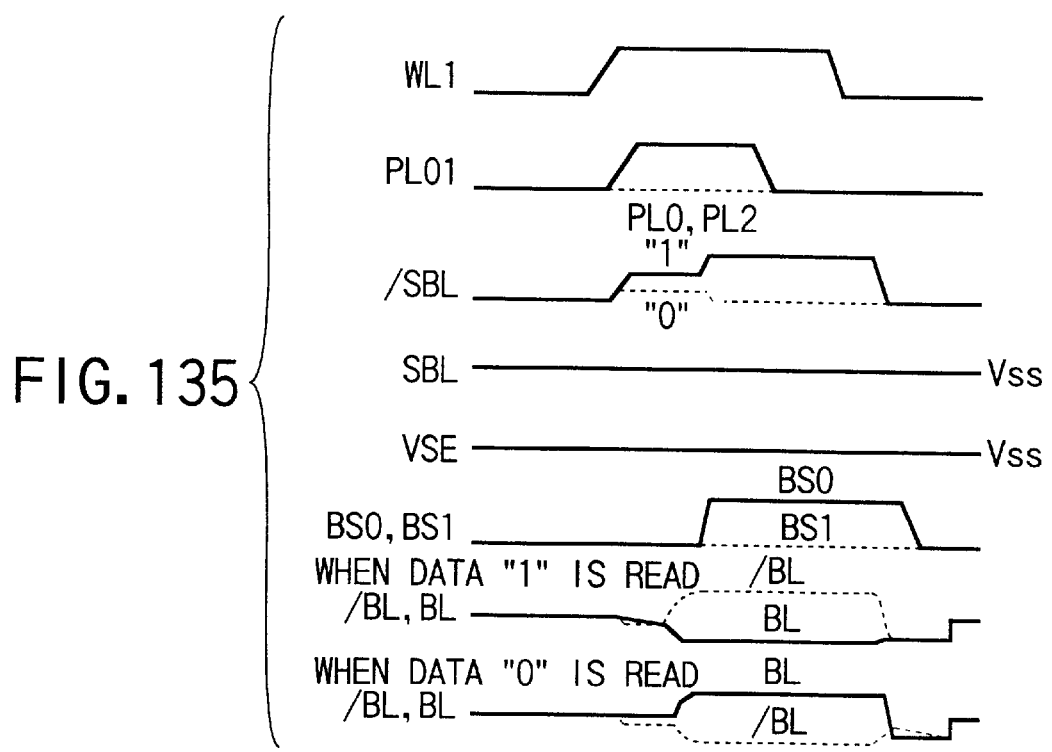
Figure 136:
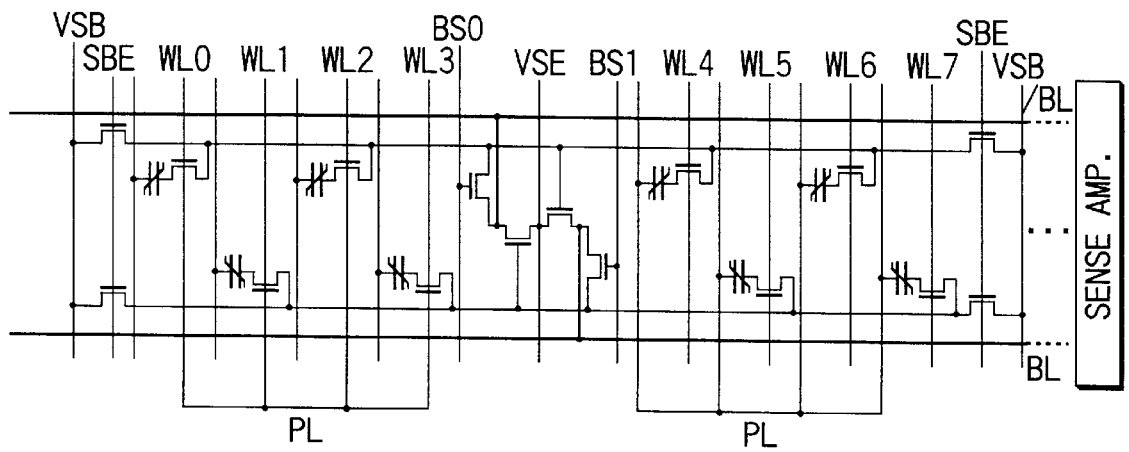
Figure 137:
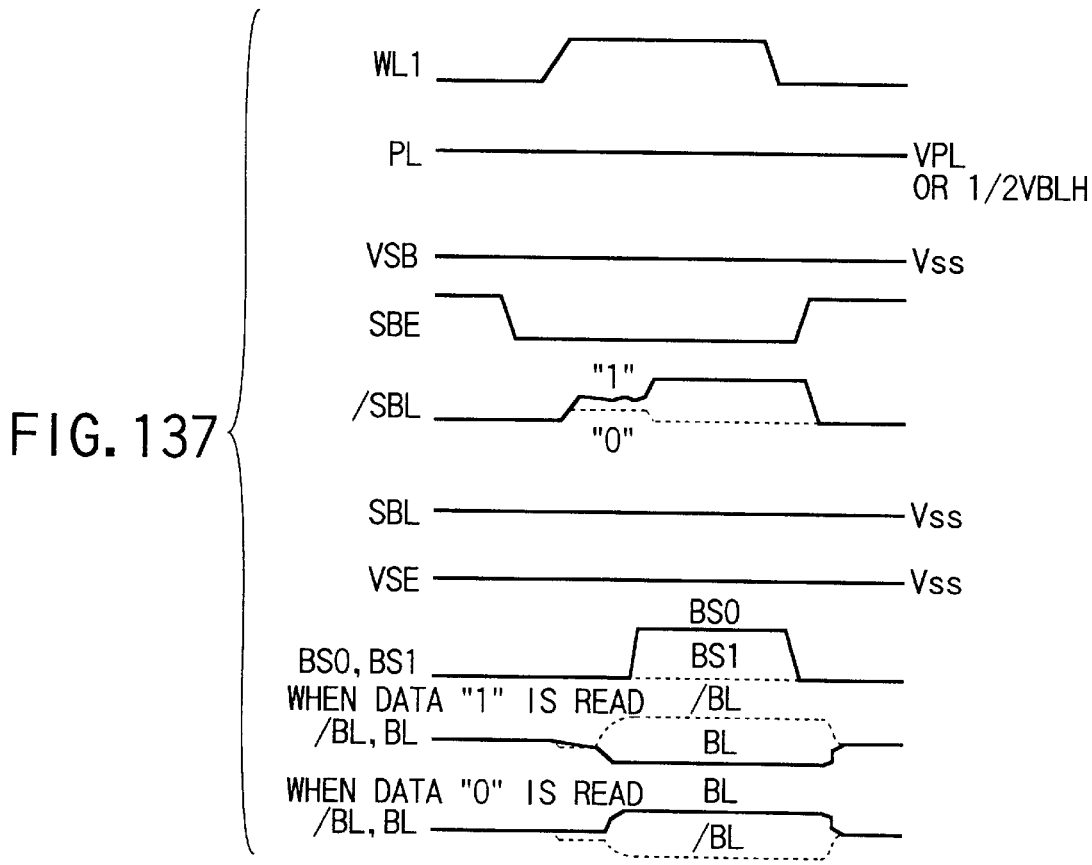
Figures 138, 139:
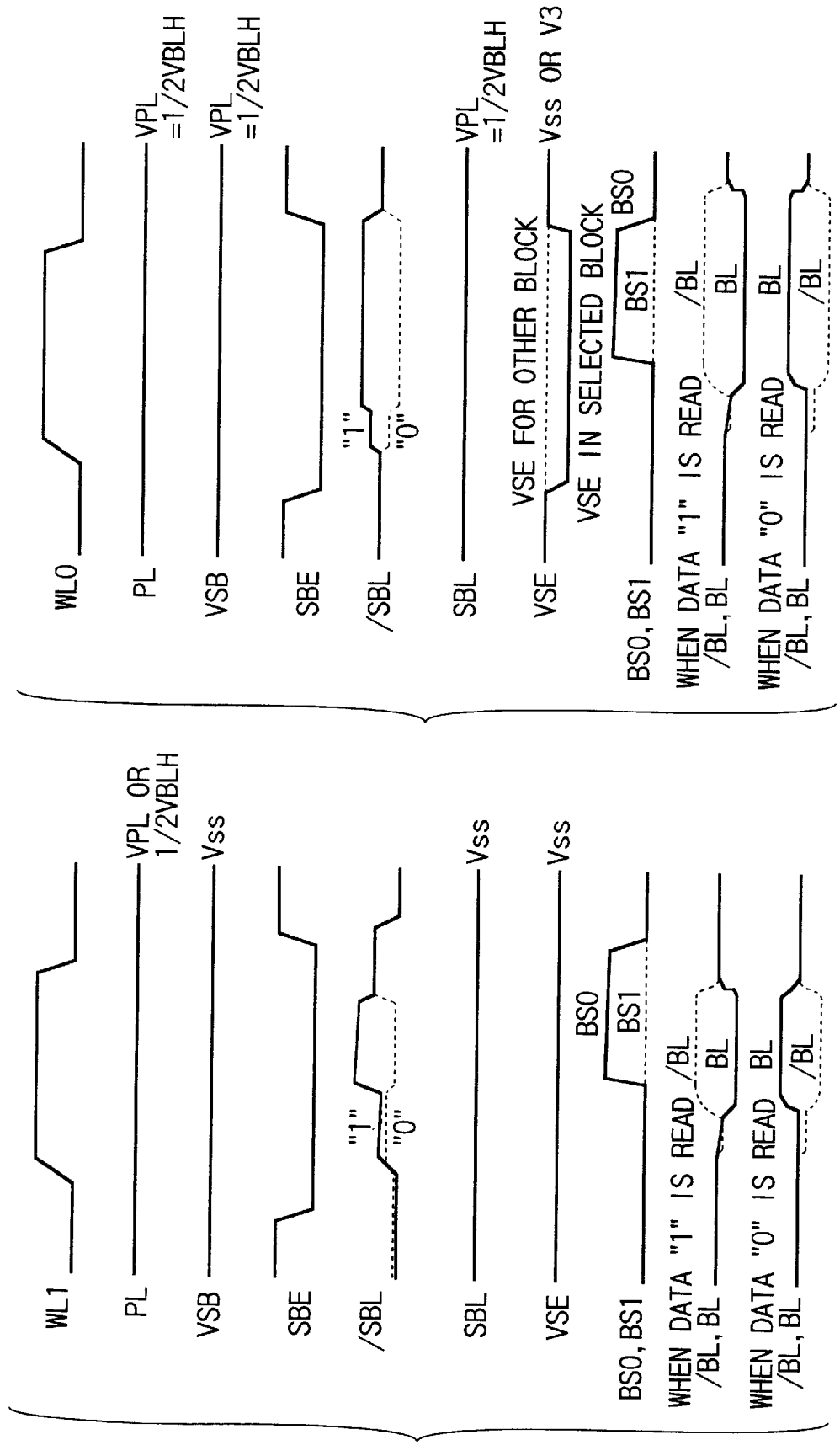
Figure 140:
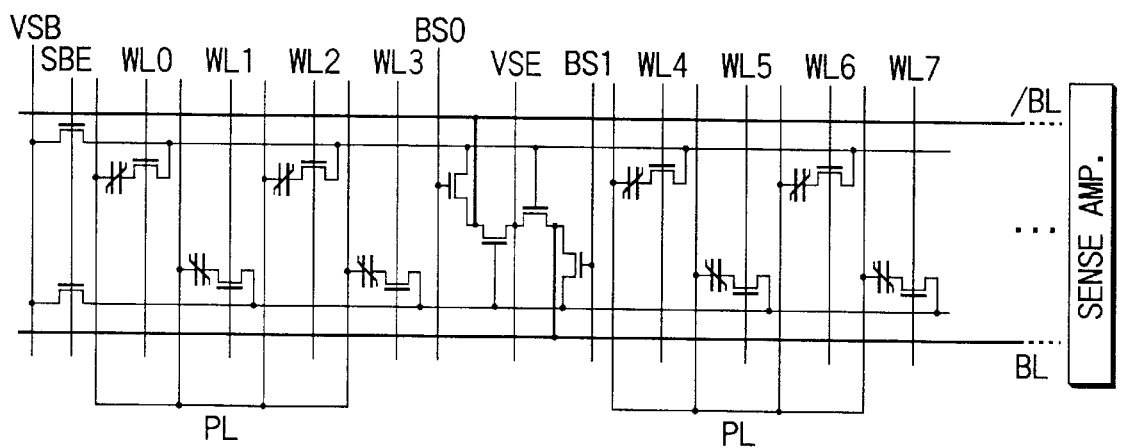
Figure 141:
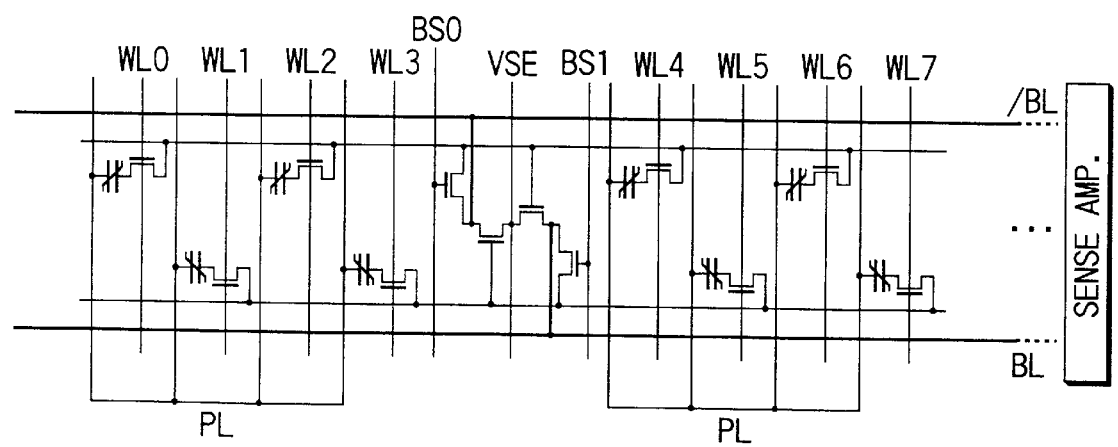
Figure 142:
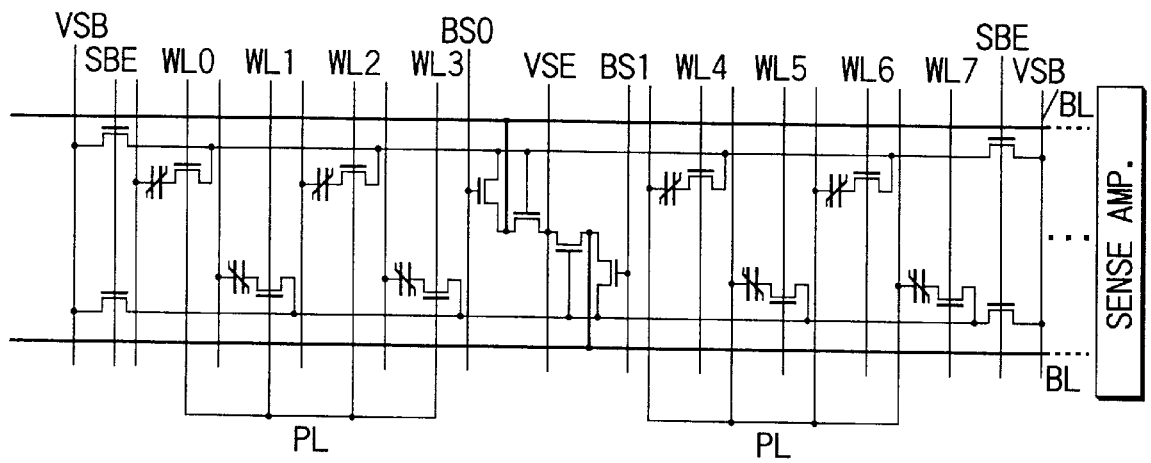
Figure 143:
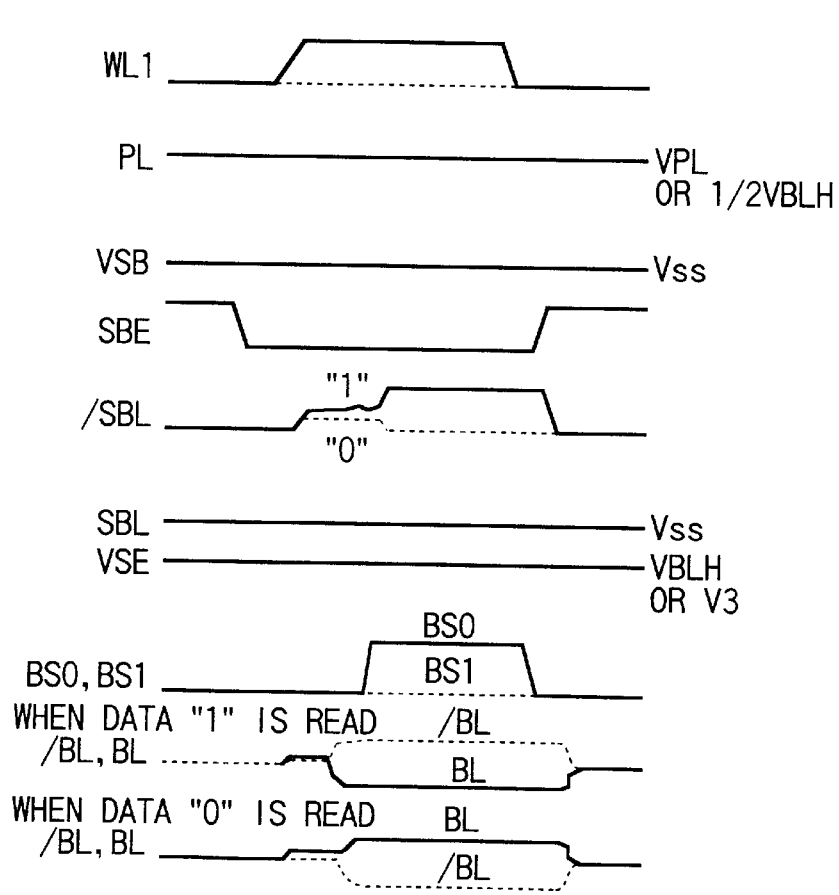
Figure 144:
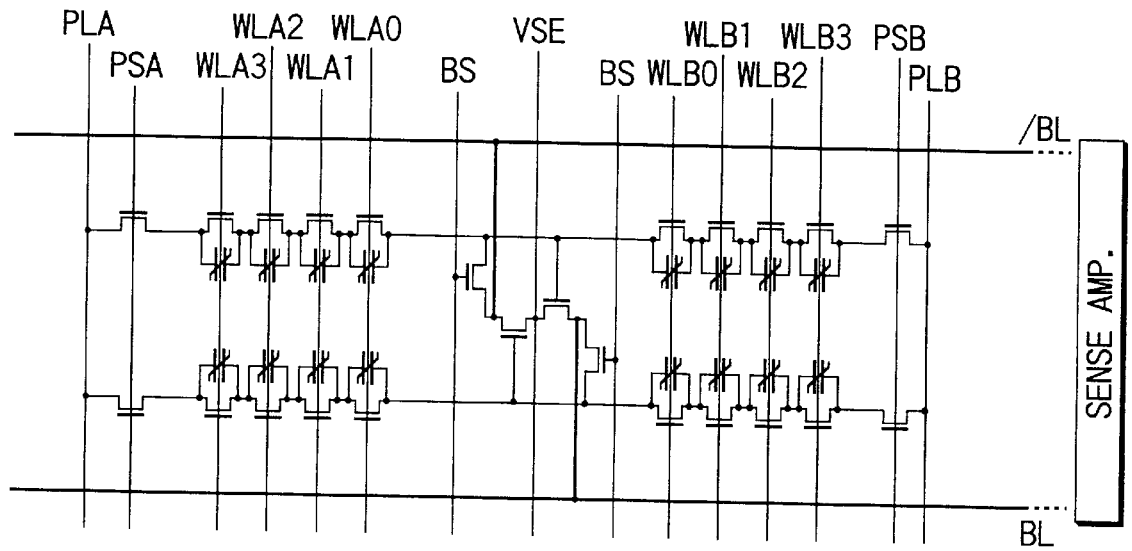
Figure 145:
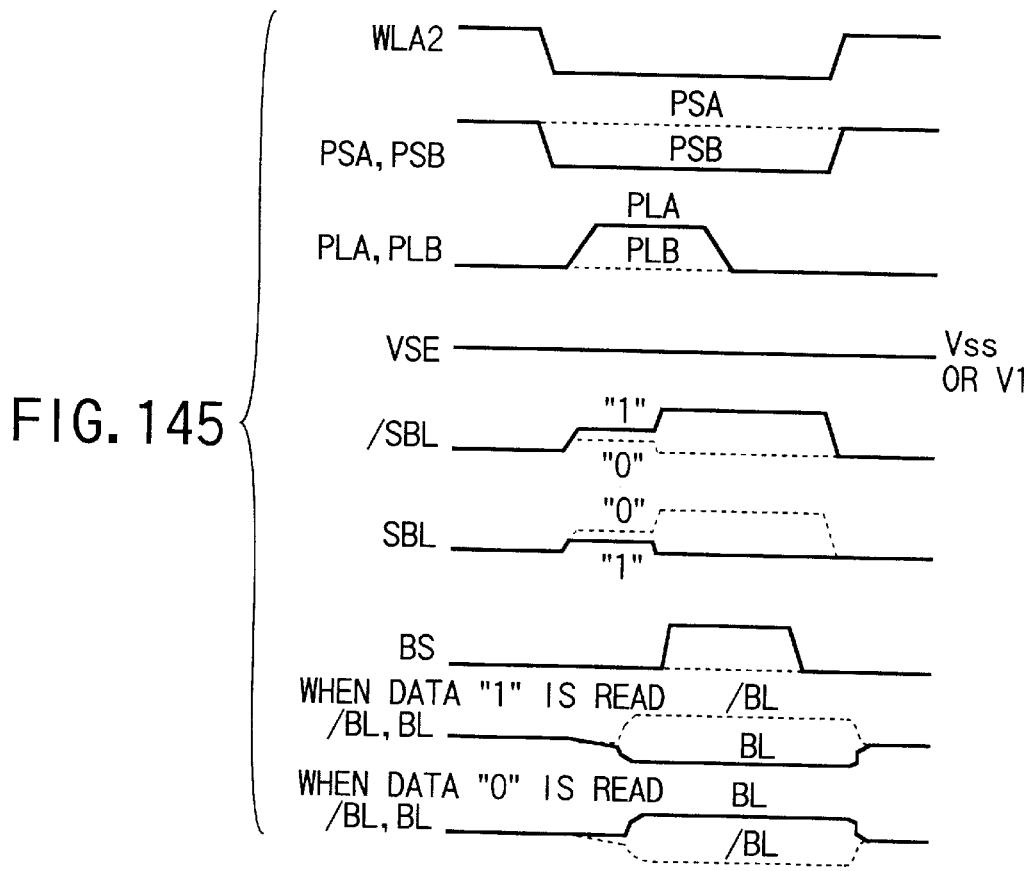
Figure 146:
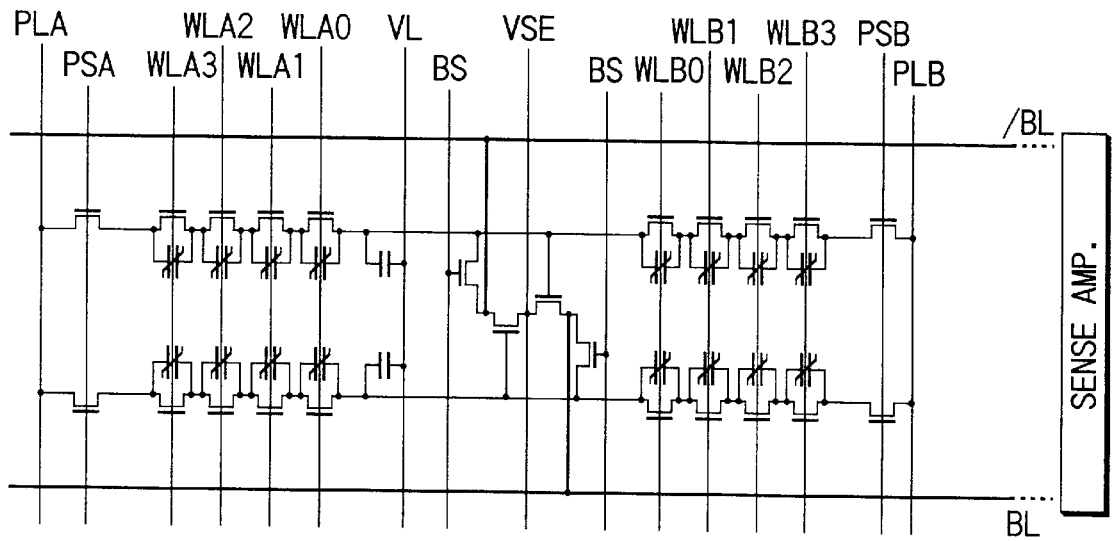
Figure 147:
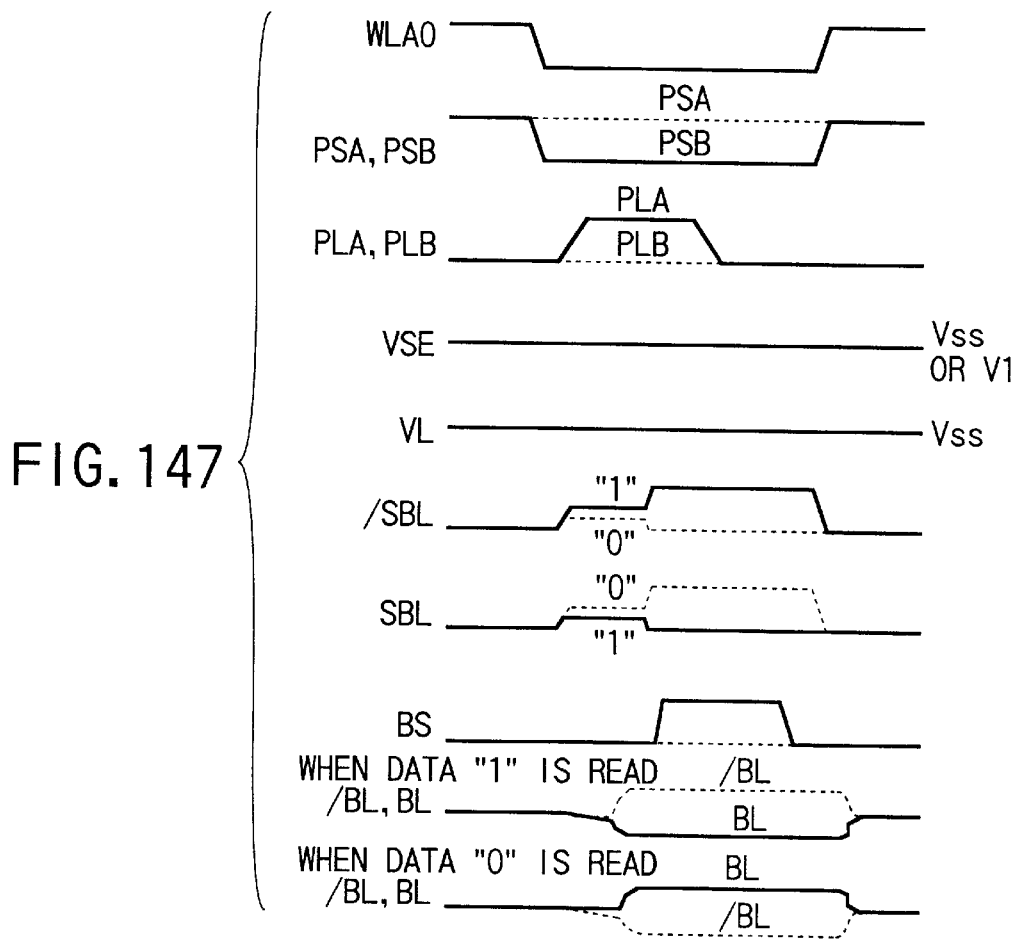
Figure 148:
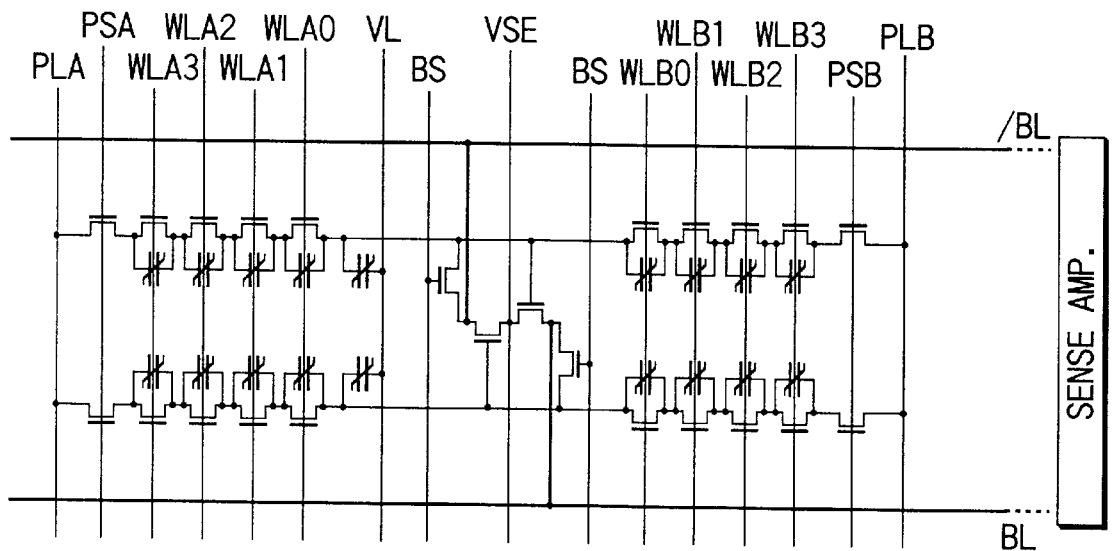
Figure 149:
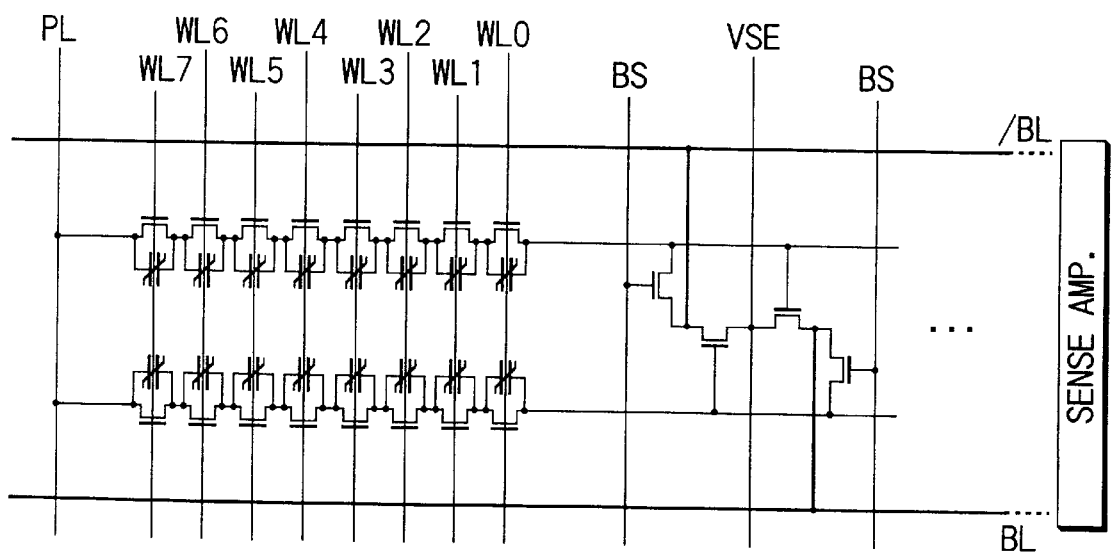
Figure 150:
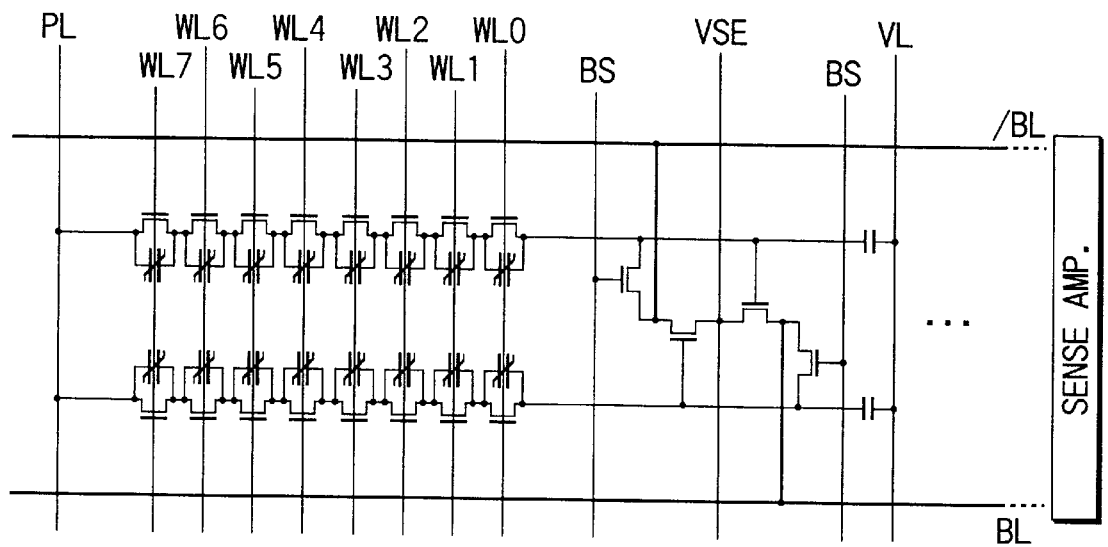
Figure 151:
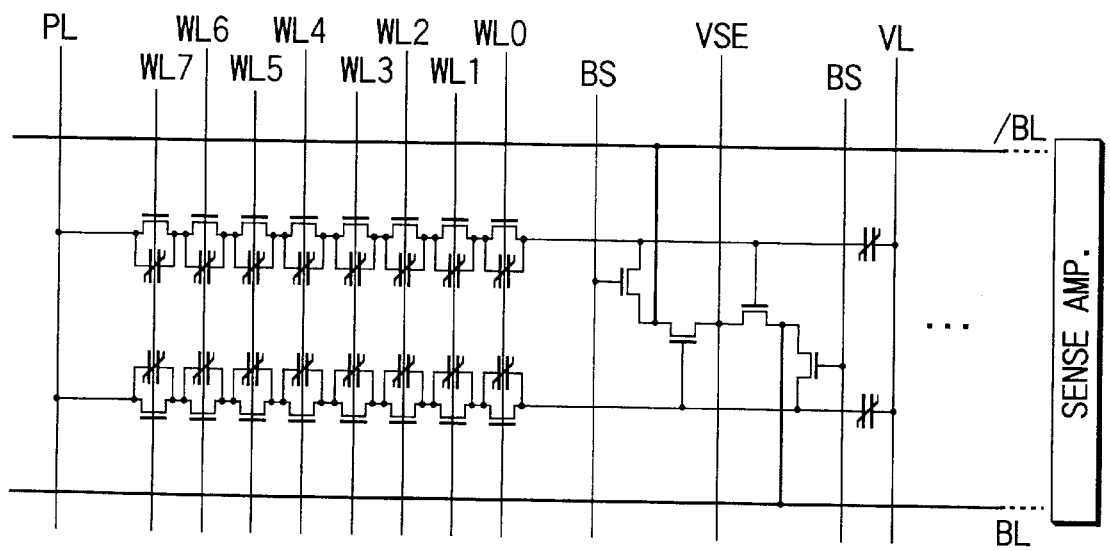
Figure 152:
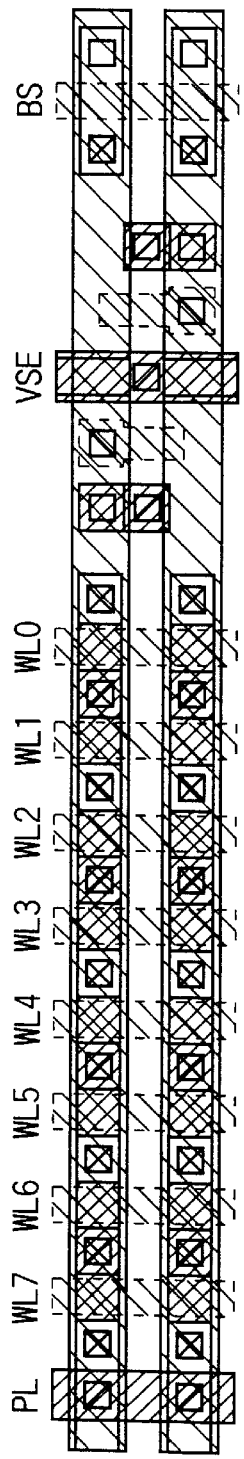
Figure 153:
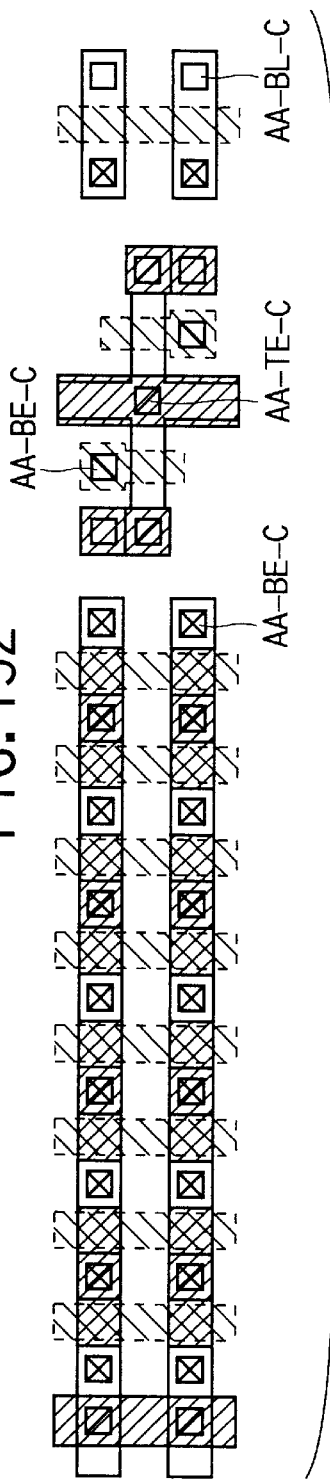
Figure 154:
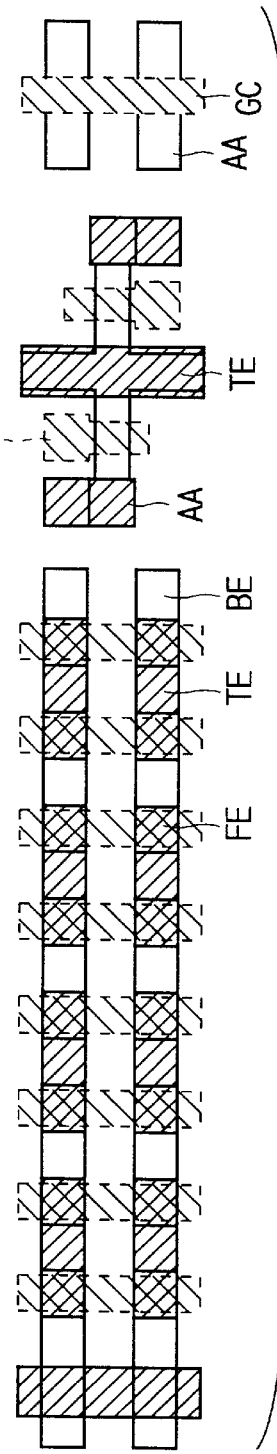
Figure 155:
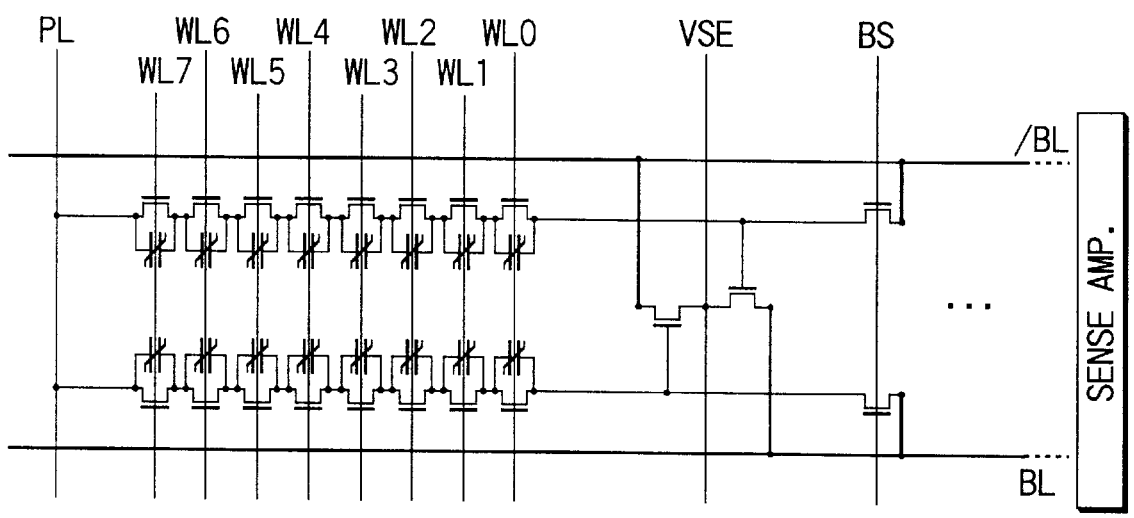
Figure 156:
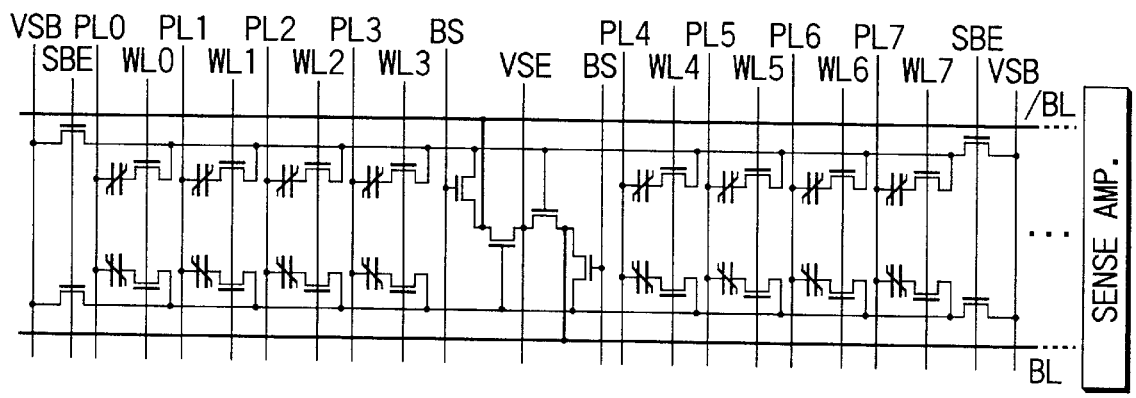
Figure 157:
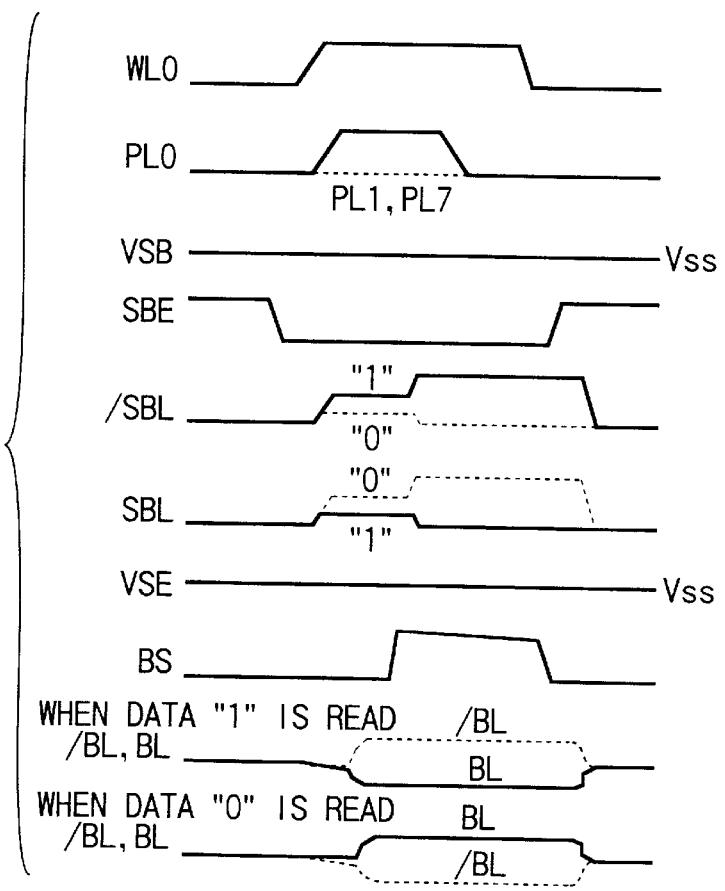
Figure 158:
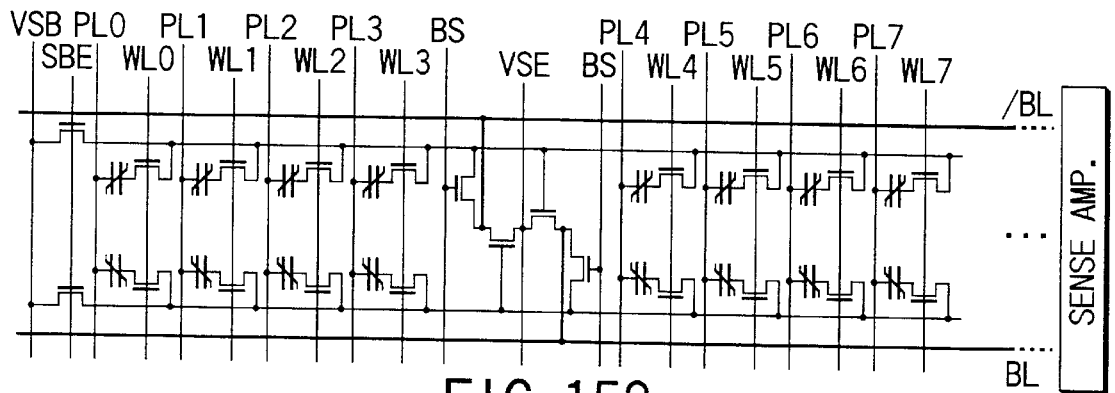
Figure 159:
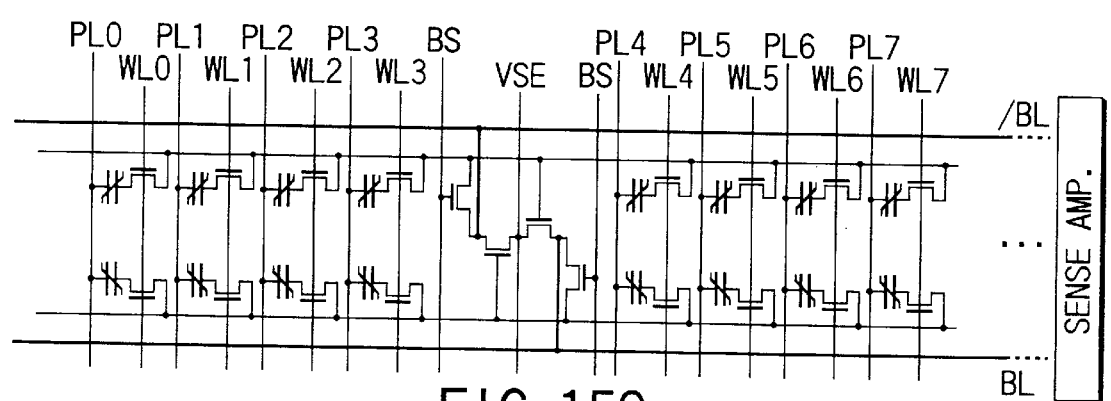
Figure 160:
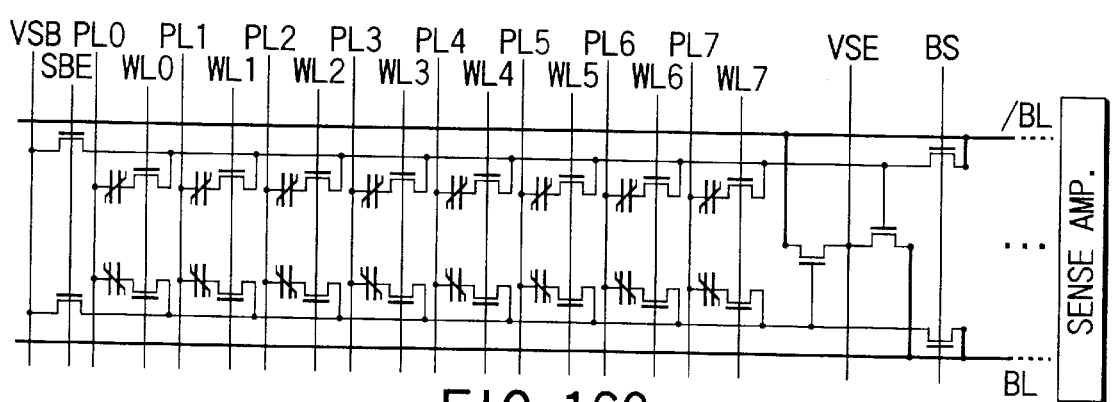
Figure 161:
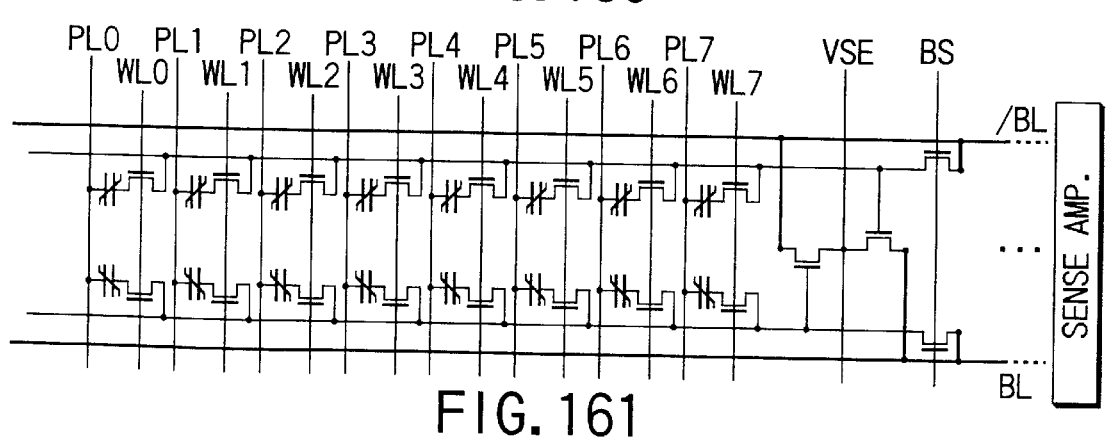
Figure 164:
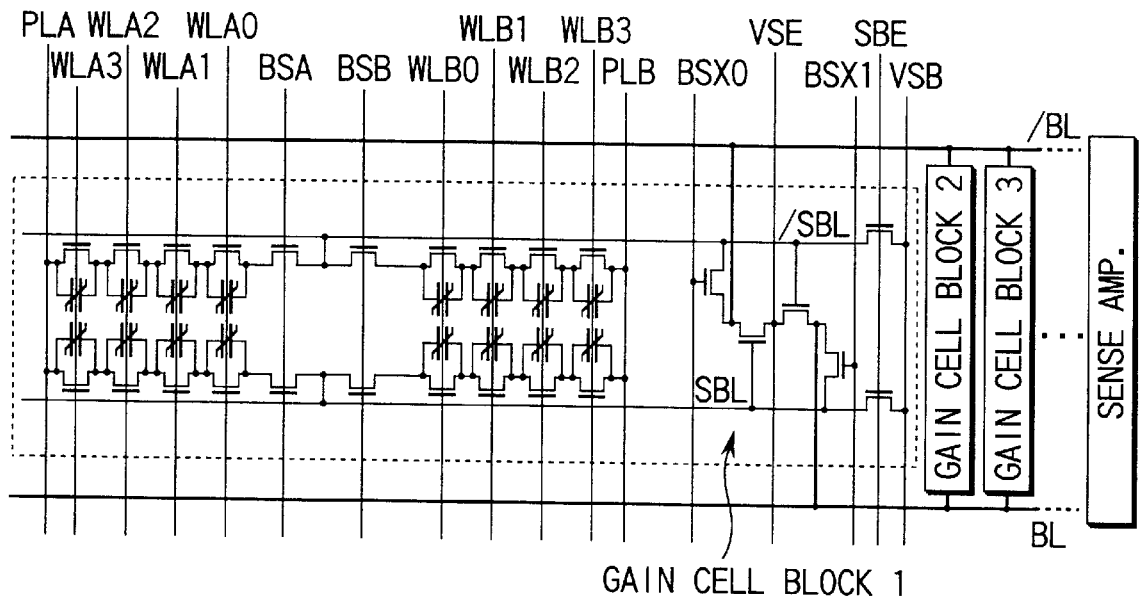
Figure 165:
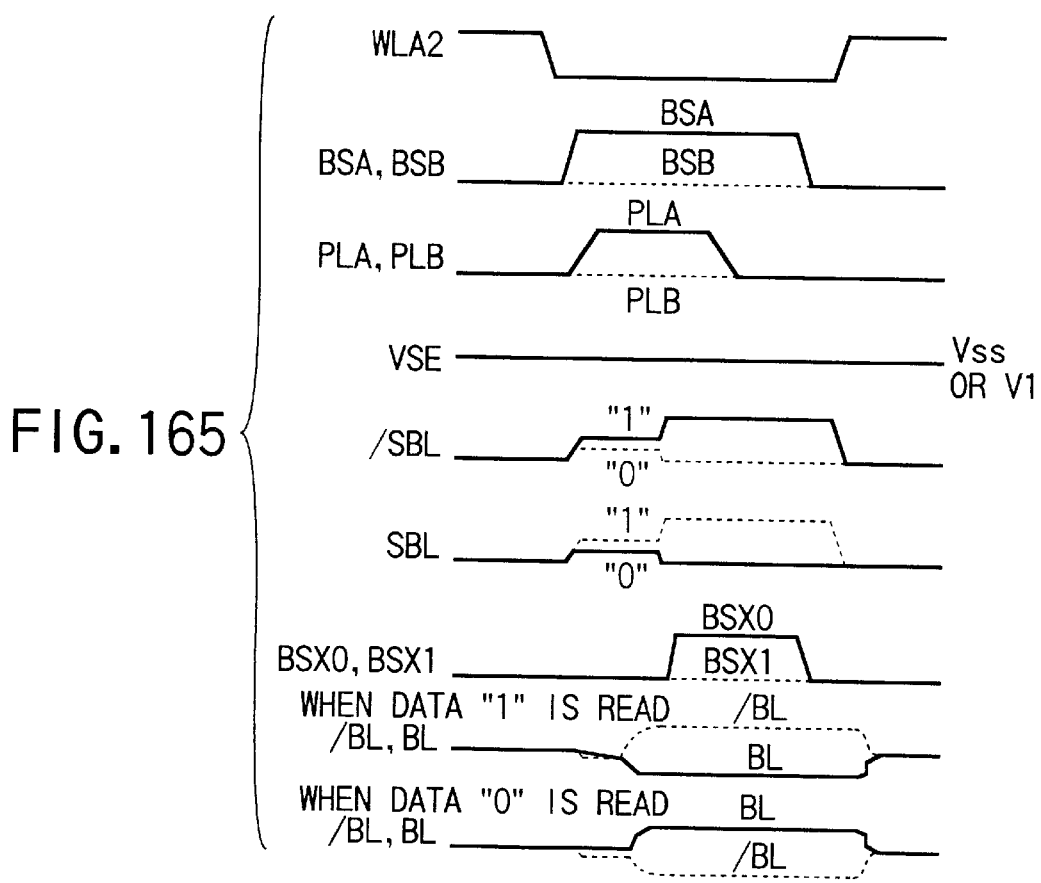
Figure 166:
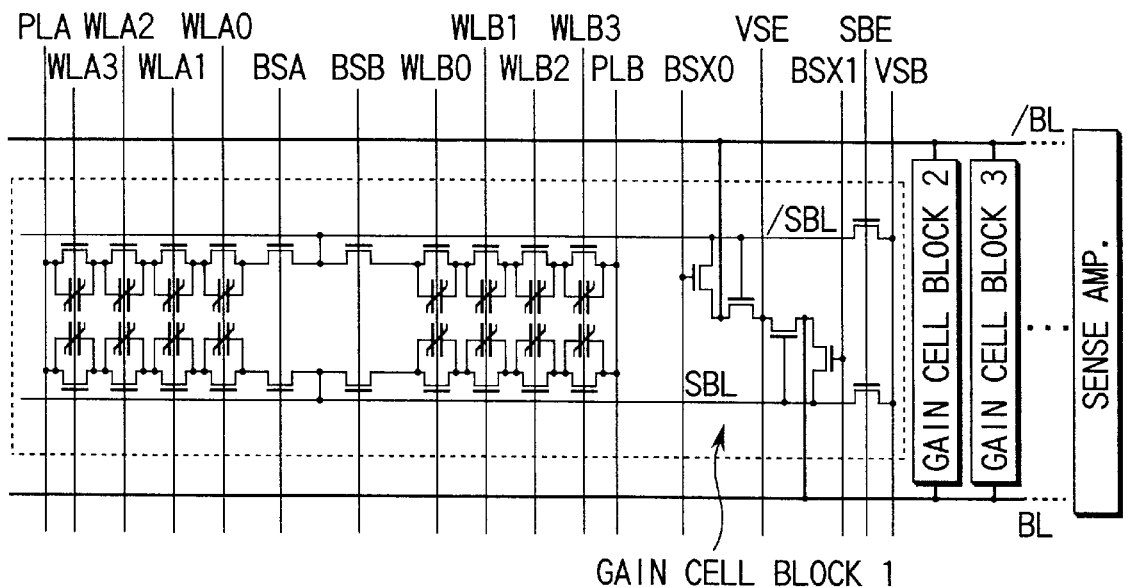
Figure 167:
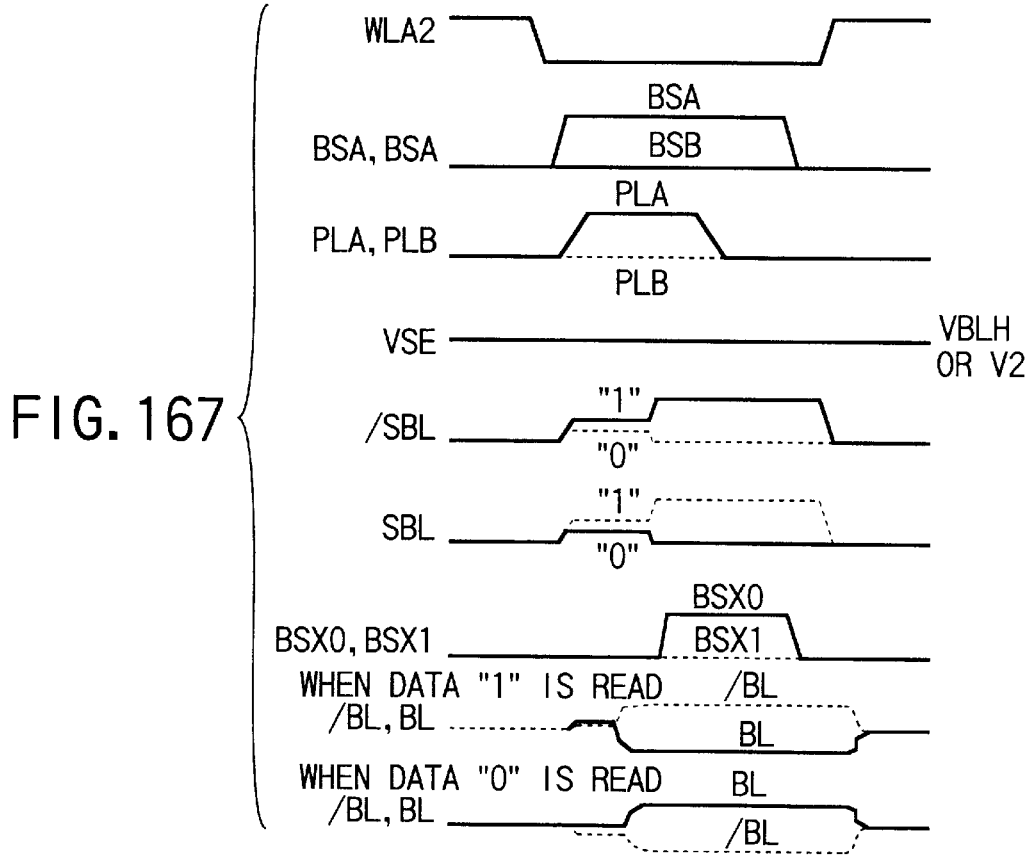
Figure 168:
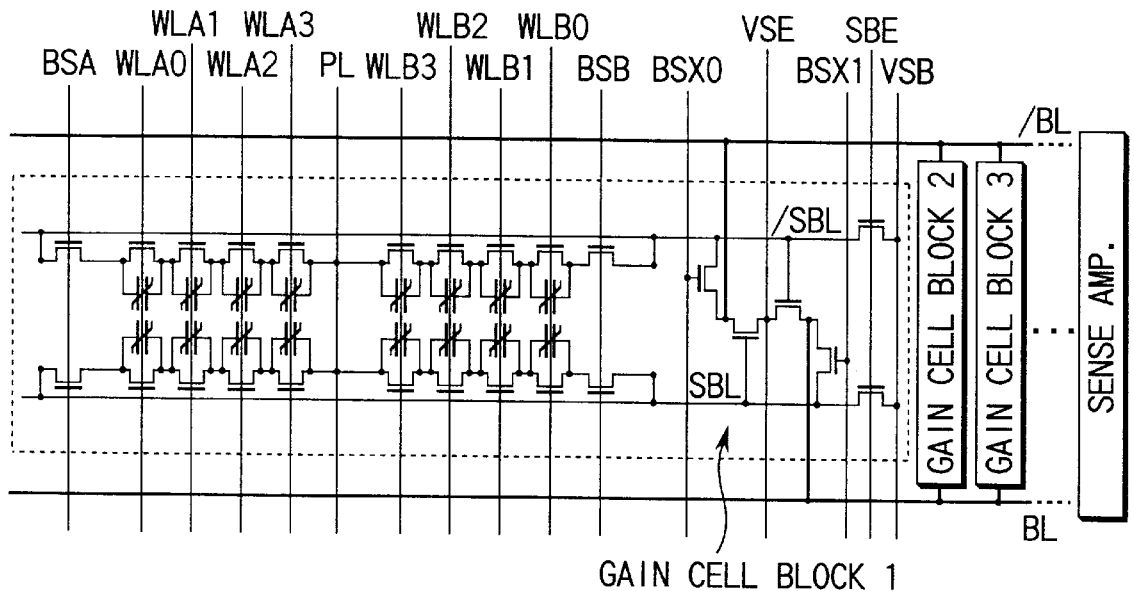
Figure 169:
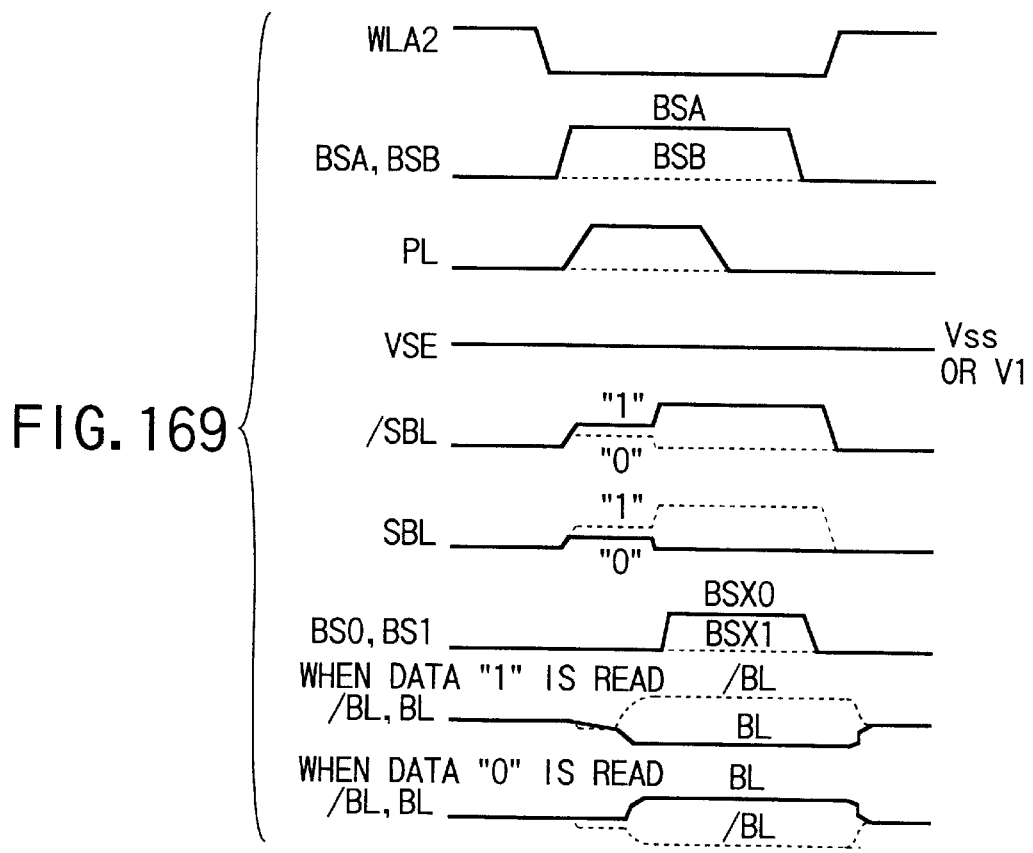
Figure 170:
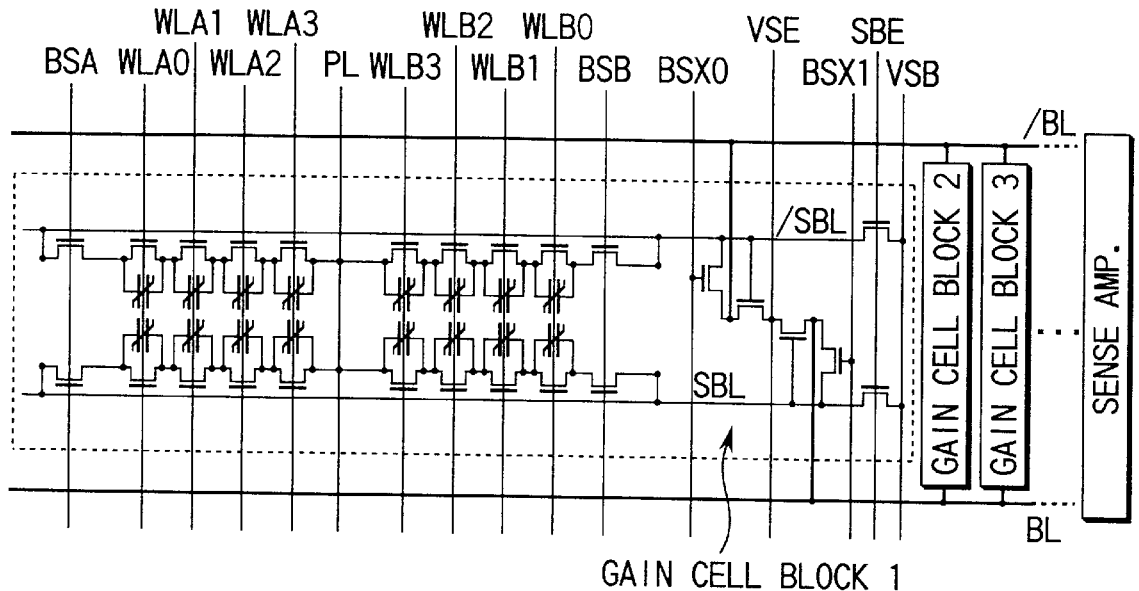
Figure 171:
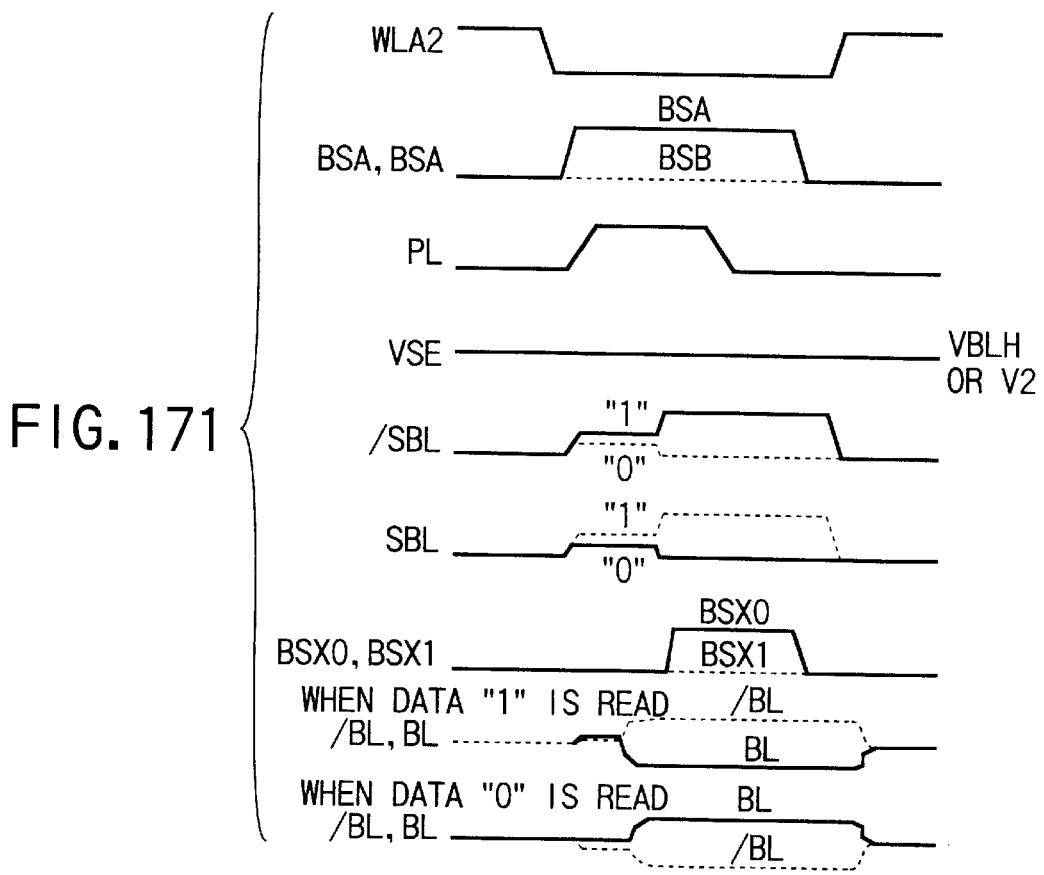
Figure 172:
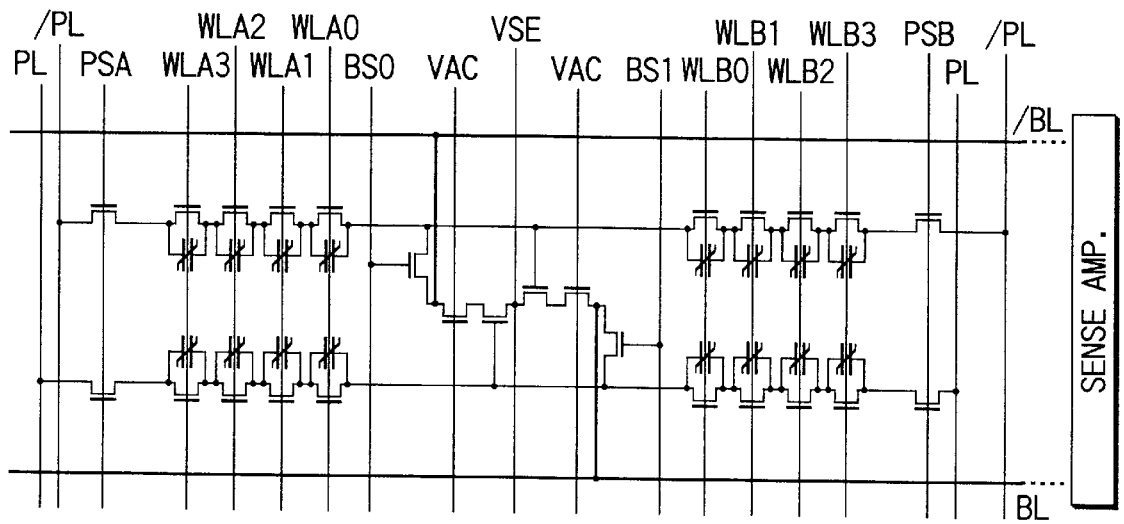
Figure 173:
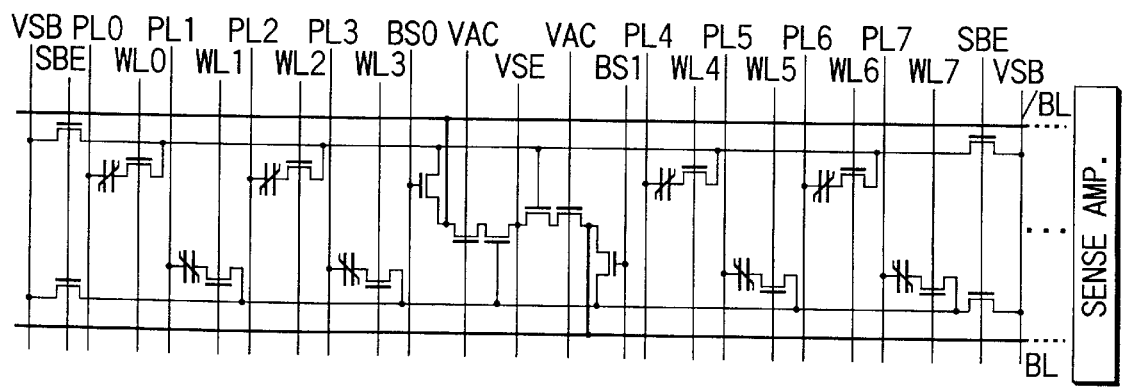
Figure 174:
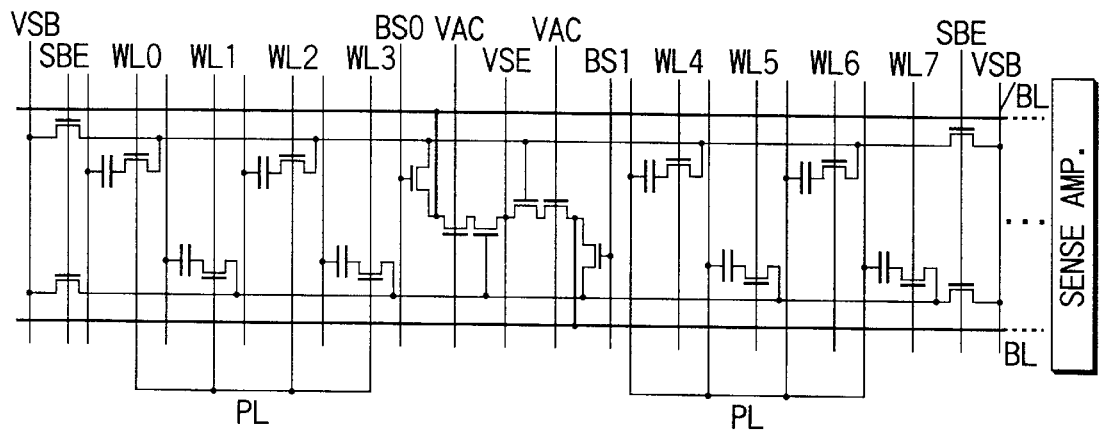
Figure 175:
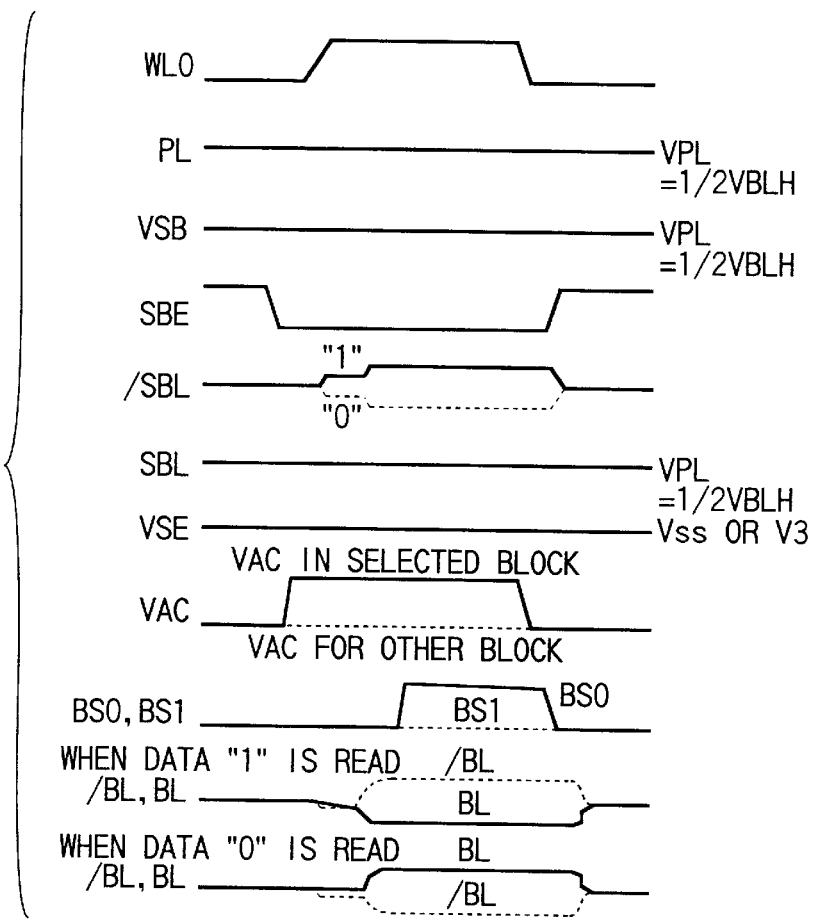
Figure 176:
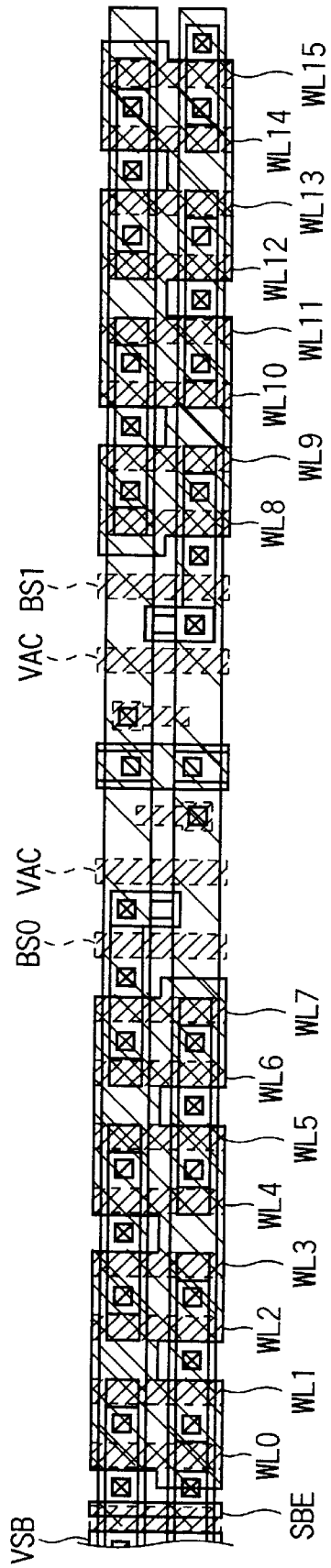
Figure 177:
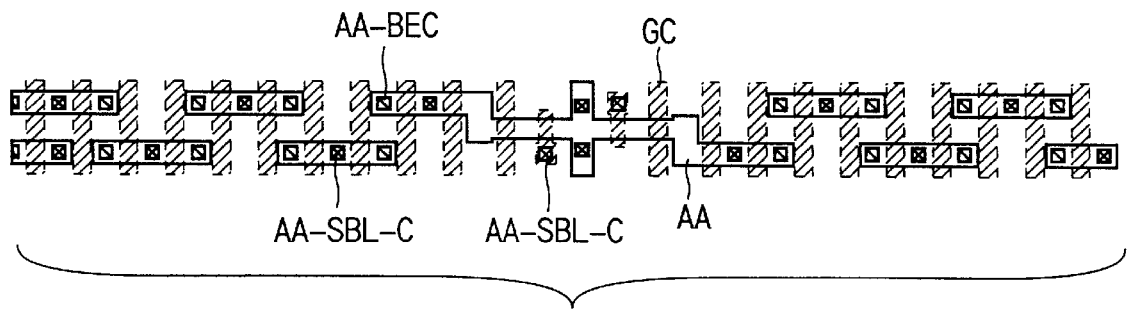
Figure 178:
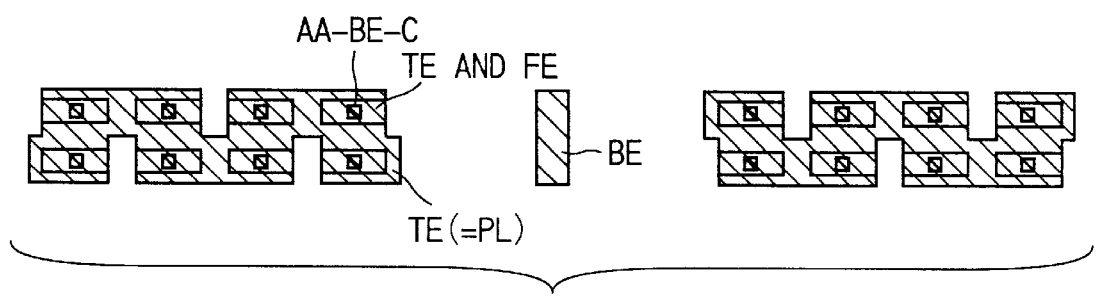
Figure 179:
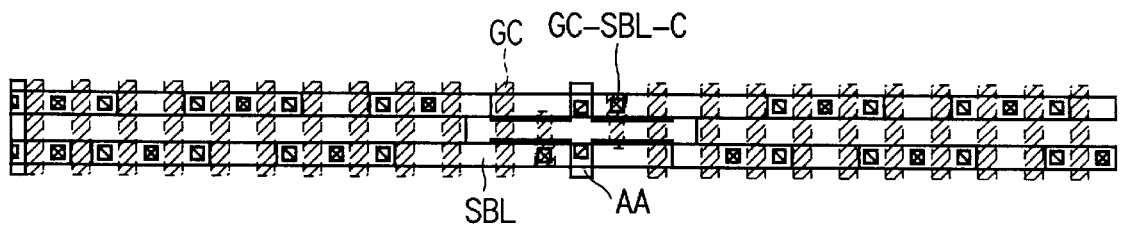
Figure 180:
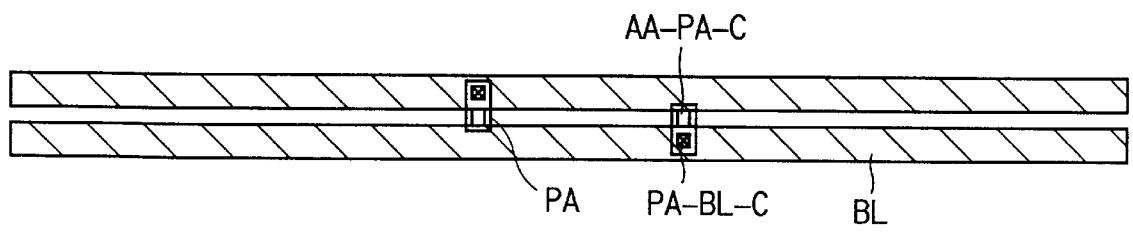

FIG. 131 is a circuit diagram showing the gain cell block structure of a ferroelectric memory according to a fifty-first embodiment;

FIG. 132 is a signal waveform showing an example of the specific operation of FIG. 131;

FIG. 133 is a circuit diagram showing the gain cell block structure of a ferroelectric memory according to a fifty-second embodiment;

FIG. 134 is a circuit diagram showing the gain cell block structure of a ferroelectric memory according to a fifty-third embodiment;

FIG. 135 is a signal waveform showing an example of the specific operation of FIG. 134;

FIG. 136 is a circuit diagram showing the gain cell block structure of a ferroelectric memory according to a fifty-fourth embodiment;

FIG. 137 is a signal waveform showing an example of the specific operation of FIG. 136;

FIG. 138 is a signal waveform showing an example of the specific operation of FIG. 136;

FIG. 139 is a signal waveform showing an example of the specific operation of FIG. 136;

FIG. 140 is a circuit diagram showing the gain cell block structure of a ferroelectric memory according to a fifty-fifth embodiment;

FIG. 141 is a circuit diagram showing the gain cell block structure of a ferroelectric memory according to a fifty-fifth embodiment;

FIG. 142 is a circuit diagram showing the gain cell block structure of a ferroelectric memory according to a fifty-sixth embodiment;

FIG. 143 is a signal waveform showing an example of the specific operation of FIG. 142;

FIG. 144 is a circuit diagram showing the gain cell block structure of a ferroelectric memory according to a fifty-seventh embodiment;

FIG. 145 is a signal waveform showing an example of the specific operation of FIG. 144;

FIG. 146 is a circuit diagram showing the gain cell block structure of a ferroelectric memory according to a fifty-eighth embodiment;

FIG. 147 is a signal waveform showing an example of the specific operation of FIG. 146;

FIG. 148 is a circuit diagram showing the gain cell block structure of a ferroelectric memory according to a fifty-ninth embodiment;

FIG. 149 is a circuit diagram showing the gain cell block structure of a ferroelectric memory according to a sixtieth embodiment;

FIG. 150 is a circuit diagram showing the gain cell block structure of a ferroelectric memory according to a sixty-first embodiment;

FIG. 151 is a circuit diagram showing the gain cell block structure of a ferroelectric memory according to a sixty-second embodiment;

FIG. 152 is a plan view showing the layout of the memory cell structure of a ferroelectric memory according to a sixty-third embodiment;

FIG. 153 is a diagram showing a portion of layout layers shown in FIG. 152 which is a plan view of the layout;

FIG. 154 is a diagram showing a portion of layout layers shown in FIG. 152 which is a plan view of the layout;

FIG. 155 is a circuit diagram showing the gain cell block structure of a ferroelectric memory according to a sixty-fourth embodiment;

FIG. 156 is a circuit diagram showing the gain cell block structure of a ferroelectric memory according to a sixty-fifth embodiment;

FIG. 157 is a signal waveform showing an example of the specific operation of FIG. 156;

FIG. 158 is a circuit diagram showing the gain cell block structure of a ferroelectric memory according to a sixty-sixth embodiment;

FIG. 159 is a circuit diagram showing the gain cell block structure of a ferroelectric memory according to a sixty-sixth embodiment;

FIG. 160 is a circuit diagram showing the gain cell block structure of a ferroelectric memory according to a sixty-sixth embodiment;

FIG. 161 is a circuit diagram showing the gain cell block structure of a ferroelectric memory according to a sixty-sixth embodiment;

FIGS. 162A and 162B are plan views showing the layout of the memory cell structure of a ferroelectric memory according to a sixty-seventh embodiment;

FIGS. 163A and 163B are diagrams showing a portion of layout layers shown in FIGS. 162A and 162B which are plan views of the layout;

FIG. 164 is a circuit diagram showing the gain cell block structure of a ferroelectric memory according to a sixty-eighth embodiment;

FIG. 165 is a signal waveform showing an example of the specific operation of FIG. 164;

FIG. 166 is a circuit diagram showing the gain cell block structure of a ferroelectric memory according to a sixty-ninth embodiment;

FIG. 167 is a signal waveform showing an example of the specific operation of FIG. 166;

FIG. 168 is a circuit diagram showing the gain cell block structure of a ferroelectric memory according to a seventieth embodiment;

FIG. 169 is a signal waveform showing an example of the specific operation of FIG. 168;

FIG. 170 is a circuit diagram showing the gain cell block structure of a ferroelectric memory according to a seventy-first embodiment;

FIG. 171 is a signal waveform showing an example of the specific operation of FIG. 170;

FIG. 172 is a circuit diagram showing the gain cell block structure of a ferroelectric memory according to a seventy-second embodiment;

FIG. 173 is a circuit diagram showing the gain cell block structure of a ferroelectric memory according to a seventy-second embodiment;

FIG. 174 is a circuit diagram showing the gain cell block structure of a DRAM according to a seventy-third embodiment;

FIG. 175 is a signal waveform showing an example of the specific operation of FIG. 174;

FIG. 176 is a plan view showing a layout of the gain cell block structure of a DRAM according to a seventy-fourth embodiment;

FIG. 177 is a diagram showing a portion of layout layers shown in FIG. 176 which is a plan view of the layout;

FIG. 178 is a diagram showing a portion of layout layers shown in FIG. 176 which is a plan view of the layout;

FIG. 179 is a diagram showing a portion of layout layers shown in FIG. 176 which is a plan view of the layout; and FIG. 180 is a diagram showing a portion of layout layers shown in FIG. 176 which is a plan view of the layout.

DETAILED DESCRIPTION OF THE INVENTION

Prior to describing embodiments of the present invention, the previous suggestion performed by the inventors of the present invention will now be described.

To overcome the first and second critical problems, the inventors has provided a semiconductor memory device which enables a nonvolatile ferroelectric memory to realize three requirements, that is, (1) a memory cell having a small size which is the $4F^2$ size, (2) a planar transistor which can easily be manufactured and (3) a random access function having general versatility. Moreover, the PL potential is fixed, a high-speed operation is permitted, data retention is permitted even during standby and no refreshing operation is required. Another suggestion of a semiconductor memory device is performed with which a high-speed operation can be realized even if the PL operation method is employed.

The outline of the previous suggestion performed by the inventors of the present invention will now be described. FIGS. 5A and 5B show a circuit for the memory cell and the structure of cells according to the invention suggested previously. FIGS. 6A and 6B show examples of the operation. FIG. 5A shows an equivalent circuit, and FIG. 5B is a sectional view showing the device. As shown in FIGS. 5A and 5B, one memory cell is constituted by a parallel connection of cell transistors and ferroelectric capacitors. One memory cell block is constituted by, in series, connecting a plurality of memory cell connected in parallel with one another. One end of the memory cell block is connected to a bitline through a block select transistor, while another end is connected to a plate. As a result of the foregoing structure, a memory cell using the planar transistor is able to realize the $4F^2$ size.

As shown in FIG. 6A, all of the memory cell transistors are turned on and the block select transistors are turned off in a standby state. As a result, both the ends of the ferroelectric capacitor are electrically short-circuited by the cell transistors which are turned on. Therefore, no difference in the potential occurs between both the ends. As a result, stable storage of polarization data "1" at the point of "1" on the hysteresis curve shown in FIG. 6A and polarization data "0" at the point "0" on the hysteresis curve is permitted. Thus, data in the cell can stably be stored at the time of standby regardless of existence of a variety of leakage currents, such as pn-junction leakage, the plate driving method which is performed at 0V or vdd and whether or not the (½)Vdd fixed method is employed.

As shown in FIG. 6B, only the memory cell transistors, in parallel, connected to the ferroelectric capacitor required to be read are turned off in an active state. On the other hand, the block select transistors are turned on. At this time, the difference between the PL and BL is applied to only both the ends of the ferroelectric capacitor, in parallel, connected to the memory cell transistor. Thus, polarization information in the ferroelectric capacitor is read to the bitline. As a result, if the cells are connected to one another in series, selection of an arbitrary word line enables information in a cell in an arbitrary ferroelectric capacitor to be read. As a result, complete random access can be realized. Thus, the cell blocks shown in FIGS. 5A and 5B are able to realize the open BL structure.

Figure 7:
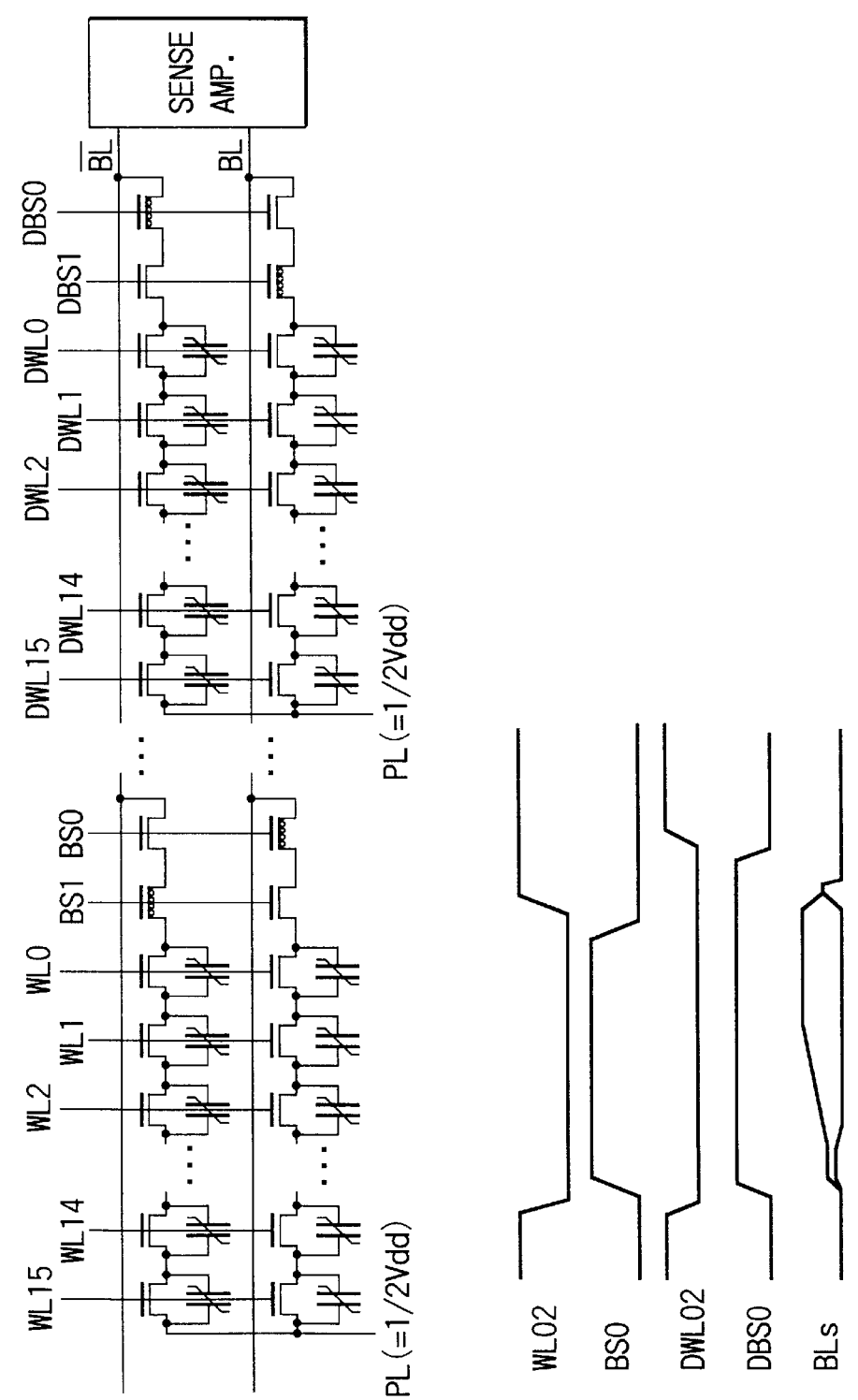
FIG. 7 is a circuit diagram showing an example of the structure of an array of the ferroelectric memory previously suggested by the inventors of the present invention.

When two cell blocks shown in FIGS. 5A and 5B are formed into a pair and each of the cell blocks is connected to either of the bitlines forming a pair (/BL, BL) so that two cell blocks and two memory cells connected to the same word line are combined with each other. Thus, 2-transistor/2-ferroelectric capacitor (=2T/2C) store one bit. Thus, a folded BL method can be realized. As shown in FIG. 7, two block select transistors are connected to each other in series such that either of the block select transistor is made to be a depression type transistor. Moreover, either of the block select transistors (BS0 or BS1) is made to be High. Thus, only data of either of the two cell blocks is read to the bitline. When the other bitline forming the pair is a reference bitline, also the folded BL structure can be realized. In the foregoing case, the plate electrode is fixed to (½)Vdd. A lower drawing in FIG. 7 shows an example of the operation of the folded BL method.

Figure 8:
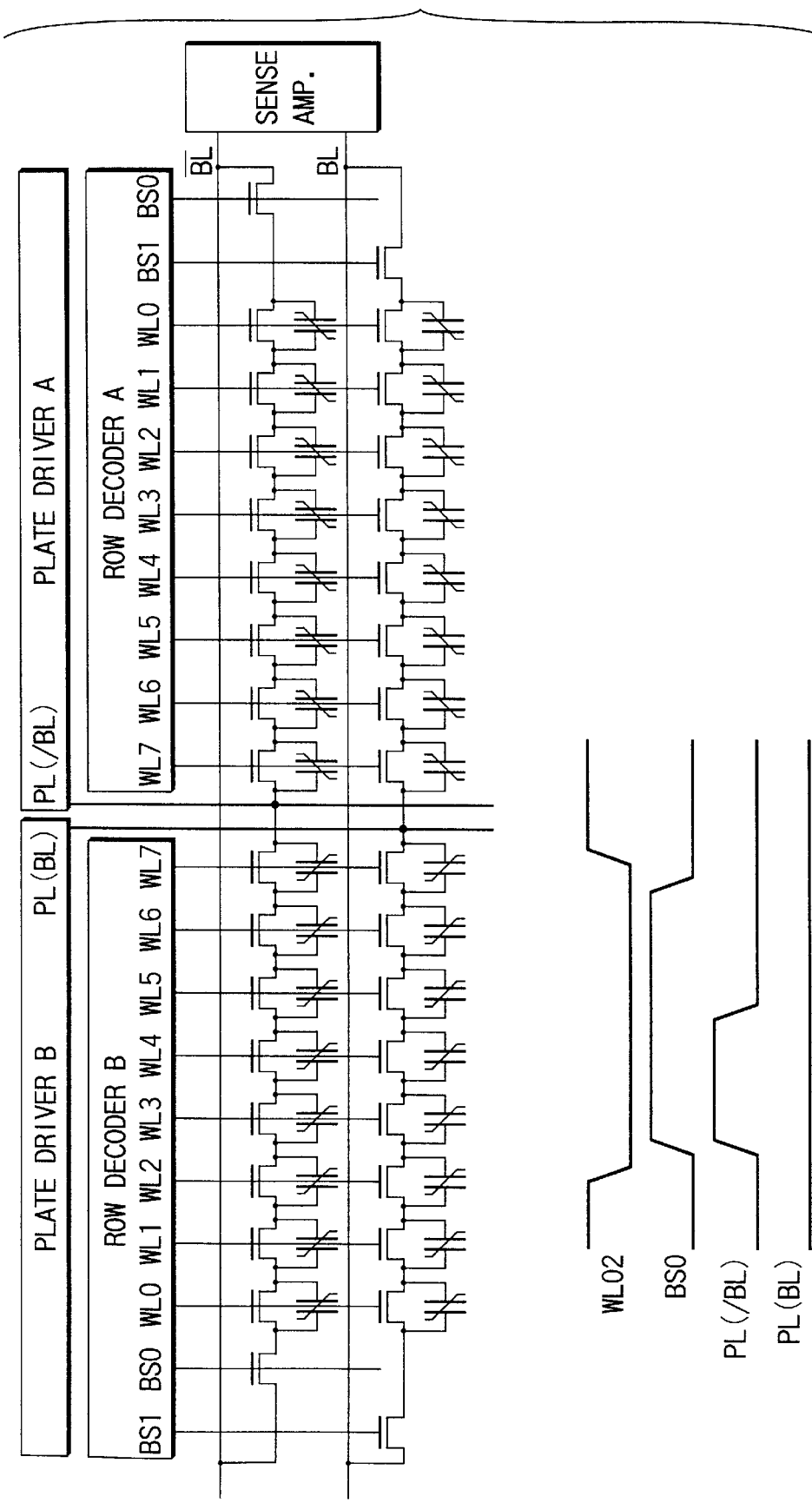
FIG. 8 is a circuit diagram showing an example of the structure of an array of the ferroelectric memory previously suggested by the inventors of the present invention.

According to the other suggestion, a semiconductor memory device is suggested which is capable of performing a high-speed operation and eliminating noise of a unselected memory cell even if the PL operation method is employed. The foregoing semiconductor apparatus is shown in FIG. 8. As compared with the structure shown in FIG. 7, the PL lines are divided into two types. As shown in an example of the operation shown in FIG. 8, when a cell connected to /BL is selected, only PL (/BL) is driven from 0V to Vdd. On the other hand, 0V to which PL (BL) is fixed is maintained. As a result, when a cell which is connected to /BL is selected and PL is operated in the structure shown in FIG. 7, connection to BL is established. The ferroelectric capacitor of the cell which is connected to the same selection word line and connected to BL when the selected word line is turned off is not applied with unnecessary voltage because the cell transistor is turned off.

The previous suggestion by the inventors of the present invention encounters reduction in the polarization of the ferroelectric capacitor for each memory cell when raising of the density has caused the area of each ferroelectric capacitor of the memory cell. Therefore, the voltage for reading a signal is lowered, causing a critical problem to arise in that increase in the capacity and raising of the density cannot easily be realized.

The present invention will now be described with the following embodiments.

(First Embodiment)

Figure 9:
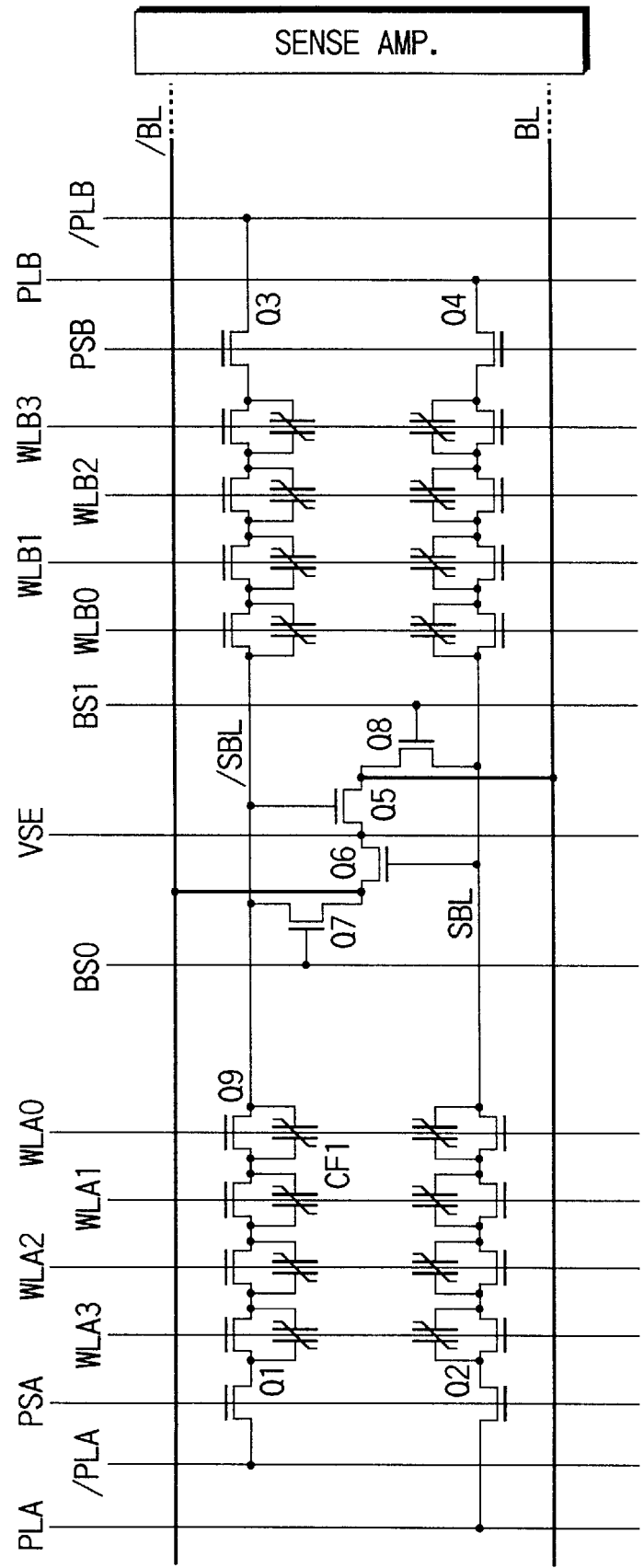
FIG. 9 is a circuit diagram showing the structure of cell blocks of the ferroelectric memory according to a first embodiment.

FIG. 9 is a circuit diagram showing a semiconductor memory device according to a first embodiment of the present invention, in which the cell block structure of a ferroelectric memory is illustrated. Similarly to the previous suggestion performed by the inventors of the present invention, this embodiment has a structure that one memory cell is constituted by parallel connection of cell transistors and ferroelectric capacitors. The gates of the cell transistors are connected to word lines WLA0 to WLA3 and WLB0 to WLB3.

A block unit of one memory cell has four memory cells connected in series. The foregoing structures are the same as the previous suggestion performed by the inventors of the present invention. In this embodiment, one cell block has four block units. An upper left block unit and an upper right block unit are connected to a sub-bitline (/SBL). A lower left block unit and the upper right block unit are connected to a sub-bitline (SBL). The upper left block unit is connected to a plate line /PLA through a transistor Q1. The lower left block unit is connected to PLA through a transistor Q2. The upper right block unit is connected to a plat line /PLB through a transistor Q3. A lower right block unit is connected to PLB through a transistor Q4.

A transistor Q5 has a gate to which the sub-bitline /SBL is input, a source connected to the potential VSE and a drain connected to the bitline BL. By using the transistor Q5, the potential of /SBL is amplified so as to be transmitted to the bitline BL. To the contrary, the transistor Q7 makes a block writing select signal BS0 to be High when rewriting or writing is performed so as to transfer the writing potential transferred from the bitline /BL to the sub-bitline /SBL through the transistor Q7 so that data is rewritten on the cell.

The transistor Q6 has a gate to which the sub-bitline (SBL) is input, a source connected to the potential VSE and a drain connected to the bitline /BL. The transistor Q6 is used to amplify the potential of SBL to transfer the potential to the bitline /BL. To the contrary, the transistor Q8 makes a block writing select signal BS1 to be High when rewriting or writing is performed so as to transfer the writing potential from the bitline BL to the sub-bitline SBL through the transistor Q8 so that data is rewritten on the cell.

FIG. 10 is a signal waveform showing an example of the specific operation of FIG. 9. In particular, an example of the operation which is performed when data in a memory cell having the cell transistor Q9 and a ferroelectric capacitor CF1 is read or rewritten is shown.

In a standby state, all of the word lines WLA0 to WLA3 and WLB0 to WLB3 are set to be boosted potential Vpp, all of the plates /PLA, PLA, /PLB, PLB are set to be 0V and the plate select signal PSA and PLB are set to be Vpp. Thus, all of the cell transistors are turned on. Both the ends of the ferroelectric capacitor of all of the cells are electrically short-circuited. The potential of both of the ends and those of the sub-bitline /SBL and SBL are connected to the plate and, therefore, set to be 0V because the plate select signal is High. The block writing select signal BS0 and BS1 are made to be 0V so that the transistors Q7 and Q8 have been turned off. Since /SBL and SBL are 0V and VSE is 0V, also the amplifying transistors Q5 and Q6 have been turned off. Therefore, the bitlines /BL and BL and the sub-bitlines /SBL and SBL are completely separated from one another.

In the conventional FRAM, the bitlines /BL and BL must be precharged to 0V. In this embodiment similarly to the conventional DRAM, the foregoing bitlines can be precharged to (½)VBLH. Note that VBLH indicates the High level of the amplitude of the bitline.

The operation will now be described which is performed when, for example, a memory cell (Q9, CF1) of the upper left block unit of the selected cell block is selected. Initially, the word line WLA0 connected to the selected memory cell is lowered to 0V so that the cell transistor Q9 is turned off. Simultaneously or before or after the foregoing operation, the upper right and lower right block units and the plates /PLB and PLB are separated from one another by lowering the plate select signal PSB to 0V so that the transistors Q3 and Q4 are turned off. Moreover, the bitlines /BL and BL set to (½)VBLH are floated. Note that the states of Q1 and Q2 which are turned on are maintained. As a result, the cell transistor Q9 is turned off and the transistor Q3 is turned off. Therefore, the right-side terminal of the ferroelectric capacitor CF1 of the selected cell to /SBL and all of nodes in the cell of the upper right block unit are connected to one another. Moreover, the foregoing portion is floated when the voltage is 0V.

Then, only the potential of the plate /PLA connected to the selected upper left block unit is raised from 0V to VBLH. The potential VBLH is applied to a region from PLA to the left-side terminal of the selected ferroelectric capacitor. At this time, the capacities of the right-side terminal of CF1 to /SBL and the nodes in the cell of the upper right block unit are made to be load capacity CL. If data "1" is written on the ferroelectric capacitor, polarization inversion take place. Thus, data in the cell is read to the sub-bitline /SBL (more accurately, from the right-side terminal of CF 1 to /SBL and nodes in the cell of the upper right block unit). As a result, the potential of /SBL is raised from 0V to 2Vs+Vo.

If data "0" is written on the ferroelectric capacitor, the polarization inversion does not take place. The potential of the sub-bitline /SBL is raised to a degree corresponding to the ratio of the capacity of the paraelectric component of CF1 and that of CL. Thus, the potential of /SBL is made to be Vo. At this time, the potential of the sub-bitline SBL forming the pair is maintained at 0V because the potential of PLA is maintained at 0V. When the potential VSE is set to be 0V, the potential of the gate of the amplifying transistor Q5 is made to be 2Vs+Vo in a case of data "1" and Vo in a case of data "0". The potential of the source (=VSE) is made to be 0V and the potential of the drain (=/BL) is made to be (½)VBLH.

When the threshold voltage Vt of the transistor Q5 is designed to be Vo<Vt<2Vs+Vo, since the transistor Q5 is turned on in a case of data "1", the potential of BL precharged to (½)VBLH is lowered from (½)VBLH owning to flowing of an electric current in the VSE through the amplifying transistor Q5, as shown in FIG. 10. Note that the lowered potential before the sense amplifier operation is performed is defined to be (½)VBLH−2Vst.

In a case of data "0", the transistor Q5 is turned off, the potential BL precharged to (½)VBLH is maintained at (½)VBLH because no electric current flows into VSE through the amplifying transistor Q5. In this case, a dummy cell or the like incorporating a constant-current drive transistor is employed to set the potential of /BL to be lowered to a degree which is half of the potential of the BL which is lowered in a case of data "1" (that is, (½)VBLH−Vst before the sense operation). Thus, BL is made to be (½)VBLH−2Vst and /BL is made to be (½)VBLH−Vst in a case of data "1" before the sense amplifier operation. Thus, the difference in the potential Vst is input to the right-side sense amplifier shown in FIG. 9. Then, a flip-flop type sense amplifier amplifies the potential so that BL is made to be 0V and /BL is made to be VBLH. In a case of data "0", BL is made to be (½)VBLH and /BL is made to be (½)VBLH−Vst. Thus, the difference in the potential Vst is input to the right-side sense amplifier shown in FIG. 9. Then, a flip-flop type sense amplifier amplifies the potential so that BL is made to be VBLH and /BL is made to be 0V.

When the threshold voltage of the amplifying transistor satisfies the region Vt<Vo, the amplifying transistor is turned on to lower the potentials of both of /BL and BL. Also in the foregoing case, the driving currents are considerably different from each other. Therefore, no problem arises if the driving current for the dummy cell is designed properly. The potential of VSE may be 0V or another constant potential (that is, the apparent threshold voltage of the amplifying transistor can be raised to a degree corresponding to raising of the potential of VSE from 0V) to correct the threshold value.

When data is rewritten, only block writing select signal BS0 connected to the sub-bitline /SBL is raised to Vpp. Thus, the potential of the bitline /BL which is 0V or amplified to VBLH is written on /SBL. In a case of data "1", /SBL is made to be VBLH and /SBL is made to be 0V in a case of data "0". At this time, the potential of the plate (the left-side terminal of the selected ferroelectric capacitor) is VBLH. Therefore, voltage−VBLH (the right-side terminal of the ferroelectric capacitor is defined to be positive) is applied to the ferroelectric capacitor in a case of data "0". Thus, data "0" is rewritten. In a case of data "1", the potential of the plate /PLA is then lowered to 0V. When also the left-side terminal of the selected ferroelectric capacitor is made to be 0V, the ferroelectric capacitor is applied with voltage VBLH (the right-side terminal of the ferroelectric capacitor is defined to be positive). Thus, data "1" is rewritten.

In the above-mentioned sequential operations, the potential of the SBL of 0V is maintained. Therefore, data in the lower block unit is maintained and stabilized. If different data is written from outside (Write Mode) or external data is written after data is read (Read Modified Write), data is required to be written after BS0 is made to be High.

After rewriting is completed, the potential of the block writing select signal BS0 is lowered from High to 0V. As a result, interference from /BL portion to /SBL can be eliminated. Then, the potential of WLA0 is raised. Simultaneously or before or after the foregoing operation, the potential of the plate control signal PSA is raised. Thus, the ferroelectric capacitor of the selected cell is electrically short-circuited. Thus, internal nodes of the upper right and upper left block units and /SBL are made to be 0V. Simultaneously or before or after the foregoing operation, the bitline pair /BL and BL are electrically short-circuited, the potential of the bitline pair is made to be (½)VBLH. Thus, the standby state is restored.

In this embodiment, the precharge potential of the bitline is set to be (½)VBLH. The foregoing structure can be realized because the load capacities for reading information in the cell by the polarization inversion are the sub-bitlines /SBL and SBL. The bitlines /BL and BL are not the load capacities for reading information in the cell by the polarization inversion. Therefore, when only short-circuiting of the bitline pair enables the precharge potential of (½)VBLH to be obtained. Thus, similarly to the conventional DRAM, the power consumption which takes place owning to charge/discharge of the bitline can be halved as compared with the conventional FRAM. Moreover, noise caused from charge/discharge of the bitline can be reduced.

This embodiment described with reference to FIG. 9 which is a circuit diagram and FIG. 10 which shows the example of the operation has the structure similarly to the previous suggestion performed by the inventors of the present invention. That is, the ferroelectric capacitors and cell transistors are connected in parallel with one another to form one cell. A plurality of obtained cells are connected in series so that the block unit is constituted. Thus, the cell having the high density of $4F^2$ can be realized, the structure of a planar transistor which can easily be manufactured is employed and higher-speed random access function can be obtained.

The conventional FRAM has the problem in that raising of the density causes the design rule to be reduced, the area of the ferroelectric capacitor is reduced with substantially the square of the design rule. Thus, the capacity of the bitline is not reduced in spite of reduction in the polarization of the ferroelectric capacitor of the memory cell. Thus, the amount of read signals is reduced and, therefore, the operation cannot easily be performed. On the other hand, this embodiment has the structure that one end of the block unit is connected to the gate of the amplifying transistor and the drain terminal is connected to the bitline. Thus, polarization inversion reading of the memory cell enables data read to one end of the block unit to be amplified and transferred to the bitline.

At this time, the load capacity CL realized when the ferroelectric capacitor is polarization-inverted is the capacity from the right-side terminal of CF1 to /SBL and those of the nodes in the cell of the upper right block unit. Therefore, a considerable smaller value as compared with the capacity of the bitline can be employed. Even if the size of the ferroelectric capacitor is reduced, an amount of signals read to /SBL, that is, the value of Vs which is ½ of the difference between 2Vs+Vo in a case of data "1" and Vo in a case of data "0", can be increased. The foregoing value is amplified by the amplifying transistor Q5. Therefore, a stable operation can be performed even if the bitlines /BL and BL have a considerably large capacity. If the capacity of the cell block is ¹⁄₁₀ of the capacity of the bitline of the conventional FRAM, the operation can be performed in a case in which the area of the ferroelectric capacitor is reduced to about ¹⁄₁₀.

Conversely, according to this embodiment, even if the capacity of the bitline is increased, the amplifying transistor requires a long time to amplify the signal read to the bitline. Therefore, arbitrary increase in the capacity of the bitline is permitted. That is, the number of cell blocks connected to one bitline can arbitrarily be increased. Therefore, the problem experienced with the conventional FRAM and arisen in that the area of the sense amplifier is 15% to 20% of the area of the chip can be overcome. Therefore, the number of cell blocks connected to the bitline can be increased, the number of sense amplifiers is reduced and the overhead of the area of the sense amplifier can substantially be eliminated. As a result, an effect can be obtained in that the size of the chip can be reduced.

This embodiment enables the load capacity CL in the cell block to easily be changed by changing the number of series-connected cells in the block unit. The foregoing fact means that design is required to be performed such that the number of series-connected cells is increased to increase CL when the size of the ferroelectric capacitor is large. When the size of the ferroelectric capacitor is small, design is required to be performed such that the number of series-connected cells is reduced to reduce CL so as to maintain the amount of signals read to the sub-bitline. If the load capacity CL is small, the potential read to the sub-bitline can be increased. However, since the total amount of charges is small, a problem of a software error owning to a diffusion layer of the sub-bitline when data is read from the cell is raised.

The foregoing problem can effectively be overcome by adjusting the number of series-connected cells. That is, if the design rule is relaxed and the software error is in a severe state, the number of series-connected cells in the block unit is increased to add the load capacity. Thus, Qs=Vs×CL can be realized. If Vs is somewhat lowered, Qs can be increased. Therefore, large quantity of inversion charges can be read to the sub-bitline. As a result, the abovementioned problem can be overcome. As the design rule is reduced and as the software error rate is lowered, the number of series-connected cells is required to gradually be reduced to a degree with which the software error is not made. Thus, the amount of signals read to the sub-bitline can be maintained.

Figure 1A:
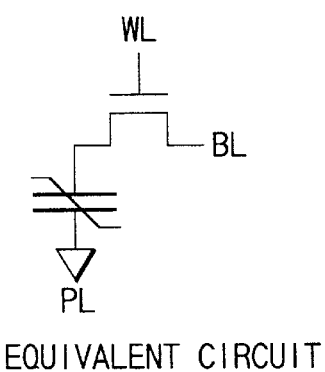
FIGS. 1A to 1D are diagrams showing the structure of a conventional ferroelectric memory.
Figure 1B:
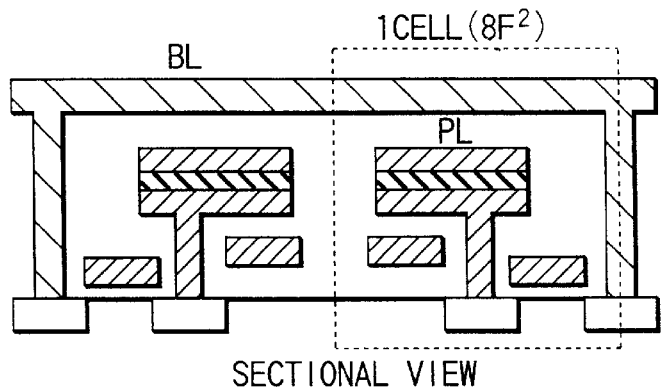
Figure 1C:
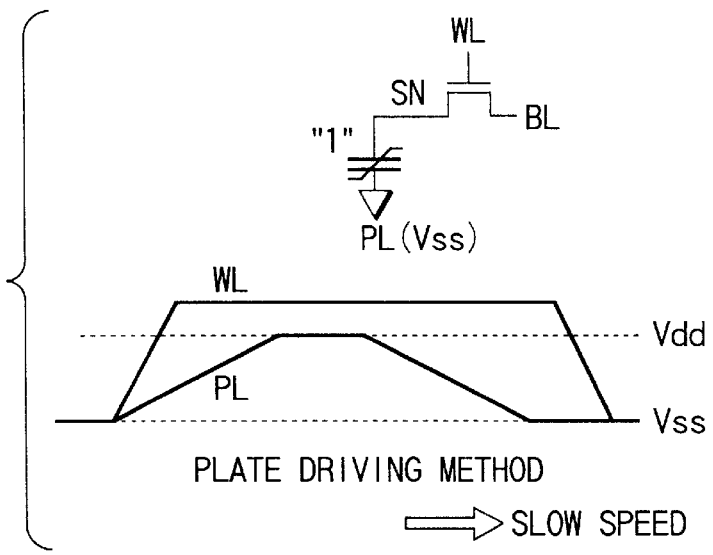
Figure 1D:
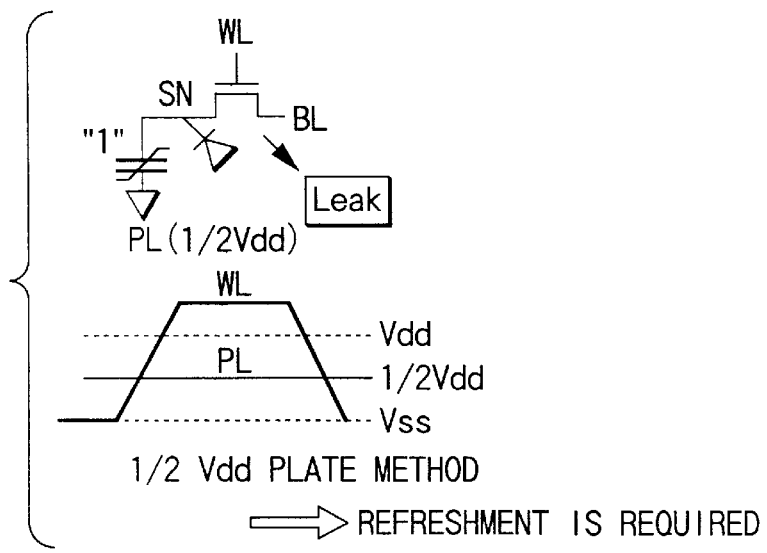
Figure 2A:
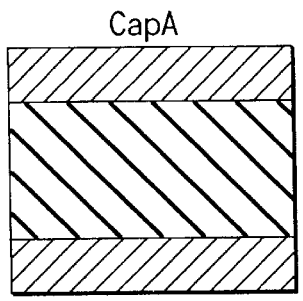
FIGS. 2A to 2C show change in the characteristics when the thickness of a ferroelectric film is reduced.
Figure 2B:
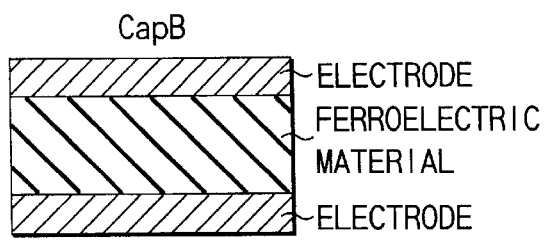
Figure 2C:
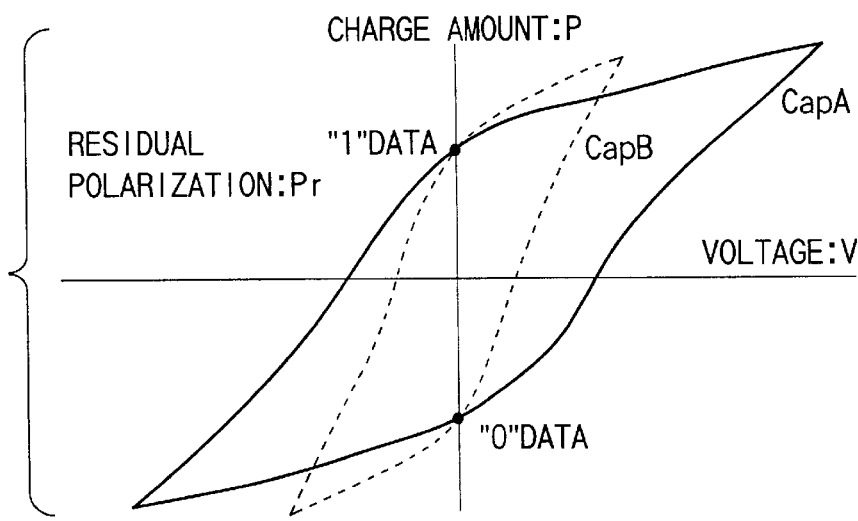
Figure 3:
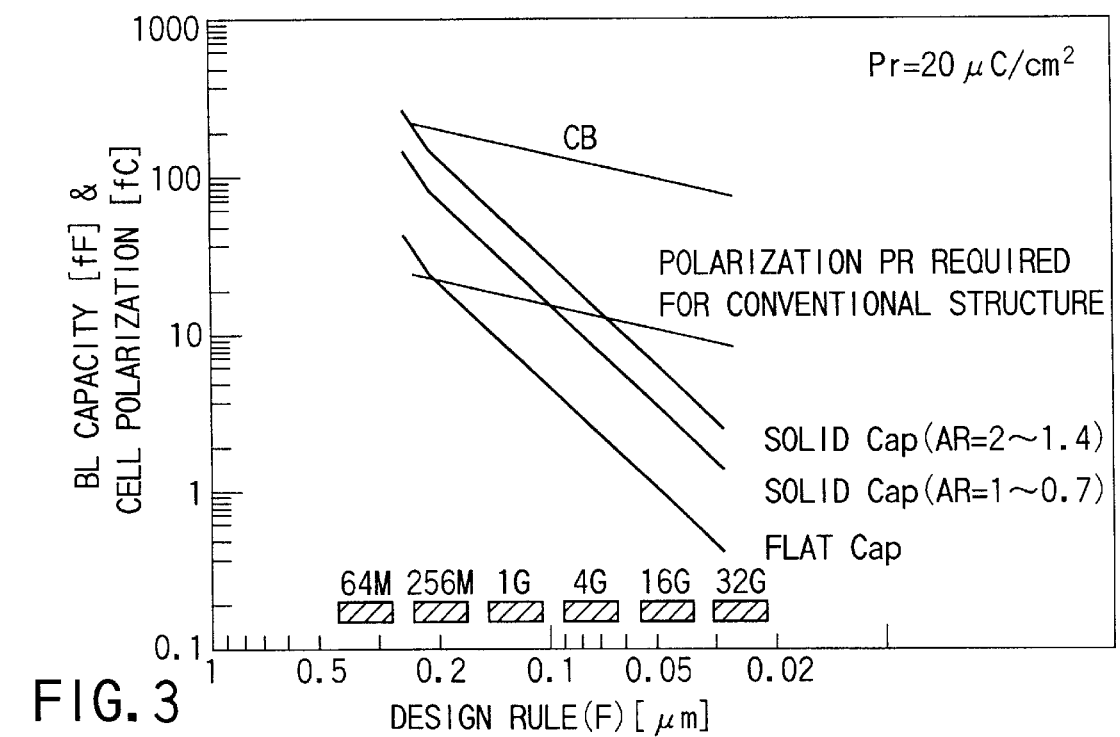
FIG. 3 is a graph showing design rules, capacities of a bitline, required amounts of polarization of a cell and enabled amounts of a conventional ferroelectric memory.
Figure 4:
FIG. 4 is a diagram showing a list of conventional ferroelectric memories each having a self-amplifying function.

If the foregoing adjustment is employed for the conventional memory cell having the self-amplifying function, the structure is limited to the cell shown in FIG. 4D. What is worse, the area of the ferroelectric capacitor is increased excessively and a too large cost is required. As compared with the conventional memory cell having the self-amplifying function, the stable and normal operation which can be performed by the cell having the large ferroelectric capacitor and shown in FIG. 4D can be performed. Moreover, this embodiment enables the amplifying transistor and the write transistor to be shared as the number of cells in one block unit is increased. As a result, the overhead of the size of the cell can significantly be reduced.

In the circuit shown in FIG. 9, the right and left block units share the amplifying transistor and the block writing select transistor. Therefore, the overhead of the foregoing units is small. To solve the change in the value overhead CL, the cell block structure according to this embodiment is arranged such that at least the internal capacity of the block units opposite to the selected block units is added to the capacity of the other amplifying transistors and the like, depending on the positions of the selected cell in the block unit. Thus, the load capacity is obtained. Therefore, dependency of the position of the selected word line on the value of CL is reduced to ½ or lower. AS can be understood from the operation shown in FIG. 10, sharing of the sub-bitline by the right and left block units can be realized by introducing the plate select transistor structured as shown in FIG. 9 to turn off the plate select transistor of the block unit opposite to the selected block unit.

Another characteristic of the operation shown in FIGS. 9 and 10 lies in the method of lowering the potential of BL opposite to the bitline pair by the amplifying transistor when the potential of /SBL is raised in response to a signal in the cell.

When the signal read to the bitline is amplified by the sense amplifier, the potential of /BL is raised. As a result, rewriting is permitted such that the potential of /SBL is raised to a positive level through the block writing select transistor. Thus, coherence can be maintained. In the case of the above-mentioned method, the source of the amplifying transistor is inevitably VSE. Thus, the potential of the sub-bitline (/SBL and SBL) is as it is the potential between the gate and the source. Therefore, control can easily be performed because the amplifying transistor is always turned on in the case of data "1" and the same is always turned off in the case of data "0" regardless of the potential of the bitline. Namely, if the potential of the bitline is lowered owing to amplification, the potential between the gate and the source is constant. The potential between the drain and the source can be made to be a high level of (½)VBLH. The operation is the pentode operation and a constant electric current is used to perform the operation. Therefore, the foregoing fact means that the dummy cell can easily be manufactured.

As a matter of course, the circuit shown in FIG. 9 has the 1-transistor+1-capacitor. The foregoing structure can be realized by changing the operation of the 2-transistor+2-capacitor method with which one information item is stored in two cells. The foregoing structure can easily be realized by changing the structure shown in FIG. 10 such that also PLA is operated as well as /PLA to operate BS1 from Low→High→Low as well as BS0. For example, a method may be employed to realize the foregoing structure such that a test of the 1-transistor+1-capacitor is performed to screen defective cells so as to be substituted by a redundancy circuit. Then, the actual product is operated by the 2-transistor+2-capacitor which is a reliable structure.

As shown in FIG. 10, as compared with the conventional FRAM, this embodiment permits a high-speed operation because of no factor for reducing the operation speed except for the overhead occurring when the block writing select signal is clocked after the cell is read. When merit of this method is considered in that the timing at which WLA0 is lowered and the timing at which equalization of the bitline is suspended can simultaneously be performed, the foregoing overhead can be compensated.

The conventional FRAM have problems which arise in that the plate must be separated for each cell. Moreover, the load of the ferroelectric capacitor of the plate is heavy and the resistance of the plate is high. Moreover, the driving performance of the driver is low because the size of the plate driver cannot be increased (if the size is increased, the size of the chip is increased because the plate driver is provided for each word line) and the operation speed of the plate is low. Similarly to the previous suggestion performed by the inventors of the present invention, this embodiment enables a plurality of word lines to share the plate driver. Therefore, great driving performance can be realized. Since the number of plate lines is small, a metal circuit can be employed and the width of each line can be increased. Thus, the resistance factors can be reduced. Since the load capacity is substantially determined by the capacity of the ferroelectric capacitor, the capacity is not changed. As a result, a high-speed drive can be performed.

The effects obtained from the structures shown in FIGS. 9 and 10 are summarized as follows.

(1) Similarly to the previous suggestion performed by the inventors of the present invention, a high-density cell having the $4F^2$ size can be realized by the planar transistor which can easily be manufactured. Moreover, a high-speed random access function can be obtained.

(2) If the design rule is reduced and the area of the ferroelectric capacitor is reduced, the capacity of the sub-bitline, which is the load capacity at the time of the polarization inversion, can be reduced to correspond to the reduction in the area. As a result, a sufficiently high voltage for reading a signal can be obtained. Since the amplifying transistor is used to amplify the bitline, a stable operation can be performed.

(3) Precharging of the bitline to (½)Vdd (=VBLH) can be employed to reduce power consumption and eliminate noise.

(4) Similarly to the conventional FRAM, the principle of the operation is simple and a high-speed operation can be performed owing to the high-speed operation of the plate.

(5) Even if the bitline has a large capacity, reading is permitted. Therefore, the number of cell blocks which are connected to the bitline can be increased. As a result, the area of the sense amplifier can be reduced.

(6) Optimization is permitted by reducing the series-connected cells in the block unit to correspond to reduction in the polarization of the ferroelectric capacitor owning to reduction in the design rule.

(7) In a state in which the design rule is relaxed and the software error is in a severe state, the number of series-connected cells in the block unit is increased and the load capacity is added to enlarge the reading charge, software error can be prevented. As the design rule is reduced and as the software error rate is lowered, the size of the ferroelectric capacitor and the number of series-connected cells are required to gradually be reduced to a degree with which the software error does not raise a problem. Thus, an amount of signals read to the sub-bitline is maintained.

(8) A plurality of cells in the block unit share the amplifying transistor and the write transistor. Thus, the overhead of the size of the cell can significantly be reduced.

(9) When the right and left block units share the amplifying transistor and the block writing select transistor, their overhead can furthermore be reduced.

(10) As the load capacity for the polarization inversion, the internal capacity of the block unit opposite to the selected block unit is used so that substantially stable operation is performed.

(11) When the number of cells in the block unit is changed, the load capacity can arbitrarily be adjusted.

(12) The signal of the sub-bitline is used to cause the amplifying transistor to drive the bitline opposite to the bitline pair so that a stable amplifying operation is performed.

FIG. 11 is a signal waveform showing an example of the specific operation of FIG. 9. The graph is different from that shown in FIG. 10 in only a structure in which bitlines /BL and BL are precharged to Vdd (precharged to VBLH). The foregoing structure is inferior to the structure shown in FIG. 10 in that the Vdd precharging method results in increase in the power consumption and noise of the power supply. The foregoing structure is superior to that shown in FIG. 10 in that the voltages of the drains of the amplifying transistors Q5 and Q6 shown in FIG. 9 are precharged to VBLH before the transistor is operated. Therefore, voltage Vds=VBLH, which is two times the voltage which is applied in the case shown in FIG. 10 is applied between the drain and the source. Therefore, the electric current which flows in the amplifying transistor is doubled. As a result, the speed at which the difference in the potential between the bitline pair /BL and BL is doubled.

Figures 12A, 12B:
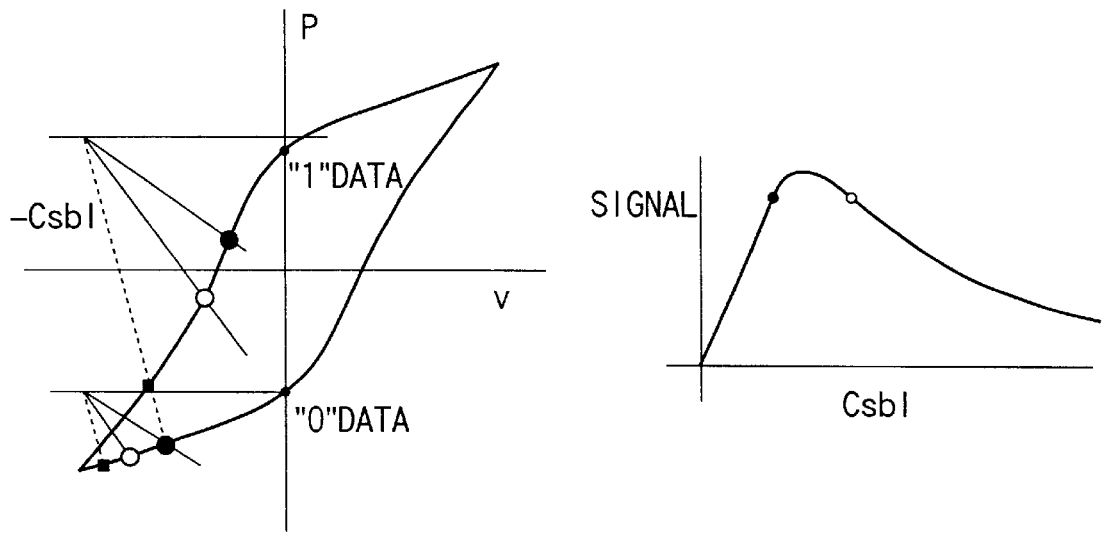
FIGS. 12A and 12B are diagrams showing design of operation point which can be applied to the present invention.

FIGS. 12A and 12B are diagrams showing design of the operation point which can be applied to this embodiment. In the circuit shown in FIG. 9, even if the design rule is reduced and the area of the ferroelectric capacitor is reduced with the square, the load capacity in the cell block is moderately reduced. Therefore, if the number of cells in the block unit is constant, a solution is obtained in only a case of a certain design rule. Particularly in a case of the conventional ferroelectric memory cell having the self-amplifying function, a solution is obtained in only a case of a certain design rule if the size of the cell is constant. On the other hand, change of the number of series-connected cells in the block unit to 4, 16, 32, 64, 128 or 256 enables an optimum load capacity CL to be set. Therefore, even a planar ferroelectric capacitor is able to have a solution from a low integration structure to a high integration structure.

FIG. 12B shows signal voltages read to the sub-bitline when the number of series-connected cells is changed to change CL. The signal voltage is able to have a maximum value owing to the polarization/capacity ratio of the ferroelectric capacitor and the paraelectric capacitor. Therefore, CL near the maximum value is required to be designed. Since the circuit shown in FIG. 9 has the structure that the amount of change is made to be two times or smaller owing to the capacity of the opposite block unit. However, the position of the selected word line changes the load capacity CL.

FIG. 12A shows deviation of the operation point when CL is changed by about two times in a case of a PZT film. Black circles indicate a state in which CL is small, while white circles indicate a state in which CL is large. Also in this case, inversion of the amount of reading signal is prevented between the cases of data "1" and data "0". Thus, a stable operation can be realized. In a case of a material, such as SBT or stained BST, having a hysteresis curve near a rhomboid, a determination operation is furthermore permitted. The characteristic that the amount of reading signal has a maximum value as in the case shown in FIG. 12B is used to perform the design such that the operation point is aligned to the black circle point when CL is small and the operation point is aligned to the white circle point when CL is large. Thus, the amount of reading signal can be maximized. Although the amount of signal can be maximized in the foregoing case, the operation point is deviated. Therefore, a method must be employed with which the reference position of the dummy cell is shifted to correspond to the position of the selected word line as shown in the rear portion.

Figure 13:
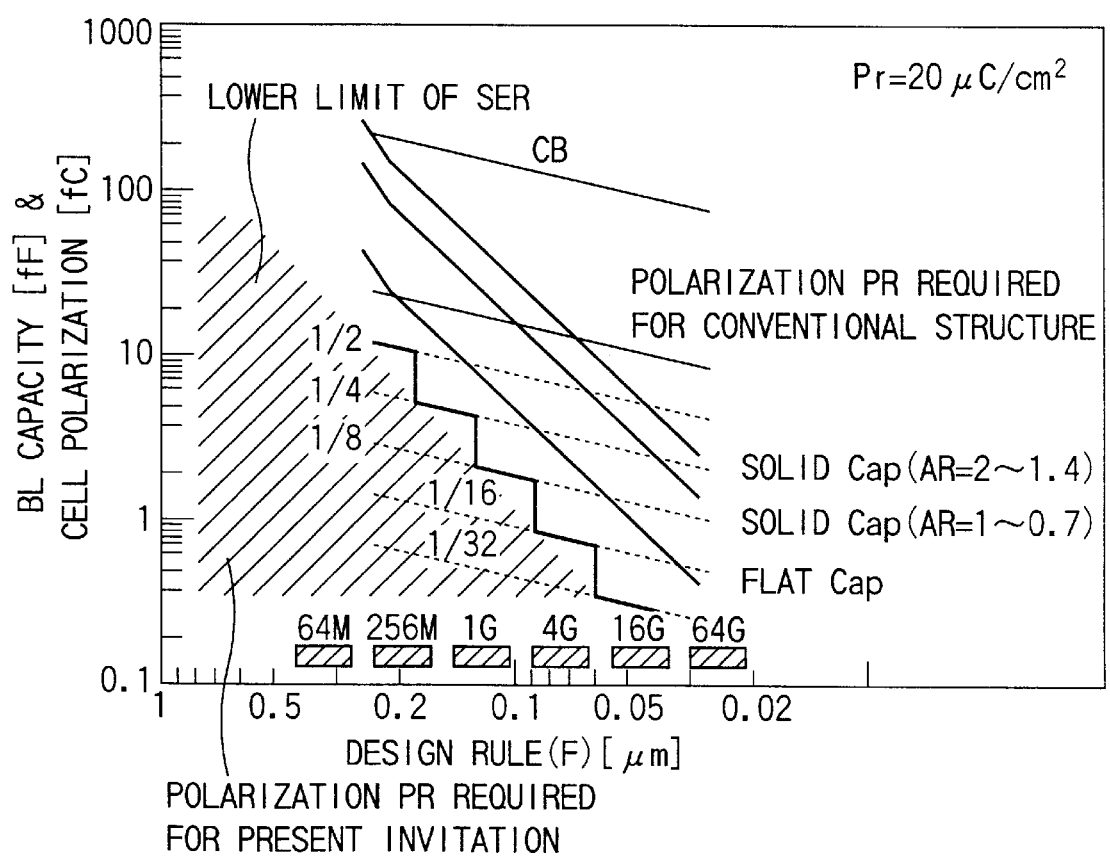
FIG. 13 is a diagram showing a guideline for designing the structure of the array which can be applied to the present invention.

FIG. 13 is a diagram showing a guideline for designing the structure of the array which can be applied to this embodiment. The abscissa axis stands for design rules and ordinate axis stands for capacities of bitlines of a FRAM and residual polarization for each cell. An assumption is made that the capacity of the bitline is 512 WL/BL. The capacity is slightly reduced owing to fining (reduction in the design rule). The line indicating the amount Pr of polarization required for the conventional structure indicates a minimum polarization Pr for each cell from an equation Vs=Pr/Cb on an assumption that reading signal: Vs is 110 mV.

In proportion to reduction in the capacity Cb of the bitline, the residual polarization is reduced. However, the reduction rate is moderate. On the other hand, an assumption is made that the residual polarization of a ferroelectric material is 20 $\mu C/cm^2$. In the foregoing state, residual polarization obtained when the ferroelectric capacitor is realized by the planar capacitor of the design rule are indicated with a line of planar Cap. Residual polarization obtained when the solid capacitor is employed and the aspect ratio of the base and the height is made to be 1 to 0.7 are indicated with solid Cap (AR=1 to 0.7). Residual polarization obtained when the solid capacitor is employed and the aspect ratio of the base and the height is made to be 2 to 1.4 are indicated with solid Cap (AR=2 to 1.4). An assumption is made that the area of the base of the ferroelectric capacitor is $3F^2$ (F is the design rule).

The thus obtained residual polarization for each cell is reduced with substantially the square of the design rule. Therefore, the residual polarization is rapidly reduced as the design rule is reduced. Therefore, when the conventional FRAM has the structure that a ferroelectric capacitor is formed by a planar structure, a limit exists at a 256 Mb FRAM in the 0.2 $\mu$m rule. The ferroelectric capacitors usually have anisotropy and axiality on the polarization. Therefore, a satisfactory large residual polarization cannot be obtained from the solid capacitor. There has not been any report showing realization by using the solid capacitor. Even if the solid cap is able to realize the foregoing residual polarization, there are limits at 1 Gb FRAM and 4 Gb FRAM, as shown in FIG. 13. The foregoing structures corresponds to the conventional FRAM which is capable of realizing the maximum area of the base of $3F^2$. The previous suggestion performed by the inventors of the present invention with which a cell size of $4F^2$ which is 50% of the conventional structure can be realized. However, a bottom area of the base of the capacitor of $F^2$ can be realized.

Therefore, the structure suggested previously realizes a further poor result.

As compared with the conventional structure in which the capacity of the bitline is the load capacity, this embodiment causes the capacity of the sub-bitline to be the load capacity CL. Therefore, when the number of series-connected cells in the block unit is gradually reduced in substantially proportion to the reduction in the area of the ferroelectric capacitor, the amount of signals read to the sub-bitline can always be maintained for each generation. When the bitline is amplified by the amplifying transistor, a normal operation can be performed.

Thick and solid lines shown in FIG. 13 indicate residual polarization required for the ferroelectric capacitor to perform a normal operation when the number of cells in the block unit is changed to reduce the capacity of the sub-bitline to ½, ¼, ⅛, 1/16 and 1/32 on an assumption that the capacity of the conventional bitline is 1. The values indicated with the solid lines do not rise a problem if a value is employed which is always larger than the lower limit of the software error for each of the generation of the design rule. If the area of the diffusion layer is large and electrons of electron-positive hole pair generated owning to impact of all a rays are absorbed by one diffusion layer, the software error is made to be constant at about 80 fC. When the area of the diffusion layer is reduced, electrons are dispersed and absorbed by adjacent diffusion layers. To prevent a software error in a design rule of 0.25 $\mu$m, about 20 fC is required. As the design rule is reduced, the lower limit of the software error is lowered in proportion to the area of the diffusion layer.

As can be understood from FIG. 13, according to this embodiment (according to the design guideline of this embodiment), even a planar ferroelectric capacitor is able to realize 16 Gb FRAM to 64 Gb FRAM or furthermore high-density FRAM while the potential of the reading signal is maintained and a software error is prevented. The FRAM is free from the problem of the data retention which arises in that accumulated charges are discharged from the diffusion layer to destroy data and which is experienced with the DRAM. The software error (a bit-line mode: correctly, it is called as a sub-bit-line mode in the present invention) at the time of reading and the amount of reading signal determine the minimum residual polarization. Therefore, the method as shown in this embodiment is considerably effective Although a cell mode exists in the software error, the FRAM is free from a problem because the potential between both the ends of the ferroelectric capacitor can be made to be 0V at the time of standby as described in the previous suggestion performed by the inventors of the present invention. In a case of the structure shown in FIG. 9, no problem arises because both the ends of the ferroelectric capacitor are short-circuited at the time of standby.

(Second Embodiment)

Figure 14:
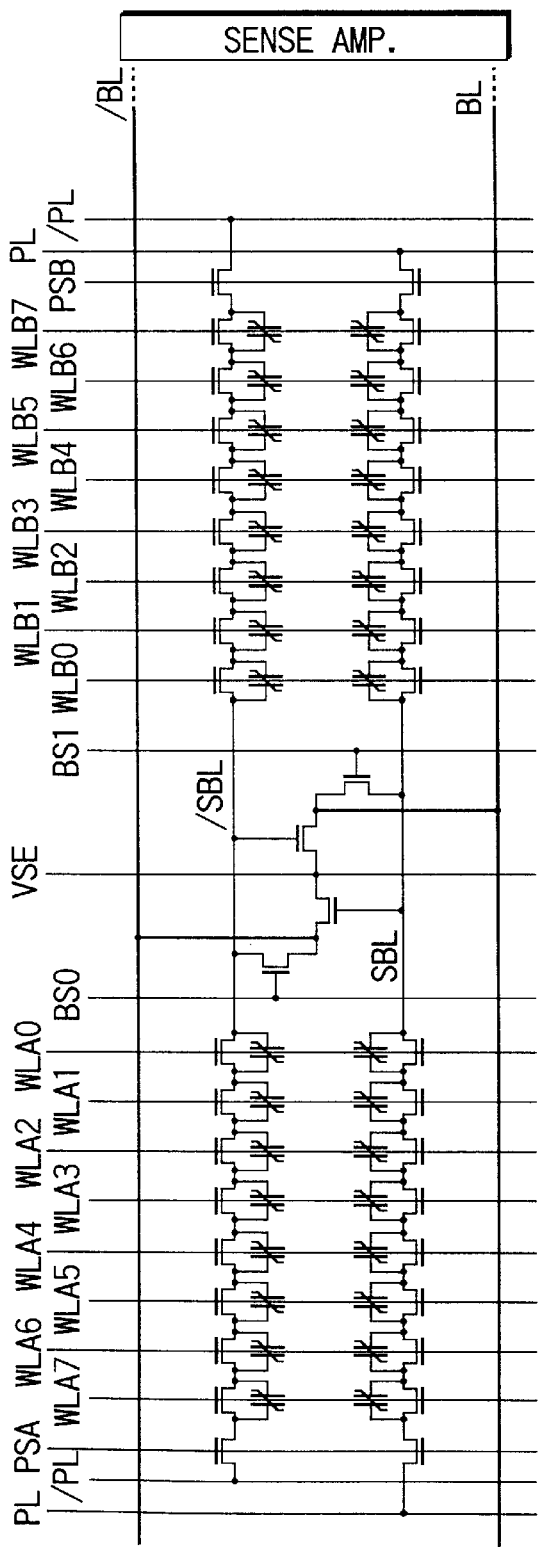
FIG. 14 is a circuit diagram showing the structure of blocks of a ferroelectric memory according to a second embodiment.

FIG. 14 is a circuit diagram showing a semiconductor memory device according to a second embodiment of the present invention, in which the block structure of the ferroelectric memory is illustrated.

FIG. 14 is different from FIG. 9 in that the number of series-connected cells in the block unit is increased to eight. As a result, overhead for each cell, such as the plate select signal, the block writing select signal and the amplifying transistor can be halved. As described above, the area of the ferroelectric capacitor is used to change the optimum load capacity CL to that shown in FIGS. 12A, 12B and 13. Thus, the amount of signal read to the sub-bitline can be maintained for each generation. When the bitline is driven by the amplifying transistor, a normal operation can be performed. Other effects are similar to those obtained from the structure shown in FIG. 9.

When the number of series-connected cells in the block unit is increased to 16, overhead for each cell can be halved and the optimum load capacity CL can be changed. As described above, the number of series-connected cells in the block unit can arbitrarily be changed. The number of series-connected cells may be changed to 32, 64, 128 and 256 (not shown). Other effects are similar to those obtained from the structure shown in FIG. 9.

(Third Embodiment)

Figure 15:
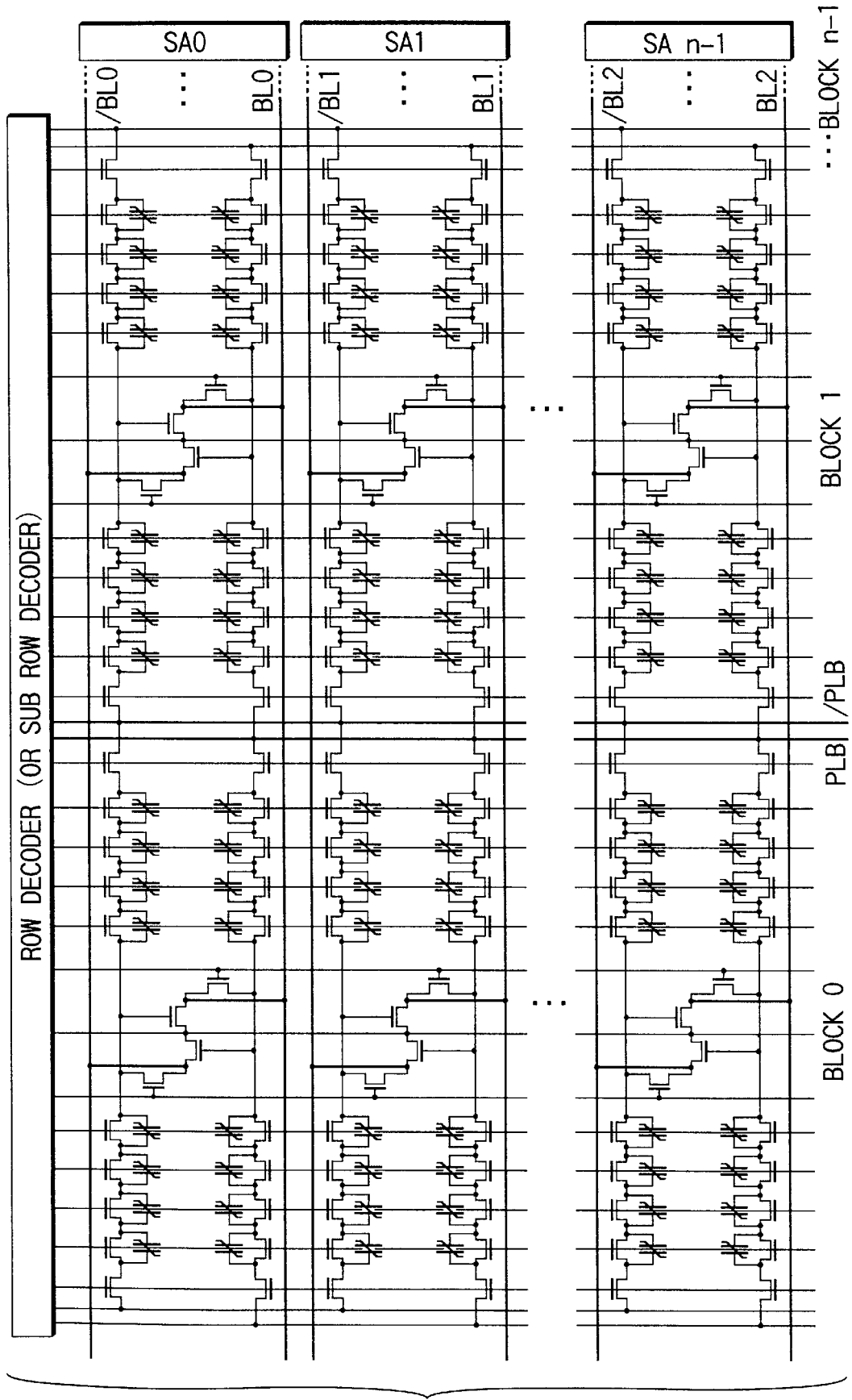
FIG. 15 is a circuit diagram showing the overall structure of a memory mat (a cell array) of a ferroelectric memory according to a third embodiment.

FIG. 15 is a circuit diagram showing a semiconductor memory device according to a third embodiment of the present invention, in which the overall structure of a memory mat (a cell array) of the ferroelectric memory is illustrated.

In this embodiment, the cell blocks shown in FIG. 9 are two-dimensionally disposed and low decoders and sense amplifiers (SA0 to SAn–1) are connected to one another. As an alternative to the low decoders, a hierarchy word line method may be employed with which sub-low decoders are employed. The plate lines PLB and /PLB shown in FIG. 15 are arranged such that the right and left cell blocks share the plate line so that the size of the array is reduced. Moreover, the area of the plate driving circuit can be reduced. Conversely, the driving performance can be improved. A flip-flop type sense amplifier circuit similar to that provided for the conventional FRAM may be employed as the sense amplifier circuit. In cases of the operations shown in FIGS. 10 and 11, design must be performed such that precharge of the bitline is made to be (½ VBLH) and VBLHH. Other effects are similar to those obtained from FIG. 9.

(Fourth Embodiment)

FIGS. 16A and 16B are circuit diagrams showing a semiconductor memory device according to a fourth embodiment of the present invention, in which the structure of the sense amplifier and the block structure of the cell array are illustrated. In the illustrated example, a plurality of cell blocks (Gain Cell Block 0 to n–1) each having the self-amplifying function and structured as shown in FIG. 9 are connected to the bitlines /BL and BL so that bitline pairs are constituted. The plural bitline pairs are disposed along the direction of the word lines to constitute an array (not shown). Each of the bitline pairs are connected to the sense amplifier circuit through an array-sense amplifier separation transistor having a gate to which ⌀t0 is input.

In the example shown in FIG. 16B, also cell arrays are disposed on the right side of the sense amplifier circuit. Moreover, the bitline pairs are connected to the sense amplifier circuit through the array-sense amplifier separation transistor having a gate to which ⌀t1 is input. The foregoing structure is different from that shown in FIG. 16A. The circuit shown in FIG. 16B constitutes the right and left cell arrays sharing the sense amplifier circuit. FIG. 16A shows an example in which no sharing is performed. In this example, the array-sense amplifier separation transistor having the gate to which ⌀t0 is input may be omitted. The examples shown in FIGS. 16A and 16B incorporates the dummy cell disposed in the sense amplifier. FIG. 16B shows a fact that the right and left cell arrays are able to share the dummy cell.

The sense amplifier circuits shown in FIGS. 16A and 16B are able to realize the operation shown in FIG. 10. /EQL signal equalizes the bitline pair and simultaneously precharges the same to VBL (=(½)VBLH). Note that SEN and /SEP operates a flip-flop amplifier incorporated by nMOS and PMOS transistors. Symbols CSL represent a column select signal. Thus, data of a signal line (/BLSA and BLSA) amplified by the sense amplifier is transmitted to data line /DQ and DQ. Alternatively, data is written from /DQ and DQ. When the potential of VBL is set to be VBLH, the operation shown in FIG. 11 can be realized.

Figure 17:
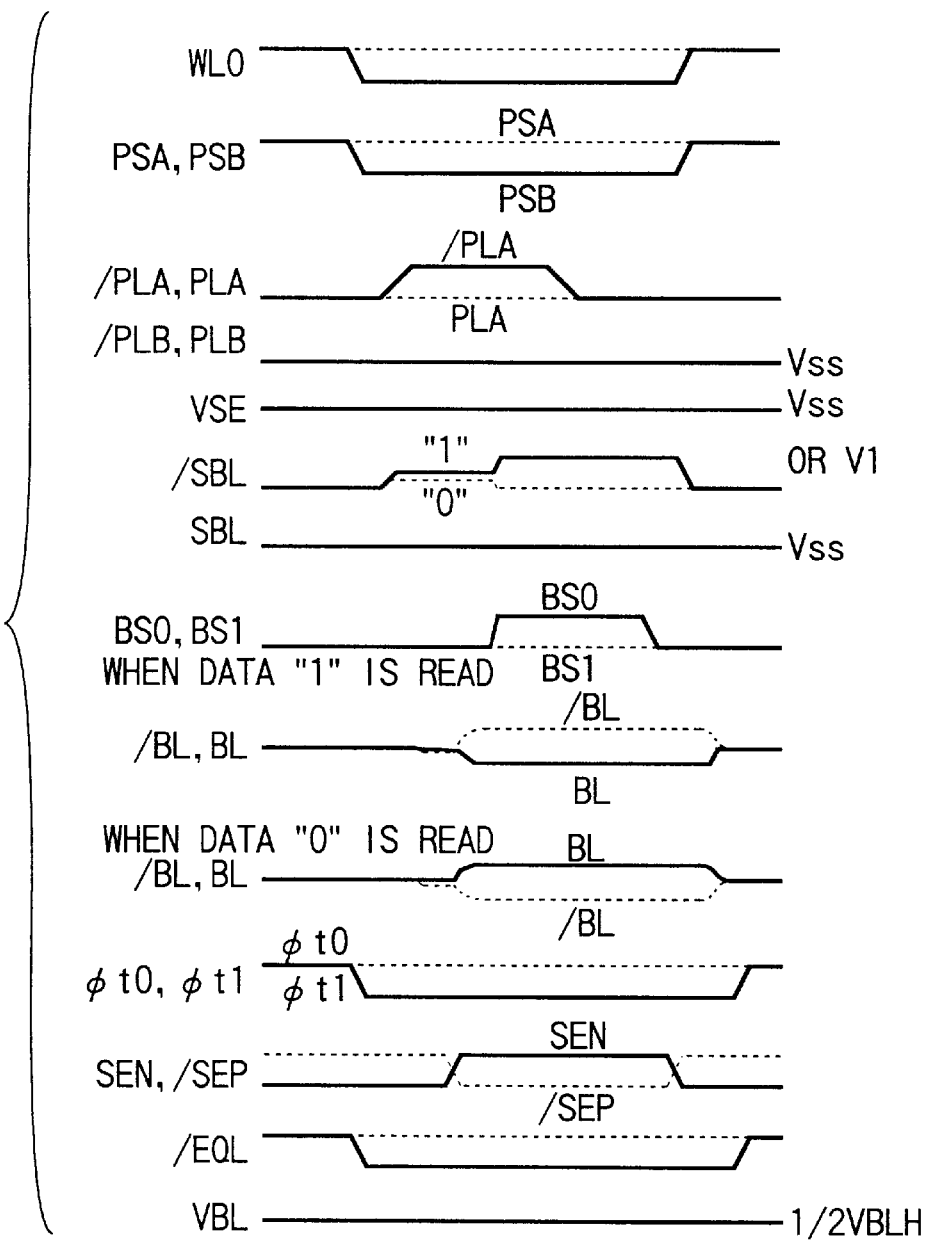
FIG. 17 is a signal waveform showing an example of a specific operation of the embodiment shown in FIGS. 16A and 16B.

FIG. 17 is a signal waveform showing an example of the specific operation of FIG. 16. An example the operation is shown which is performed when the cell block shown in FIG. 9 and the array structures shown in FIGS. 16A and 16B are employed. That is, the operations of signal lines shown in FIGS. 16A and 16B are added to the example of the operation shown in FIG. 10.

In addition to the operation shown in FIG. 10, /EQL is lowered prior to selecting the plates /PLA and PLA to suspend equalization of the bitlines /BL and BL. To simultaneously separate the right-side cell array of the unselected sense amplifier and the sense amplifier from each other, øt1 is made to be Low. Activation of the sense amplifier is performed by using the signal from the sub-bitline /SBL to cause an electric current to flow in the amplifying transistor. After a sufficiently large difference in the potential is generated between the bitline pair /BL and BL, SEN is made to be High and /SEP is made to be Low. Thus, the flip-flop type sense amplifier can be operated. After the block writing select signal BS0 is turned off, SEN is made to be Low and /SEP is made to be High. Thus, the sensing operation is completed. Then, /EQL is made to be High and øt1 is made to be High so that the standby state is realized.

(Fifth Embodiment)

Figure 18:
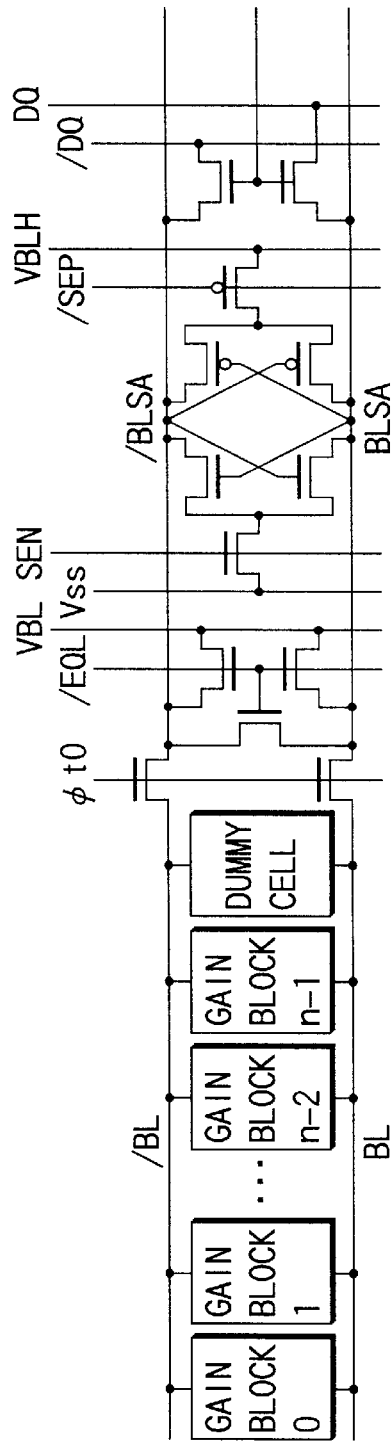
FIG. 18 is a circuit diagram showing the structure of a sense amplifier and blocks of the cell array according to a fifth embodiment.

FIG. 18 is a circuit diagram showing a semiconductor memory device according to a fifth embodiment of the present invention, in which the structure of the sense amplifier and the block structure of the cell array are illustrated.

This embodiment is basically the same as the examples shown in FIGS. 16A and 16B. The difference from the examples shown in FIGS. 16A and 16B lies in that the dummy cell is disposed in the cell array portion. The foregoing structure is suitable to form a process similar to that of the cells in the cell array and a dummy cell having a similar structure.

(Sixth Embodiment)

Figure 19A:
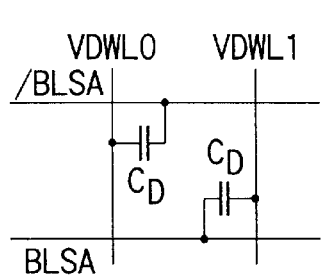
FIGS. 19A to 19C are circuit diagrams showing the structure of a dummy cell according to a sixth embodiment.
Figure 19B:
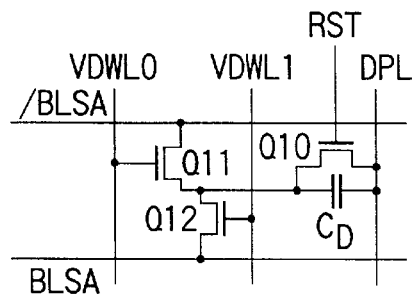
Figure 19C:
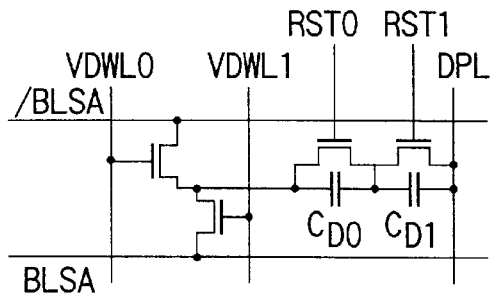

FIGS. 19A to 19C are circuit diagrams showing a semiconductor memory device according to a twelfth embodiment of the present invention, in which the structure of the dummy cell is illustrated. This embodiment may be applied to the embodiment shown in FIG. 9 and following embodiments.

The dummy cell according to this embodiment is connected to the bitline /BLSA and BLSA of the sense amplifier shown in FIGS. 16A and 16B. The connection may be established with the inside portion of the cell array shown in FIG. 18. The dummy cell shown in FIG. 19A simply uses a capacitor for performing coupling to generate a potential of the reference bitline.

Figure 20:
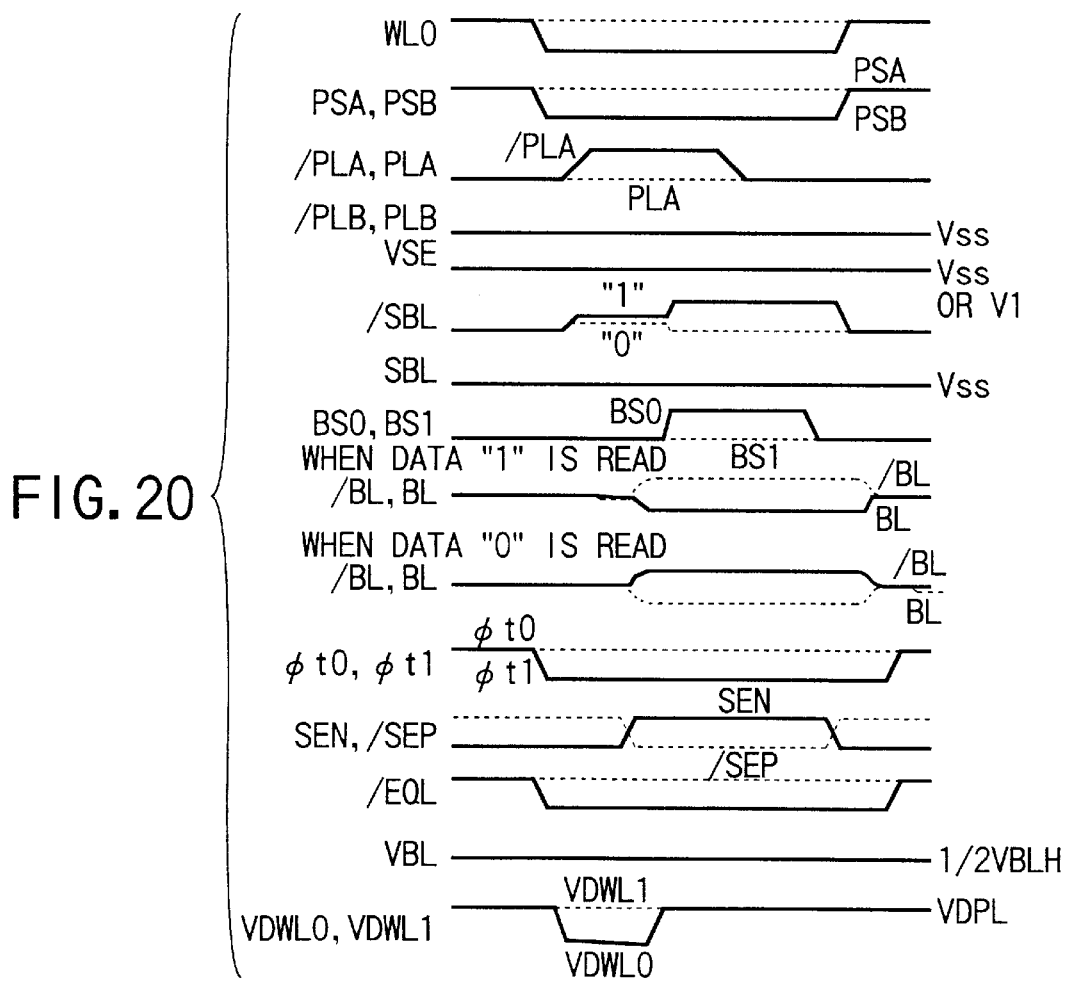
FIG. 20 is a signal waveform showing an example of the operation of the dummy cell shown in FIG. 19A.

FIG. 20 is a signal waveform showing an example of the specific operation of FIG. 19A. The foregoing example is realized by employing the example of the circuit shown in FIG. 9 and the example of the operation shown in FIG. 10. Data is read from the cell to the BLSA portion. When BLSA is in the state of data "1", the potential is lowered from VBLH to (½)VBLH−2Vs. In a state of data "0", the potential (½)VBLH is maintained and the reference bitline /BLSA is made to be an intermediate value between the two states, that is, the potential is made to be (½)VBLH−Vs by lowering the potential of VWDL0. The coupling of the dummy capacitor is used to lower the potential of /BLSA. After the sense amplifier has amplified the bitline pair, the potential of VWDL0 may be raised to the original potential.

FIG. 19B shows a dummy cell adapted to the capacitance coupling method similar to that shown in FIG. 19A. The dummy cell has a dummy capacitor, transistor Q10 for short-circuiting both the ends and resetting, signal RST, transistors Q11 and Q12 for connecting the dummy capacitor to the bitline and dummy word lines VDWL0 and VDWL1. The problem of increase in the area which arises when the MOS gate capacitor is used to form the dummy capacitor is overcome by causing the bitline pair to share the dummy capacitor so that the area is reduced.

FIG. 21 is a signal waveform showing an example of the operation of the dummy cell shown in FIG. 19B. Prior to reading data in the dummy cell, RST is made to be Low so as to suspend the short-circuit of the dummy capacitor. Then, VDWL0 is made to be High. When the potential of VDPL is lower than (½)VBLH, the potential of /BLSA is lowered by a degree corresponding to the coupling of the capacitor so as to be serve as the reference potential. As an applicable example, clocking of DPL may be performed in the structure shown in FIG. 21.

FIG. 19C shows a dummy cell adapted to the capacitance coupling method similar to that shown in FIG. 19B. The difference lies in that two types of dummy capacitors CD0 and CVD1 are provided.

FIG. 22 is a signal waveform showing an example of the operation of the dummy cell shown in FIG. 19C. As shown in FIGS. 12A and 12B, the position of the selected word line causes the load capacity CL (=CSBL) and the potential of the sub-bitline to be varied. As a result, the problem of lowering of the potential of the bitline BL can be overcome. That is, the capacities of CD0 and CD1 are varied to lower RST0 or RST1 as shown in FIG. 22 in accordance with the position of the selected word line. Thus, the problem of change of CL can be overcome in spite of a quantum manner. If the number of CD1 is increased, fine control is permitted. Although the examples shown in FIGS. 20A to 20C incorporate the paraelectric capacitor, the structure may be constituted by using the ferroelectric capacitor.

(Seventh Embodiment)

Figure 23A:
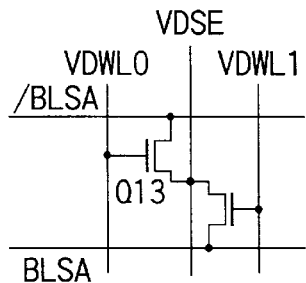
FIGS. 23A to 23C are circuit diagrams showing the structure of a dummy cell according to a seventh embodiment.
Figure 23B:
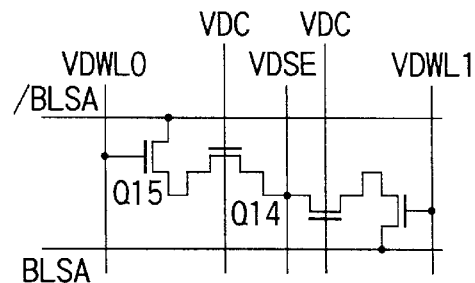
Figure 23C:
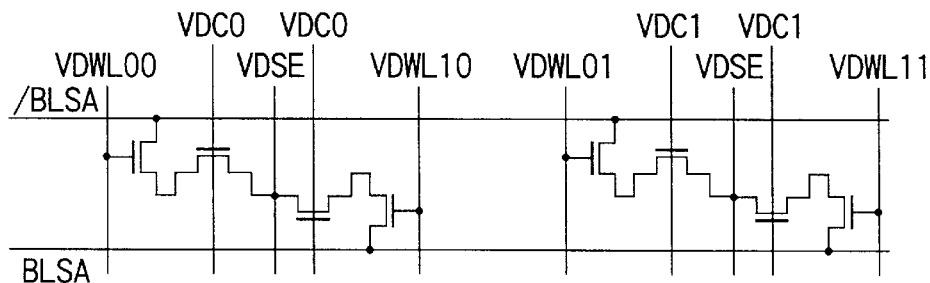

FIGS. 23A to 23C are circuit diagrams showing a semiconductor memory device according to a seventh embodiment of the present invention, in which the structure of the dummy cell is illustrated. The structure of the dummy cell according to this embodiment may be applied to the embodiment shown in FIG. 9 and the following embodiments. The dummy cell according to the present invention is a constant current type dummy cell.

Figure 24:
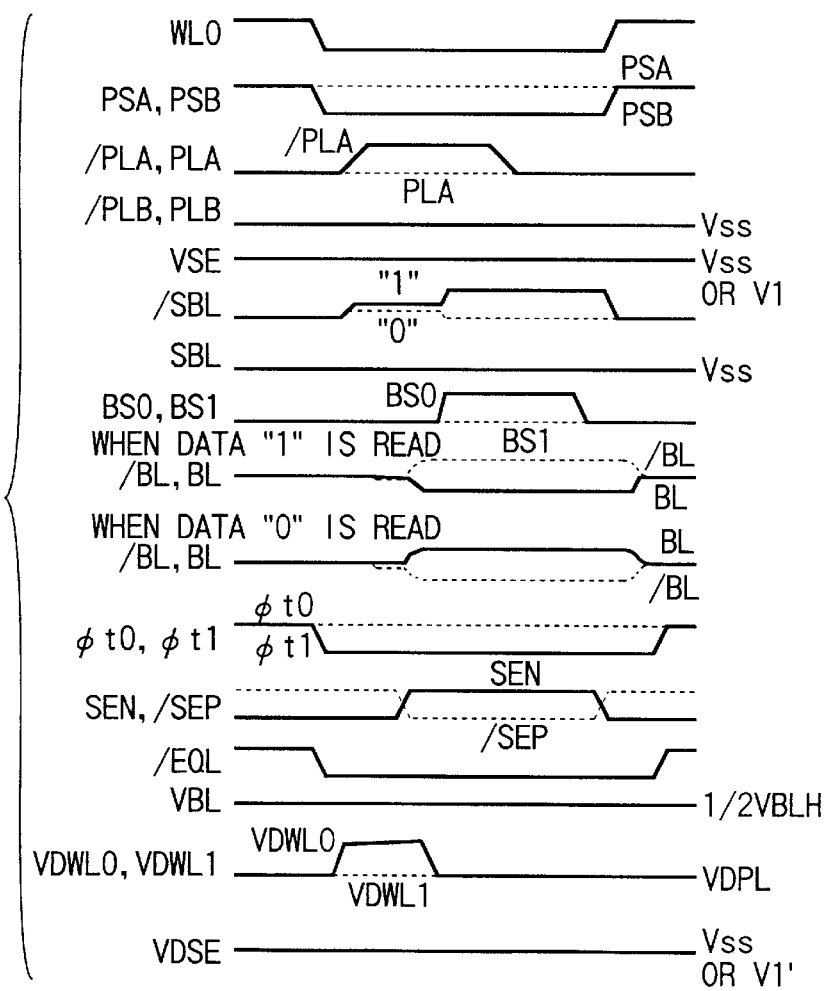
FIG. 24 is a signal waveform showing an example of the operation of the dummy cell shown in FIG. 23A.

FIG. 23A shows a structure in which the dummy cell is constituted by two transistors. FIG. 24 is a signal waveform showing an example of the operation of the dummy cell shown in FIG. 23A. The transistor Q5 shown in FIG. 9 is turned on, causing data "1" to be read to BLSA and the potential of BLSA to be lowered. An electric current which flows in the transistor Q5 in the foregoing state is assumed to be I. In the foregoing case, VDWL0 is made to be High. When the transistor Q13 is turned on and an electric current which flows from /BLSA to VDSE is set to be (½)I, a reference can be generated.

The dummy cells shown in FIGS. 19A to 19C require a sensing operation after a lapse of a predetermined time because the reference potential is fixed though the potential of the bitline BLSA from which the cell data is read is lowered as time elapses. However, the examples shown in FIGS. 23A to 23C have merit that the reference potential can always be set to be an intermediate value between data "1" and data "0". Setting of (½)I can be adjusted by changing the potential of VDSE, the potential of High of VDWL0 and the size of the transistor Q13.

Figures 25, 26:
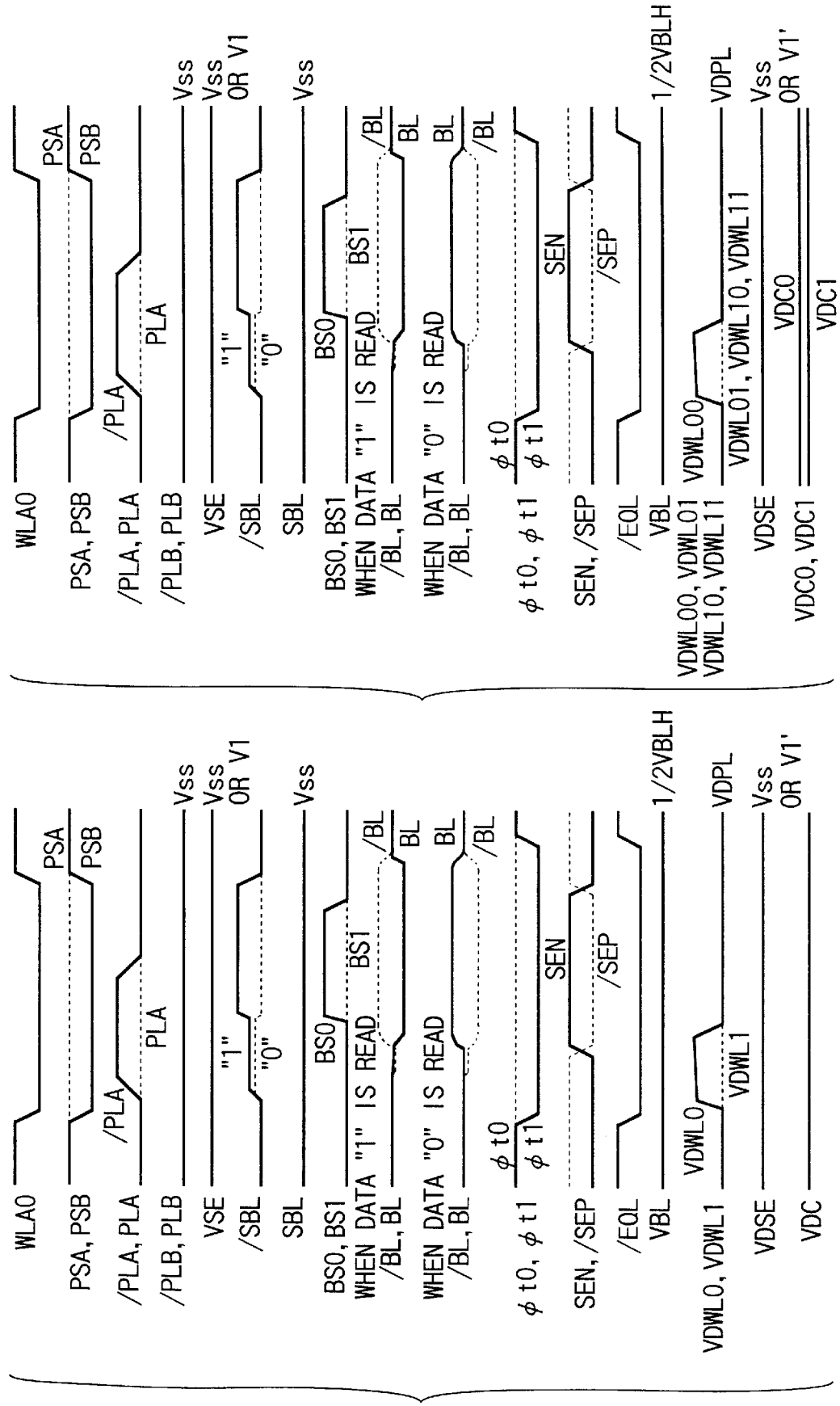
FIG. 25 is a signal waveform showing an example of the operation of the dummy cell shown in FIG. 23B.
FIG. 26 is a signal waveform showing an example of the operation of the dummy cell shown in FIG. 23C.

FIG. 23B shows an example in which the accuracy can be adjusted as compared with FIG. 23A. FIG. 25 is a signal waveform showing an example of the operation of the dummy cell shown in FIG. 23B. The driving performance of a transistor Q15 is made to be larger than that of a transistor Q14 to cause the current (½)I to be limited by the transistor Q14. Also an electric current of the transistor Q14 is arranged to be determined by the potentials of VDC and VDSE. The potential VDWL0 is made to be High to enable the current (½)I to flow. When fine adjustment of the potentials VDC and VDSE from outside by using a fuse or the like is permitted, the accuracy can be improved.

FIG. 23C shows a structure in which a plurality of constant-current type dummy cells shown in FIG. 23B are provided. FIG. 26 is a signal waveform showing an example of the operation of the dummy cell shown in FIG. 23C. Similarly to the example shown in FIG. 19C, either of word lines is selected to overcome the problem that the reading signal varies depending on the position of the selected word line. As an alternative to selecting either of the word lines, both of the word lines are selected to perform finer adjustment.

(Eighth Embodiment)

Figure 27:
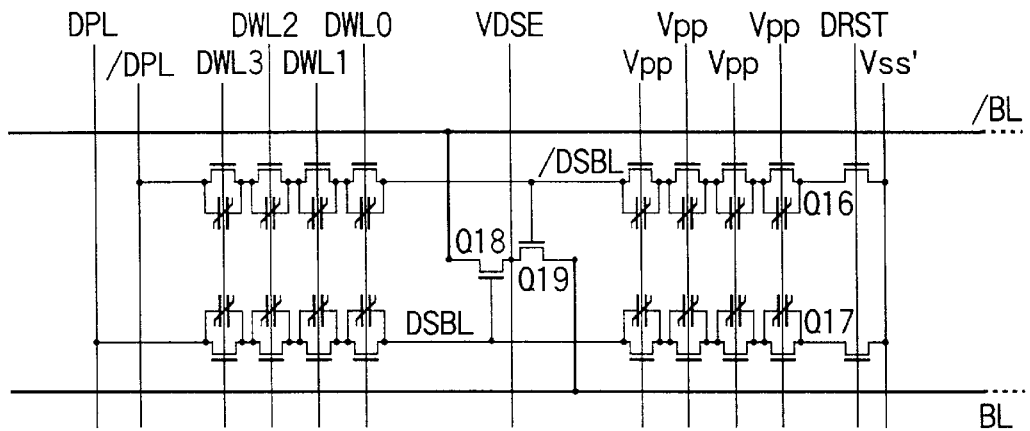
FIG. 27 is a diagram showing the structure of a dummy cell according to an eighth embodiment.

FIG. 27 is a circuit diagram showing a semiconductor memory device according to an eighth embodiment of the present invention, in which the structure of the dummy cell is illustrated. The structure of the dummy cell according to this embodiment may be applied to the embodiment shown in FIG. 9 and following embodiments. As the dummy capacitor, the foregoing example uses a ferroelectric capacitor similar to that of the cell array. The problem in which the load capacity CL shown in FIG. 9 is varied and the potential of the sub-bitline SBL varies depending on the position of the selected word line shown in FIGS. 12A and 12B can be overcome.

Referring to FIG. 27, upper left and lower left block units have the same structures as those shown in FIG. 9 and connected to the dummy word line. The left end is directly connected to the dummy plates DPL and DPL. The upper right and lower right block units are not selected and connected to VPP so as to be connected to fixed potential Vss' through reset transistors Q16 and Q17. The block writing select signal and the transistor for the foregoing signal are omitted. Only the amplifying transistor is provided.

Figure 28:
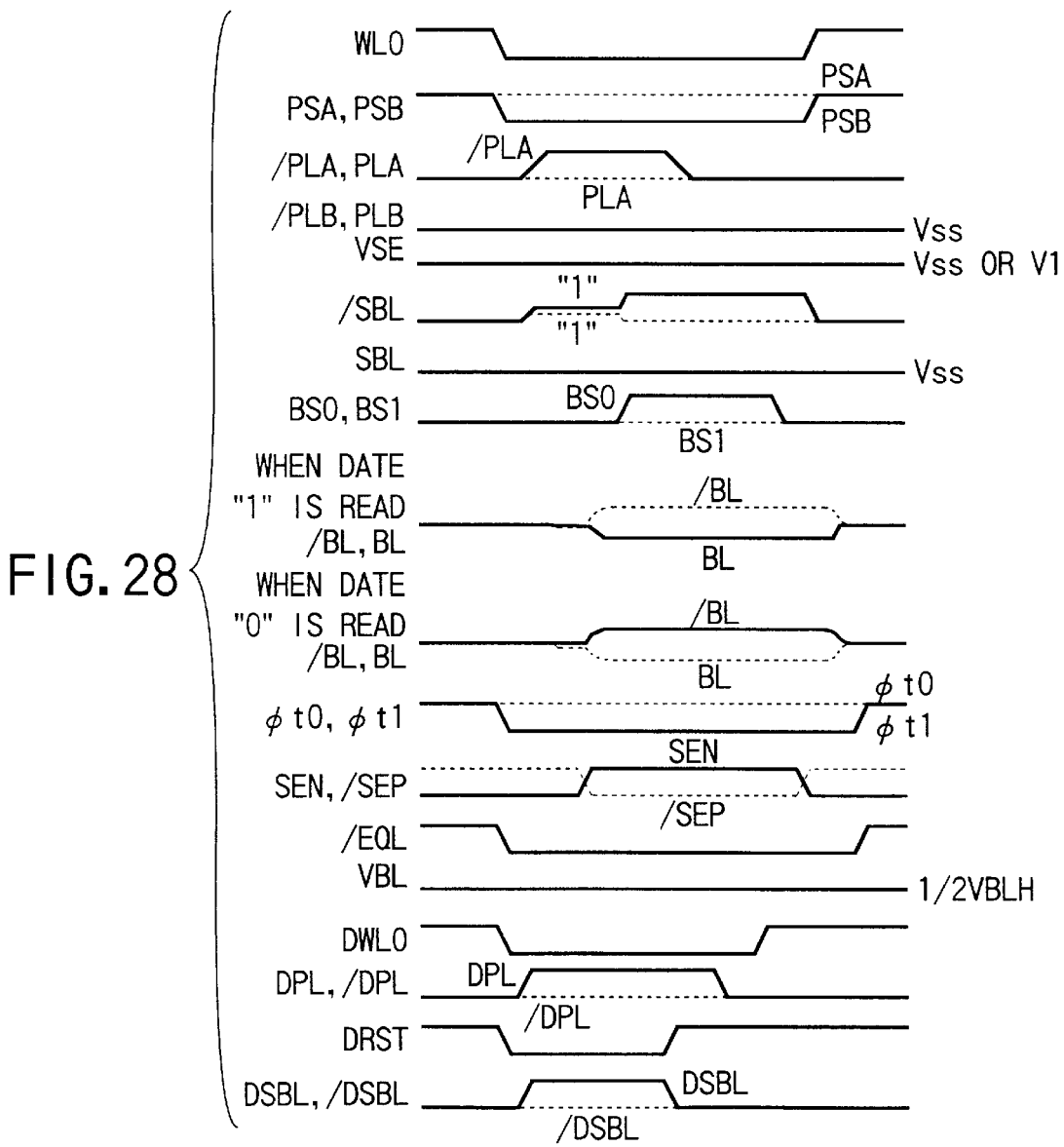
FIG. 28 is a signal waveform showing an example of the operation of the dummy cell shown in FIG. 27.

FIG. 28 is a signal waveform showing an example of the operation of the dummy cell shown in FIG. 27. In this case, DRST0 is lowered, the dummy word line at the position corresponding to the selected word line is lowered and the dummy sub-bitlines /DSBL and DSBL are floated. Then, DPL is raised so that data "0" is read to DSBL. Thus, an amplifying transistor Q18 is turned on so that a current (½)I flows so that the potential of the reference bitline /BL is lowered. Thus, a reference potential can be generated. When DRST is raised while the high potential of DPL is maintained, potential DPL–Vss' is written on the ferroelectric capacitor of the selected dummy cell. Thus, data "0" is restored to the original state. Then, DPL is lowered and DWL is raised so that the standby state is restored.

In the foregoing case, the potential of DSBL realized owning to reading of data "0" of the dummy cell and the potential of SBL realized owning to reading of data "0" shown in FIG. 9 are the same regardless of the position of the selected word line. At this time, the W/L ratio of the amplifying transistor Q18 shown in FIG. 27 is made to be higher than W/L of the transistor Q5 shown in FIG. 9. The reference potential can easily be generated.

Figure 29:
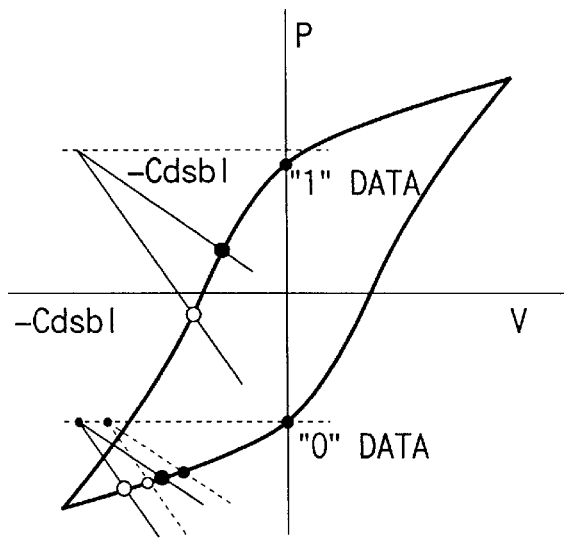
FIG. 29 is a diagram showing a guideline for designing the operation point of the dummy cell shown in FIG. 27.

As another method, the potential Vss' is set to be higher than Vss, the operation point of the dummy cell is always positioned on the right side of the operation point of a usual cell if the sizes of the transistor Q18 and that of the transistor Q5 are the same as indicated by a straight line of loads indicated with a dashed line indicating the guideline of the operation point shown in FIG. 29. The foregoing dummy cell method of writing data "0" is free from polarization inversion of the dummy ferroelectric capacitor. Therefore, if a large number of selections is performed as compared with a usual cell, the problem of deterioration due to fatigue can be overcome.

As another applicable example, the relationship Vss'=Vss is maintained and the sizes of the transistors Q18 and Q5 are maintained. In this state, the load capacities of the upper right and lower right block units are reduced. Thus, the operation point of data "0" of the dummy cell is positioned on the right side as compared with a usual cell. For example, it is preferable that a method is employed with which the number of upper right and lower right series block units is halved.

Another method may be employed with which data "1" is always read as the dummy cell. For example, DPL is lowered, and then Vss' is raised or lowered so that data "1" is written on the ferroelectric capacitor of the dummy. Reading is performed such that the load capacity of the right-side DSBL portion is made to be larger than that of a usual cell, a reference can be obtained. Alternatively, the same structure is employed and the potential of High of Vss' is made to be lower than that of a usual cell or the size of the transistor Q19 is made to be smaller than the size of the transistor Q5. Thus, a reference can easily be generated. The two block units, that is, the upper right and lower right block units may be combined with each other to increase the load capacity.

(Ninth Embodiment)

Figure 30:
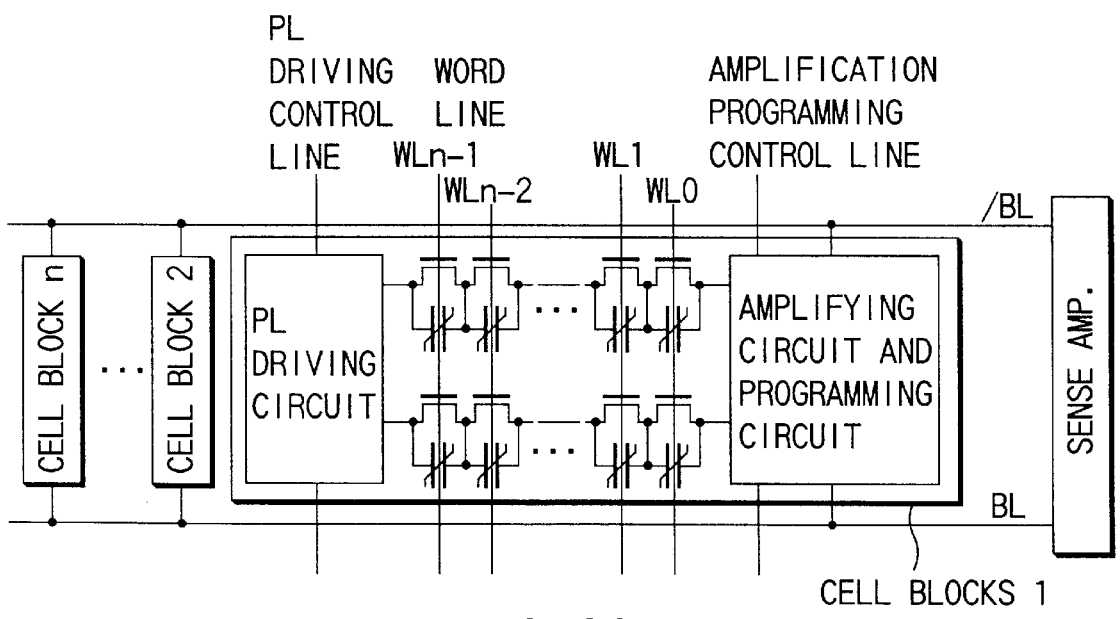
FIG. 30 is a circuit diagram showing the structures of cell blocks, a cell array and a sense amplifier of the ferroelectric memory according to a ninth embodiment.

FIG. 30 is a circuit diagram showing a semiconductor memory device according to a ninth embodiment of the present invention, in which the structures of cell blocks, cell arrays and sense amplifiers of the ferroelectric memory are shown. FIG. 30 shows a more conceptual structure as compared with the structure shown in FIG. 9.

A cell transistor and a ferroelectric capacitor are connected to each other in parallel to constitute one cell. The cells are connected in series so that a block unit is constituted. One end of the block unit is connected to a PL driving circuit, while another end is connected to the bitlines /BL and BL through the amplifying circuit and the writing circuit. A plurality of cell blocks are connected to the bitline. One end of the bitline is connected to the sense amplifier circuit.

In this embodiment, the selected word line is lowered, and the PL driving circuit applies voltage to the block unit to read the charge in the cell to the sub-bitline /SBL or SBL. The charge is amplified by the sense amplifier so as to transmit a signal to the bitline /BL or BL, and then the sense amplifier perform amplification. Then, the writing circuit writes back the signal to the sub-bitline /SBL or SBL. That is, the method of writing back the signal on the cell. The obtained effect from this embodiment is similar to that obtained from the structure shown in FIG. 9. As an alternative to the 1-transistor+1-capacitor, 2-transistor+2-capacitor may be employed in which data in the cell is read from both of the upper and lower block units. In the foregoing case, the dummy cell may be omitted.

(Tenth Embodiment)

Figure 31A:
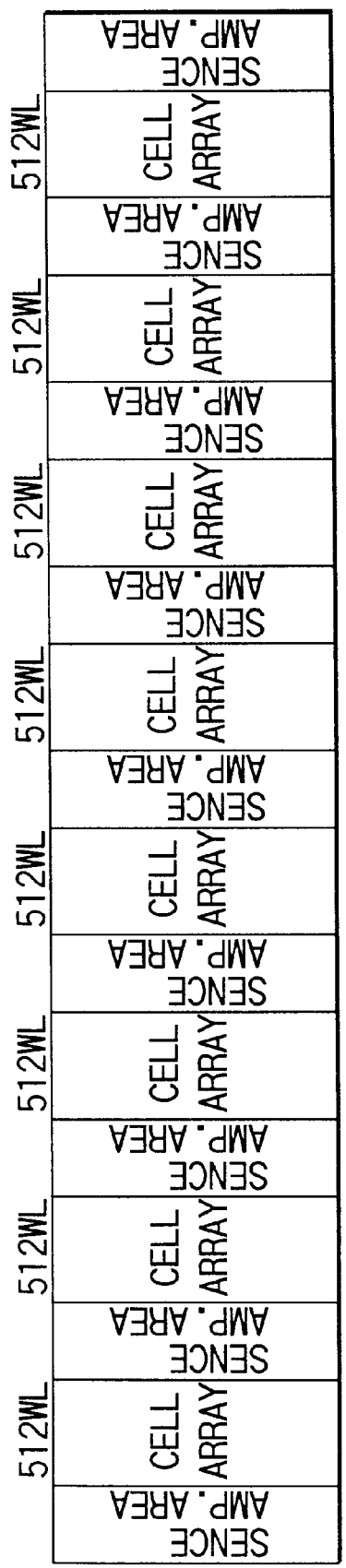
FIGS. 31A and 31B are diagrams showing an example of the positions of a plurality of ferroelectric memories and a plurality of sense amplifiers according to a tenth embodiment.
Figure 31B:
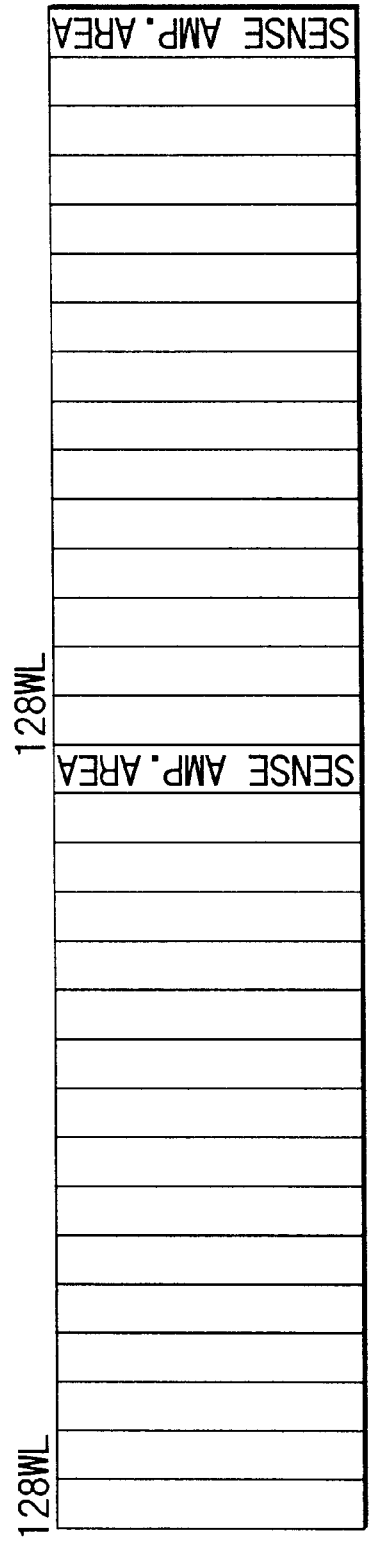

FIGS. 31A and 31B show a semiconductor memory device according to a tenth embodiment of the present invention, in which an example of positions of a plurality of ferroelectric memory arrays and a plurality of sense amplifiers are illustrated. The structure according to this embodiment may be applied to the embodiment shown in FIG. 9 and the other embodiments. As described in the summary (5) of the effects of the structure shown in FIG. 9, application of the present invention causes the load capacity of the sub-bitline in the cell block to determine the reading potential of the sub-bitline. Then, the amplifying transistor is used to drive the bitline. If reading time is provided, reading can be performed regardless of the parasitic capacity of the bitline.

FIG. 31A shows a conventional cell array and the positions of the sense amplifiers. FIG. 31B shows an example of the structure according to this embodiment. When the number of cells connected to the bitline is be increased, the number of sense amplifiers can significantly be reduced. Thus, the size of the chip can be reduced, that is, the rate of occupancy of the cells in the chip can be raised. The description "time is provided" will now be described. In the present invention, only two transistors are connected to the bitline in each cell block. As compared with the conventional cell having 1-transistor+1-capacitor, the capacity of the bitline/cell is small which is about ½ to ¼. Therefore, the sense amplifier can be operated even if the power and the charge/discharge time are the same. Thanks to the self-block amplifying effect, the number of sense amplifiers can be reduced.

(Eleventh Embodiment)

Figure 32A:
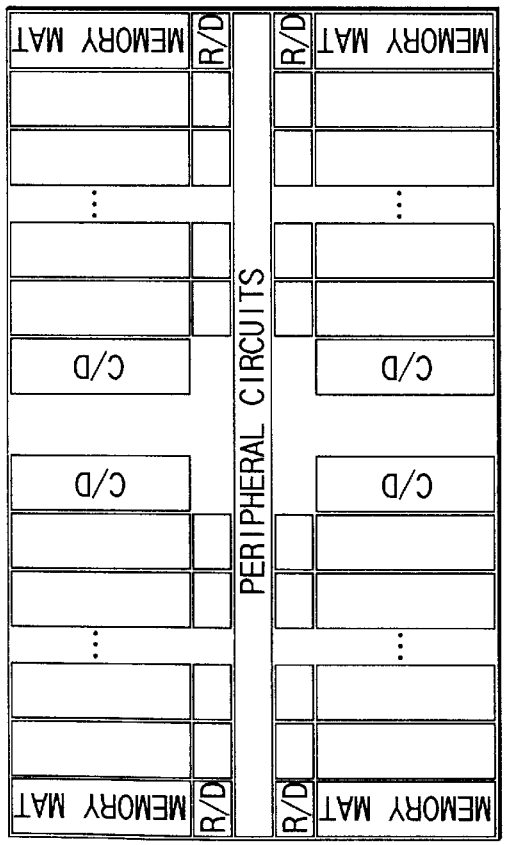
FIGS. 32A to 32C are diagrams showing the structures of the memory chip, logic consolidation and RF-ID card according to an eleventh embodiment.
Figure 32B:
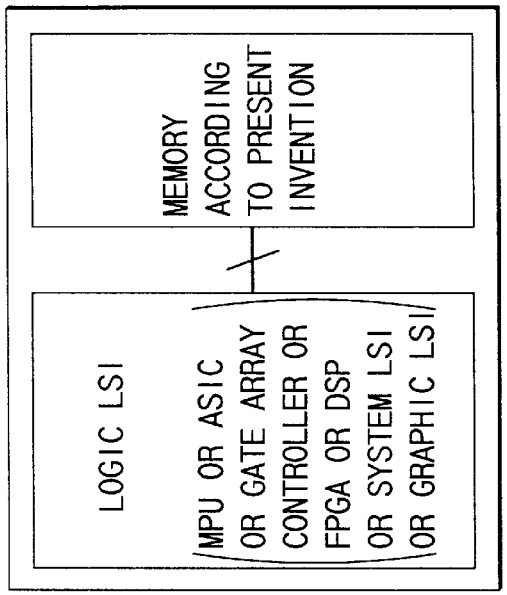
Figure 32C:
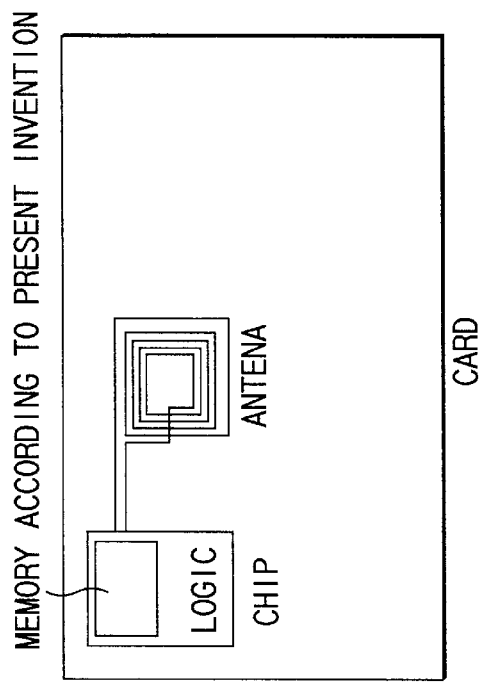

FIGS. 32A to 32C are diagrams showing a semiconductor memory device according to an eleventh embodiment of the present invention, in which an example of the structure of a memory chip, an example of logic consolidation structure and an example of the structure of a RF-ID card. The structure according to this embodiment may be applied to the embodiment shown in FIG. 9 and the other embodiments.

FIG. 32A shows an example of the structure of the memory chip. The chip is provided with at least a row decoder (R/D), a column decoder (C/D) and a peripheral circuit in addition to the cell array and the sense amplifier. FIG. 32B shows an example of the logic consolidation structure incorporating the memory according to the present invention and a variety of logic LSI. If the logic LSI has no limit and the conventional memory has a limit (a limit for a stable reading operation or a limit of the cost), the foregoing structure is an effective storage in a case where the present invention is free from a limit. FIG. 32C shows the RF-ID card structure constituted by the memory according to the present invention, a logic LSI and an antenna.

(Twelfth Embodiment)

Figure 33:
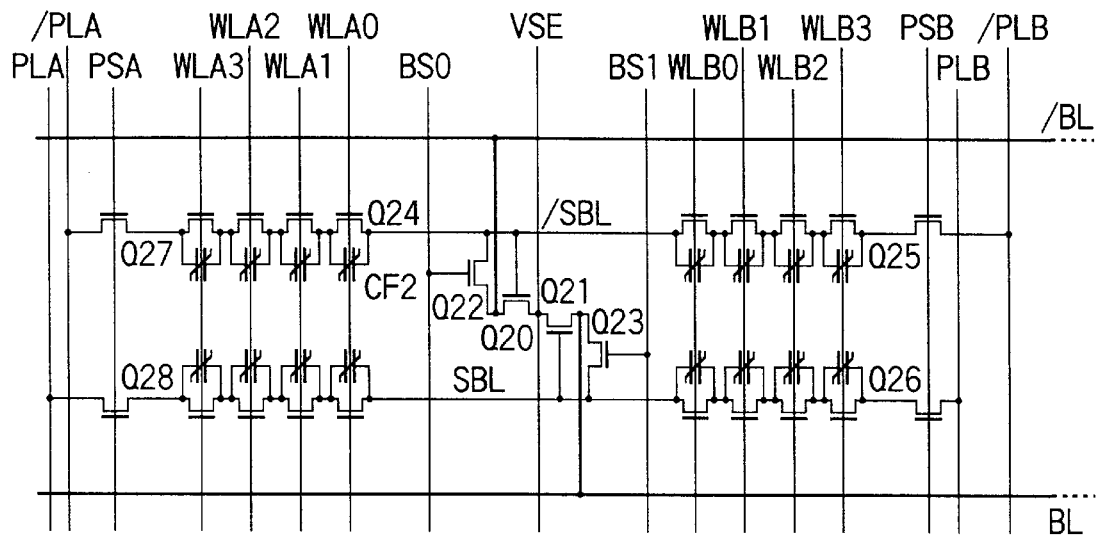
FIG. 33 is a circuit diagram showing the block structure of a ferroelectric memory according to a twelfth embodiment.

FIG. 33 is a circuit diagram showing a semiconductor memory device according to a twelfth embodiment of the present invention, in which the block structure of a ferroelectric memory is illustrated. The foregoing structure is similar to that shown in FIG. 9. A major portion of the effects is the same as that obtained from the structure shown in FIG. 9. The difference lies in that the source of an amplifying transistor Q20 having the gate, the input of which is the sub-bitline /SBL connected to the upper right and left block units is connected to the bitline /BL. The drain is connected to the potential VSE. Moreover, the source of an amplifying transistor Q21 having the gate, the input of which is the sub-bitline SBL connected to the lower right and left block units is connected to the bitline BL. The drain is connected to the potential VSE. That is, the reading bitline and the writing bitline are the same bitline /BL or BL.

Figure 34:
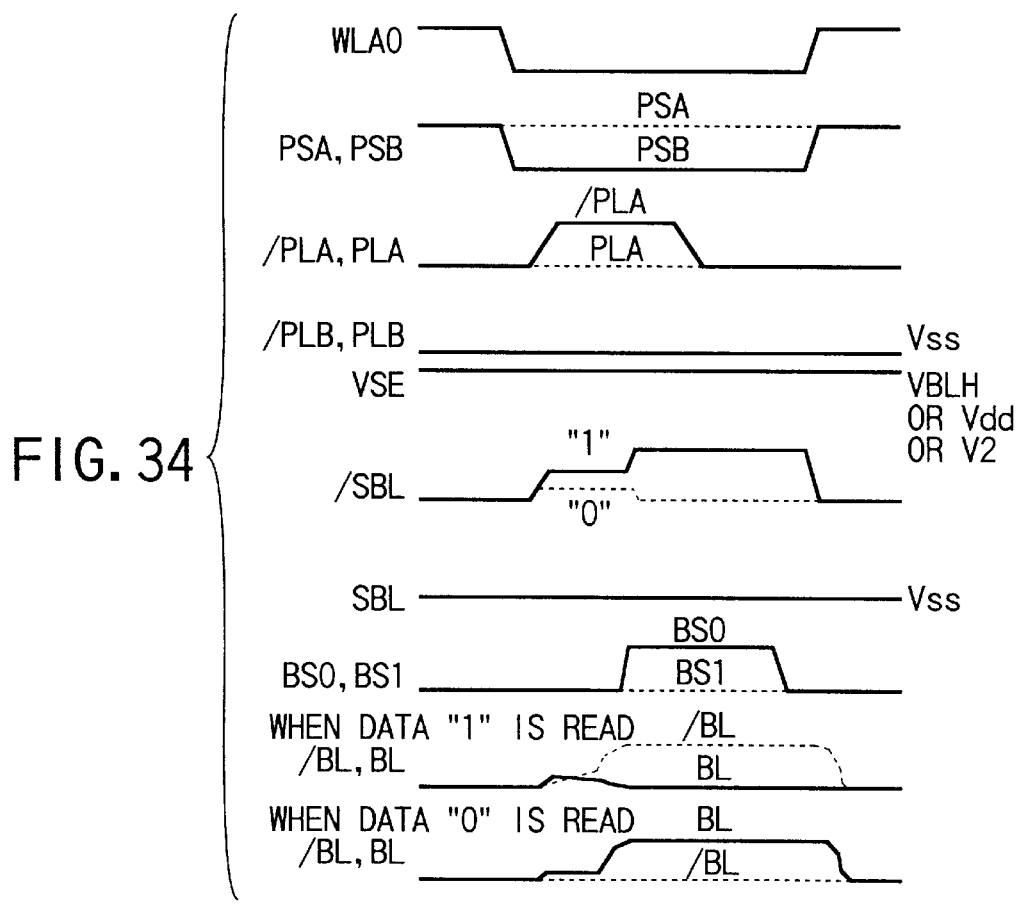
FIG. 34 is a signal waveform showing an example of the specific operation of FIG. 33.

FIG. 34 is a signal waveform showing an example of the specific operation of FIG. 33. In a standby state, all of the word lines WLA0 to WLA3 and WLB0 to WLB3 are made to be the boosted potential Vpp, all of the plates /PLA, PLA, /PLB and PLB are made to be 0v and the plate select signals PSA and PLB are made to be Vpp. Therefore, all of the cell transistors are turned on. Both the ends of the ferroelectric capacitor of all of the cells are electrically short-circuited. The potential of both the ends and those of the sub-bitline /SBL and SBL are connected to the plate and, therefore, set to be 0V because the plate select signal is High.

The block writing select signal BS0 and BS1 are made to be 0V so that the transistors Q22 and Q23 have been turned off. Since /SBL and SBL are 0V, also the amplifying transistors Q20 and Q21 have been turned off even if the potential of the VSE is VBLH which is a high level. Therefore, the bitlines /BL and BL and the sub-bitlines /SBL and SBL are completely separated from one another.

In the foregoing example of the operation, the precharged potential of the bitlines /BL and BL is 0V. The operation will now be described which is performed when, for example, a memory cell (Q24, CF2) of the upper left block unit of the selected cell block is selected. Initially, the word line WLAO connected to the selected memory cell is lowered to 0V so that the cell transistor Q24 is turned off. Simultaneously or before or after the foregoing operation, the upper right and lower right block units and the plates /PLB and PLB are separated from one another by lowering the plate select signal PSB to 0V so that the transistors Q25 and Q26 are turned off. Moreover, the bitlines /BL and BL set to 0V are floated. Note that the states of Q27 and Q28 which are turned on are maintained.

As a result, the cell transistor Q24 is turned off and the transistor Q25 is turned off. Therefore, the right-side terminal of the ferroelectric capacitor CF2 of the selected cell to /SBL and all of nodes in the cell of the upper right block unit are connected to one another. Moreover, the foregoing portion is floated when the voltage is 0V.

Then, only the potential of the plate /PLA connected to the selected upper left block unit is raised from 0V to VBLH. The potential VBLH is applied to a region from PLA to the left-side terminal of the selected ferroelectric capacitor. At this time, the capacities of the right-side terminal of CF2 to /SBL and the nodes in the cell of the upper right block unit are made to be load capacity CL. If data "1" is written on the ferroelectric capacitor, polarization inversion take place.

Thus, data in the cell is read to the sub-bitline /SBL (more accurately, from the right-side terminal of CF2 to /SBL and nodes in the cell of the upper right block unit). As a result, the potential of /SBL is raised from 0V to 2Vs+Vo.

If data "0" is written on the ferroelectric capacitor, the polarization inversion does not take place. The potential of the sub-bitline /SBL is raised to a degree corresponding to the ratio of the capacity of the paraelectric component of CF2 and that of CL. Thus, the potential of /SBL is made to be Vo. At this time, the potential of the sub-bitline SBL forming the pair is maintained at 0V because the potential of PLA is maintained at 0V. When the potential VSE is set to be VBLH, the potential of the gate of the amplifying transistor Q20 is made to be 2Vs+Vo in a case of data "1" and Vo in a case of data "0". The potential of the drain (=VSE) is made to be VBLH and the potential of the drain (=/BL) is made to be 0V.

When the threshold voltage Vt of the transistor Q20 is designed to be Vo<Vt<2Vs+Vo, since the transistor Q20 is turned on in a case of data "1", the potential of /BL precharged to 0V is, as shown in FIG. 34, raised from 0V owing to flowing of an electric current in the VSE through the amplifying transistor Q20. The raised potential before the sense amplifier operation is defined to be 0V+2Vst. In a case of data "0", the transistor Q20 is turned off, /BL precharged to 0V is maintained at 0V because no electric current flows into VSE through the amplifying transistor Q20.

In this case, a dummy cell or the like incorporating a constant-current drive transistor is employed such that the potential of BL is set so as to be raised to a degree which is half of the potential of the BL which is raised in a case of data "1" (that is, 0V+Vst before the sense operation). Thus, /BL is made to be 0V+2Vst and BL is made to be 0V+Vst in a case of data "1" before the sense amplifier operation. Thus, the difference in the potential Vst is input to the right-side sense amplifier shown in FIG. 33. Then, a flip-flop type sense amplifier amplifies the potential so that BL is made to be 0V and /BL is made to be VBLH. In a case of data "0", /B2k is made to be 0V and BL is made to be 0V+Vst. Thus, the difference in the potential Vst is input to the right-side sense amplifier shown in FIG. 33. Then, a flip-flop type sense amplifier amplifies the potential so that BL is made to be VBLH and /BL is made to be 0V.

In the example shown in FIG. 34, the bitline pair is precharged to 0V. The precharge may be made to another constant potential VBL or (½)VBLH. In the foregoing case, the amplifying transistors Q20 and Q21 are turned on in a case of data "1" and turned off in a case of data "0" by designing the threshold voltage Vt of the amplifying transistor to be Vo−VBL<Vt<Vo+2Vs−VBL.

In a case where the amplifying transistors are turned on and the difference in the electric current is detected by the sense amplifier, the design must be performed such that Vt<Vo−VBL. Note that this embodiment is different from the embodiment shown in FIG. 9 in that the source of the amplifying transistor serves as the bitline. Therefore, there arises a problem in that the potential of the source varies. If rising of /BL is started in a case of data "1", the potential of the source is raised and the transistor is turned off at an intermediate state. When /BL is brought to a state except for the state in which it is precharged to 0V in a case of data "0", there arises a problem in that the amplifying transistor is undesirably turned on when /BL is lowered owing to amplification performed by the sense amplifier.

The latter problem can be overcome by the method of precharging the bitline to 0V shown in FIG. 34. As for the former problem, the amount of read signals is reduced as compared with the structure shown in FIG. 9. However, a large amount of signals can be read to the sub-bitline. Therefore, no problem arises, since the amplifying transistor is turned off after the difference in the potential of the bitline pair is increased. Since the difference in the potential of the bitline pair is interrupted at a certain position, the foregoing structure is suitable to the capacitance coupling type dummy cell shown in FIGS. 19A to 19C. Conversely, the constant current type dummy cells shown in FIGS. 23A to 23C and 27 are suitable to the method shown in FIG. 9. Note that the potential of VSE may be VBLH. If the potential is higher than the potential to which the bitline is precharged, any potential may be employed.

When data is rewritten, only block writing select signal BS0 connected to the sub-bitline /SBL is raised to Vpp. Thus, the potential of the bitline /BL which is 0V or amplified to VBLH is written on /SBL. In a case of data "1", /SBL is made to be VBLH and /SBL is made to be 0V in a case of data "0". At this time, the potential of the plate (the left-side terminal of the selected ferroelectric capacitor) is VBLH. Therefore, voltage−VBLH (the right-side terminal of the ferroelectric capacitor is defined to be positive) is applied to the ferroelectric capacitor in a case of data "0". Thus, data "0" is rewritten. In a case of data "1", the potential of the plate /PLA is then lowered to 0V. When also the left-side terminal of the selected ferroelectric capacitor is made to be 0V, the ferroelectric capacitor is applied with voltage VBLH (the right-side terminal of the ferroelectric capacitor is defined to be positive). Thus, data "1" is rewritten.

In the above-mentioned sequential operations, the potential of the SBL of 0V is maintained. Therefore, data in the lower block unit is maintained and stabilized. If different data is written from outside (Write Mode) or external data is written after data is read (Read Modified Write), data is required to be written after BS0 is made to be High.

After rewriting is completed, the potential of the block writing select signal BS0 is lowered from High to 0V. As a result, interference from /BL portion to /SBL can be eliminated. Then, the potential of WLA0 is raised. Simultaneously or before or after the foregoing operation, the potential of the plate select signal PSA is raised. Thus, the ferroelectric capacitor of the selected cell is electrically short-circuited. Thus, internal nodes of the upper right and upper left block units and /SBL node are made to be 0V. Simultaneously or before or after the foregoing operation, the bitline pair /BL and BL are lowered to 0V. Thus, the standby state is restored.

As described above, the structure shown in FIG. 33 is similar to that shown in FIG. 9 and the following effects can be obtained.

(1) Similarly to the previous suggestion performed by the inventors of the present invention, a high-density cell having the $4F^2$ size can be realized by the planar transistor which can easily be manufactured. Moreover, a high-speed random access function can be obtained.

(2) Even if the design rule is reduced and the area of the ferroelectric capacitor is reduced, the capacity of the sub-bitline, which is the load capacity at the time of the polarization inversion, can be reduced to correspond to the reduction in the area. As a result, a sufficiently high voltage for reading a signal can be obtained. Since the amplifying transistor is used to amplify the bitline, a stable operation can be performed.

(3) Similarly to the conventional FRAM, the principle of the operation is simple and a high-speed operation can be performed owning to the high-speed operation of the plate.

(4) Even if the bitline has a large capacity, reading is permitted. Therefore, the number of cell blocks connected to the bitline can be increased. As a result, the area of the sense amplifier can be reduced.

(5) Optimization is permitted by reducing the number of series-connected cells in the block unit to correspond to reduction in the polarization of the ferroelectric capacitor owning to reduction in the design rule.

(6) In a state in which the design rule is relaxed and the software error is in a severe state, the number of series-connected cells in the block unit is increased and the load capacity is added to increase the reading charge, software error can be prevented. As the design rule is reduced and as the software error rate is lowered, the size of the ferroelectric capacitor and the number of series-connected cells are required to gradually be reduced to a degree with which the software error does not raise a problem. Thus, an amount of signals read to the sub-bitline is maintained.

(7) A plurality of cells in the block unit share the amplifying transistor and the write transistor. Thus, the overhead of the size of the cell can significantly be reduced.

(8) When the right and left block units share the amplifying transistor and the block writing select transistor, their overhead can furthermore be reduced.

(9) As the load capacity for the polarization inversion, the internal capacity of the block unit opposite to the selected block unit is used so that substantially stable operation is performed.

(10) When the number of cells in the block unit is changed, the load capacity can arbitrarily be adjusted.

(11) The signal of the sub-bitline is used to cause the amplifying transistor to drive the bitline on the same side of the bitline pair. Thus, a difference in the potential in a predetermined quantity is generated in the bitline. Therefore, a dummy cell of a simple capacitance coupling type can easily be used.

(Thirteenth Embodiment)

Figure 35A:
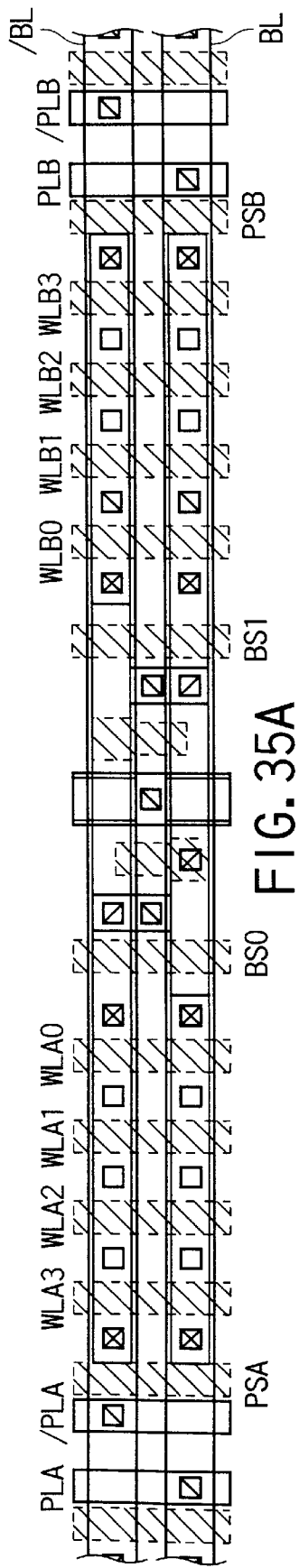
FIGS. 35A and 35B are plan views showing the layout of the block structure of a ferroelectric memory according to a thirteenth embodiment.
Figure 35B:
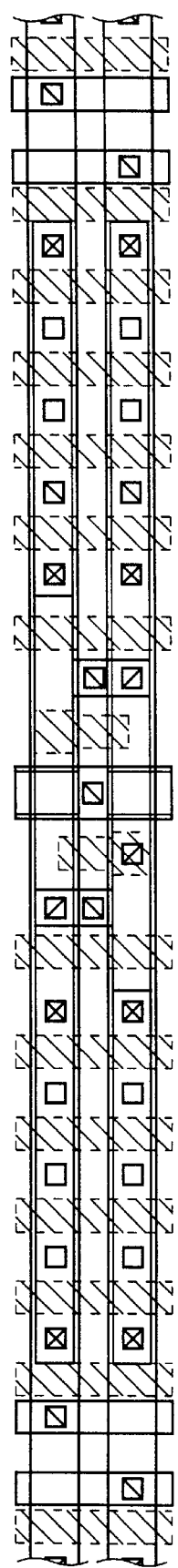

FIGS. 35A and 35B are plan views showing a semiconductor memory device according to a thirteenth embodiment of the present invention, in which the layout of the block structure of the ferroelectric memory. FIG. 35A corresponds to the circuit diagram shown in FIG. 9 in which the positions of the transistors are the same as those of the structure shown in FIG. 9. FIG. 35B corresponds to the circuit diagram shown in FIG. 33 in which the positions of the transistors are the same as those of the structure shown in FIG. 33. As described above, FIGS. 9 and 33 enables equivalent circuits to attain the effects of the present invention. Moreover, an effect of a precise configuration can be obtained from a topological viewpoint.

Figure 36:
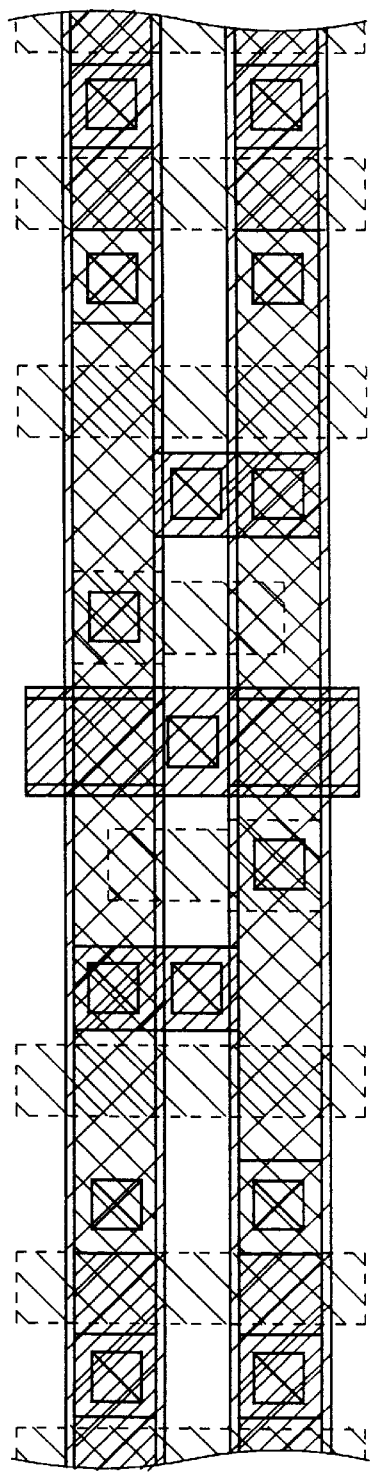
FIG. 36 is an enlarged layout diagram showing the amplifying transistor and the block writing select transistor portions shown in FIG. 35A.

FIG. 36 is an enlarged layout diagram showing the amplifying transistor and the block writing select transistor portion shown in FIG. 35A. If a plurality of layers are laminated, easy understanding is inhibited. Therefore, each of layers of the same layout is divided and illustrated from FIGS. 37 to 39. The layers are indicated such that the diffusion layer is indicated with AA, the gate layer is indicated with GC, the upper electrode layer is indicated with TE, the lower electrode layer is indicated with BE, the ferroelectric layer is indicated with FE, the bitline layer is indicated with BL, the contact between the diffusion layer and the lower electrode layer is AA-BE-C, the contact between the diffusion layer and the upper electrode layer is indicated with AA-TE-C, the contact between the gate layer and the lower electrode layer is GC-BE-C and the contact between the upper electrode layer and the bitline layer is indicated with TE-BE-C. The upper and lower electrode layers means the upper and lower electrode layers of the ferroelectric capacitor.

Figure 37:
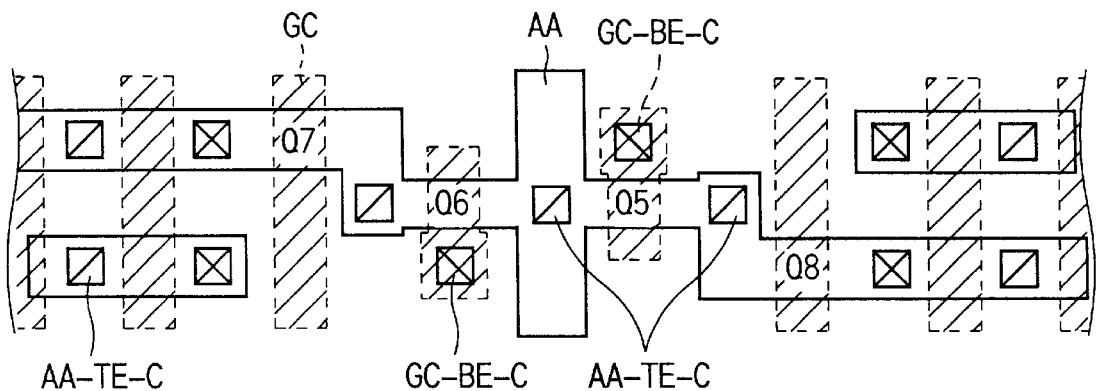
FIG. 37 is a diagram showing a layer layout of a portion of the layout shown in FIG. 36.
Figure 38:
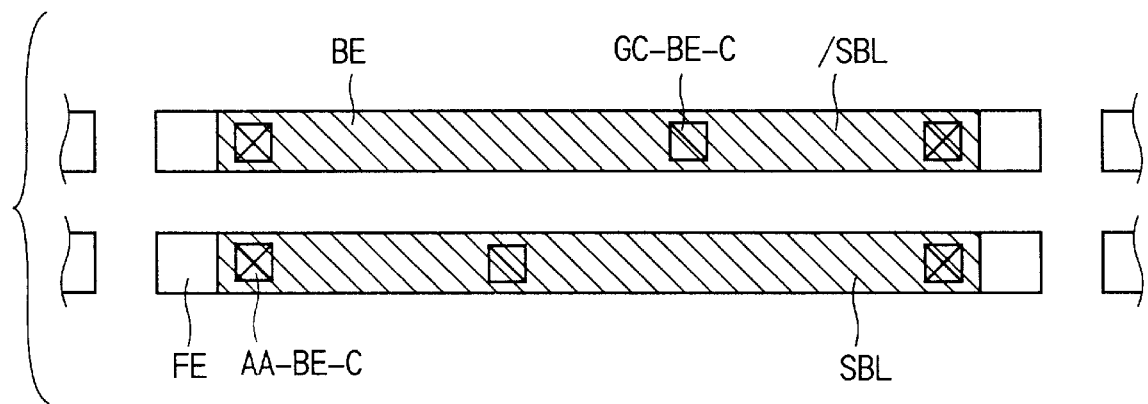
FIG. 38 is a diagram showing a layer layout of a portion of the layout shown in FIG. 36.
Figure 39:
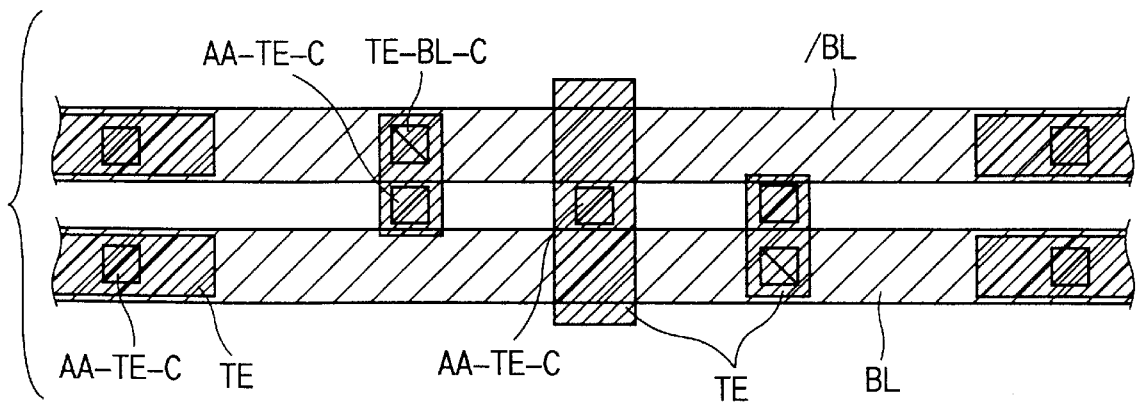
FIG. 39 is a diagram showing a layer layout of a portion of the layout shown in FIG. 36.

Referring to FIG. 37, Q6 and Q5 represent channel portions of the amplifying transistor, while Q7 and Q8 represent channel portions of the block writing select transistor. The sub-bitlines /SBL and SBL can easily be formed below the bitline layer (BL) to be a bitline by routing the lower electrode layer (BE) as shown in FIG. 38. As can be understood from FIGS. 36 to 39, the number of amplifying transistor and the block writing select transistors is reduced by the right and left block units. The terminal portion of VSE shares the sources of the transistors Q6 and Q5. The drain of the amplifying transistor and that of the block writing select transistor share the diffusion layer. Moreover, the drain of the cell transistor and the source of the block writing select transistor share the diffusion layer. Therefore, a very compact layout is realized.

Referring to FIGS. 35A and 35B, when the size of the cell is $4F^2$, the plate driving portion, an average size of a block including the amplifying transistor portion and the block writing select transistor portion is $5F^2$ in a case where the number of series-connected cells of the block unit is 16. In a case where the number is 32, the size is $4.5F^2$. In a case where the number is 64, the size is $4.25F^2$. Thus, a very small cell can be obtained in spite of the self-amplifying function provided for the cell. Therefore, transistors having the self-amplifying function can easily be disposed in spite of severe pitch in the cell array.

Figure 40:
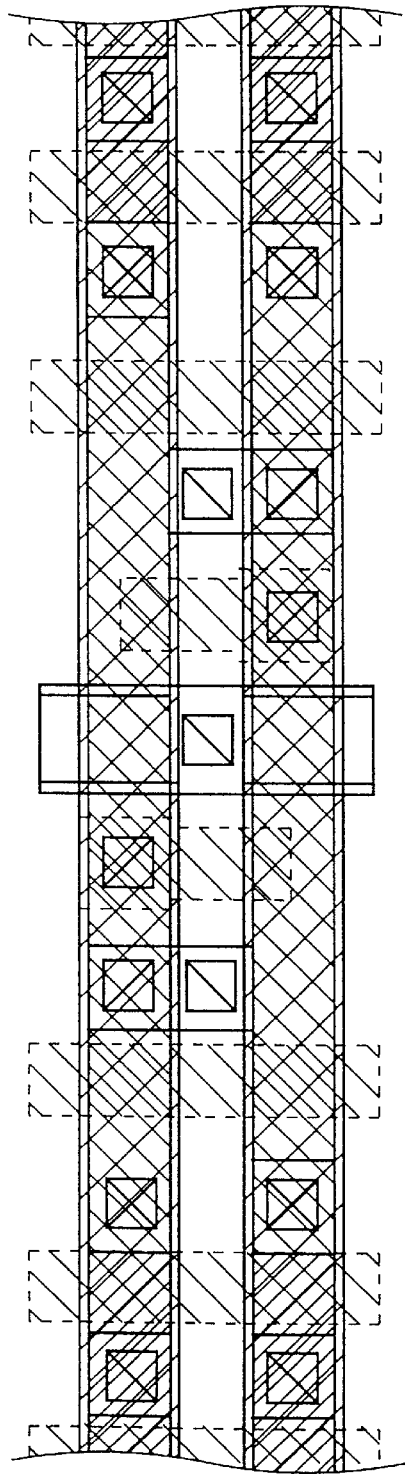
FIG. 40 is an enlarged layout diagram showing the amplifying transistor and the block writing select transistor portions shown in FIG. 35B.
Figure 41:
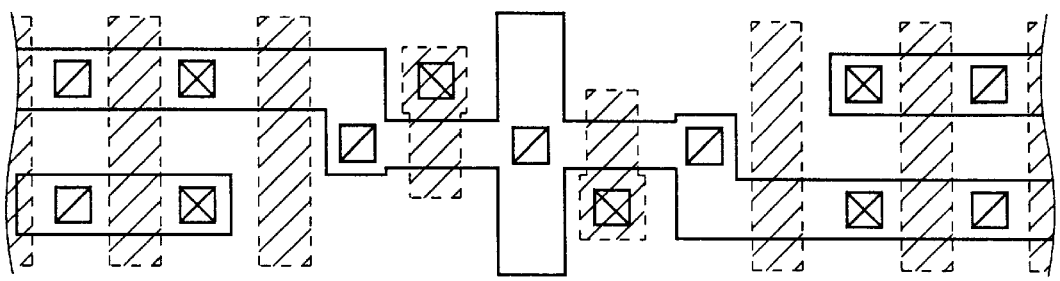
FIG. 41 is a diagram showing a layer layout of a portion of the layout shown in FIG. 36.
Figure 42:
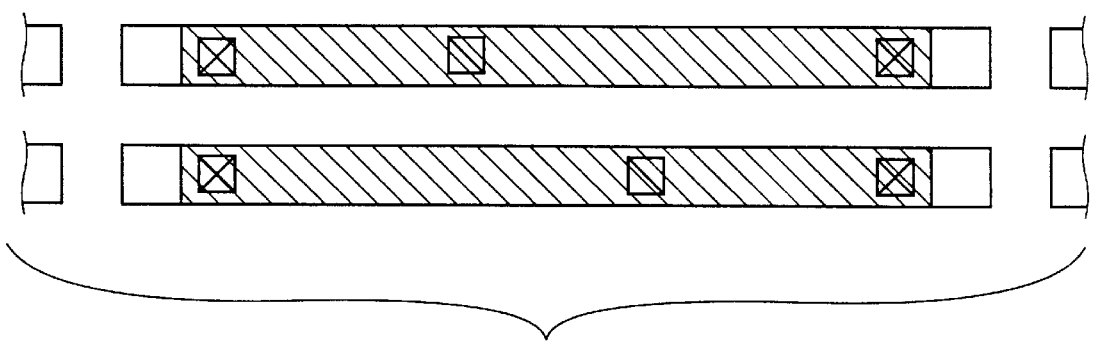
FIG. 42 is a diagram showing a layer layout of a portion of the layout shown in FIG. 36.
Figure 43:
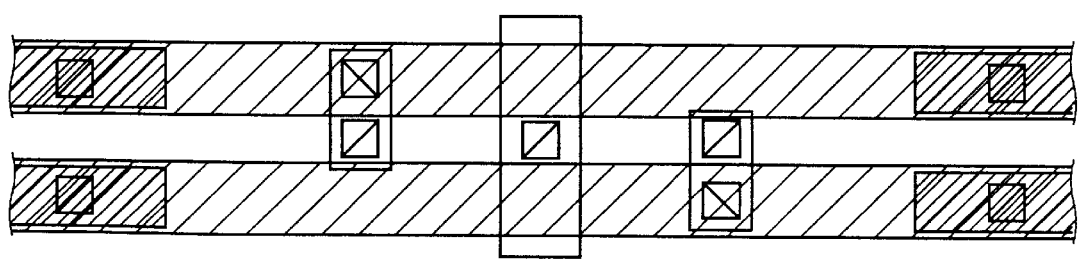
FIG. 43 is a diagram showing a layer layout of a portion of the layout shown in FIG. 36.

FIG. 40 is an enlarged layout diagram showing the amplifying transistor and the block writing select transistor portion shown in FIG. 35B. When a plurality of layers are laminated, easy understanding is inhibited. The layers of the same layout are divided and illustrated from FIG. 41 to FIG. 43. The layers are structures and divided similar to those shown in FIGS. 37 and 40. To realize the circuit structure shown in FIG. 33, GC, GC-BE-C of the transistors Q5 and Q6 shown in FIG. 37 are vertically folded at the channel.

Figure 44:
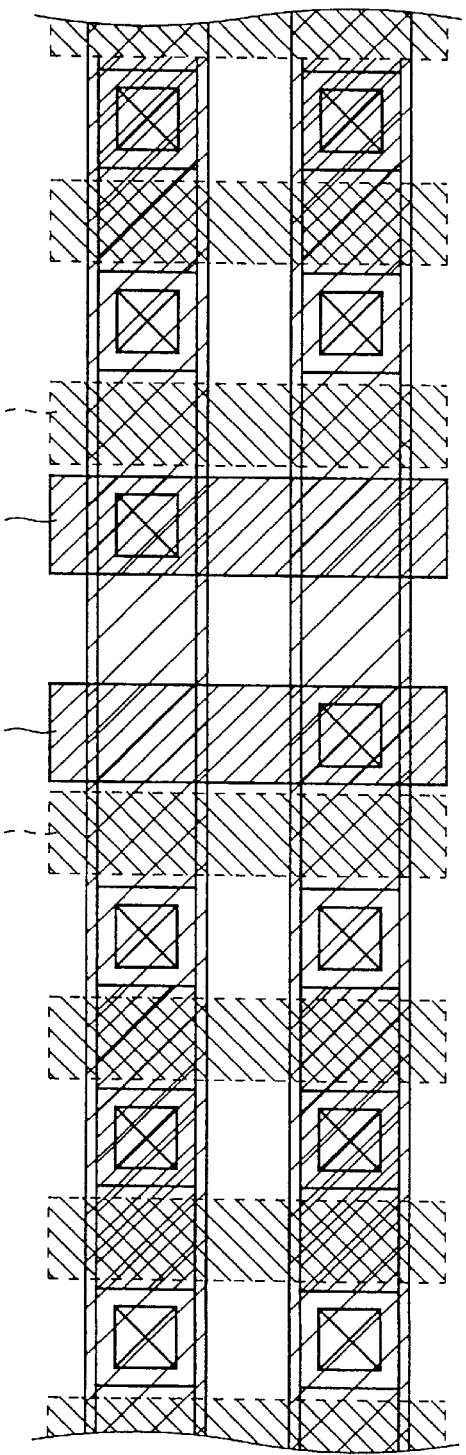
FIG. 44 is an enlarged layout diagram showing the plate select transistor and plate line portions common to FIGS. 35A and 35B.

FIG. 44 is an enlarged layout diagram showing the plate select transistor and the plate line common to FIGS. 35A and 35B. FIGS. 45 and 46 show the layout of a portion of layers of the layout shown in FIG. 44. Also the plate line is shared by the adjacent cell blocks, the area of the foregoing portion can be halved. The portion is the other cell block portion adjacent to the /PLB' shown in FIG. 44. The plate line is constituted by TE and contact with the diffusion layer AA is established for each 2-bitline so that a folded BL method is realized.

(Fourteenth Embodiment)

FIGS. 47A to 50C are sectional views showing the device structure of a semiconductor memory device according to a fourteenth embodiment of the present invention, in which an example of the block structure of the ferroelectric memory is illustrated.

FIGS. 47A to 47C correspond to the sectional view of the left side of the layout structure shown in FIG. 35A. FIGS. 48A to 48C correspond to the sectional view of the right side layout structure shown in FIG. 35A. FIGS. 47A to 48C correspond to a sectional view when division is performed at the center of /BL, an intermediate position between /BL and BL and the center of BL. By using BE with finesse, a compact structure can be realized, design allowance is obtained and the self-amplifying function can be realized.

FIGS. 49A to 50C are diagrams showing structures similar to those shown in FIGS. 47A to 48C. The structures are considerably different from the foregoing structures in an arrangement that the ferroelectric capacitor is formed between the lower electrodes. As a result, merit can be obtained in that the ferroelectric capacitor in the memory cell portion can be formed in a self-alignment manner. A fact can be understood from wiring of the sub-bitline is realized by BE.

(Fifteenth Embodiment)

Figure 51:
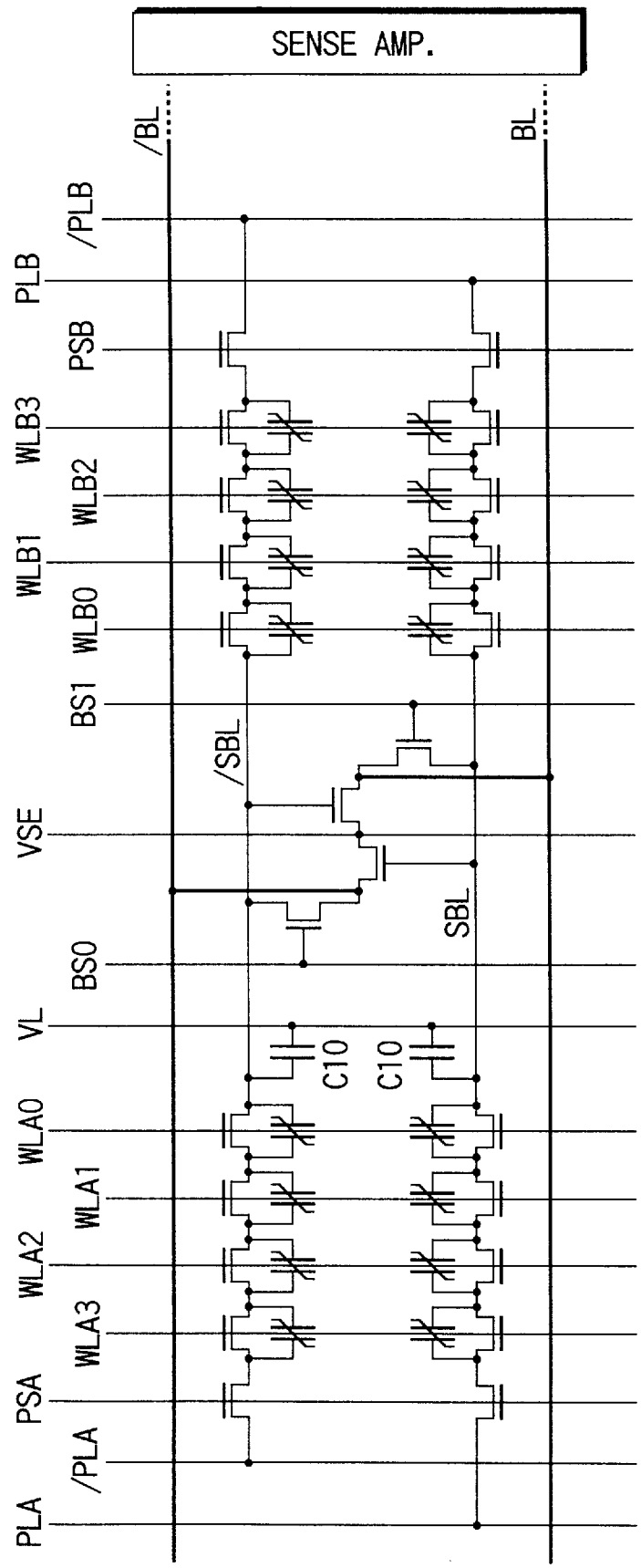
FIG. 51 is a circuit diagram showing the block structure of a ferroelectric memory according to a fifteenth embodiment.

FIG. 51 is a circuit diagram showing a semiconductor memory device according to a fifteenth embodiment of the present invention, in which the block structure of the ferroelectric memory is illustrated. The circuit structure and effects of this embodiment are similar to those of the structure shown in FIG. 9. The difference from the structure shown in FIG. 9 lies in that a load capacity stabilizing capacitor C10 is connected to the sub-bitline /SBL and SBL and another end is connected to a fixed potential VL.

Since the fixed and stable load capacity is added, the problem of the deviation of the operation point which arises when the load capacity is changed owning to the position of the selected word line shown in FIGS. 12A and 12B can be overcome. The foregoing structure can be applied to a case in which reduction of the device is not realized considerably and, therefore, the load capacity obtained from the opposite block units is unsatisfactorily small. When reduction in the device is not realized considerably, the load capacity is increased by increasing the number of cells in the block unit. Thus, delay in reading can be prevented.

FIG. 52 is a signal waveform showing an example of the specific operation of FIG. 51. The (½)VBLH precharge method is employed and the same operation as that of the structure shown in FIG. 10 is performed. FIG. 53 is a signal waveform showing another example of the specific operation of FIG. 51. The VBLH precharge method is employed and the same operation as that of the structure shown in FIG. 11 is performed. Note that the potential for reading the sub-bitline varies depending on the variation of the load capacity.

(Sixteenth Embodiment)

Figure 54:
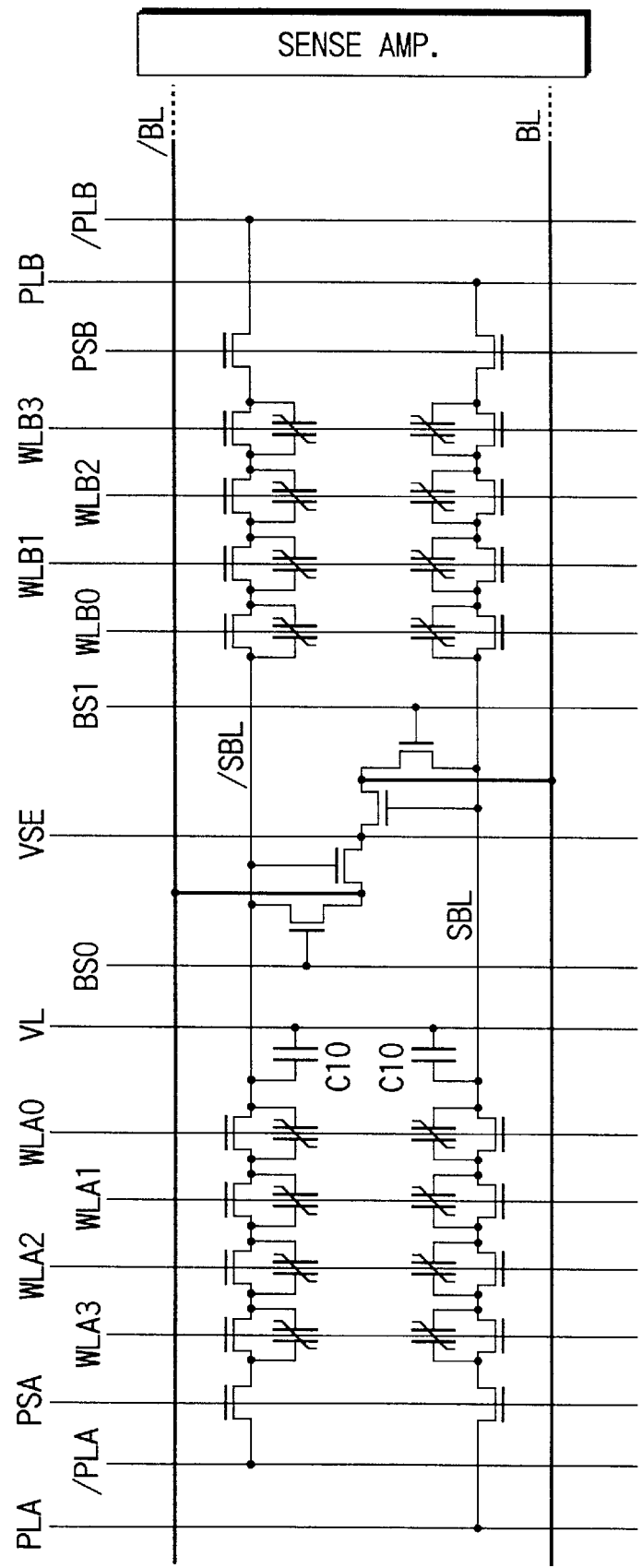
FIG. 54 is a circuit diagram showing the block structure of a ferroelectric memory according to a sixteenth embodiment.

FIG. 54 is a circuit diagram showing a semiconductor memory device according to a sixteenth embodiment of the present invention, in which the block structure of the ferroelectric memory is illustrated. The load capacity C10 is added to the structure shown in FIG. 33. Effects are the same as those obtained from the structure shown in FIG. 51. FIG. 55 is a signal waveform showing an example of the specific operation of FIG. 54. The vss bitline precharge method is employed and the same operation is performed as that of the structure shown in FIG. 34.

FIG. 56 is a signal waveform showing another example of the specific operation of FIG. 54. The bitline (½)VBLH precharge method is employed. The threshold voltage of the amplifying transistor described with reference to FIG. 34 may be changed to realize the bitline (½)VBLH precharge method. As shown in FIG. 56, the VL line may be raised when the amplifying transistor is operated to raise the potential of the sub-bitline so as to turn the amplifying transistor on.

(Seventeenth Embodiment)

Figure 57:
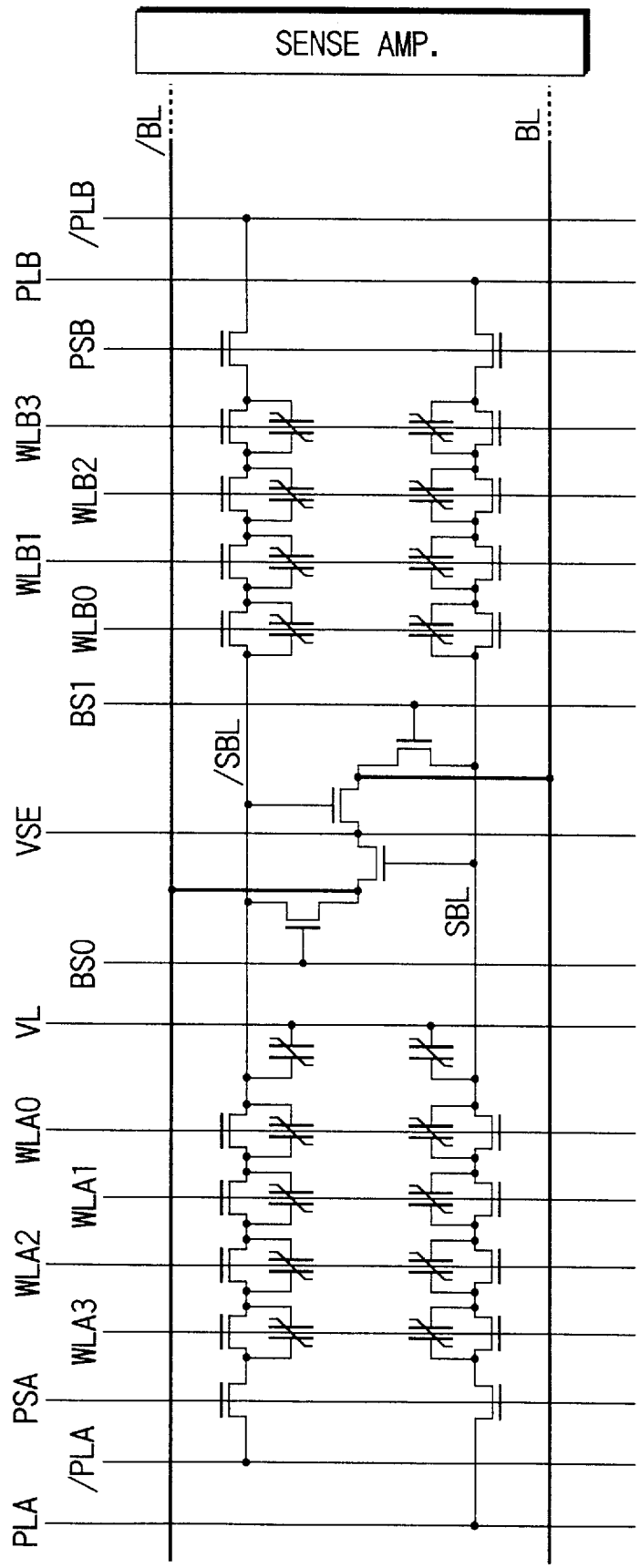
FIG. 57 is a circuit diagram showing the block structure of a ferroelectric memory according to a seventeenth embodiment.

FIG. 57 is a circuit diagram showing a semiconductor memory device according to a seventeenth embodiment of the present invention, in which the block structure of a ferroelectric memory is illustrated. The structure shown in FIG. 57 is formed such that the load capacity shown in FIG. 51 is realized by the ferroelectric capacitor. Similarly, the load capacity shown in FIG. 54 may be realized by the ferroelectric capacitor.

When design is performed such that positive or negative bias is always applied to the ferroelectric capacitor, polarization inversion is prevented and the use as the load capacity is permitted. For example, VL is set to be Vss and the apparatus is operated before shipment to make the sub-bitline to be VBLH. Then, polarization inversion of the ferroelectric capacitor can be prevented.

(Eighteenth Embodiment)

Figure 58A:
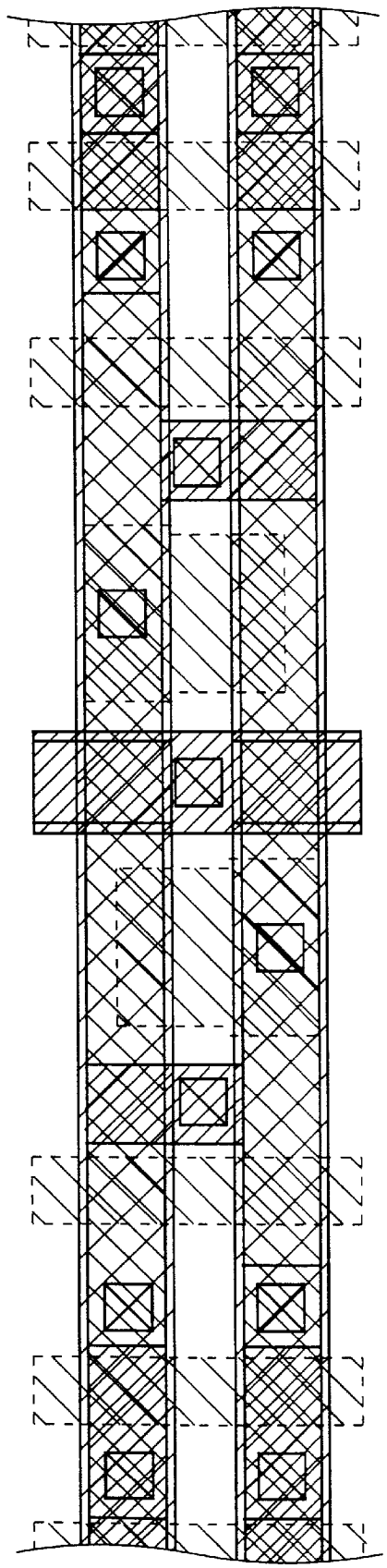
FIGS. 58A and 58B are layout diagrams showing the block structure of a ferroelectric memory according to an eighteenth embodiment.
Figure 58B:
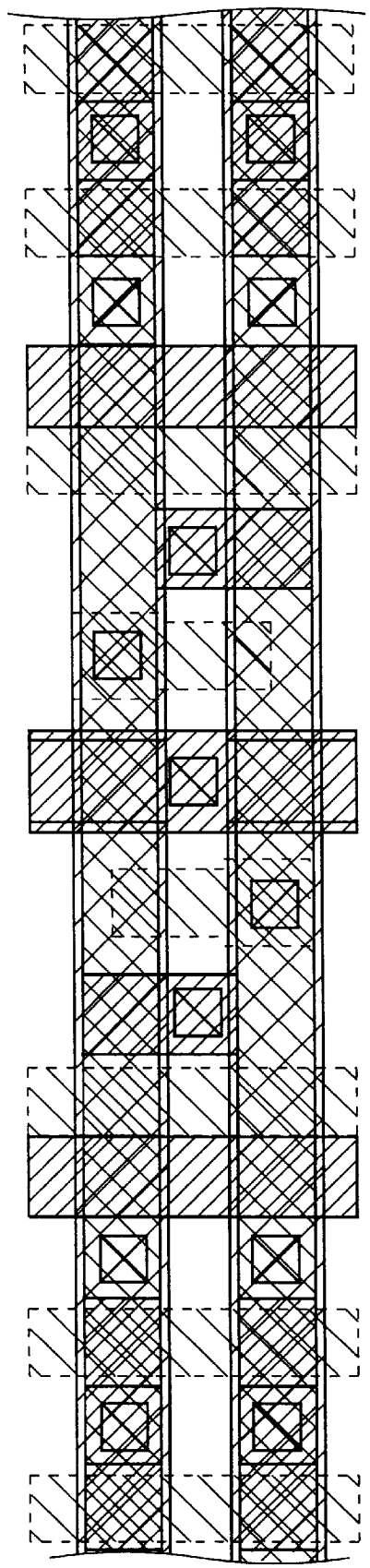

FIGS. 58A and 58B are plan views showing a semiconductor memory device according to an eighteenth embodiment of the present invention, in which the layout of the block structure of a ferroelectric memory is illustrated. The layout of the block writing select transistor and the amplifying transistor portion is illustrated.

Figure 59A:
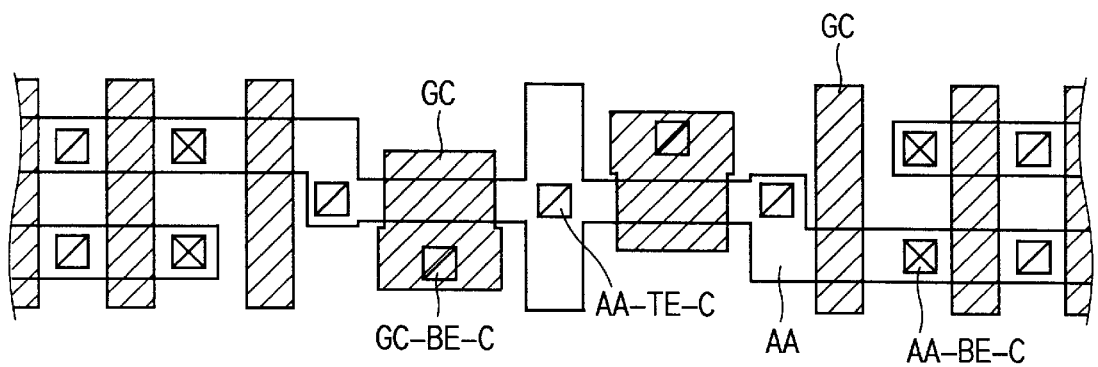
FIGS. 59A and 59B are diagrams showing a portion of layers shown in FIGS. 58A and 58B which are layout diagrams.
Figure 59B:
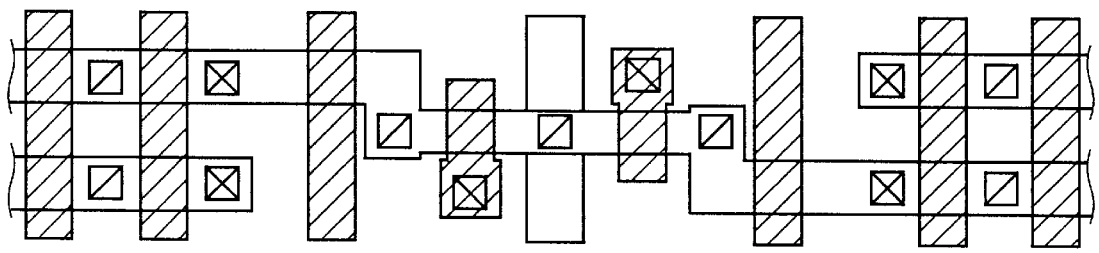
Figure 60A:
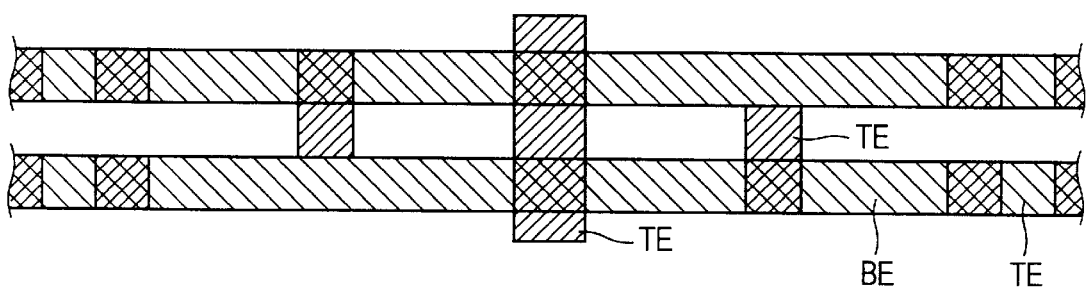
FIGS. 60A and 60B are diagrams showing a portion of layers shown in FIGS. 58A and 58B which are layout diagrams.
Figure 60B:
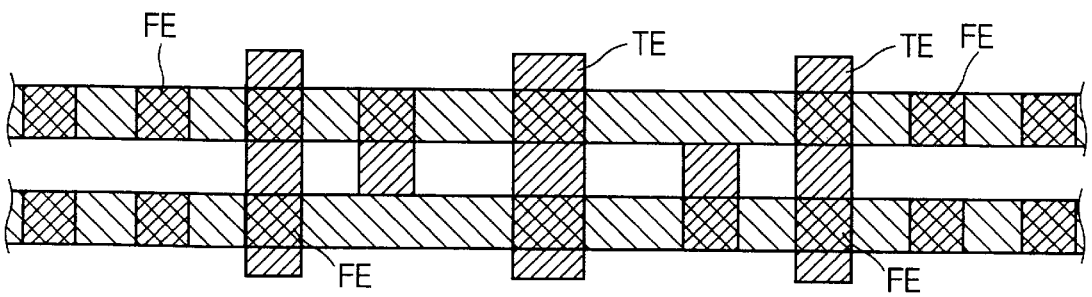

FIGS. 59A and 59B show a portion of layers shown in the layout shown in FIGS. 58A and 58B. FIGS. 60A and 60B shows a portion of layers shown in the layout shown in FIGS. 58A and 58B. FIGS. 58A, 59A and 60A of FIGS. 58A to 60B show a case in which the channel length L of the amplifying transistor is increased as compared with FIG. 36. Thus, a predetermined component of the load capacity of the sub-bitline can be increased. FIGS. 58B, 59B and 60B correspond to FIG. 51 and show a structure that a capacitor for stabilizing the ferroelectric component is added. In this example, four stabilizing FE are added to one cell block.

(Nineteenth Embodiment)

Figure 61:
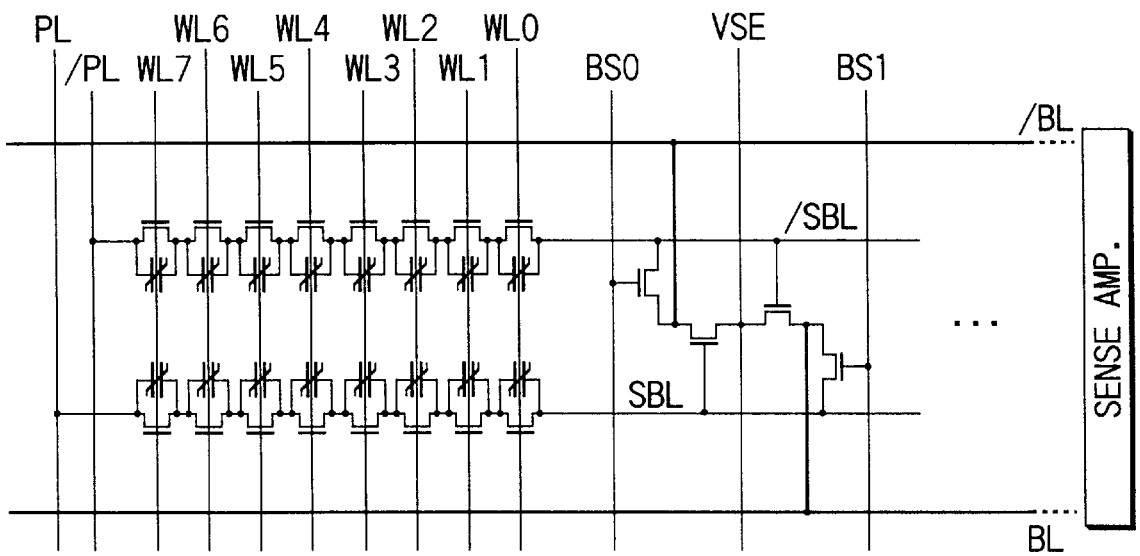
FIG. 61 is a circuit diagram showing the block structure of a ferroelectric memory according to a nineteenth embodiment.

FIG. 61 is a circuit diagram showing a semiconductor memory device according to a nineteenth embodiment of the present invention, in which the block structure of a ferroelectric memory is illustrated. The structure according to this embodiment is formed such that the upper right and lower right block units are removed from the cell block shown in FIG. 9. A major portion of the effects are same as those obtained from the structure shown in FIG. 9. Since the right and left block units are not selected, the plate select signal and the plate select transistor are not required. The plate is directly connected to the block unit. Although the load capacity is considerably changed owning to the position of the selected word line shown in FIGS. 12A and 12B, use of the dummy cell is able to overcome the foregoing fact. When the size of the transistor is increased as shown in FIG. 58A, the problem can be overcome.

FIG. 62 is a signal waveform showing an example of the specific operation of FIG. 61. When WL0 is lowered and /PL is raised, data can be read to the sub-bitline /SBL, the read data is, through the amplifying transistor, read to the opposite bitline BL of the bitline pair, and then amplified by the sense amplifier. Amplified data is returned to the sub-bitline by making the block writing select signal BS0 to be High. When /PL is driven from High to Low, data items "1" and "0" are written back on the cell. Then, BS0 is lowered and WL0 is raised, all of the nodes of the sub-bitline are automatically made to be Vss. When also the bitline is equalized, the potential is returned to (½)VBLH similarly to the structure shown in FIG. 9. Thus, the standby state is realized.

FIG. 63 is a signal waveform showing another example of the specific operation of FIG. 61. The only difference from FIG. 62 lies in that the bitline is precharge to VBLH. Thus, similar effects and operations to those of the structure shown in FIG. 9 can be realized.

(Twentieth Embodiment)

Figure 64:
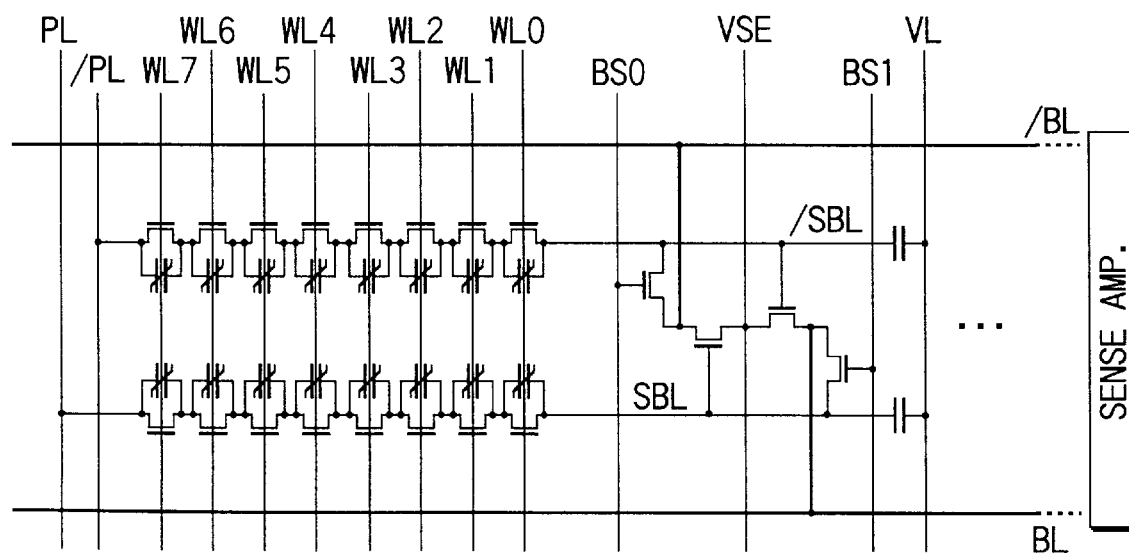
FIG. 64 is a circuit diagram showing the block structure of a ferroelectric memory according to a twentieth embodiment.
Figure 65:
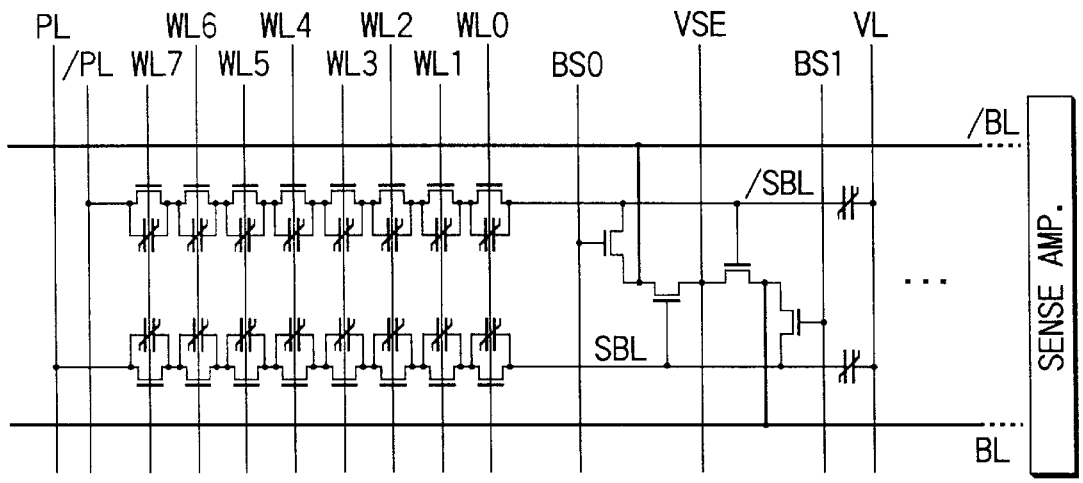
FIG. 65 is a circuit diagram showing the block structure of the ferroelectric memory according to a twenty-first embodiment.

FIG. 64 is a circuit diagram showing a semiconductor memory device according to a twentieth embodiment of the present invention, in which the block structure of a ferroelectric memory is illustrated. The difference from the structure shown in FIG. 61 lies in that a paraelectric capacitor for stabilizing the load capacity is added.

(Twenty-First Embodiment)

FIGS. 65 to 69 are circuit diagrams showing a semiconductor memory device according to a twenty-first embodiment of the present invention, in which the block structure of a ferroelectric memory is illustrated. The only difference of structure shown in FIG. 65 lies in that a ferroelectric capacitor is employed in place of the load capacity realized by the paraelectric shown in FIG. 64.

Figure 66:
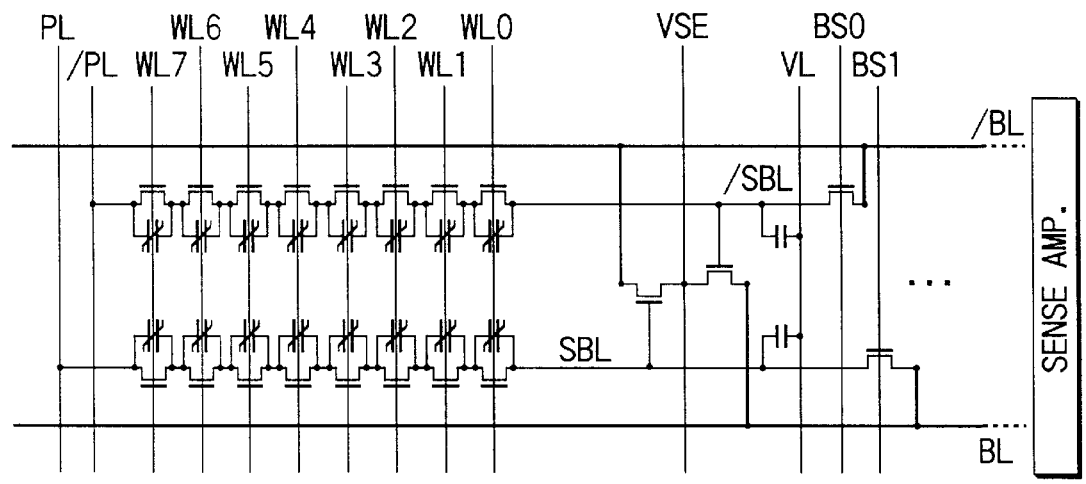
FIG. 66 is a circuit diagram showing the block structure of the ferroelectric memory according to a twenty-first embodiment.

The structure shown in FIG. 66 is formed such that the equivalent circuit is the same and the effect are the same as those of the structure shown in FIG. 64. Note that the topology of the positions of the transistors is different. The load capacitor may be omitted from the structure shown in FIG. 66. Moreover, a ferroelectric capacitor may be substituted for the paraelectric capacitor.

Figure 67:
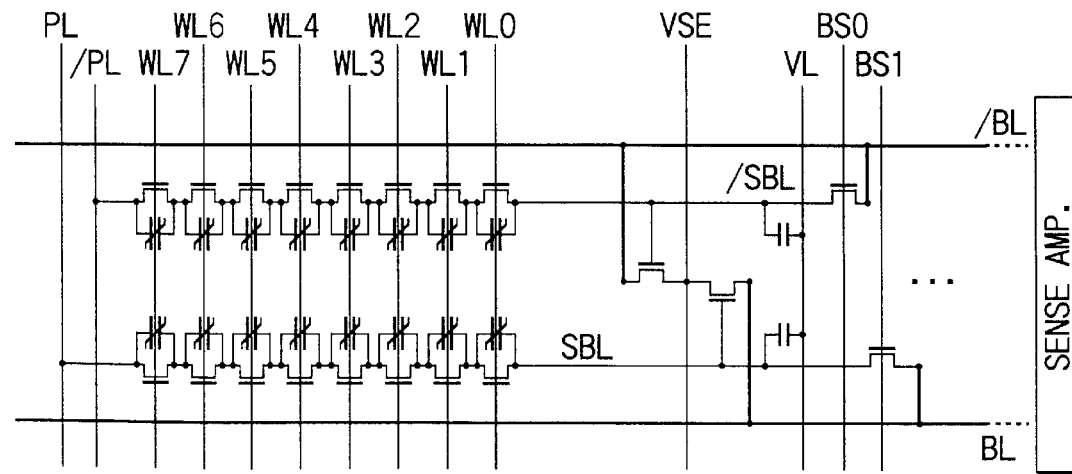
FIG. 67 is a circuit diagram showing the block structure of the ferroelectric memory according to a twenty-first embodiment.

The structure shown in FIG. 67 is formed such that the equivalent circuit is the same and the effect are the same. Note that the topology of the positions of the transistors is different. The load capacitor may be omitted from the structure shown in FIG. 67. Moreover, a ferroelectric capacitor may be substituted for the paraelectric capacitor.

Figure 68:
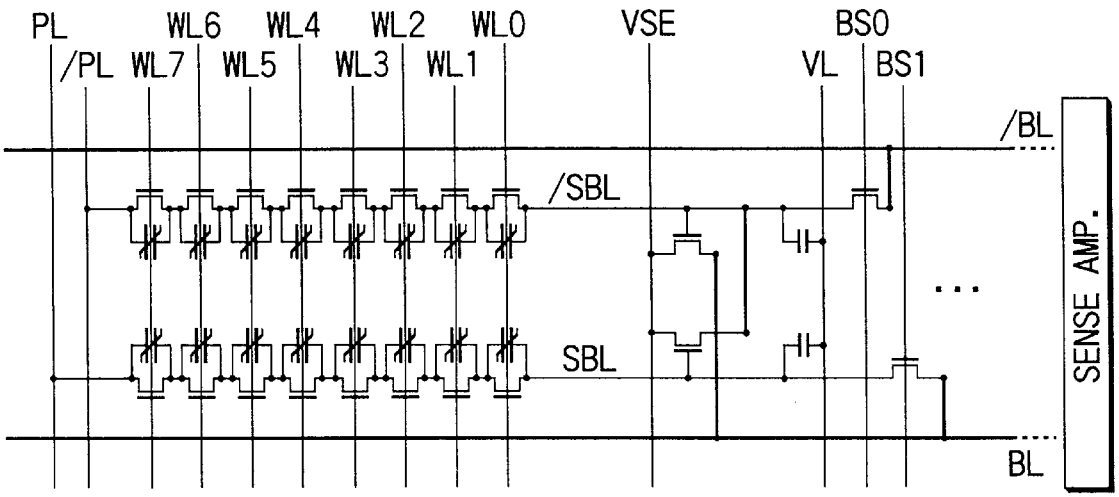
FIG. 68 is a circuit diagram showing the block structure of the ferroelectric memory according to a twenty-first embodiment.

The structure shown in FIG. 68 is formed such that the equivalent circuit is the same and the effect are the same as those of the structure shown in FIG. 66. Note that the topology of the positions of the transistors is different. The load capacitor may be omitted from the structure shown in FIG. 68. Moreover, a ferroelectric capacitor may be substituted for the paraelectric capacitor.

Figure 69:
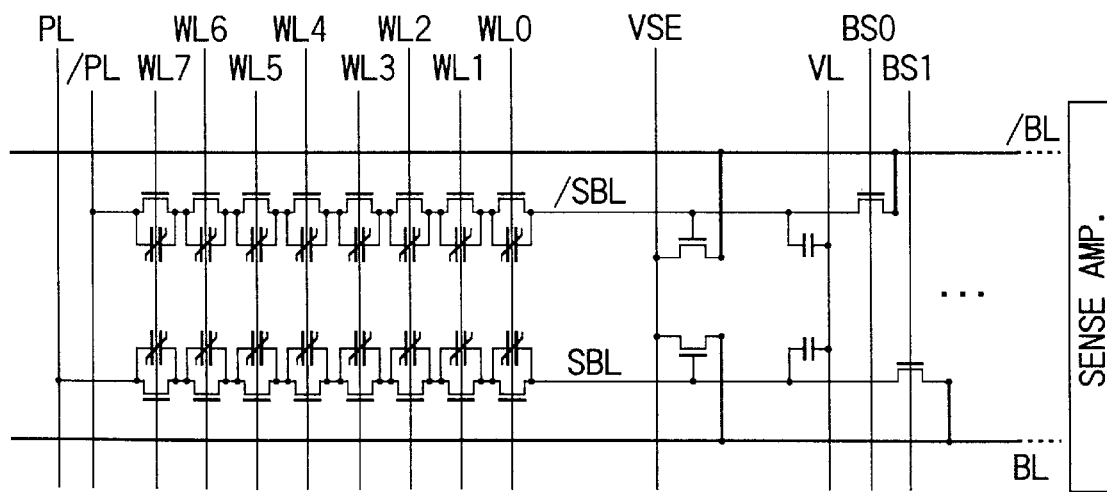
FIG. 69 is a circuit diagram showing the block structure of the ferroelectric memory according to a twenty-first embodiment.

The structure shown in FIG. 69 is formed such that the equivalent circuit is the same and the effect are the same as those of the structure shown in FIG. 67. Note that the topology of the positions of the transistors is different. The load capacitor may be omitted from the structure shown in FIG. 69. Moreover, a ferroelectric capacitor may be substituted for the paraelectric capacitor.

(Twenty-Second Embodiment)

FIGS. 70A to 70C are plan views showing a semiconductor memory device according to a twenty-second embodiment of the present invention, in which the layout of the block structure of the ferroelectric memories is illustrated. FIG. 70A corresponds to the circuit diagram shown in FIG. 61 and also the topology of the positions of the transistors corresponds to the same. FIG. 70B corresponds a circuit diagram in which the load capacitor shown in FIG. 66 is omitted. Also the topology of the positions of the transistors corresponds to the same. FIG. 70C corresponds to the circuit diagram shown in FIG. 69 in a case where the load capacitor is omitted. Also the topology of the positions of the transistors corresponds to the same.

Figure 72A:
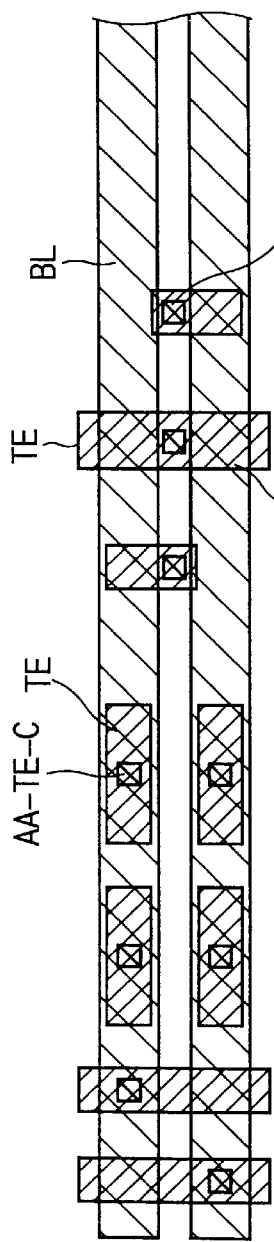
FIGS. 72A to 72C are diagrams showing the layout of a portion of layers of the layouts shown in FIGS. 70A to 70C.
Figure 72B:
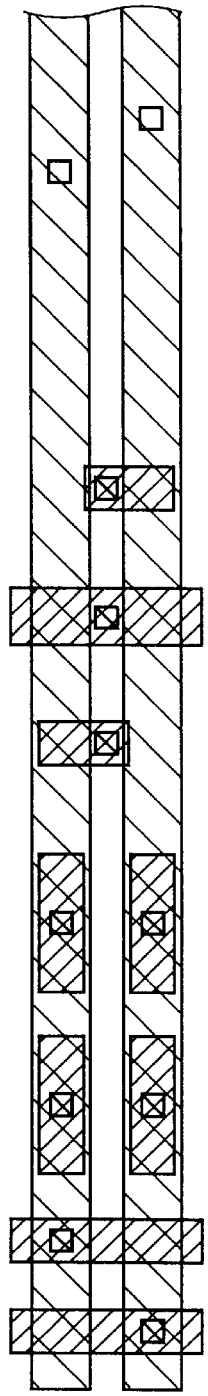
Figure 72C:
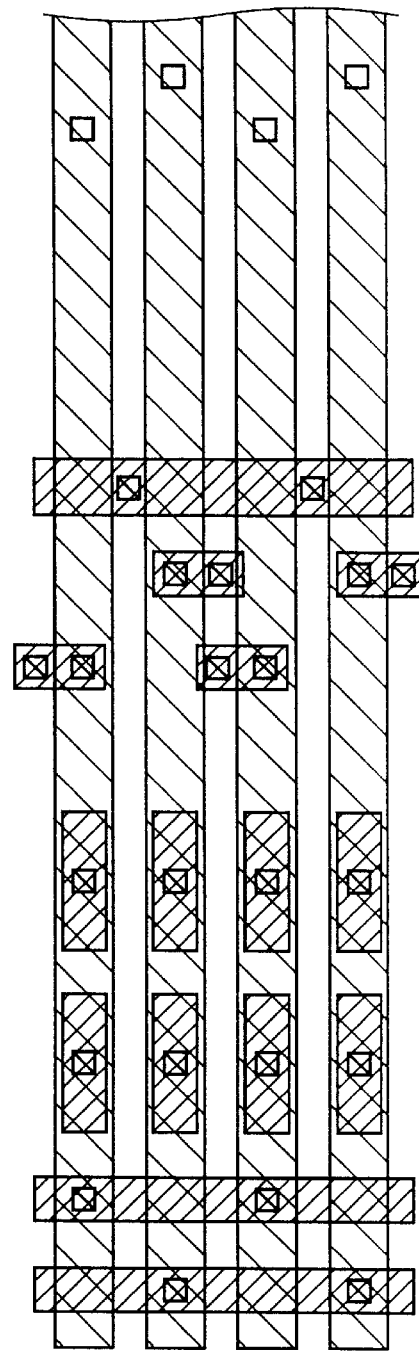

FIGS. 71A to 71C show the layout of a portion of layers of the layout shown in FIGS. 70A to 70C. Similarly, FIGS. 72A to 72C show the layout of a portion of layers of the layout shown in FIGS. 70A to 70C. Each of the layouts enables the self-amplifying function to be mounted in a cell array having a severe pitch without making the design rule to be severe.

(Twenty-Third Embodiment)

Figure 73:
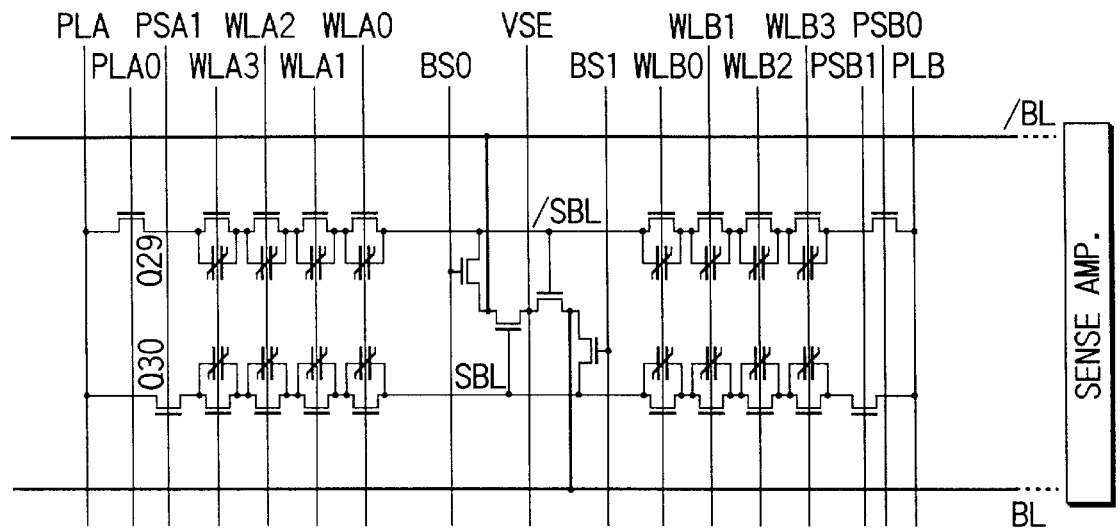
FIG. 73 is a circuit diagram showing the block structure of a ferroelectric memory according to a twenty-third embodiment.

FIG. 73 is a circuit diagram showing a semiconductor memory device according to a twenty-third embodiment of the present invention, in which the block structure of a ferroelectric memory is illustrated. This circuit structure, operations and effect according to this embodiment are similar to those of the structure shown in FIG. 9. The difference lies in that the plate select signal is divided into two types (PSA0 and PSA1) and, thus, one type of plate line is employed.

Figure 74:
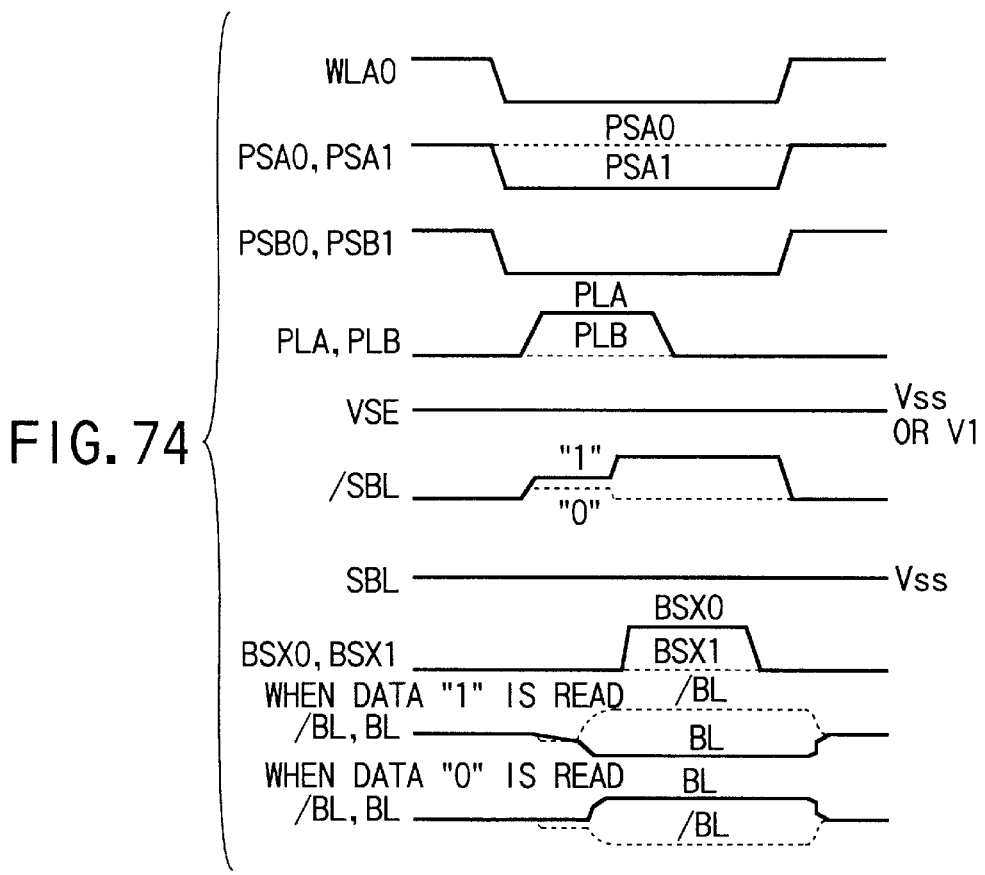
FIG. 74 is a signal waveform showing an example of the specific operation of FIG. 73.

FIG. 74 is a signal waveform showing an example of the specific operation of FIG. 73. The difference in the operation from that shown in FIG. 10 will now be described. When the state is changed from the standby state to the active state, the plate select signals (PSB0, PSB1 and PSA1) for controlling the connection of the upper right block unit, the lower right block unit and the lower left block unit are lowered from High to Low so that the block units and the plates are separated from one another. At this time, the high level of only the plate select signal (PSA0) for controlling the connection of the upper left block unit and the plate PLA is maintained. Simultaneously or before or after the foregoing operation, the potential of the word line WLA0 is lowered.

Then, the potential of only PLA is raised from Low to High so that data in the cells in the upper left block unit of the four block units is read to the sub-bitline /SBL so as to be amplified by the amplifying transistor. Then data is transferred to the bitline BL so as to be amplified by the sense amplifier. Then, the potential of BS0 is made to be High so that data is rewritten. When the state is returned to the standby state, the potential of BS0 is lowered and PSA1, PSB0, PSB1 are raised and WLA0 is raised.

(Twenty-Fourth Embodiment)

Figure 75:
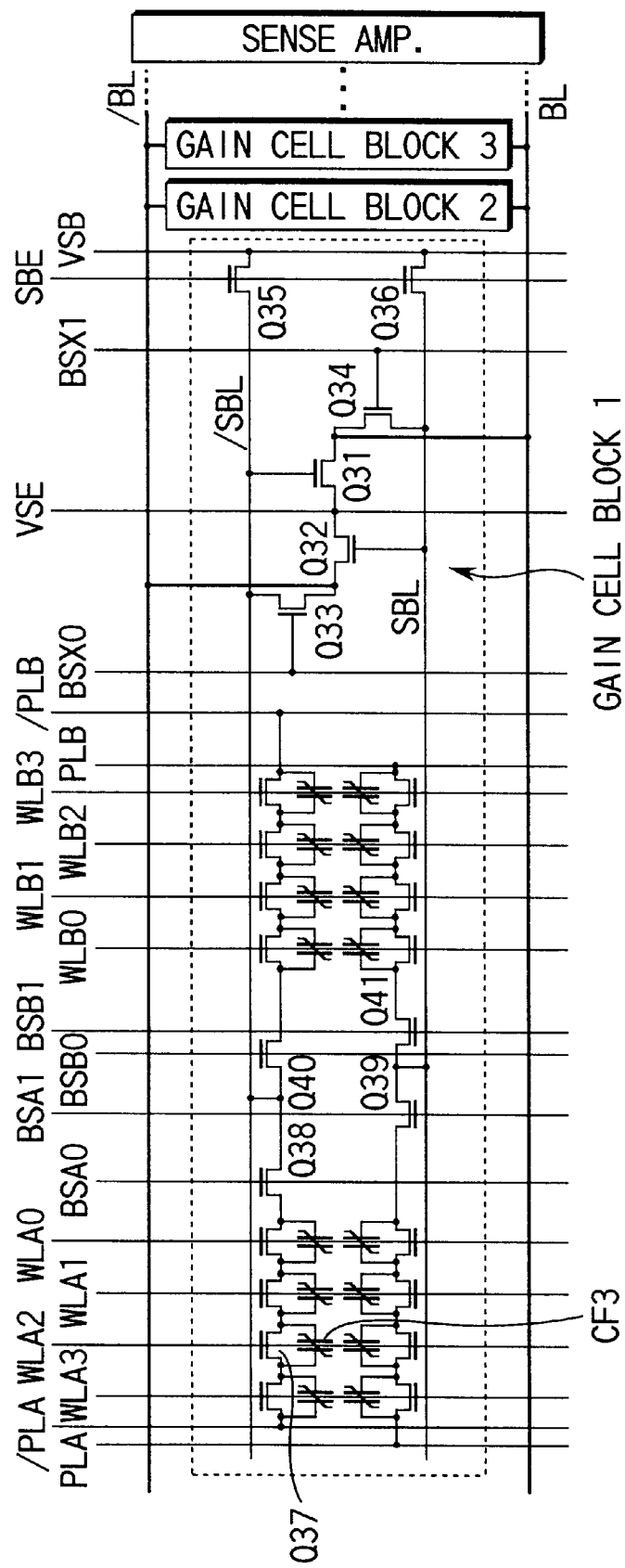
FIG. 75 is a circuit diagram showing the block structure of a ferroelectric memory according to a twenty-fourth embodiment.

FIG. 75 is a circuit diagram showing a semiconductor memory device according to a twenty-fourth embodiment of the present invention, in which the block structure of a ferroelectric memory is illustrated. Similarly to the previous suggestion performed by the inventors of the present invention, one memory cell is constituted by the parallel connection of the cell transistor and the ferroelectric capacitor. The gate of the cell transistor is connected to the word lines WLA0 to WLA3 and WLB0 to WLB3.

One cell block is constituted by four (a multiplicity of memory cells is permitted) memory cells connected to one another in series. One end is connected to the plate (/PLA and PLA). The foregoing structure is the same as that of the previous suggestion performed by the inventors of the present invention. In this embodiment, another end of the cell block is connected to the sub-bitline /SBL through the cell block select transistor. A plurality of cell blocks are connected to the sub-bitline /SBL. Similarly, a plurality of cell blocks are connected to the sub-bitline SBL.

Referring to the drawing, specifically, four cell blocks are provided which are: an upper left cell block having the gate which is WLA0 to WLA, the plate which is /PLA and the cell block select signal which is BSA0 and connected to /SBL; a lower left cell block having the gate which is WLA0 to WLA3, the plate which is PLA and the cell block select signal which is BSA1 and connected to SBL; an upper right cell block having the gate which is WLB0 to WLB3, the plate which is /PLB and the cell block select signal which is BSB0 and connected to /SBL; and an upper left cell block having the gate which is WLB0 to WLB3, the plate which is PLB and the cell block select signal which is BSB1 and connected to SBL.

The transistor Q31 has the gate to which the sub-bitline (/SBL) is input, the source which is connected to the potential VSE and the drain connected to the bitline BL. By using the transistor Q31, the potential of /SBL is amplified so as to be transferred to the bitline BL. Conversely, the transistor Q33 makes the block writing select signal BSX0 to be High to transfer the writing potential from the bitline /BL to the sub-bitline /SBL through the transistor Q33 when rewriting or writing is performed. Thus, the foregoing transistor is used to rewrite data on the cell.

The transistor Q32 has the gate to which the sub-bitline (SBL) is input, the source connected to the potential VSE and the drain connected to the bitline /BL. By using the transistor Q32, the potential of SBL is amplified so as to be transferred to the bitline /BL. Conversely, the transistor Q34 makes the block writing select signal BSX1 to be High to transfer the writing potential from the bitline BL to the sub-bitline SBL through the transistor Q34 when rewriting or writing is performed. Thus, the foregoing transistor is used to rewrite data on the cell.

The transistors Q35 and Q36 have gates to which the sub-bit-line precharge signal SBE is input to precharge the sub-bitlines /SBL and SBL to a certain potential (VSB). A unit including the sub-bitline, the plural cell blocks, the amplifying transistor, the block writing select transistor and the sub-bit-line precharge transistor is called a gain cell block.

The plural gain cell blocks are connected to the bitline pair (/BL and BL). Although three gain cell blocks are connected in the drawing, the number may be increased. The right end of the bitline pair (/BL and BL) is connected to the sense amplifier circuit. A plurality of structures shown in FIG. 75 are disposed along the direction of the word line so that one cell array (not shown) is constituted.

The characteristic of this embodiment will briefly be described. The structure shown in FIG. 9 is arranged such that the self-amplifying function is provided in the cell block. The structure shown in FIG. 75 is arranged such that a plurality of cell blocks connected to the same sub-bitline have the self-amplifying function. Moreover, the foregoing cell blocks are connected to the bitline pair in the upper hierarchy so as to be connected to the sense amplifier circuit. If fining proceeds as compared with the effect region for the conventional FRAM, fining does not proceed as compared with the effective region realized by the structure shown in FIG. 9 and the parasitic capacity in the cell block is smaller than the polarization of the ferroelectric capacitor of the memory cell, the foregoing structure is effective. The sub-bitline to which a plurality of cell block are connected is used as the load capacity. Thus, data in the cell is read so as to be amplified by the amplifying transistor. Then, the signal is read to the bitline so as to be amplified by the sense amplifier.

Figures 76, 77:
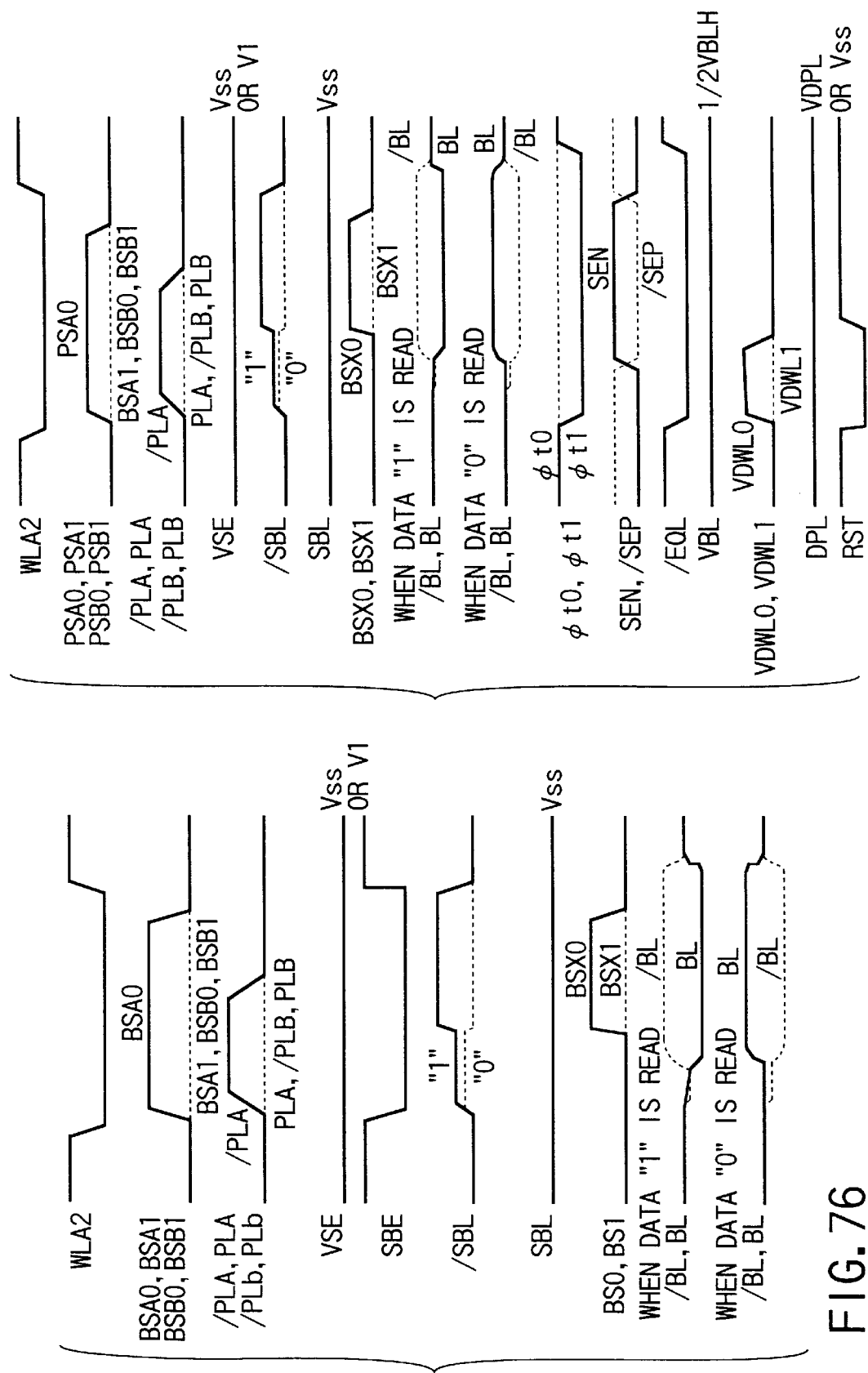
FIG. 76 is a signal waveform showing an example of the specific operation of FIG. 75.
FIG. 77 is a signal waveform showing an example of the specific operation of FIG. 75.

FIG. 76 is a signal waveform showing an example of the specific operation of FIG. 75. Referring to the operation diagram, the operation and the effects of the structure shown in FIG. 75 will now be described. FIG. 76 shows an example of the operation performed when data in the memory cell constituted by the transistor Q37 and the ferroelectric capacitor CF3 is read and data is rewritten.

In a standby state, all of the word lines WLA0 to WLA3 and WLB0 to WLB3 are set to be boosted potential Vpp, all of the plates /PLA, PLA, /PLB, PLB are set to be 0V and the cell block select signals BSA0, BSA1, BSB0 and BSB1 are made to be 0V and all of the cell transistors have been turned on. Both the ends of the ferroelectric capacitor of all of the cells are electrically short-circuited. All of the potentials of both the ends of the cell capacitors in the cell block are made to be 0V because the potential of the plate line is 0V. The potentials of all of the block writing select signal are made to be 0V. Thus, the transistors Q38 and Q39 are turned off and the cell blocks and the sub-bitlines are separated from one another.

The sub-block select precharge signal SBE is made to be High, and the sub-bitline /SBL and SBL are connected to VSB. Since VSB is set to be 0V, the sub-bitlines /SBL and SBL have been made to be 0V. Since the sub-bitlines /SBL and SBL have been set to be 0V and VSE is set to be 0V, the amplifying transistors Q31 and Q32 are turned off. Since also the block writing select signals BSX0 and BSX1 have been made to be 0V, also the block writing select transistors Q33 and Q34 have been turned off. Therefore, the bitlines /BL and BL and the sub-bitlines /SBL and SBL are completely separated from one another.

In the conventional FRAM, the bitlines /BL and BL must be precharged to 0V. In the present invention, the foregoing bitlines can be precharged to (½)VBLH similar to the conventional DRAM.

The operation will now be described which is performed when, for example, a memory cell (Q37, CF3) of the upper left block unit of the selected cell block is selected. Initially, the word line WLA2 connected to the selected memory cell is lowered to 0V so that the cell transistor Q37 is turned off. Simultaneously or before or after the foregoing operation, the sub-block select precharge signal SBE to which the sub-bitline is fixed is lowered, and the sub-bit-line precharge transistors Q35 and Q36 are turned off. Moreover, the bitlines /BL and BL set to (½)VBLH is floated.

In the foregoing state, the states where the cell block select transistors Q39, Q40 and Q41 of the other cell blocks have been turned off are maintained. As a result, the cell transistors Q37 is turned off, Q38 is turned on and the sub-bitline /SBL is floated. Therefore, all of the right-side terminal of the ferroelectric capacitor CF3 of the selected cell to the inside portion of the cell and the sub-bitline /SBL are connected to one another. Moreover, floating state is realized when the potential is 0V.

Then, only the plate /PLA connected to the selected upper left cell block is raised from 0V to VBLH. The potential VBLH is applied from PLA to the left-side terminal of the selected ferroelectric capacitor. At this time, the capacity from the right-side terminal of CF3 to the cell block select transistor and that of /SBL are made to be load capacity CL. When data "1" is written on the ferroelectric capacitor, polarization inversion takes place. Thus, data in the cell is read to the sub-bitline /SBL. Thus, the potential of /SBL is raised from 0V to 2Vs+Vo. When data "0" is written on the ferroelectric capacitor, polarization inversion does not take place. Thus, the potential of sub-bitline /SBL is raised by a degree corresponding to the ratio of the capacity of the paraelectric component of CF3 and that of CL. The potential of /SBL is made to be Vo.

At this time, the potential of the sub-bitline SBL forming the pair is maintained at 0V because Q39 and Q41 have been turned off. The potential VSE is set to be 0V so that the potential of the gate of the amplifying transistor Q31 is 2Vs+Vo in a case of data "1" and Vo in a case of data "0". The potential (=VSE) of the source is 0V. The potential (=/BL) of the drain is made to be (½)VBLH. When design is performed such that the threshold voltage Vt of the transistor Q31 satisfies Vo<Vt<2Vs+Vo, the potential of BL precharged to (½)VBLH, because the transistor Q31 is turned on as shown in FIG. 76 in the case of data "1", is lowered from (½)VBLH owning to flowing of an electric current in the VSE. Note that the lowered potential before the sense amplifier operation is performed is defined to be (½)VBLH−2Vst.

Conversely, the transistor Q31 is turned off in a case of data "0". Therefore, the potential of BL precharged to (½)VBLH is maintained at (½)VBLH because no electric current flows in VSE through the amplifying transistor Q31. At this time, a dummy cell or the like incorporating a constant-current drive transistor is employed such that the potential of /BL is set to be lowered to a degree which is half of the potential of the BL which is lowered in a case of data "1" (that is, (½)VBLH−Vst before the sense operation). Thus, BL is made to be (½)VBLH−2Vst and /BL is made to be (½)VBLH−Vst in a case of data "1" before the sense amplifier operation. Thus, the difference in the potential Vst is input to the right-side sense amplifier shown in FIG. 75. Then, a flip-flop type sense amplifier amplifies the potential so that BL is made to be 0V and /BL is made to be VBLH.

In a case of data "0", BL is made to be (½)VBLH and /BL is made to be (½)VBLH−Vst. Thus, the difference in the potential Vst is input to the right-side sense amplifier shown in FIG. 75. Then, a flip-flop type sense amplifier amplifies the potential so that BL is made to be VBLH and /BL is made to be 0V.

When the threshold voltage of the amplifying transistor satisfies the region Vt<Vo, the amplifying transistor is turned on to lower the potentials of both of /BL and BL. Also in the foregoing case, the driving currents are considerably different from each other. Therefore, no problem arises if the driving current for the dummy cell is designed properly. The potential of VSE may be 0V or another constant potential (that is, the apparent threshold voltage of the amplifying transistor can be raised to a degree corresponding to raising of the potential of VSE from 0V) to correct the threshold value.

When data is rewritten, only block writing control signal BSX0 connected to the sub-bitline /SBL is raised to Vpp. Thus, the potential of the bitline /BL which is 0V or amplified to VBLH is written on /SBL. In a case of data "1", /SBL is made to be VBLH and /SBL is made to be 0V in a case of data "0". At this time, the potential of the plate (the left-side terminal of the selected ferroelectric capacitor) is VBLH. Therefore, voltage−VBLH (the right-side terminal of the ferroelectric capacitor is defined to be positive) is applied to the ferroelectric capacitor in a case of data "0". Thus, data "0" is rewritten. In a case of data "1", the potential of the plate /PLA is then lowered to 0V. When also the left-side terminal of the selected ferroelectric capacitor is made to be 0V, the ferroelectric capacitor is applied with voltage VBLH (the right-side terminal of the ferroelectric capacitor is defined to be positive). Thus, data "1" is rewritten.

In the above-mentioned sequential operations, the potential of the SBL of 0V is maintained. Therefore, data in lower right and left cell blocks is maintained and stabilized. Also Q40 is turned off, data in the upper right cell block is stable. If different data is written from outside (Write Mode) or external data is written after data is read (Read Modified Write), data is required to be written after BS0 is made to be High.

After rewriting is completed, the potential of the block writing select signal BSX0 is lowered from High to 0V. As a result, interference from /BL portion to /SBL can be eliminated. Then, the potential of WLA2 is raised. Moreover, the cell block select signal BSA0 is lowered. Thus, the ferroelectric capacitor of the selected cell is electrically short-circuited. Thus, internal nodes in all of cell blocks is made to be 0V. Simultaneously or before or after the foregoing operation, the bitline pair /BL and BL are electrically short-circuited. Thus, the potential of the bitline pair is made to be (½)VBLH. When SBE is returned to High, also the potential of the sub-bitline pair is lowered to 0V. Thus, the standby state is restored.

In this embodiment, the precharge potential of the bitline is set to be (½)VBLH. The foregoing structure can be realized because the load capacities for reading information in the cell by the polarization inversion are the sub-bitlines /SBL and SBL. The bitlines /BL and BL are not the load capacities for reading information in the cell by the polarization inversion. Therefore, when only electrical short-circuiting of the bitline pair enables the precharge potential of (½)VBLH to be obtained. Thus, similarly to the conventional DRAM, the power consumption which takes place owning to charge/discharge of the bitline can be halved as compared with the conventional FRAM. Moreover, noise caused from charge/discharge of the bitline can be reduced.

This embodiment described with reference to FIG. 75 which is a circuit diagram and FIG. 76 which shows the example of the operation has the structure similarly to the previous suggestion performed by the inventors of the present invention. That is, the ferroelectric capacitors and cell transistors are connected in parallel with one another to form one cell. A plurality of obtained cells are connected in series. Then the block select transistor is connected to the foregoing structure so that a cell block is constituted. Thus, the cell having the high density of $4F^2$ can be realized, the structure of a planar transistor which can easily be manufactured is employed and higher-speed random access function can be obtained.

The conventional FRAM has the problem in that raising of the density causes the design rule to be reduced, the area of the ferroelectric capacitor is reduced with substantially the square of the design rule. Thus, the capacity of the bitline is not reduced in spite of reduction in the polarization of the ferroelectric capacitor of the memory cell. Thus, the amount of read signals is reduced and, therefore, the operation cannot easily be performed. On the other hand, this embodiment has the structure that the sub-bitline is input to the gate of the amplifying transistor and the drain terminal is connected to the bitline. Thus, polarization inversion reading of the memory cell enables data read from the cell block to the sub-bitline to be amplified and transferred to the bitline.

At this time, the load capacity CL realized when the ferroelectric capacitor is polarization-inverted is the total sum of the capacity from the right-side terminal of CF3 to the cell block select transistor and that of the sub-bitline /SBL. Thus, the number of cell blocks connected to the sub-bitline is made to be smaller than the number of cell blocks connected to the bitline according to the previous suggestion performed by the inventors of the present invention. Therefore, a considerably smaller value as compared with the capacity of the bitline can be employed. Even if the size of the ferroelectric capacitor is reduced, an amount of signals which are read to /SBL, that is, the value of Vs which is ½ of the difference between 2Vs +Vo in a case of data "1" and Vo in a case of data "0", can be increased. The foregoing value is amplified by the amplifying transistor Q31.

Therefore, a stable operation can be performed even if the bitlines /BL and BL have a considerably large capacity.

For example, the number of cell blocks connected to the sub-bitline is made to be 1/16 of the number of cell blocks connected to the bitline of the structure according to the previous suggestion performed by the inventors of the present invention. The capacity of the sub-bitline is made to be about 1/16. Therefore, even if the area of the ferroelectric capacitor is reduced to 1/16, the operation can be performed (accurately, the value is larger than 1/16 because the capacity in the cell block is included. In the foregoing case, no problem arises when the number of blocks is made to be 1/32 or the like).

Conversely, this embodiment permits increase in the capacity of the bitline in spite of requirement of a long time for the amplifying transistor to amplify the signal read to the bitline. Therefore, arbitrary increase in the number of gain cell blocks connected to one bitline is permitted. Therefore, the problem experienced with the conventional FRAM and arisen in that the area of the sense amplifier is 15% to 20% of the area of the chip can be overcome. Therefore, the number of gain cell blocks connected to the bitline is increased, the number of sense amplifiers is reduced and overhead of the area of the sense amplifier is substantially eliminated. Thus, an effect can be obtained in that the size of the chip can be reduced.

This embodiment enables the load capacity CL in the cell block to easily be changed by changing the number of cell blocks connected to the sub-bitline and the number of cells connected in series to the cell block. The foregoing fact means that design is required to be performed such that the number of cell blocks connected to the sub-bitline and the number of cells connected in series to the cell block are increased when the size of the ferroelectric capacitor is large. When the size of the ferroelectric capacitor is small, design is required to be performed such that the number of cell blocks connected to the sub-bitline and the number of cells connected in series to the cell block are reduced to reduce CL so as to maintain the amount of signals read to the sub-bitline. Parameters including the number of cell blocks connected to the two sub-bitlines and the number of cells connected in series to the cell block may independently be selected.

The foregoing method is arranged such that the load capacity CL is determined by (the capacity of the cells connected in series to the cell blocks)+(the capacity of the sub-bitlines). As compared with the capacity of the cells connected in series to the cell blocks shown in FIG. 9, a larger value can be obtained. The structure according to this embodiment is effective when the design rule is relatively moderate and the polarization of the ferroelectric capacitor is insufficient in the conventional FRAM as shown in FIG. 13. When the generation proceeds, the number of gain cell blocks connected to the bitline is increased to 2, 4, 8, 16, 32 and 64. Conversely, the number of cell blocks connected to the sub-bitline is reduced to 64, 32, 16, 8, 4 and 2.

The problem of change in the load capacity CL arises because the capacity in the cell is changed owning to the position of the selected word line. When the number of cell blocks which are connected to the sub-bitline is reduced, it is preferable that the number of cells in the cell block is reduced to a number with which no problem arises. That is, it is preferable that the ratio of the capacity of the sub-bitline portion/the capacity in the cell block is maintained at a value not smaller than a predetermined value. It is preferable that the ratio is 3 or more. When the structures shown in FIGS. 75 and 9 are combined with each other, that is, the amplifying transistor of the structure shown in FIG. 9 is omitted and the block writing select transistor is arranged to serve as the block select transistor. Thus, a cell block is formed. Moreover, the structure shown in FIG. 75 is employed. In this case, the load capacity is the capacity in the block unit+the capacity in the opposite block unit+the capacity of the sub-bitline. Thus, the load capacity can furthermore be stabilized.

When the load capacity CL is small, a high potential read to the sub-bitline can be maintained. However, since the total amount of charges is small, a problem of a software error owning to a diffusion layer of the sub-bitline is raised when data is read from the cell. As a matter of course, the foregoing problem can effectively be overcome by adjusting the number of series-connected cells and the number of cell blocks which are connected to the sub-bitline as can be understood from FIGS. 9, 10, 12A and 12B. That is, if the design rule is relaxed and the software error is in a severe state, the numbers are increased to add the load capacity. Thus, Qs=Vs×CL can be realized. If Vs is somewhat lowered, Qs can be increased. Therefore, a larger quantity of inversion charges can be read to the sub-bitline. As a result, the abovementioned problem can be overcome.

As the design rule is reduced and as the software error rate is lowered, the foregoing numbers are required to gradually be reduced to a degree with which the software error is not made. Thus, the amount of signals read to the sub-bitline can be maintained. If the foregoing adjustment is employed for the conventional memory cell having the self-amplifying function, the structure is limited to the cell shown in FIG. 4D. What is worse, the area of the ferroelectric capacitor is increased excessively and a too large cost is required.

As compared with the conventional memory cell having the self-amplifying function, the stable and normal operation performed by the cell having the large ferroelectric capacitor and shown in FIG. 4D can be performed. Moreover, this embodiment enables the amplifying transistor and the write transistor to be shared as the number of cells in one block unit is increased and as the number of cell blocks connected to one sub-bitline is increased. As a result, the overhead of the size of the cell can significantly be reduced.

Another characteristic of the operation shown in FIGS. 75 and 76 lies in the method of lowering the potential of BL opposite to the bitline pair by the amplifying transistor when the potential of /SBL is raised in response to a signal in the cell. When the signal read to the bitline is amplified by the sense amplifier, the potential of /BL is raised. As a result, rewriting is permitted such that the potential of /SBL is raised to a positive level through the block writing select transistor. Thus, coherence can be maintained. In the case of the above-mentioned method, the source of the amplifying transistor is inevitably VSE. Thus, the potential of the sub-bitline (/SBL and SBL) is as it is the potential between the gate and the source. Therefore, control can easily be performed because the amplifying transistor is always turned on in the case of data "1" and the same is always turned off in the case of data "0" regardless of the potential of the bitline.

Namely, even if the potential of the bitline is lowered owning to amplification, the potential between the gate and the source is constant. The potential between the drain and the source can be made to be a high level of (½)VBLH. The operation is the pentode operation and a constant electric current is used to perform the operation. Therefore, the foregoing fact means that the dummy cell can easily be manufactured. As a matter of course, the circuit shown in FIG. 75 has the 1-transistor+1-capacitor structure such that one information item is stored in one cell. The foregoing structure can be realized by changing the operation of the 2-transistor+2-capacitor method with which one information item is stored in two cells.

The foregoing structure can easily be realized by changing the structure shown in FIG. 76 such that also PLA is driven as well as /PLA to also drive BS1 from Low→High→Low as well as BS0. For example, a method may be employed to realize the foregoing structure such that a test of the 1-transistor+1-capacitor is performed to screen defective cells so as to be substituted by a redundancy circuit. Then, the actual product is operated by the 2-transistor+2-capacitor which is a reliable structure.

As shown in FIG. 76, this embodiment permits a high-speed operation as compared with the conventional FRAM because of no factor for reducing the operation speed except for the overhead occurring when the block writing control signal is clocked after the cell is read. When a merit of this method is considered in that the timing at which WLAO is lowered and the timing at which equalization of the bitline and the sub-bitline is suspended can simultaneously be performed, the foregoing overhead can be compensated.

The conventional FRAM have problems which arise in that the plate must be separated for each cell. Moreover, the load of the ferroelectric capacitor of the plate is heavy and the resistance of the plate is high. Moreover, the driving performance of the driver is low because the size of the plate driver cannot be increased (if the size is increased, the size of the chip is increased because the plate driver is provided for each word line) and the operation speed of the plate is low. Similarly to the previous suggestion performed by the inventors of the present invention, this embodiment enables a plurality of word lines to share the plate driver. Therefore, great driving performance can be realized. Since the number of plate lines can be reduced, a metal circuit can be employed and the width of each wire can be increased. Thus, the resistance factors can be reduced. Since the load capacity is substantially determined by the capacity of the ferroelectric capacitor, the capacity is not changed. As a result, a high-speed operation of the plate can be performed.

The effects obtained from the structures shown in FIGS. 75 and 76 are summarized as follows.

(1) Similarly to the previous suggestion performed by the inventors of the present invention, a high-density cell having the $4F^2$ size can be realized by the planar transistor which can easily be manufactured. Moreover, a high-speed random access function can be obtained.

(2) Even if the design rule is reduced and the area of the ferroelectric capacitor is reduced, the capacity of the sub-bitline which is the load capacity at the time of the polarization inversion, can be reduced to correspond to the reduction in the area. As a result, a sufficiently high voltage for reading a signal can be obtained. Since the amplifying transistor is used to amplify the bitline, a stable operation can be performed.

(3) Precharging of the bitline to (½)Vdd (=VBLH) can be employed to reduce power consumption and eliminate noise.

(4) Similarly to the conventional FRAM, the principle of the operation is simple and a high-speed operation can be performed owing to the high-speed operation of the plate.

(5) Even if the bitline has a large capacity, reading is permitted. Therefore, the number of cell blocks connected to the bitline can be increased. As a result, the area of the sense amplifier can be reduced.

(6) Optimization is permitted by reducing the number of series-connected cells in the cell block and the number of cell blocks connected to the sub-bitlines to correspond to reduction in the polarization of the ferroelectric capacitor owning to reduction in the design rule.

(7) In a state in which the design rule is relaxed and the software error is in a severe state, the number of series-connected cells in the cell block and the number of cell blocks connected to the sub-bitline are increased and the load capacity is added to enlarge the reading charge, software error can be prevented. As the design rule is reduced and as the software error rate is lowered, the size of the ferroelectric capacitor and the number of series-connected cells are required to gradually be reduced to a degree with which the software error does not raise a problem. Thus, an amount of signals which are read to the sub-bitline is maintained.

(8) A plurality of cell blocks share the amplifying transistor, the write transistor and the sub-bitline selection precharge transistor. Thus, the overhead of the size of the cell can significantly be reduced.

(9) As the load capacity for the polarization inversion, the capacity of the sub-bitline can be use so that substantially stable operation is performed.

(10) When the number of cells in the cell block and the number of cell blocks connected to the sub-bitline are changed, the load capacity can arbitrarily be adjusted.

(11) The signal of the sub-bitline is used to cause the amplifying transistor to drive the bitline opposite to the bitline pair so that a stable amplifying operation can be performed.

(12) Since the parasitic capacity of the sub-bitline serves as the load capacity, a wide range can be covered from a region in which the load capacity is insufficient and fining proceeds to an unsatisfactory degree to a region in which the polarization of the ferroelectric capacitor of the memory cell is slightly insufficient in the case of the conventional structure of the FRAM.

FIGS. 77 to 79 are signal waveform graphs showing an example of the specific operation of FIG. 75 All of the graphs show examples of the operation waveform which is used when the gain cell block structure shown in FIG. 75 is employed and the sense amplifier circuit shown in FIGS. 16A and 16B is employed. FIG. 77 shows a case in which the capacitance coupling type dummy cell shown in FIGS. 19A to 19C is employed. FIG. 78 shows a case in which the constant current type dummy cell shown in FIG. 23A is employed. FIG. 79 shows a case in which the constant current type dummy cell shown in FIG. 23B is employed. As a matter of course, even the structure shown in FIG. 75 encounters somewhat change of the load capacity because the fixed capacity of the sub-bitline has the capacity in the cell block which is changed depending on the position of the selected word line. As a mater of course, the dummy cell shown in FIGS. 19C and 23C may be employed. A dummy cell incorporating a memory cell improved on the basis of the structure shown in FIG. 75 may be employed.

(Twenty-Fifth Embodiment)

Figure 80:
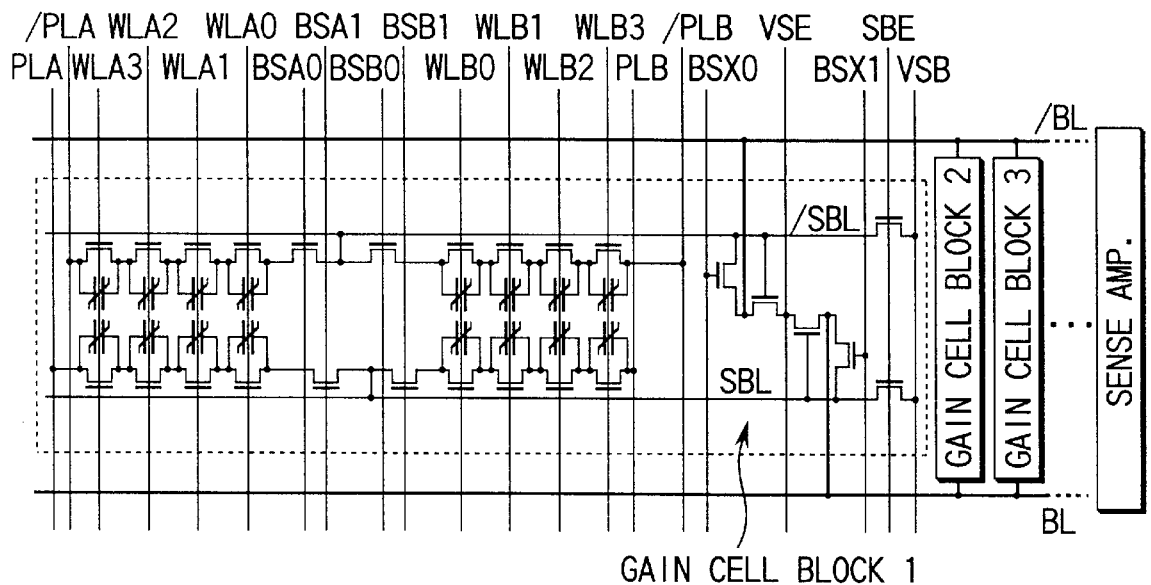
FIG. 80 is a circuit diagram showing the block structure of a ferroelectric memory according to a twenty-fifth embodiment.
Figure 81:
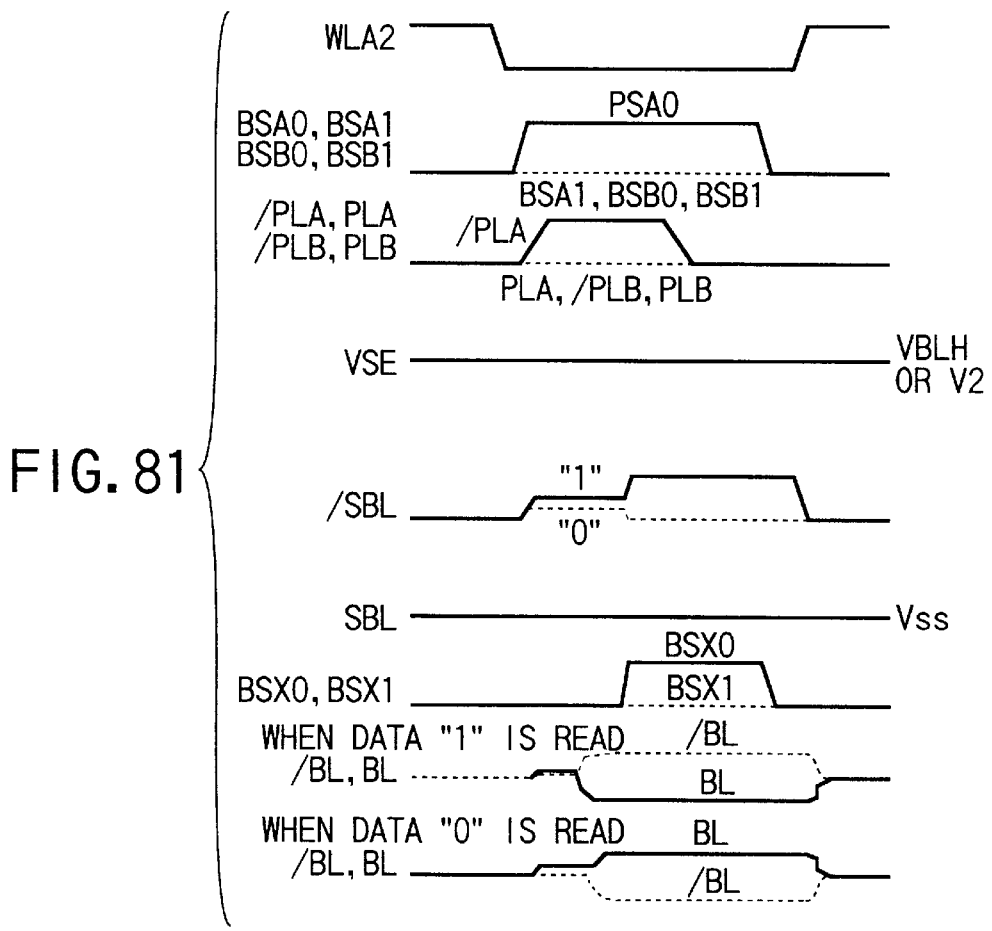
FIG. 81 is a signal waveform showing an example of the specific operation of FIG. 80.

FIG. 80 is a circuit diagram showing a semiconductor memory device according to a twenty-fifth embodiment of the present invention, in which the block structure of a ferroelectric memory is illustrated. FIG. 81 is a signal waveform showing an example of the specific operation of FIG. 80.

FIG. 80 shows the structure which is similar to that shown in FIG. 75. A major portion of the effects is the same as those obtained from the structure shown in FIG. 75. The difference lies in that the source of the amplifying transistor having the gate to which the sub-bitline /SBL is input is connected to the bitline /BL. Moreover, the drain is connected to the potential VSE. The source of the amplifying transistor having the gate to which the sub-bitline SBL is input is connected to the bitline BL and the drain is connected to the potential VSE. That is, the reading bitline and the writing bitline is the same bitline, which is /BL or BL.

The operation shown in FIG. 81 is arranged such that the potential VSE is higher than the voltage to which the bitline is precharged. A fact can be understood that the potential of the bitline is upwards amplified by the amplifying transistor when the amplifying transistor is turned on. It is preferable that the bitline pair is precharged to Vss. When setting to Vt is employed, the method of precharging to (½)VBLH as shown in FIG. 81 may be employed.

(Twenty-Sixth Embodiment)

Figure 82:
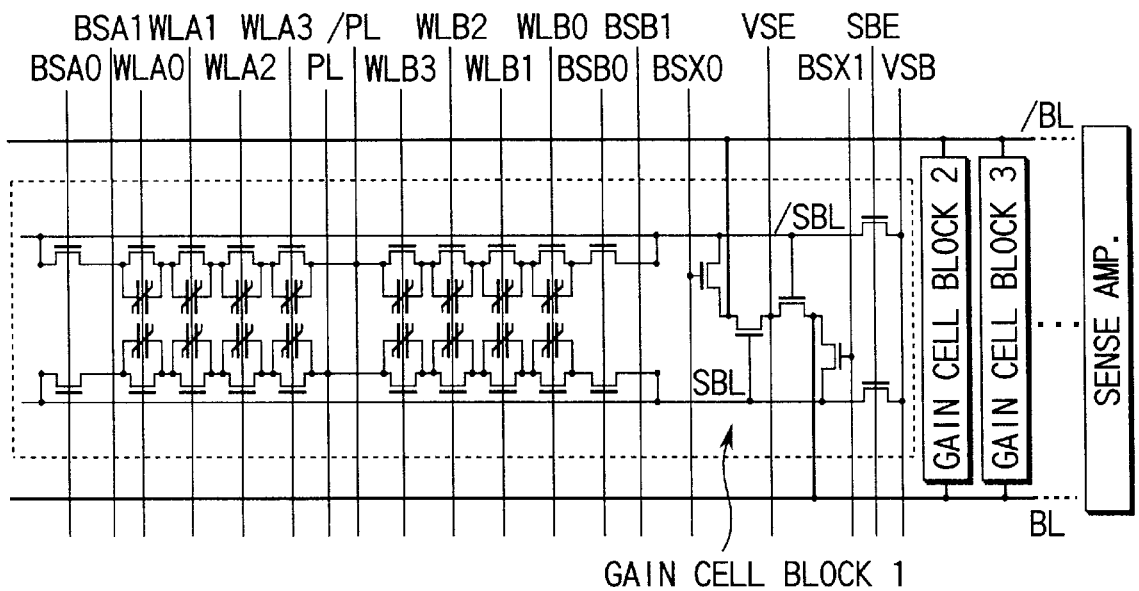
FIG. 82 is a circuit diagram showing the block structure of a ferroelectric memory according to a twenty-sixth embodiment.

FIG. 82 is a circuit diagram showing a semiconductor memory device according to a twenty-sixth embodiment of the present invention, in which the block structure of a ferroelectric memory is illustrated.

Figure 83:
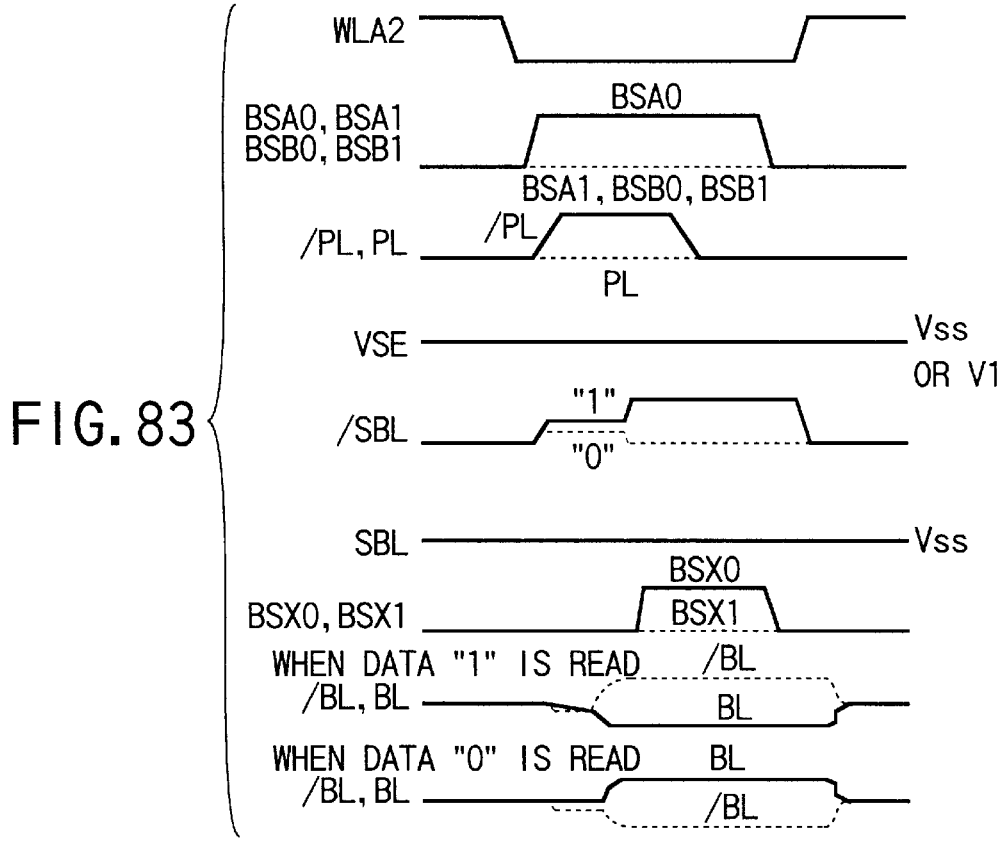
FIG. 83 is a signal waveform showing an example of the specific operation of FIG. 82.

FIG. 83 is a signal waveform showing an example of the specific operation of the dummy cell shown in FIG. 82.

FIG. 82 shows the structure similar to that shown in FIG. 75. A major portion of effects is the same as those obtained from the structure shown in FIG. 75. The difference lies in that the upper left and lower left cell blocks shown in FIG. 75 are folded along the direction of the word line. Moreover, the upper right and lower right cell blocks are folded along the direction of the word line. As a result, a fact can be understood that a merit can be obtained in that the two types of plate lines of the upper left and lower left cell blocks and the upper right and lower right cell blocks can be shared. Also in the example shown in FIG. 75, the plate can be shared when the four or more cell blocks are connected to the same sub-bitline. The operation is the same as that of the structure shown in FIG. 76 except for the current operation.

(Twenty-Seventh Embodiment)

Figure 84:
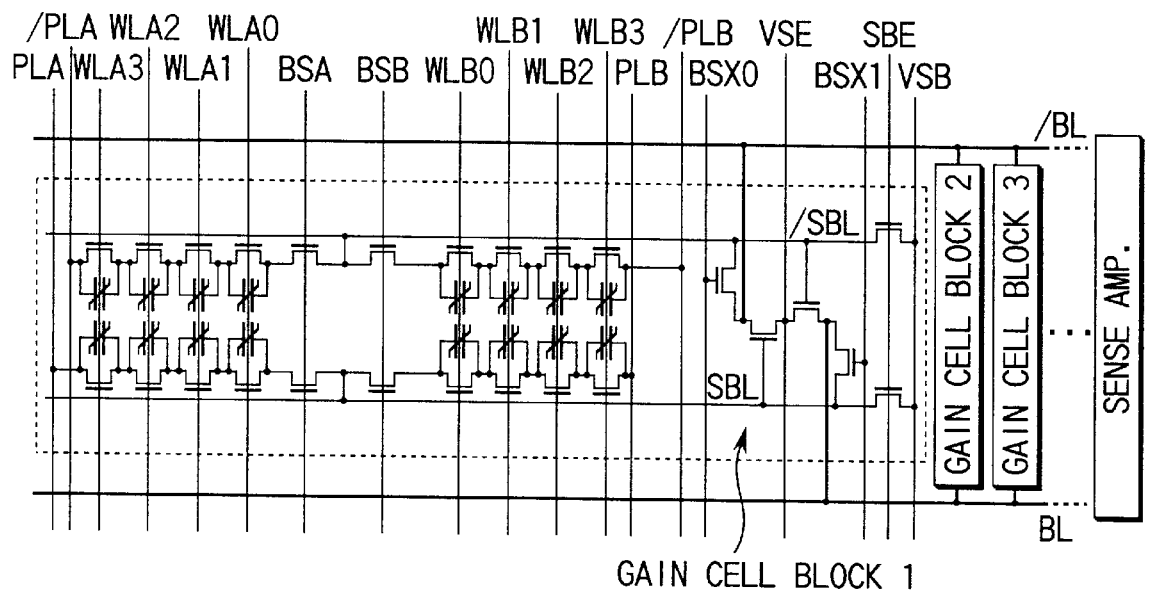
FIG. 84 is a circuit diagram showing the block structure of a ferroelectric memory according to a twenty-seventh embodiment.

FIG. 84 is a circuit diagram showing a semiconductor memory device according to a twenty-seventh embodiment of the present invention. The structure shown in FIG. 84 is similar to that shown in FIG. 75. A major portion of effects is the same as those obtained from the structure shown in FIG. 75. The difference will now be described. The structure shown in FIG. 75 is arranged such that the block select signals are divided into two types for the upper cell blocks and the lower cell blocks. The structure shown in FIG. 84 is arranged to use one type of block select signal (BSA and BSB) to perform control.

Figure 85:
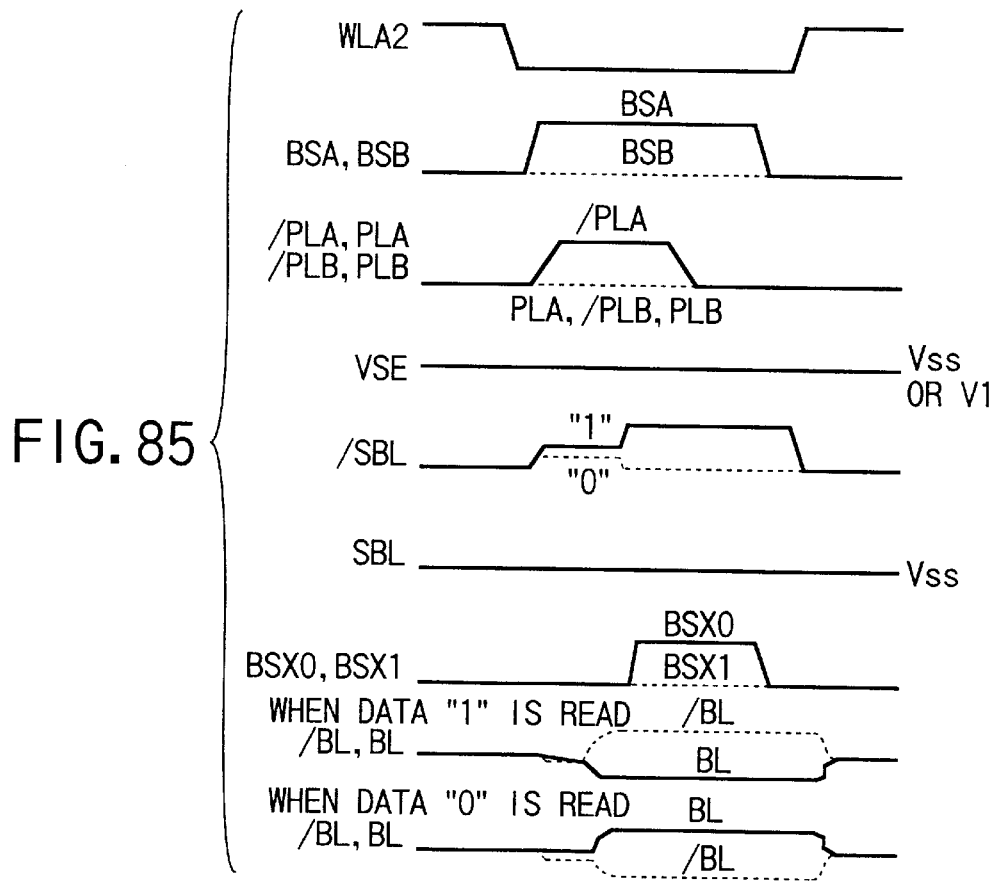
FIG. 85 is a signal waveform showing an example of the specific operation of FIG. 84.

FIG. 85 is a signal waveform showing an example of the specific operation of FIG. 84. When the operation shown in FIG. 85 is performed such that, for example, WLA2 is raised, BSA is raised and /PLA is raised to read cell in the upper left cell block to the sub-bitline, sharing of the block select signal causes the sub-bitline and the internal node of the lower left cell block to be connected to each other. When the sub-bitline SBL is precharged to 0V and the plate line PLA is set to be 0V in a standby state, the potential of PLA which is 0V is maintained in an active state even if the sub-bitline and the internal node of the lower left cell block are connected to each other. Moreover, the potential of the internal node of the cell block, which is 0V, is maintained. Moreover, the potential of the sub-bitline SBL, which is 0V, is maintained. Therefore, no problem arises.

(Twenty-Eighth Embodiment)

Figure 86:
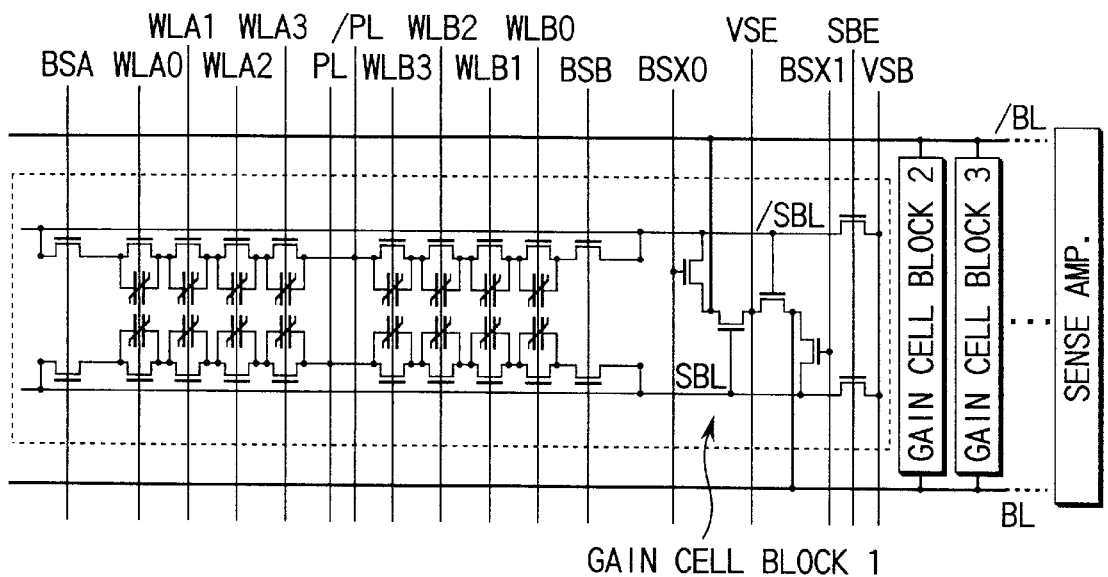
FIG. 86 is a circuit diagram showing the block structure of a ferroelectric memory according to a twenty-eighth embodiment.
Figure 87:
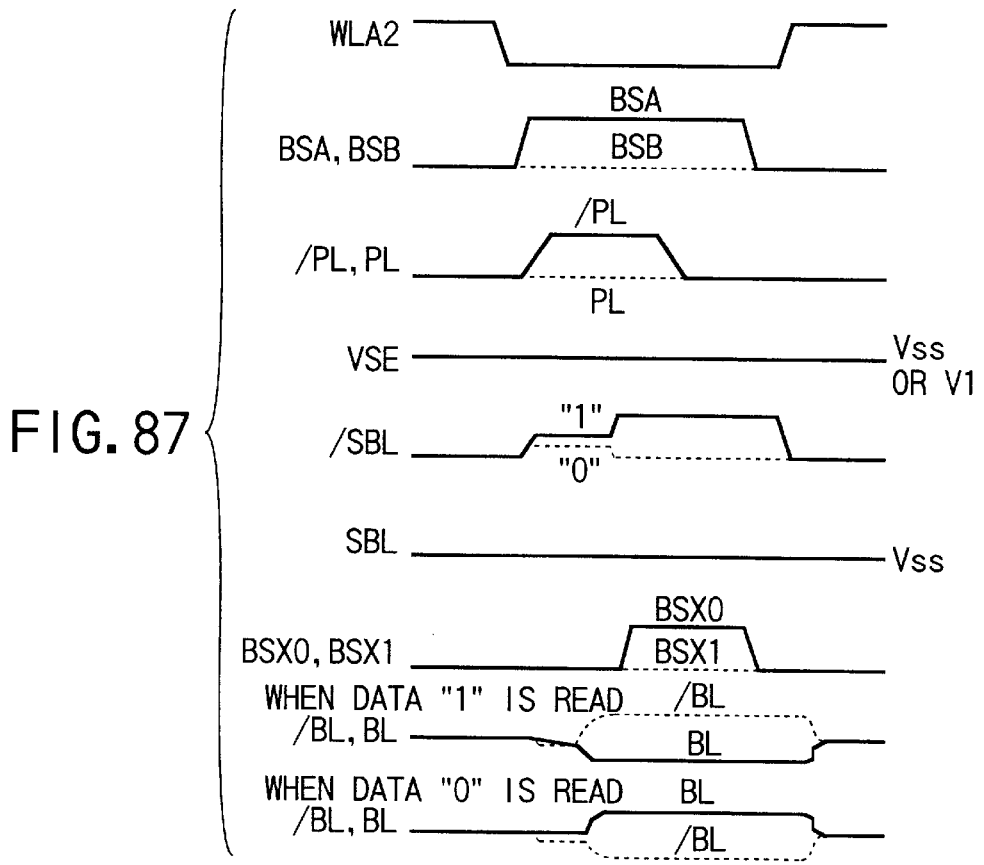
FIG. 87 is a signal waveform showing an example of the specific operation of FIG. 86.

FIG. 86 is a circuit diagram showing a semiconductor memory device according to a twenty-eighth embodiment of the present invention, in which the block structure of a ferroelectric memory is illustrated. FIG. 87 is a signal waveform showing an example of the specific operation of FIG. 86.

The circuit shown in FIG. 86 and the operation shown in FIG. 87 are substantially the same as those shown in FIGS. 84 and 85. A major portion of effects are the same as those obtained from the structures shown in FIGS. 84 and 85. The difference lies in that the cell blocks are folded to share the plate similarly to the structures shown in FIGS. 82 and 83.

(Twenty-Ninth Embodiment)

Figure 88:
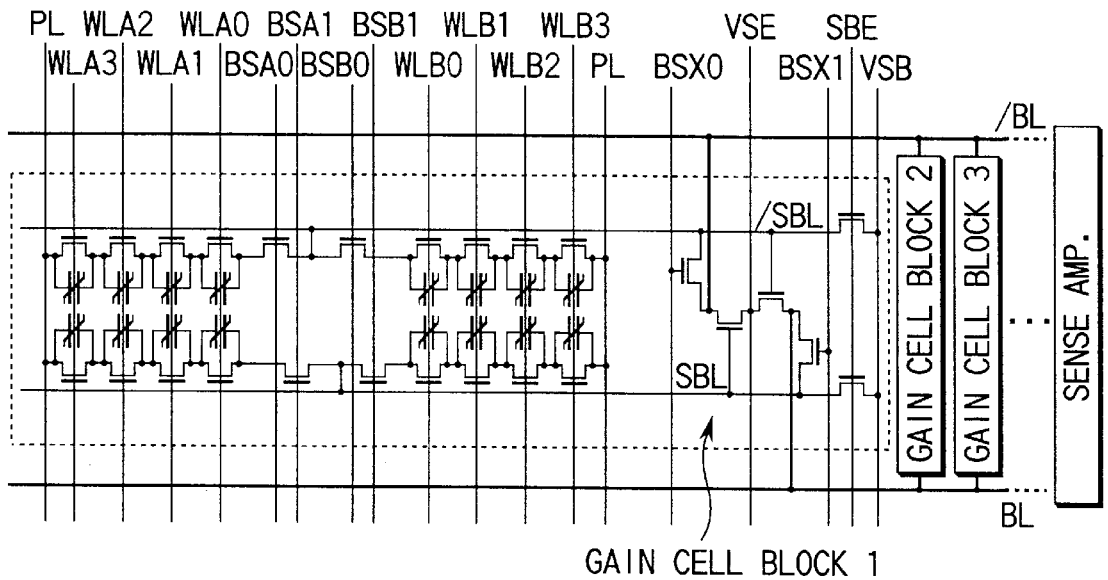
FIG. 88 is a circuit diagram showing the block structure of a ferroelectric memory according to a twenty-ninth embodiment.

FIG. 88 is a circuit diagram showing a semiconductor memory device according to a twenty-ninth embodiment of the present invention, in which the block structure of a ferroelectric memory is illustrated.

The structure shown in FIG. 88 is substantially the same as that shown in FIG. 75. A major portion of effects are the same as those obtained from the structures shown in FIG. 75. The difference lies in that the folded BL structure is employed to read and write by driving the plate. As compared with the structure shown in FIG. 75 in which two types of plate lines are employed to correspond to the sub-bitlines /SBL and SBL. The structure shown in FIG. 88 is arranged such that one type of plate line is employed, that is, the upper and lower cell blocks use the same plate line.

Figure 89:
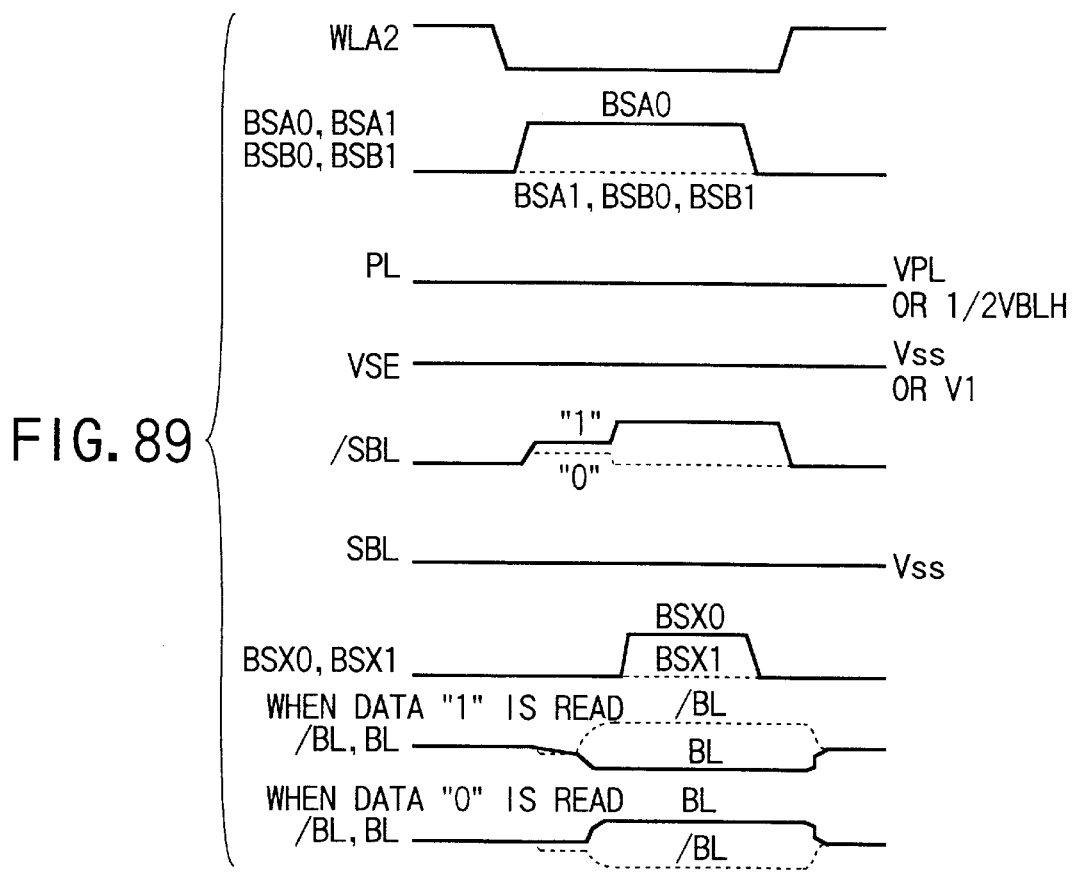
FIG. 89 is a signal waveform showing an example of the specific operation of FIG. 88.

FIG. 89 is a signal waveform showing an example of the specific operation of FIG. 88. The structure shown in FIG. 88 enables the plate operation fixed to (½)Vdd (=(½)VBLH) to be performed. In an active state and the state in which the plate line is fixed to VPL (=(½)VBLH) is maintained, the word line WLA2 is lowered and the block select transistor signal BSA0 is raised. Since the sub-bitline /SBL is precharge to 0V, voltage (½)VBLH is automatically applied to the ferroelectric capacitor of the selected cell of the upper left cell block. Thus, data in the cell is read to the sub-bitline /SBL. The following operations are the same as those of the structure shown in FIG. 75.

The difference from FIG. 75 will now be described. When data is rewritten, the sub-bitline /SBL is fully varied to 0V or VBLH, potential+(½)VBLH or −(½)VBLH is automatically applied to the ferroelectric capacitor because the potential of the plate line is (½)VBLH. Therefore, rewriting of data is permitted. As a result, data can be read/written in a state in which the plate is fixed. When the foregoing operation is performed, also the memory cell transistor connected to WLA2 of the lower left cell block is turned off. Thus, the region from the foregoing transistor to the block select transistor are floated. Since the plate is not driven, floating is performed at the potential of (½)VBLH. Therefore, no problem arises.

The foregoing floating operation in the active state raises a problem in that the potential of the node is lowered owning to leakage from pn-junction. Since active duration for the usual DRAM and FRAM is determined to be 10 $\mu$s or shorter. Since the order is smaller as compared with the longest refreshing time which is 256 ms or the like and which raises the problem of the leak, no problem arises.

(Thirtieth Embodiment)

Figure 90:
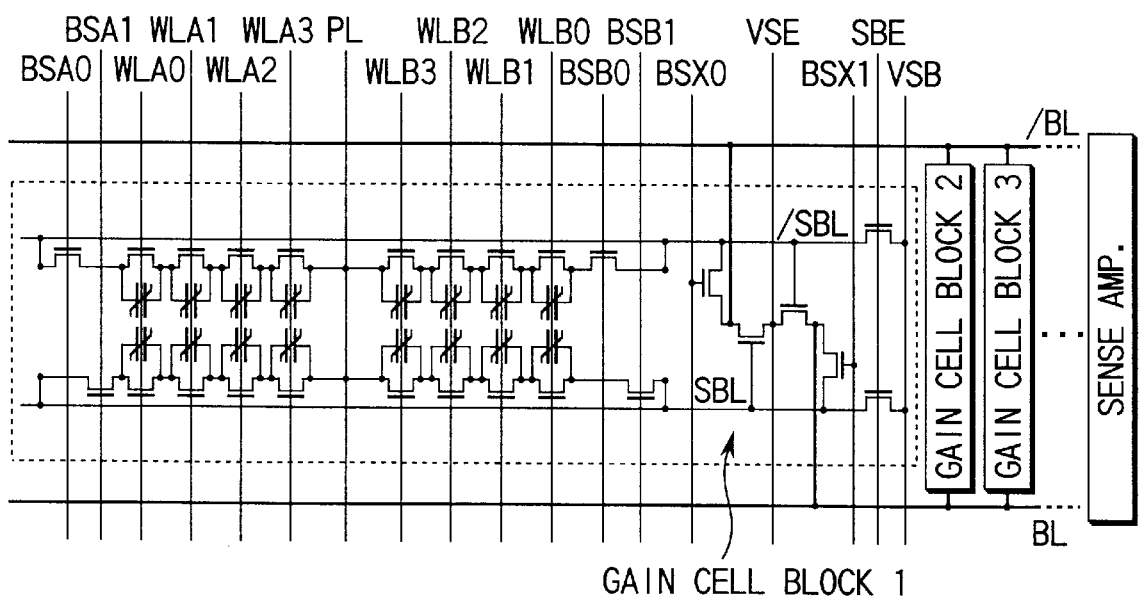
FIG. 90 is a circuit diagram showing the block structure of a ferroelectric memory according to a thirtieth embodiment.

FIG. 90 is a circuit diagram showing a semiconductor memory device according to a thirtieth embodiment of the present invention, in which the block structure of a ferroelectric memory is illustrated.

The circuit shown in FIG. 90 is structured similarly to that shown in FIG. 88. A major portion of effects is the same as those obtained from the structure shown in FIG. 88. The difference lies in that the cell blocks are folded and the plate is shared.

The circuit has the structure similar to that shown in FIG. 84. A major portion of effects is the same as those obtained from the structure shown in FIG. 84. The difference lies in that the cell blocks are folded and the plate is shared.

(Thirty-First Embodiment)

FIGS. 91A to 91C are plan views showing a semiconductor memory device according to a thirty-first embodiment of the present invention, in which the layout of the structure of the gain cell block of the ferroelectric memory is illustrated. FIG. 91A is a layout diagram in which also topology corresponds to the position in the layout shown in FIG. 82. FIG. 91B is a layout diagram in which also topology corresponds to the position in the layout shown in FIG. 86. FIG. 91C is a layout diagram in which also topology corresponds to the position in the layout shown in FIG. 90. Since lamination of layers inhibits easy understanding, the layers in the same layout are divided and illustrated in FIGS. 92A to 95C.

Figure 92A:
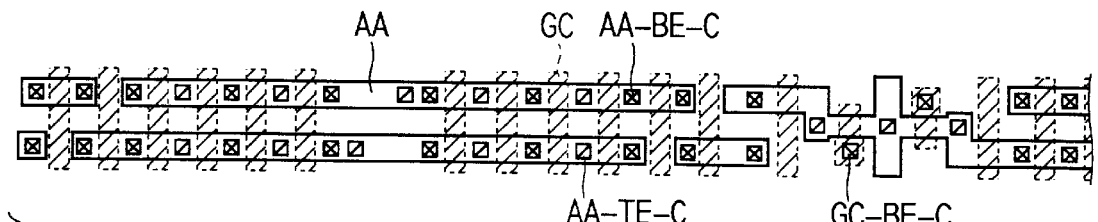
FIGS. 92A to 92C are diagrams showing the layout of a portion of layers of FIGS. 91A to 91C.
Figure 92B:
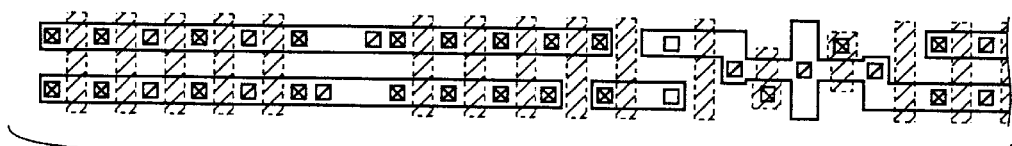
Figure 92C:
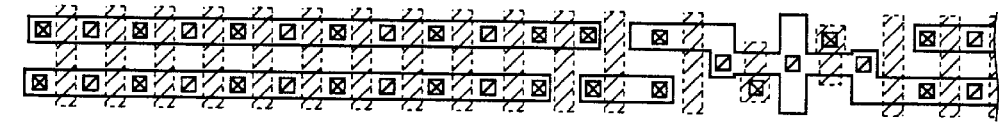
Figure 93A:
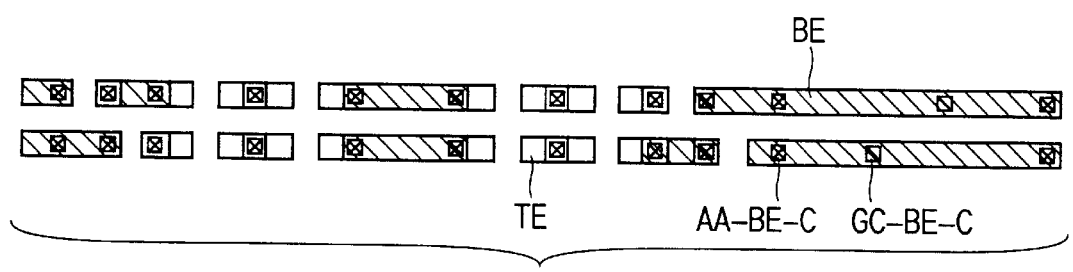
FIGS. 93A to 93C are diagrams showing the layout of the portion of the layers of FIGS. 91A to 91C.
Figure 93B:
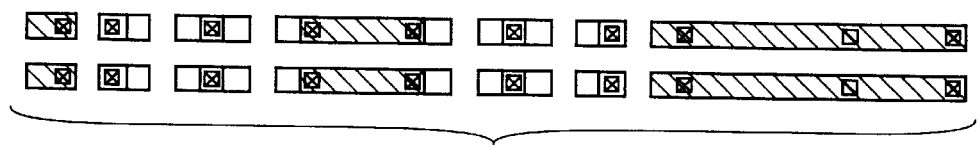
Figure 93C:
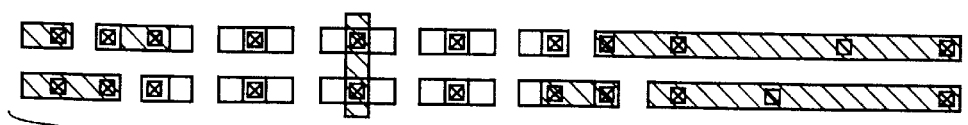
Figure 94A:
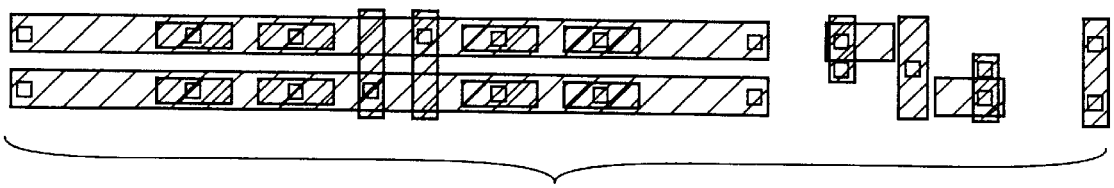
FIGS. 94A to 94C are diagrams showing the layout of the portion of the layers of FIGS. 91A to 91C.
Figure 94B:
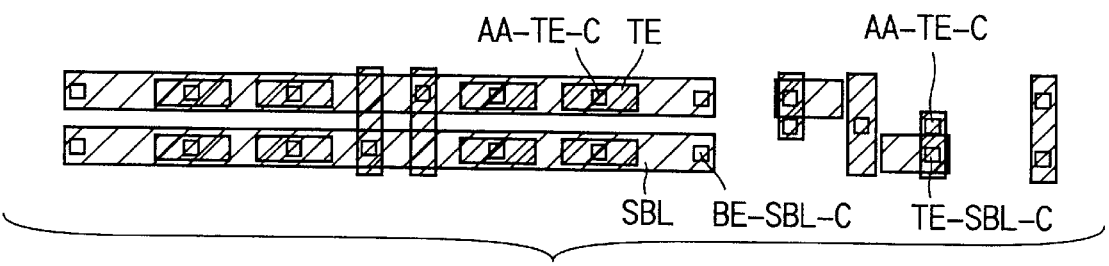
Figure 94C:
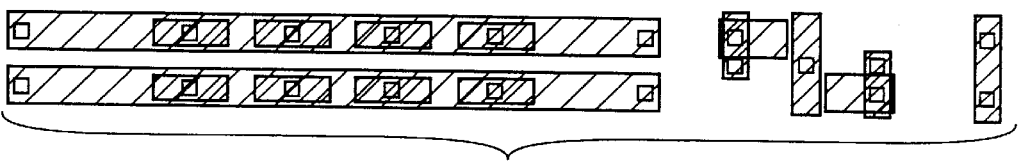
Figure 95A:
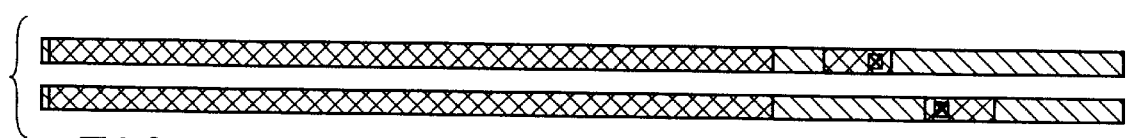
FIGS. 95A to 95C are diagrams showing the layout of the portion of the layers of FIGS. 91A to 91C.
Figure 95B:
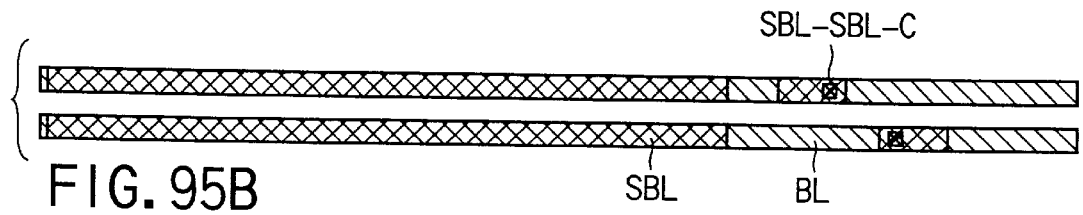
Figure 95C:
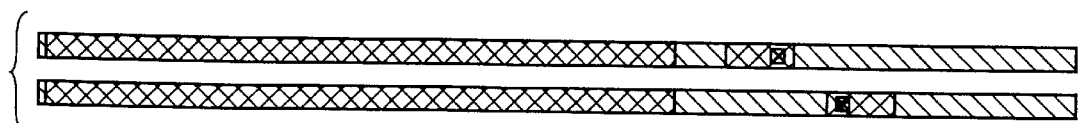

FIGS. 92A to 92C correspond to the layout of a portion of layers in the layout shown in FIGS. 91A to 91C. FIGS. 93A to 93C correspond to the layout of a portion of layers in the layout shown in FIGS. 91A to 91C. FIGS. 94A to 94C correspond to the layout of a portion of layers in the layout shown in FIGS. 91A to 91C. FIGS. 95A to 95C correspond to the layout of a portion of layers in the layout shown in FIGS. 91A to 91C.

The layers are indicated such that the diffusion layer is indicated with AA, the gate layer is indicated with GC, the upper electrode layer is indicated with TE, the lower electrode layer is indicated with BE, the ferroelectric layer is indicated with FE, the sub-bitline layer is indicated with SBL, the bitline layer is indicated with BL, the contact between the diffusion layer and the lower electrode layer is AA-BE-C, the contact between the diffusion layer and the upper electrode layer is indicated with AA-TE-C, the contact between the gate layer and the lower electrode layer is GC-BE-C, the contact between the upper electrode layer and the bitline layer is indicated with TE-BL-C, the contact between the lower electrode and the sub-bitline layer is indicated with BE-SBL-C, the contact between the upper electrode and the sub-bitline layer is indicated with TE-SBL-C and the contact between the sub-bitline and the bitline is indicated with SBL-BL-C.

The upper electrode layer and the lower electrode layer mean the upper and lower electrode layers of the ferroelectric capacitor. The foregoing structure is arranged such that one sub-bitline layer is added to the wire structure shown in FIGS. 35A and 35B. Only one layer is added so that the structure shown in FIGS. 75 to 90 is realized. Since a severe pitch is required in the cell array, transistors each of which has the self-amplifying function can easily be disposed.

(Thirty-Second Embodiment)

FIGS. 96A to 96C are sectional views showing the device structure of devices of the semiconductor memory device according to a thirty-second embodiment of the present invention, in which the gain cell block structure of the ferroelectric memory is illustrated. FIGS. 96A to 96C correspond to FIG. 91B is the sectional view showing the layout structure. FIGS. 96A to 96C correspond to sectional views obtained by division at the center of /BL, an intermediate position between /BL and BL and the center of BL along the direction of the bitline. Since BE is used with finesse, a design allowance can be provided and the self-amplifying function can be realized.

(Thirty-Third Embodiment)

Figure 97:
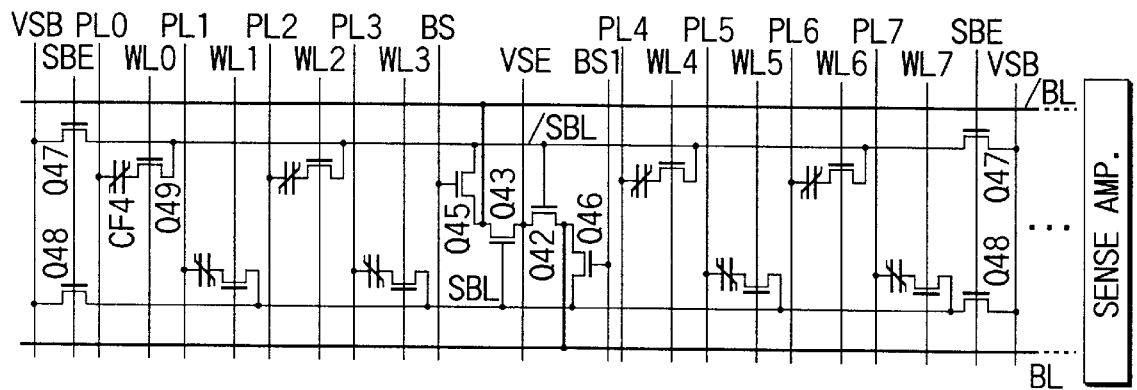
FIG. 97 is a circuit diagram showing the gain cell block structure of a ferroelectric memory according to a thirty-third embodiment.

FIG. 97 is a circuit diagram showing a semiconductor memory device according to a thirty-third embodiment of the present invention, in which the gain cell block structure of a ferroelectric memory is illustrated.

Similarly to the conventional 1-transistor+1-capacitor type ferroelectric memory, one memory cell is constituted by series connection of cell transistors and ferroelectric capacitors. The gate of the cell transistor is connected to word lines WL0 to WL7. Another end of the ferroelectric capacitor is connected to plate electrodes (PL0 to PL7).

The foregoing structure is the same as that of the conventional FRAM. In this embodiment, another end of the cell transistor is connected to the sub-bitline /SBL. A plurality of cells are connected to the sub-bitline /SBL. Similarly, a plurality of cells are connected to the sub-bitline SBL. Specifically, four memory cells are connected to /SBL and four memory cells are connected to the SBL. The plate electrodes of the memory cells are separated from one another (PL0 to PL7).

The transistor Q42 has the gate to which the sub-bitline (/SBL) is input, the source connected to the potential VSE and the drain connected to the bitline BL. By using the transistor Q42, the potential of /SBL is amplified so as to be transferred to the bitline BL. Conversely, the transistor Q45 makes the block writing select signal BS0 to be High to transfer the writing potential from the bitline /BL to the sub-bitline /SBL through the transistor Q45 when rewriting or writing is performed. Thus, the foregoing transistor is used to rewrite data on the cell.

The transistor Q43 has the gate to which the sub-bitline (SBL) is input, the source connected to the potential VSE and the drain connected to the bitline /BL. By using the transistor Q43, the potential of SBL is amplified so as to be transferred to the bitline /BL. Conversely, the transistor Q46 makes the block writing select signal BS1 to be High to transfer the writing potential from the bitline BL to the sub-bitline SBL through the transistor Q46 when rewriting or writing is performed. Thus, the foregoing transistor is used to rewrite data on the cell.

The transistors Q47 and Q48 have gates to which the sub-bit-line precharge signal SBE is input to precharge the sub-bitlines /SBL and SBL to a certain potential (VSB). A unit including the sub-bitline, the plural cell blocks, the amplifying transistor, the block writing select transistor and the sub-bit-line precharge transistor is called a gain cell block. A plurality of gain cell blocks are connected to the bitline pair (/BL and BL). The number of gain cell blocks may arbitrarily be determined. The connection to the sense amplifier circuit is established at one end of the bitline pair (/BL and BL).

The characteristic of this embodiment will briefly be described. The structure shown in FIG. 97 is arranged such that the plural cells connected to the same sub-bitline have the self-amplifying function. Moreover, the foregoing cells are connected to the bitline pair in the upper hierarchy so as to be connected to the sense amplifier circuit. Even if fining proceeds with the conventional FRAM, the polarization of the ferroelectric capacitor of the memory cell is reduced an amount of cell reading signals cannot be maintained, when the number of cells connected to the sub-bitline according to this embodiment is made to be smaller than the number of cells connected to the bitline of the conventional FRAM. The light sub-bitline is used as the load capacity to read data in the cell. Therefore, a sufficiently large amount of reading signals to the sub-bitline can be maintained. The signals are amplified by the amplifying transistor to read the signal to the bitline so as to be amplified by the sense amplifier.

Figure 98:
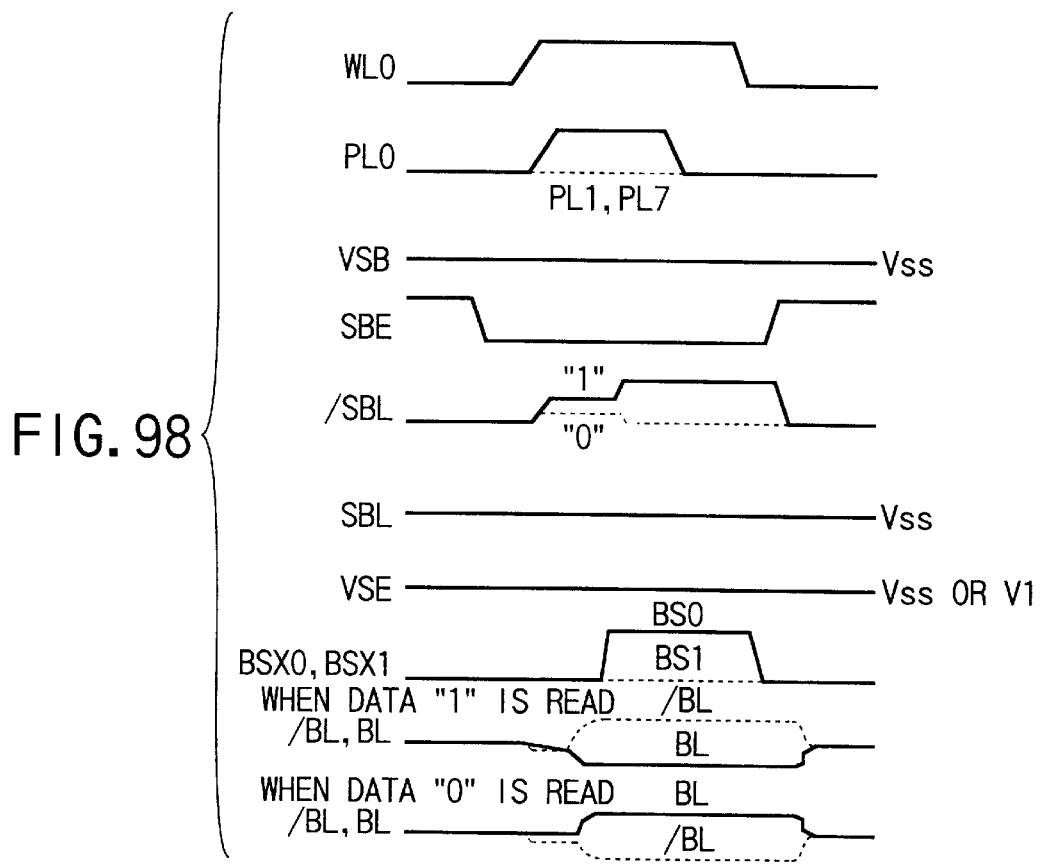
FIG. 98 is a signal waveform showing an example of the specific operation of FIG. 97.

FIG. 98 is a signal waveform showing an example of the specific operation of FIG. 97. Referring to the operation drawing, the operation and effects of the structure shown in FIG. 97 will now be described. FIG. 98 shows an example of the operation performed when data is read from a memory cell constituted by the cell transistor Q49 and the ferroelectric capacitor CF4.

In a standby state, all of the potentials of the word lines WL0 to WL7 are made to be 0V. All of the cell transistors are turned off. All of the plate lines PL0 to PL7 are made to be 0V. All of the block writing select signals BS0 and BS1 are made to be 0V. The sub-block select precharge signal SBE is made to be High. The sub-bitline /SBL and SBL are connected to VSB. Since VSB is set to be 0V, the sub-bitlines /SBL and SBL have been made to be 0V. Since the sub-bitlines /SBL and SBL have been set to be 0V and VSE is set to be 0V, the amplifying transistors Q42 and Q43 have been turned off. Since also the block writing select signals BS0 and BS1 have been made to be 0V, also the block writing select transistors Q45 and Q46 have been turned off.

Therefore, the bitlines /BL and BL and the sub-bitlines /SBL and SBL have completely been separated from one another. In the conventional FRAM, the bitlines /BL and BL must be precharged to 0V. In this embodiment, the foregoing bitlines can be precharged to (½)VBLH similar to the conventional DRAM.

The operation will now be described which is performed when, for example, a memory cell (Q49, CF4) is selected. Initially, the sub-block select precharge signal SBE to which the sub-bitline is fixed is lowered. The sub-block selection precharge transistors Q47 and Q48 are turned off. In this embodiment, the sub-block selection precharge transistors Q47 and Q48 are disposed on both the sides of the sub-bitline. Moreover, the potential (½)VBLH of the bitlines /BL and BL is maintained and the bitlines /BL and BL are floated.

Then, the word line WL0 is raised to Vpp, and the cell transistor Q49 is turned on. Then, the plate line PL0 corresponding to the selected cell is raised from 0V to VBLH. At this time, the capacity of the sub-bitline /SBL to which the plural cells are connected serves as the load capacity CL. When data "1" is written on the ferroelectric capacitor, polarization inversion takes place. Thus, data in the cell is read to the sub-bitline /SBL. Thus, the potential of /SBL is raised from 0V to 2Vs+Vo. When data "0" is written on the ferroelectric capacitor, polarization inversion does not take place. Thus, the potential of sub-bitline /SBL is raised by a degree corresponding to the ratio of the capacity of the paraelectric component of CF4 and that of CL. The potential of /SBL is made to be Vo.

At this time, the potential of the sub-bitline SBL forming the pair is maintained at 0V because all of the cell transistors which are connected to the sub-bitline SBL are turned off and also the block writing select signal BS1 is made to be 0V. The potential VSE is set to be 0V so that the potential of the gate of the amplifying transistor Q42 is 2Vs+Vo in a case of data "1" and Vo in a case of data "0". The potential (=VSE) of the source is 0V. The potential (=/BL) of the drain is made to be (½)VBLH.

When design is performed such that the threshold voltage Vt of the transistor Q42 satisfies Vo<Vt<2Vs+Vo, the potential of BL precharged to (½)VBLH, because the transistor Q42 is turned on in the case of data "1", is lowered from (½)VBLH through the amplifying transistor Q42 owning to flowing of an electric current in the VSE. Note that the lowered potential before the sense amplifier operation is performed is defined to be (½)VBLH–2Vst. Conversely, the transistor Q42 is turned off in a case of data "0". Therefore, the potential of BL precharged to (½)VBLH is maintained at (½)VBLH because no electric current flows in VSE through the amplifying transistor Q42.

At this time, a dummy cell or the like incorporating a constant-current operation transistor is employed such that the potential of /BL is set to be lowered to a degree which is half of the potential of the BL which is lowered in a case of data "1" (that is, (½)VBLH Vst before the sense operation). Thus, BL is made to be (½)VBLH–2Vst and /BL is made to be (½)VBLH Vst in a case of data "1" before the sense amplifier operation. Thus, the difference in the potential Vst is input to the right-side sense amplifier shown in FIG. 97. Then, a flip-flop type sense amplifier amplifies the potential so that BL is made to be 0V and /BL is made to be VBLH. Moreover, BL is made to be (½)VBLH and /BL is made to be (½)VBLH -Vst in a case of data "0". Thus, the difference in the potential Vst is input to the right-side sense amplifier shown in FIG. 97. Then, a flip-flop type sense amplifier amplifies the potential so that BL is made to be VBLH and /BL is made to be 0V.

When the threshold voltage of the amplifying transistor satisfies the region Vt<Vo, the amplifying transistor is turned on to lower the potentials of both of /BL and BL. Also in the foregoing case, the driving currents are considerably different from each other. Therefore, no problem arises if the driving current for the dummy cell is designed properly. The potential of VSE may be 0V or another constant potential (that is, the apparent threshold voltage of the amplifying transistor can be raised to a degree corresponding to raising of the potential of VSE from 0V) to correct the threshold value.

When data is rewritten, only block writing control signal BS0 connected to the sub-bitline /SBL is raised to Vpp. Thus, the potential of the bitline /BL which is 0V or amplified to VBLH is written on /SBL. In a case of data "1", /SBL is made to be VBLH and /SBL is made to be 0V in a case of data "0". At this time, the plate line (PL0) is set to be VBLH. Therefore, voltage–VBLH (the right-side terminal of the ferroelectric capacitor is defined to be positive) is applied to the ferroelectric capacitor in a case of data "0". Thus, data "0" is rewritten. In a case of data "1", the potential of the plate PL0 is then lowered to 0V. The ferroelectric capacitor is applied with voltage VBLH (the right-side terminal of the ferroelectric capacitor is defined to be positive). Thus, data "1" is rewritten.

In the above-mentioned sequential operations, the potential of the SBL of 0V is maintained. Therefore, data in lower right and left cell blocks is maintained and stabilized. If different data is written from outside (Write Mode) or external data is written after data is read (Read Modified Write), data is required to be written after BS0 is made to be High. After rewriting is completed, the potential of the block writing select signal BS0 is lowered from High to 0V. As a result, interference from /BL portion to /SBL can be eliminated. Then, the potential of WL0 is lowered. Thus, data in the cell can be maintained. Then, the bitline pair /BL and BL is electrically short-circuited. Thus, the bitline pair is made to be (½)VBLH. When SBE is returned to High, also the sub-bitline pair is lowered to 0V so that the standby state is returned.

In this embodiment, the precharge potential of the bitline is set to be (½)VBLH. The foregoing structure can be realized because the load capacities for reading information in the cell by the polarization inversion are the sub-bitlines /SBL and SBL. The bitlines /BL and BL are not the load capacities for reading information in the cell by the polarization inversion. Therefore, when only electrical short-circuiting of the bitline pair enables the precharge potential of (½)VBLH to be obtained. Thus, similarly to the conventional DRAM, the power consumption owning to charge/discharge of the bitline can be halved as compared with the conventional FRAM. Moreover, noise caused from charge/discharge of the bitline can be reduced.

As described with reference to FIG. 97 which is a circuit diagram and FIG. 98 which shows the example of the operation, the same memory cells as those of the conventional FRAM are used. Therefore, the density can be raised similar to the DRAM. The conventional FRAM has the problem in that raising of the density causes the design rule to be reduced, the area of the ferroelectric capacitor is reduced with substantially the square of the design rule. Thus, the capacity of the bitline is not reduced in spite of reduction in the polarization of the ferroelectric capacitor of the memory cell. Thus, the amount of read signals is reduced and, therefore, the operation cannot easily be performed.

On the other hand, this embodiment has the structure that the sub-bitline is input to the gate of the amplifying transistor and the drain terminal is connected to the bitline. Thus, polarization inversion reading of the memory cell enables data read from the cell block to the sub-bitline to be amplified and transferred to the bitline. At this time, the load capacity CL realized when the ferroelectric capacitor is polarization-inverted is the capacity of the sub-bitline /SBL. Thus, the number of cells connected to the sub-bitline is made to be smaller than the number of cell blocks connected to the bitline according to the previous suggestion performed by the inventors of the present invention. Therefore, a considerably smaller value as compared with the capacity of the bitline can be employed.

If the size of the ferroelectric capacitor is reduced, an amount of signals read to /SBL, that is, the value of Vs which is ½ of the difference between 2Vs+Vo in a case of data "1" and Vo in a case of data "0", can be increased. The foregoing value is amplified by the amplifying transistor Q42. Therefore, a stable operation can be performed if the bitlines /BL and BL have a considerably large capacity.

For example, the number of cell blocks connected to the sub-bitline is made to be ¹⁄₁₆ of the number of cell blocks connected to the bitline according to the previous suggestion performed by the inventors of the present invention. The capacity of the sub-bitline is made to be about ¹⁄₁₆. Therefore, even if the area of the ferroelectric capacitor is reduced to ¹⁄₁₆, the operation can be performed. Conversely, this embodiment permits increase in the capacity of the bitline in spite of requirement of a long time for the amplifying transistor to amplify the signal which is read to the bitline.

That is, arbitrary increase in the number of gain cell blocks which are connected to one bitline is permitted. Therefore, the problem experienced with the conventional FRAM and arisen in that the area of the sense amplifier is 15% to 20% of the area of the chip can be overcome. Therefore, the number of gain cell blocks connected to the bitline is increased, the number of sense amplifiers is reduced and overhead of the area of the sense amplifier is substantially eliminated. Thus, an effect can be obtained in that the size of the chip can be reduced.

This embodiment enables the load capacity CL in the cell block to easily be changed by changing the number of cells connected to the sub-bitline. The foregoing fact means that design is required to be performed such that the number of cells connected to the sub-bitline is increased when the size of the ferroelectric capacitor is large. When the size of the ferroelectric capacitor is small, design is required to be performed such that the number of cells connected to the sub-bitline is reduced to reduce CL so as to maintain the amount of signals read to the sub-bitline. The structure according to this embodiment is effective when the design rule is relatively moderate and the polarization of the ferroelectric capacitor is insufficient in the case of the conventional FRAM as shown in FIG. 13. As the generation proceeds, the number of gain cell blocks connected to the bitline is increased to 2, 4, 8, 16, 32 and 64. Conversely, the number of cells connected to the sub-bitline is reduced to 512, 256, 128, 64, 32, 16 and 8.

At this time, the present invention is free from the problem of change in the load capacity CL because the capacity in the cell is changed depending on the position of the selected word line. When the load capacity CL is small, a high potential read to the sub-bitline can be maintained. Since the total amount of charges is small, the problem of the software error arises in the contact with the diffusion layer of the sub-bitline when data in the cell is read. As a matter of course, the foregoing problem can effectively be overcome by adjusting the number of cells connected to the foregoing sub-bitline as can be understood from FIGS. 12A and 12B. That is, if the design rule is relaxed and the software error is in a severe state, the numbers is increased to add the load capacity. Thus, Qs=Vs×CL can be realized. Even if Vs is somewhat lowered, Qs can be increased. Therefore, a large quantity of inversion charges can be read to the sub-bitline. As a result, the above-mentioned problem can be overcome.

As the design rule is reduced and as the software error rate is lowered, the foregoing numbers are required to gradually be reduced to a degree with which the software error is not made. Thus, the amount of signals read to the sub-bitline can be maintained. If the foregoing adjustment is employed for the conventional memory cell having the self-amplifying function, the structure is limited to the cell shown in FIG. 4D. What is worse, the area of the ferroelectric capacitor is increased excessively and a too large cost As compared with the conventional memory cell having the self-amplifying function, the stable and normal operation performed by the cell having the large ferroelectric capacitor and shown in FIG. 4D can be performed. Moreover, this embodiment enables the amplifying transistor, the write transistor and the sub-block selection precharge transistor to be shared by a plurality of memory cell as the number of cell blocks which are connected to one sub-bitline is increased. As a result, the overhead of the size of the cell can significantly be reduced.

Another characteristic of the operation shown in FIGS. 97 and 98 lies in the method of lowering the potential of BL opposite to the bitline pair by the amplifying transistor when the potential of /SBL is raised in response to a signal in the cell. When the signal read to the bitline is amplified by the sense amplifier, the potential of /BL is raised. As a result, rewriting is permitted such that the potential of /SBL is raised to a positive level through the block writing select transistor. Thus, coherence can be maintained. In the case of the above-mentioned method, the source of the amplifying transistor is inevitably VSE. Thus, the potential of the sub-bitline (/SBL and SBL) is as it is the potential between the gate and the source. Therefore, control can easily be performed because the amplifying transistor is always turned on in the case of data "1" and the same is always turned off in the case of data "0" regardless of the potential of the bitline.

Namely, even if the potential of the bitline is lowered owning to amplification, the potential between the gate and the source is constant. The potential between the drain and the source can be made to be a high level of (½)VBLH. The operation is the pentode operation and a constant electric current is used to perform the operation. Therefore, the foregoing fact means that the dummy cell can easily be manufactured. As a matter of course, the circuit shown in FIG. 97 has the 1-transistor+1-capacitor structure such that one information item is stored in one cell. The foregoing structure can be realized by changing the operation of the 2-transistor+2-capacitor method with which one information item is stored in two cells.

The foregoing structure can easily be realized by changing the structure shown in FIG. 98 such that also PL1 is driven as well as PL0 to also drive BS1 from Low →High→Low as well as BS0. For example, a method may be employed to realize the foregoing structure such that a test of the 1-transistor+1-capacitor is performed to screen defective cells so as to be substituted by a redundancy circuit. Then, the actual product is operated by the 2-transistor+2-capacitor which is a reliable structure.

As shown in FIG. 98, as compared with the conventional FRAM, this embodiment permits a high-speed operation because of no factor for reducing the operation speed except for the overhead occurring when the block writing control signal is clocked after the cell is read. On the other hand, the self-amplifying function raises the speed at which a predetermined signal value is read to the bitline. Thus, the foregoing demerit can be overcome.

The effects obtained from the structures shown in FIGS. 97 and 98 are summarized as follows.

(1) Similarly to the conventional FRAM, a high-density cell having the $8F^2$ size can be realized by the planar transistor which can easily be manufactured. Moreover, a high-speed random access function can be obtained.

(2) Even if the design rule is reduced and the area of the ferroelectric capacitor is reduced, the capacity of the sub-bitline, which is the load capacity at the time of the polarization inversion, can be reduced to correspond to the reduction in the area. As a result, a sufficiently high voltage for reading a signal can be obtained. Since the amplifying transistor is used to amplify the bitline, a stable operation can be performed.

(3) Precharging of the bitline to (½)Vdd (=VBLH) can be employed to reduce power consumption and eliminate noise.

(4) Similarly to the conventional FRAM, the principle of the operation is simple.

(5) Even if the bitline has a large capacity, reading is permitted. Therefore, the number of gain cell blocks connected to the bitline can be increased. As a result, the area of the sense amplifier can be reduced.

(6) Optimization is permitted by reducing the number of cells connected to the sub-bitlines to correspond to reduction in the polarization of the ferroelectric capacitor owning to reduction in the design rule.

(7) In a state in which the design rule is relaxed and the software error is in a severe state, the number of cells connected to the sub-bitline is increased and the load capacity is added to increase the reading charge, software error can be prevented. As the design rule is reduced and as the software error rate is lowered, the size of the ferroelectric capacitor and the number of cells connected to the sub-bitline are required to gradually be reduced to a degree with which the software error does not raise a problem. Thus, an amount of signals read to the sub-bitline is maintained.

(8) A plurality of cells share the amplifying transistor, the write transistor and the sub-bitline selection precharge transistor. Thus, the overhead of the size of the cell can significantly be reduced.

(9) As the load capacity for the polarization inversion, the capacity of the sub-bitline can be used so that substantially stable operation is performed.

(10) When the number of cells connected to the sub-bitline are changed, the load capacity can arbitrarily be adjusted.

(11) The signal of the sub-bitline is used to cause the amplifying transistor to drive the bitline opposite to the bitline pair so that a stable amplifying operation can be performed.

(12) Since the parasitic capacity of the sub-bitline serves as the load capacity, a wide range can be covered from a region in which fining proceeds and the polarization of the ferroelectric capacitor is considerably inefficient to a region in which the polarization of the ferroelectric capacitor of the memory cell is slightly insufficient in the case of the conventional structure of the FRAM.

(Thirty-Fourth Embodiment)

Figure 99:
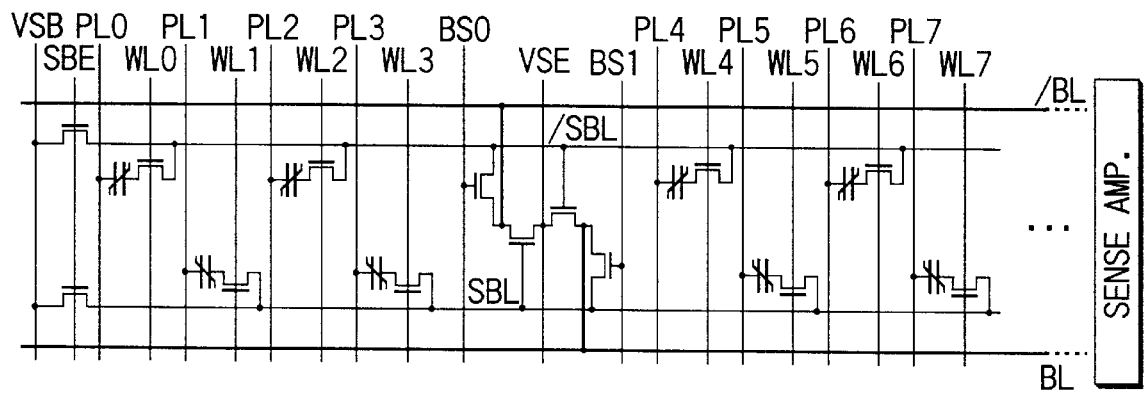
FIG. 99 is a circuit diagram showing the gain cell block structure of a ferroelectric memory according to a thirty-fourth embodiment.

FIG. 99 is a circuit diagram showing a semiconductor memory device according to a thirty-fourth embodiment of the present invention, in which the gain cell block structure of a ferroelectric memory is illustrated.

The structure shown in FIG. 99 is similar to that shown in FIG. 97 and similar effects can be obtained. The difference lies in that the structure shown in FIG. 97 is arranged such that the sub-block selection precharge transistors are disposed on both the sides of the sub-bitline. The structure shown in FIG. 99 is arranged such that the sub-block selection precharge transistor is disposed only at one end so as to reduce the area. The operation method is the same as that for the structure shown in FIG. 98.

(Thirty-Fifth Embodiment)

Figure 100:
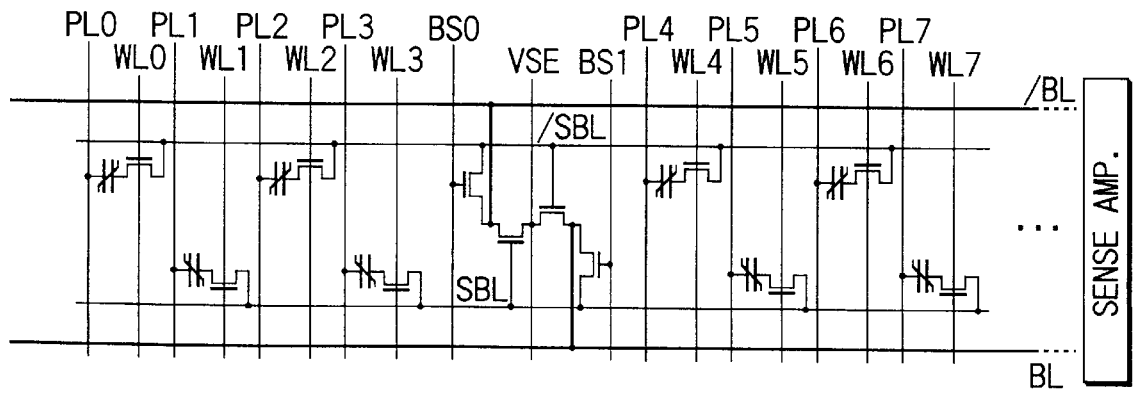
FIG. 100 is a circuit diagram showing the gain cell block structure of a ferroelectric memory according to a thirty-fifth embodiment.

FIG. 100 is a circuit diagram showing a semiconductor memory device according to a thirty-fifth embodiment of the present invention, in which the gain cell block structure of a ferroelectric memory is illustrated.

The structure shown in FIG. 100 is similar to that shown in FIG. 97 and similar effects can be obtained. The difference lies in that the structure shown in FIG. 97 is arranged such that the sub-block selection precharge transistors are disposed on both the sides of the sub-bitline. The structure shown in FIG. 100 is arranged such that the sub-block selection precharge transistor is omitted so as to reduce the area.

Figure 101:
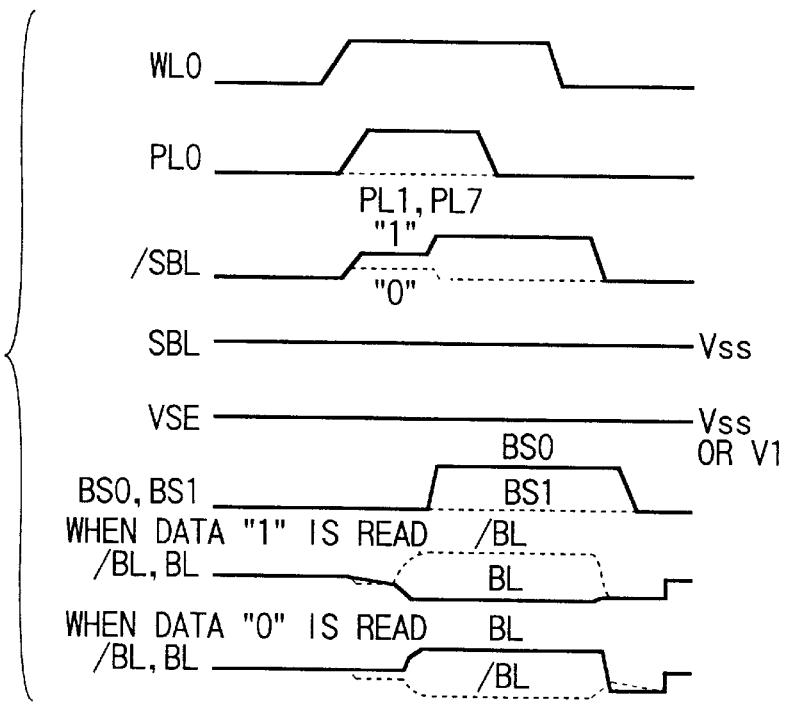
FIG. 101 is a signal waveform showing an example of the specific operation of FIG. 100.

FIG. 101 is a signal waveform showing an example of the specific operation of FIG. 100. A major portion of the operations are similar to those of the structure shown in FIG. 98. Since the means for precharging the sub-bitline to 0V is not provided, the potential of the block writing select signal BS0 which is High is maintained as shown in FIG. 101. In this state, the word line WL0 is lowered, the bitline pair set to be 0V or amplified to VBLH is temporarily lowered to 0V. Then, the block writing select signal BS0 is lowered so that the sub-bitlines /SBL and SBL are precharged to 0V.

Then, the bitline is again precharged to (½)VBLH. When the sub-bitlines /SBL and SBL are temporarily precharged to 0V and the diffusion layer connected to the sub-bitline and the pn-junction between the wells are used to maintain the potential of the well at 0V. Even during standby or selection of another sub-bitline, the potential of the sub-bitlines /SBL and SBL which is 0V is maintained. If the cell connected to the foregoing sub-bitline is selected, a normal operation is permitted.

(Thirty-Sixth Embodiment)

Figure 102:
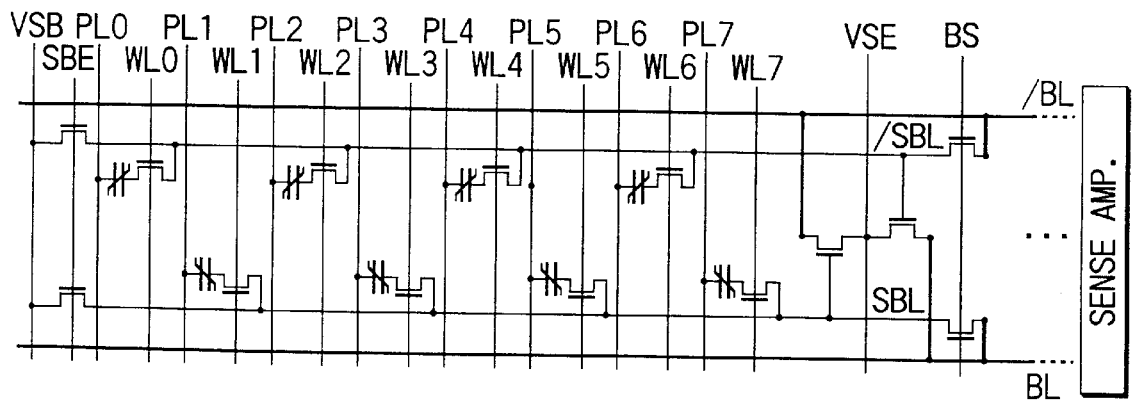
FIG. 102 is a circuit diagram showing the gain cell block structure of a ferroelectric memory according to a thirty-sixth embodiment.

FIG. 102 is a circuit diagram showing a semiconductor memory device according to a thirty-sixth embodiment of the present invention, in which the gain cell block structure of a ferroelectric memory is illustrated.

FIG. 102 shows a circuit structure which is equivalent to that shown in FIG. 99. The difference from the structure shown in FIG. 99 lies in that the self-amplifying functions are collected to one end of the gain cell block. Moreover, the sub- block selection precharge transistors are collected to another end. The amplifying transistor and the sub-block writing select signal are separated from each other. As described above, the foregoing topology of the positions is different. Effects are similar to those obtained from the structure shown in FIG. 99.

(Thirty-Seventh Embodiment)

Figure 103:
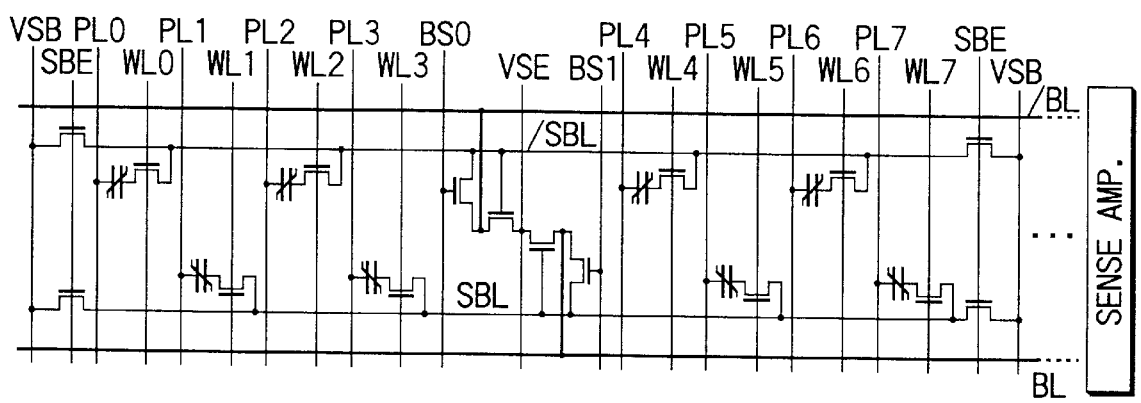
FIG. 103 is a circuit diagram showing the gain cell block structure of a ferroelectric memory according to a thirty-seventh embodiment.

FIG. 103 is a circuit diagram showing a semiconductor memory device according to a thirty-seventh embodiment of the present invention, in which the gain cell block structure of a ferroelectric memory is illustrated.

The structure shown in FIG. 103 is similar to that shown in FIG. 97 and similar effects can be obtained. The difference from the structure shown in FIG. 97 lies in that the bitline for reading data from the sub-bitline and the bitline for writing data on the sub-bitline are the same.

Figure 104:
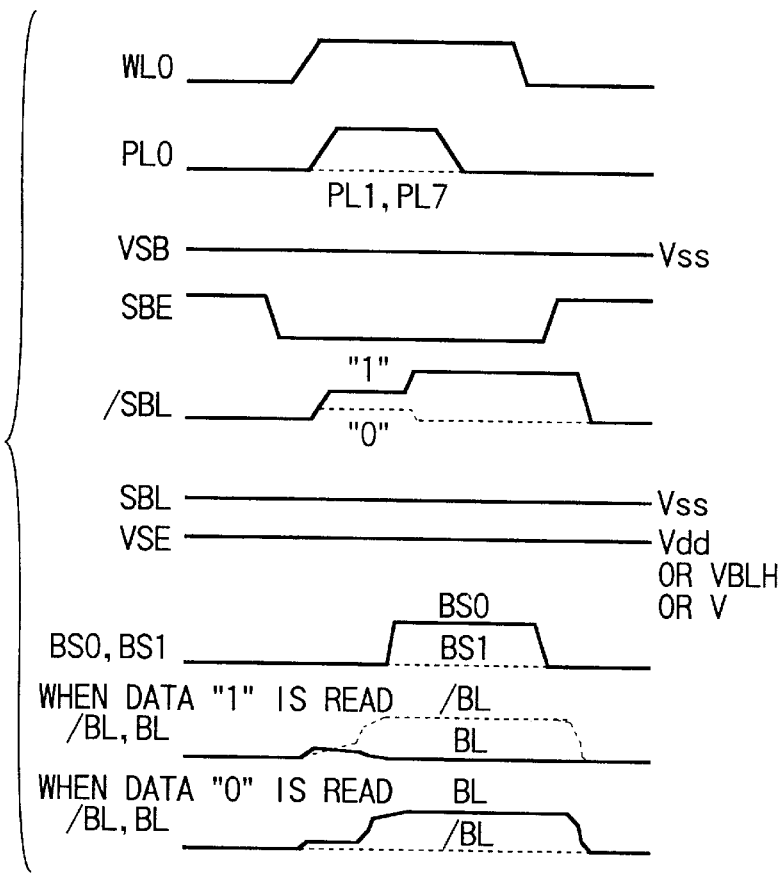
FIG. 104 is a signal waveform showing an example of the specific operation of FIG. 103.

FIG. 104 is a signal waveform showing an example of the specific operation of FIG. 103. Since the bitline for reading data from the sub-bitline and the bitline for writing data on the sub-bitline are the same, the potential of VSE is made to be higher than the potential to which the bitline is pre-charged.

(Thirty-Eighth Embodiment)

Figure 105:
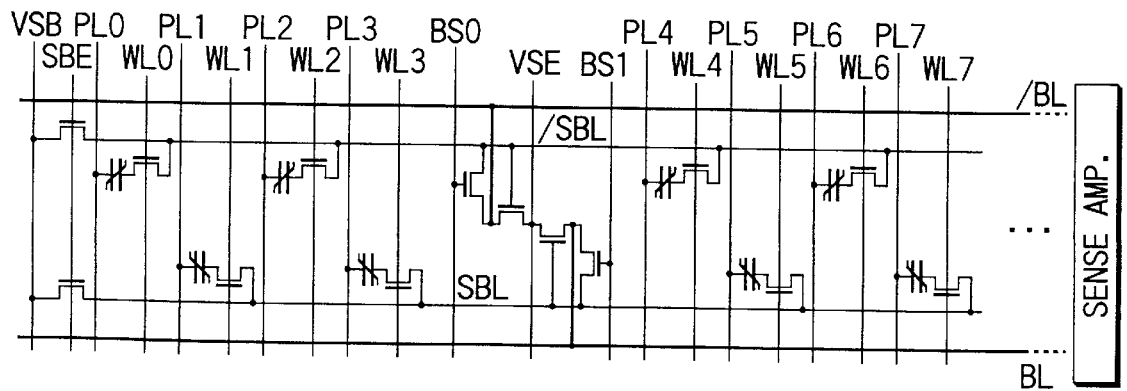
FIG. 105 is a circuit diagram showing the gain cell block structure of a ferroelectric memory according to a thirty-eighth embodiment.

FIG. 105 is a circuit diagram showing a semiconductor memory device according to a thirty-eighth embodiment of the present invention, in which the gain cell block structure of a ferroelectric memory is illustrated.

The structure shown in FIG. 105 is similar to that shown in FIG. 103 and similar effects can be obtained. The difference lies in that the structure shown in FIG. 103 incorporates the sub- block selection precharge transistors are disposed on both the sides of the sub-bitline. The structure shown in FIG. 105 is arranged such that the sub- block selection precharge transistors are disposed at one end to reduce the area. The operation method is the same as that for the structure shown in FIG. 103.

(Thirty-Ninth Embodiment)

Figure 106:
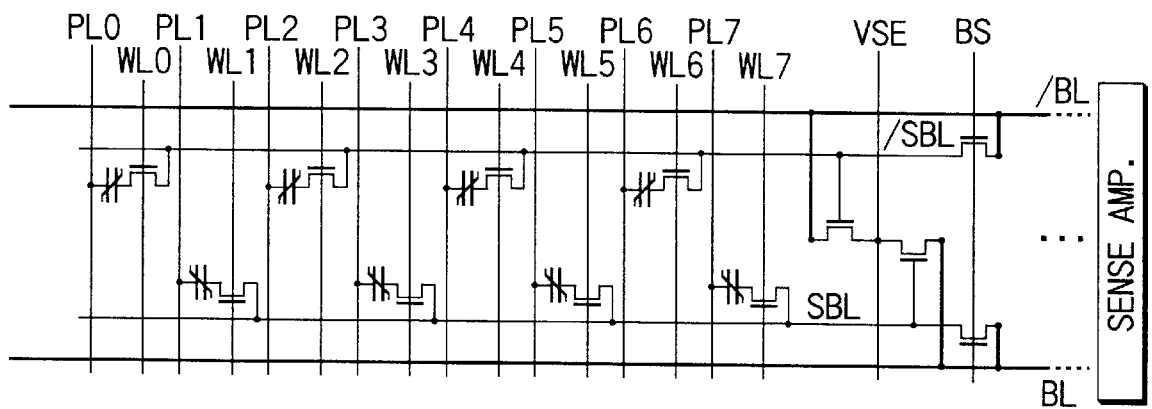
FIG. 106 is a circuit diagram showing the gain cell block structure of a ferroelectric memory according to a thirty-ninth embodiment.

FIG. 106 is a circuit diagram showing a semiconductor memory device according to a thirty-ninth embodiment of the present invention, in which the gain cell block structure of the ferroelectric memory is illustrated.

The structure shown in FIG. 106 has the same equivalent circuit and effects as those obtained from the structure shown in FIG. 100. Note that the topology of the positions of the transistors is different from the structure shown in FIG. 100.

(Fortieth Embodiment)

Figure 107A:
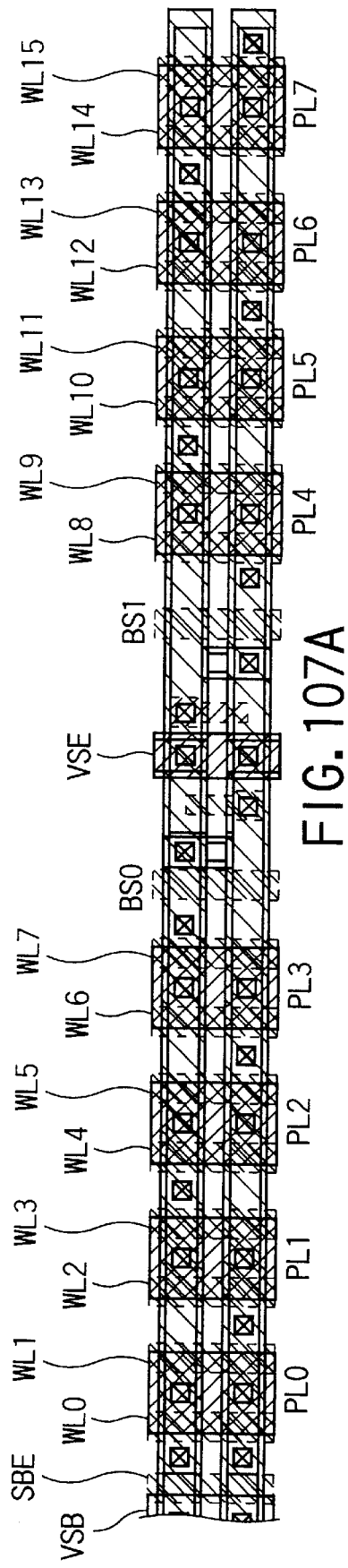
FIGS. 107A and 107B are plan views showing the layout of the block structure of a ferroelectric memory according to a fortieth embodiment.
Figure 107B:
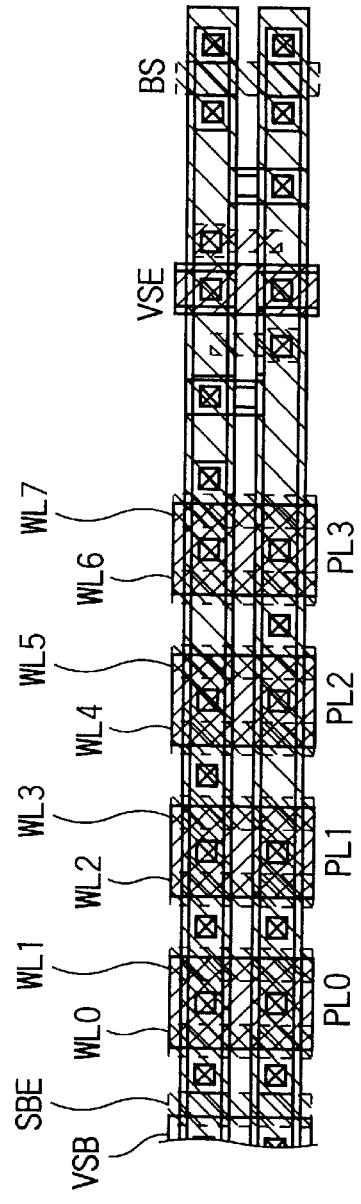
Figure 108A:
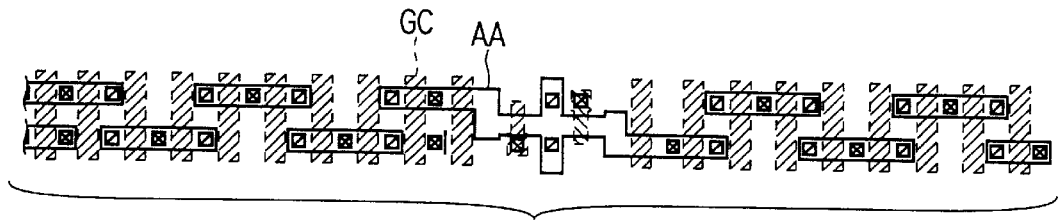
FIGS. 108A and 108B are diagrams showing the layout of a portion of layers shown in FIGS. 107A and 107B.
Figure 108B:
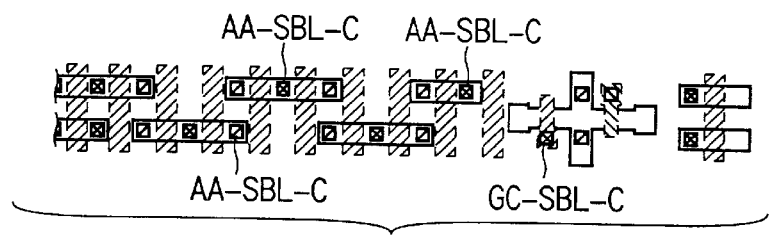
Figure 109A:
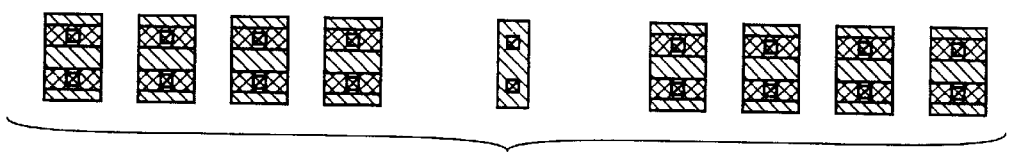
FIGS. 109A and 109B are diagrams showing the layout of the portion of layers shown in FIGS. 107A and 107B.
Figure 109B:
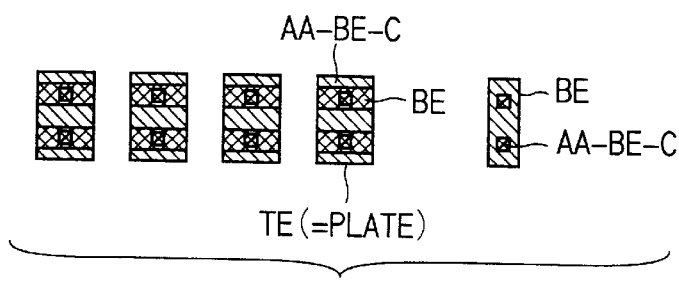
Figure 110A:
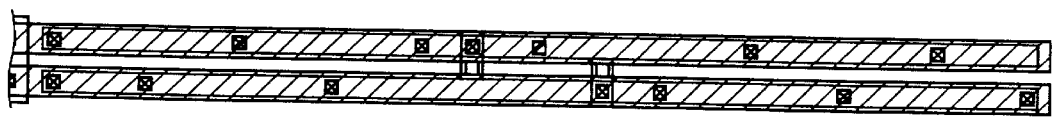
FIG. 110A and 110B are diagrams showing the layout of the portion of layers shown in FIGS. 107A and 107B.
Figure 110B:
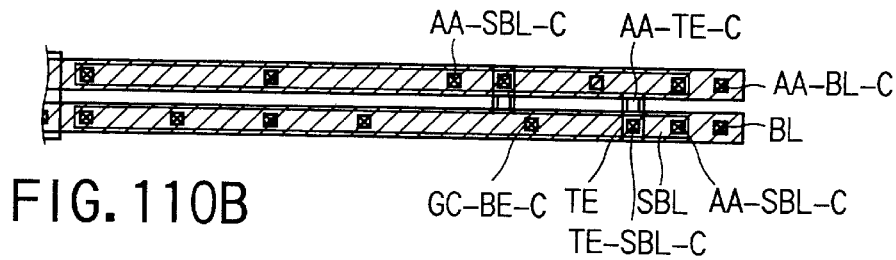

FIGS. 107A and 107B are plan views showing a semiconductor memory device according to a fortieth embodiment of the present invention, in which the layout of the block structure of a ferroelectric memory is illustrated. FIG. 107A is substantially equivalent to the circuit shown in FIG. 99. Also the topology corresponds to the foregoing circuit. The difference lies in that the number of cells connected to the sub-bitlines is two times in the layout according to this embodiment. Moreover, the plate line is shared by two cells. Thus, the plate can easily be separated from each other. FIG. 107B is substantially equivalent to the circuit shown in FIG. 102. Also the topology corresponds to the foregoing circuit. The difference lies in that the number of cells connected to the sub-bitlines is two times in the layout according to this embodiment. Moreover, the plate line is shared by two cells. Thus, the plate can easily be separated from each other.

FIGS. 108A, 108B to 110A and 110B show the layout of a portion of layers in the layout shown in FIGS. 107A and 107B. FIGS. 108A, 108B to 110A and 110B correspond to FIGS. 107A and 107B, respectively. Although severe pitches are required in the cell array, transistors each having the self-amplifying function can easily be disposed.

(Forty-First Embodiment)

Figure 111:
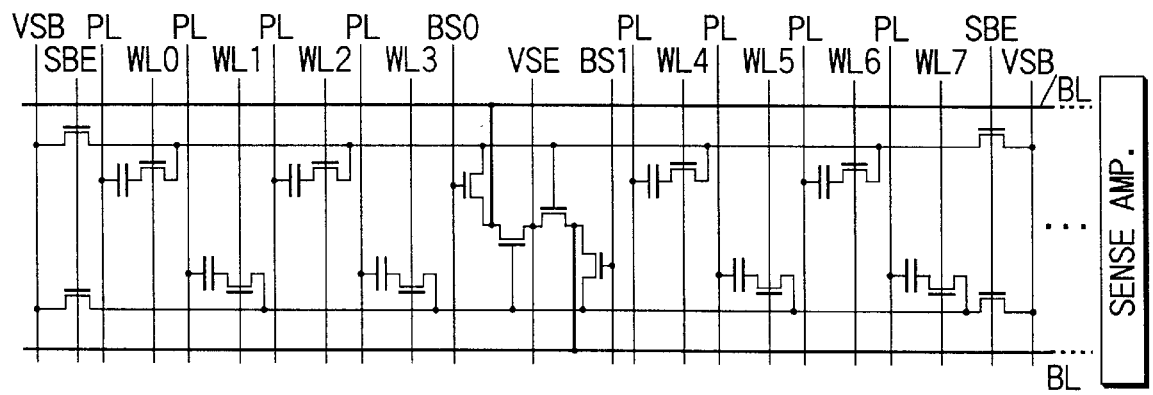
FIG. 111 is a circuit diagram showing the gain cell block structure of a DRAM according to a forty-first embodiment.

FIG. 111 is a circuit diagram showing a semiconductor memory device according to a forty-first embodiment of the present invention, in which particularly the gain cell block structure of a DRAM is illustrated.

This embodiment is structured such that a gain cell block having a self-amplifying function is constituted by a DRAM structure of the conventional structure of 1-transistor+1-capacitor. An equivalent circuit of FIG. 111 is the same as the circuit shown in FIG. 97 except for the paraelectric capacitor substituted for the ferroelectric capacitor shown in FIG. 97.

Figure 112:
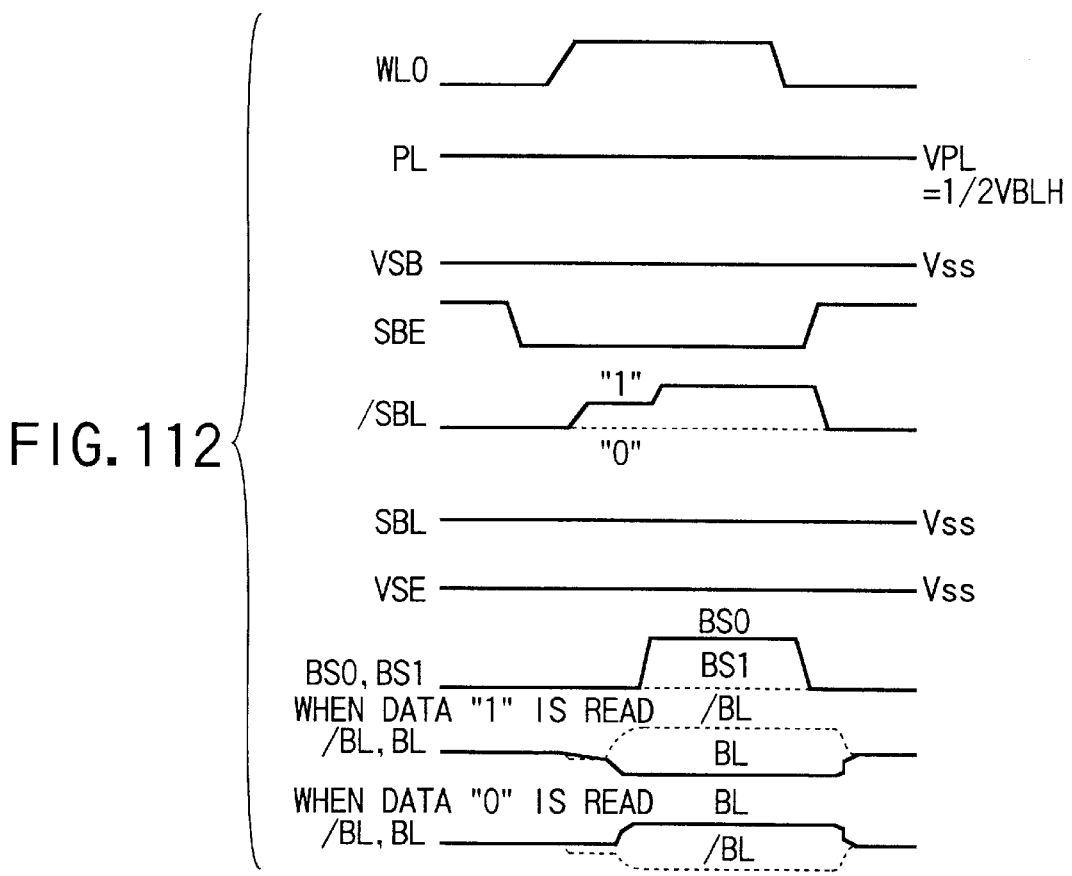
FIG. 112 is a signal waveform showing an example of the specific operation of FIG. 111.

FIG. 112 is a signal waveform showing an example of the specific operation of FIG. 111. The structure shown in FIG. 112 is substantially the same as those of the structure shown in FIG. 98. The difference lies in that storage of information is plate driver by accumulated charges similarly to the conventional DRAM in place of storage of information by means of polarization. Another difference lies in that the plate voltage is not changed and the same is set to the fixed potential of VPL (=(½)VBLH).

In the structure shown in FIG. 112, the subbitline is precharged to 0V. Then, the word line WL0 is raised to High so that charges in the memory cells are read. In a case of data "0", that is, the potential of the cell is 0V, the sub-bitline is 0V. In a case of data "1" and the potential of the cell is VBLH, information in the cell is read to the sub-bitline /SBL to correspond to the ratio of the capacity of the cell and the capacity of the sub-bitline. The information is amplified by the amplifying transistor so as to be transferred to the bitline and amplified by the sense amplifier. A result of the amplification is written back to the sub-bitline /SBL by raising BS0. Also at this time, the potential of the plate PL is maintained at (½)VBLH. Thus, potential 0V of the sub-bitline or VBLH is rewritten on the memory cell. In this example, similarly to the structure shown in FIG. 97, the signal for reading the sub-bitline is amplified so as to be transferred to the opposite bitline BL of the bitline pair.

Effects of this embodiment are as follows:

(1) Similarly to the conventional DRAM, a high-density cell having the $8F^2$ size can be realized by the planar transistor which can easily be manufactured. Moreover, a high-speed random access function can be obtained.

(2) If the design rule is reduced and the area of the DRAM capacitor is reduced, the capacity of the sub-bitline, which is the load capacity, can be reduced to correspond to the reduction in the area. As a result, a sufficiently high voltage for reading a signal can be obtained. Since the amplifying transistor is used to amplify the bitline, a stable operation can be performed.

(3) Precharging of the bitline to (½)Vdd (=VBLH) can be employed to reduce power consumption and eliminate noise.

(4) Similarly to the conventional DRAM, the principle of the operation is simple.

(5) Even if the bitline has a large capacity, reading is permitted. Therefore, the number of gain cell blocks connected to the bitline can be increased. As a result, the area of the sense amplifier can be reduced.

(6) Optimization is permitted by reducing the number of cells which are connected to the sub-bitlines to correspond to reduction in the amount of accumulated charges of the paraelectric capacitor owning to reduction in the design rule.

(7) In a state in which the design rule is relaxed and the software error is in a severe state, the number of cells connected to the sub-bitlines is increased and the load capacity is added to enlarge the reading charge, software error can be prevented. As the design rule is reduced and as the software error rate is lowered, the size of the capacitor and the number of cells connected to the sub-bitlines are required to gradually be reduced to a degree with which the software error does not raise a problem. Thus, an amount of signals which are read to the sub-bitline is maintained.

(8) A plurality of cells share the amplifying transistor, the write transistor and the sub-bitline selection precharge transistor. Thus, the overhead of the size of the cell can significantly be reduced.

(9) When the number of cells connected to the sub-bitline are changed, the load capacity can arbitrarily be adjusted.

(10) The signal of the sub-bitline is used to cause the amplifying transistor to drive the bitline opposite to the bitline pair so that a stable amplifying operation can be performed.

When the method of the gain cell block having the self-amplifying function is applied to the DRAM, an amount of reading signals can be maintained. However, the charges accumulated in the cells of the DRAM leak. Therefore, there is a possibility that data retention time (tREFmax) is reduced when the area of the capacitor is reduced. However, the leakage from the pn-junction or the like can be reduced because the area of the pn-junction is reduced. Therefore, considerable deterioration in tREFmax can be prevented. It is preferable that the area of the capacitor is reduced to a degree with which tREFmax can be maintained to meet the purpose. When the DRAM incorporating SOI is able to elongate the data retention time, no problem arises and the structure of the embodiment according to the present invention is effective.

Figure 113:
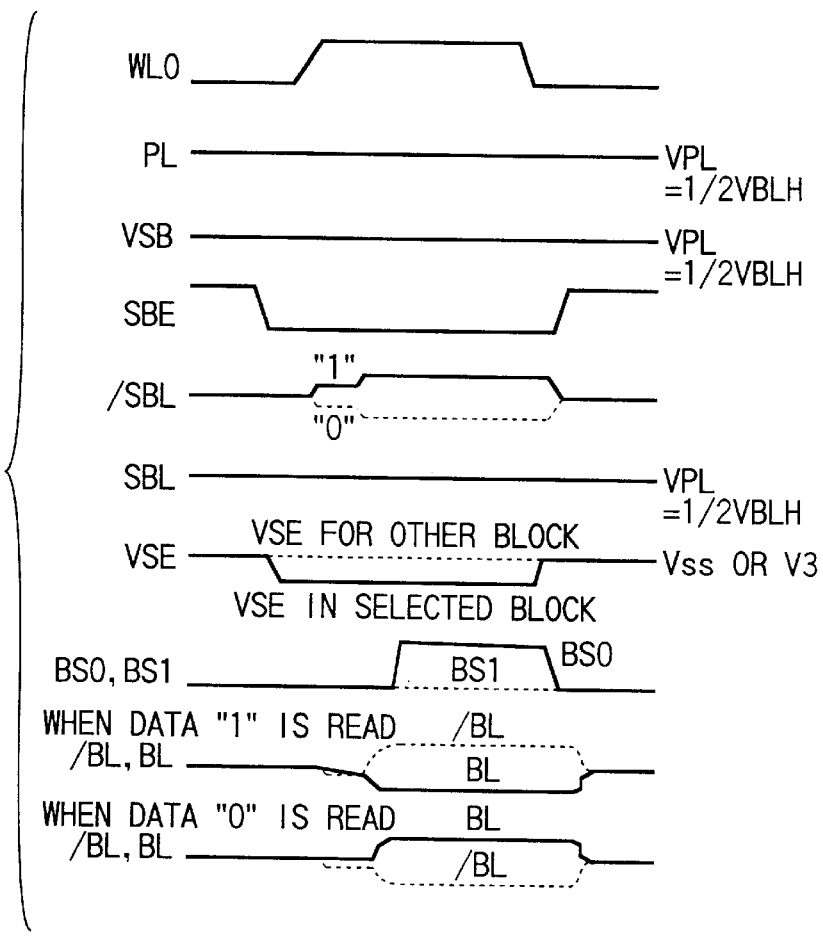
FIG. 113 is a signal waveform showing an example of the specific operation of FIG. 111.

FIG. 113 is a signal waveform showing another example of the specific operation of FIG. 111. The operation according to this embodiment is similar to that of the structure shown in FIG. 112. The difference lies in that the sub-bitline is precharged to (½)VBLH. Thus, when the word line WL0 is made to be High and the charge in the cell is read, the potential of the sub-bitline /SBL is made to be (½)VBLH±Vs. The potential is transferred to the bitline BL through the amplifying transistor. Note that the potential of the sub-bitline is (½)VBLH in a unselected gain cell block. Since the amplifying transistor is undesirably turned on, VSE of only the selected gain cell block is made to be 0V and unselected gain cell block is maintained at (½)VBLH.

(Forty-Second Embodiment)

Figure 114:
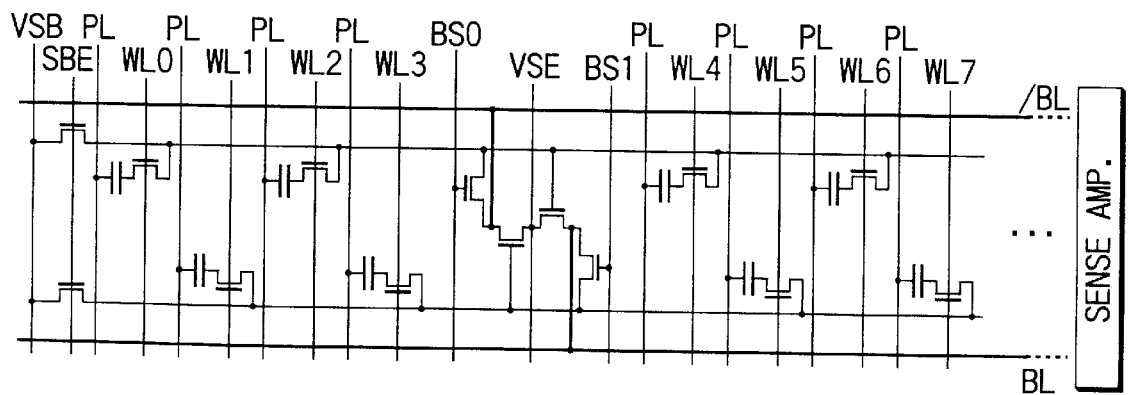
FIG. 114 is a circuit diagram showing the gain cell block structure of a DRAM according to a forty-second embodiment.

FIG. 114 is a circuit diagram showing a semiconductor memory device according to a forty-second embodiment of the present invention, in which particularly the gain cell block structure of a DRAM is illustrated. The circuit shown in FIG. 114 has similar structure, operations and effects to those of the circuit shown in FIG. 111. The difference from the circuit shown in FIG. 111 lies in that the sub-block selection precharge transistor is disposed at only the end of the sub-bitline.

(Forty-Third Embodiment)

Figure 115:
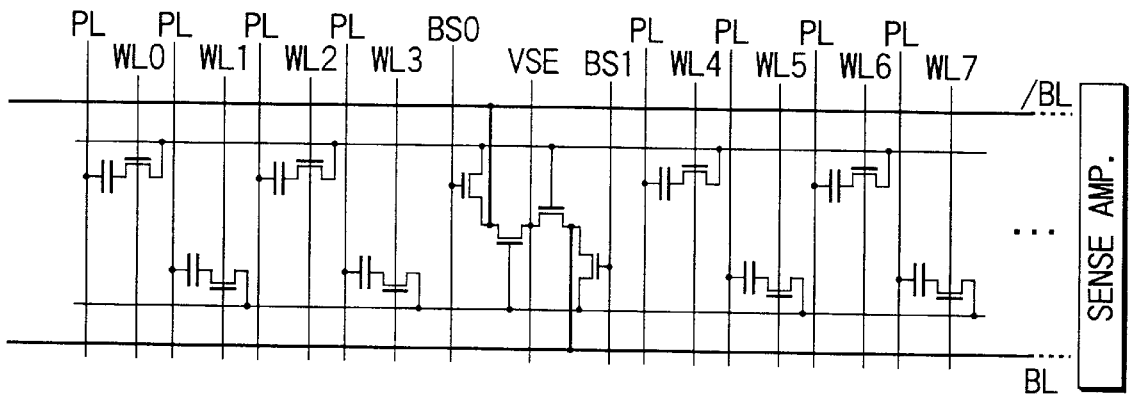
FIG. 115 is a circuit diagram showing the gain cell block structure of a DRAM according to a forty-third embodiment.

FIG. 115 is a circuit diagram showing a semiconductor memory device according to a forty-third embodiment of the present invention, in which the gain cell block structure of a DRAM is illustrated. The circuit shown in FIG. 115 has similar structure, operations and effects to those of the circuit shown in FIG. 111. The difference from the circuit shown in FIG. 111 lies in that the sub-block selection precharge transistors are omitted from both the ends of the sub-bitline.

Figure 116:
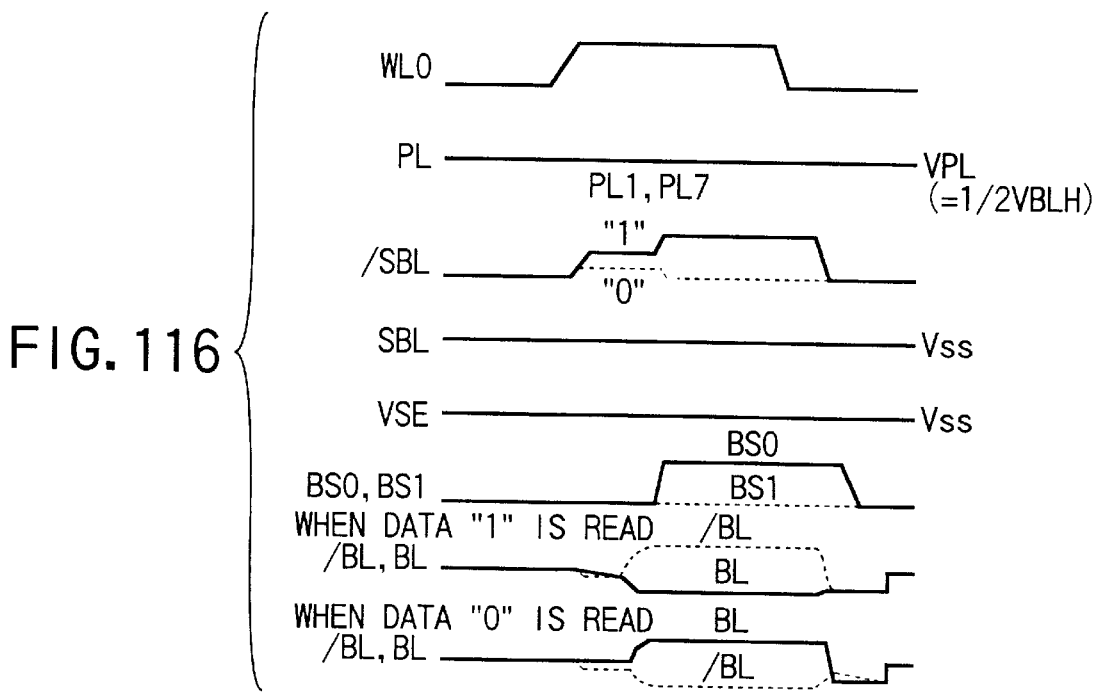
FIG. 116 is a signal waveform showing an example of the specific operation of FIG. 115.

FIG. 116 is a signal waveform showing an example of the specific operation of FIG. 115. The operation for precharging the sub-bitline to 0V is performed by the operation which is the same as the structure shown in FIG. 101.

(Forty-Fourth Embodiment)

Figure 117:
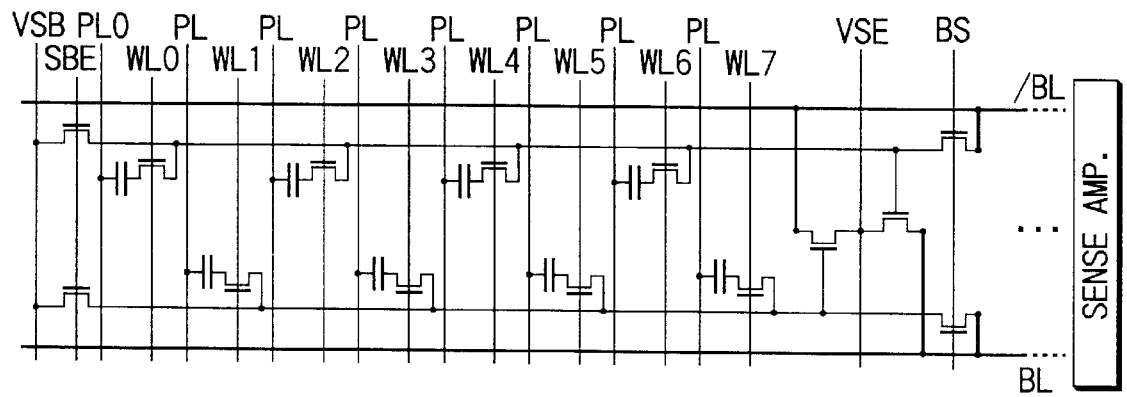
FIG. 117 is a circuit diagram showing the gain cell block structure of a DRAM according to a forty-fourth embodiment.
Figure 118:
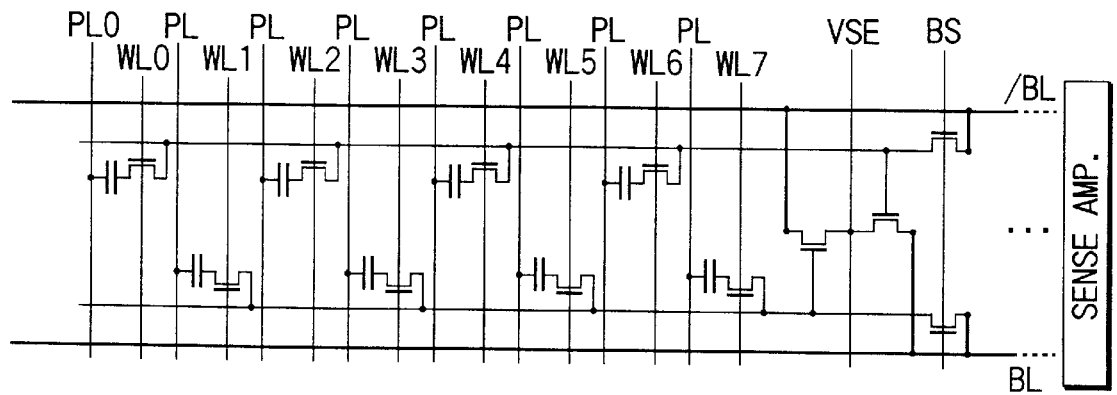
FIG. 118 is a circuit diagram showing the gain cell block structure of a DRAM according to a forty-fourth embodiment.

FIGS. 117 and 118 are circuit diagrams showing a semiconductor memory device according to a forty-fourth embodiment of the present invention, in which particularly the gain cell block structure of a DRAM is illustrated.

The equivalent circuit and effects of the structure shown in FIG. 117 are the same as those of the structure shown in FIG. 114 except for only the topology of the positions of the transistors. The equivalent circuit and effects of the structure shown in FIG. 118 are the same as those of the structure shown in FIG. 115 except for only the topology of the positions of the transistors. The operations are the same as those of the structure shown in FIG. 116.

(Forty-Fifth Embodiment)

Figure 119:
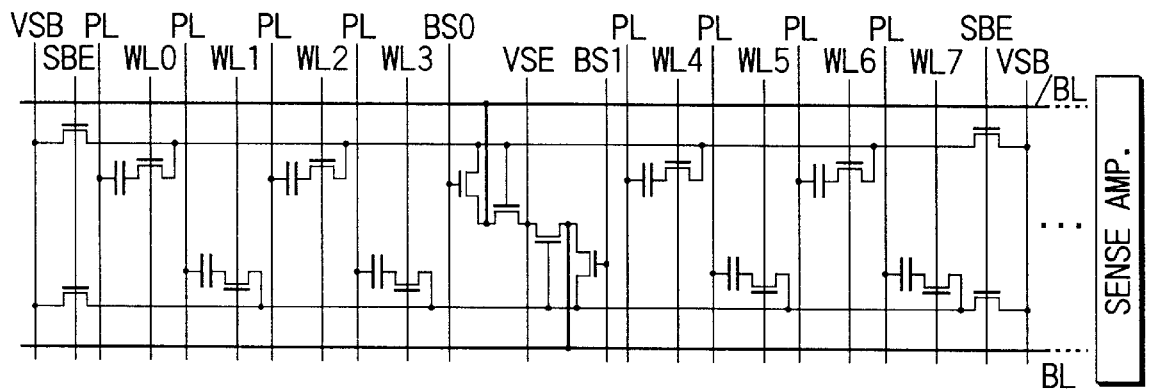
Figure 120:
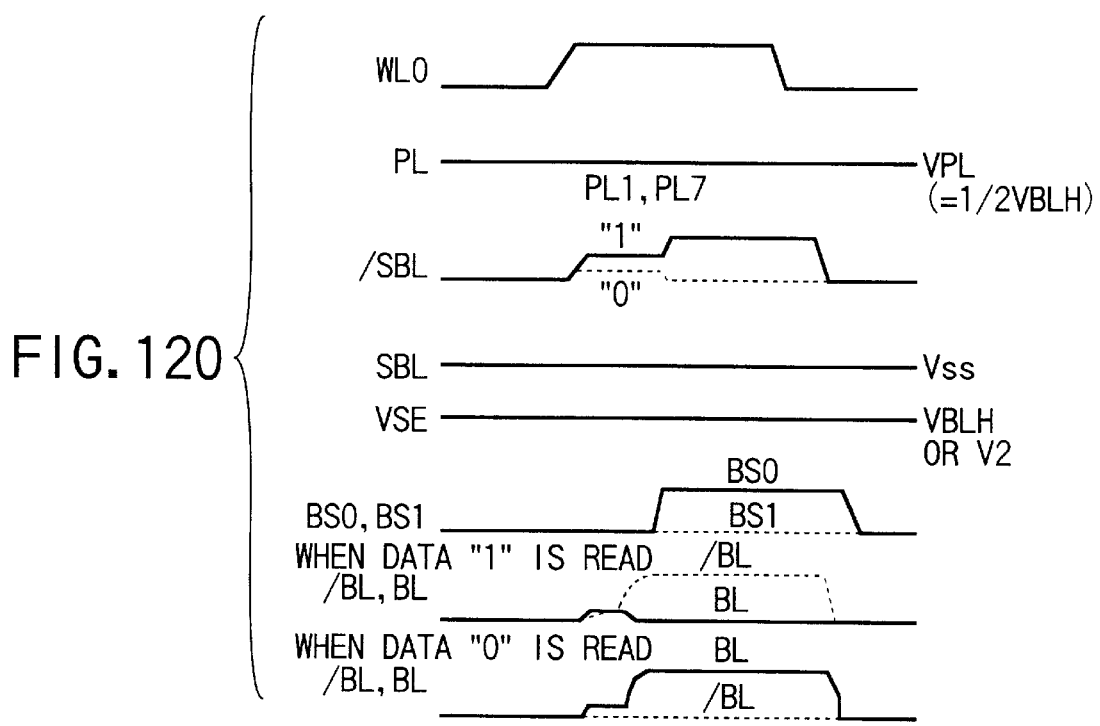
Figure 121:
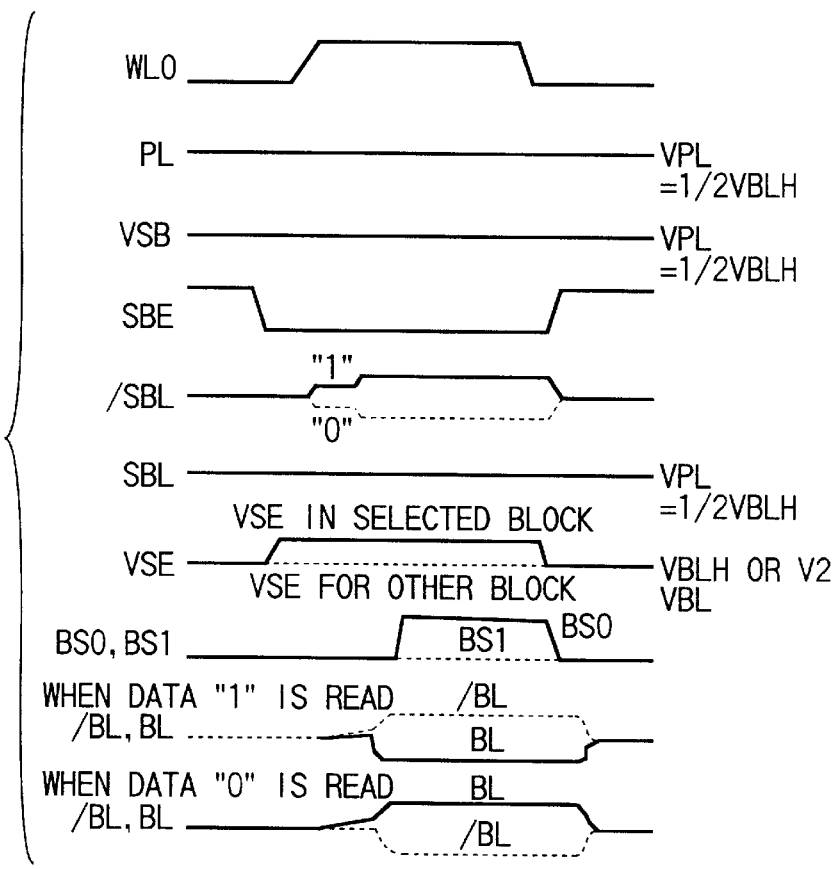

FIG. 119 is a circuit diagram showing a semiconductor memory device according to a forty-fifth embodiment of the present invention, in which particularly the gain cell block structure of a DRAM is illustrated. FIG. 120 is a signal waveform showing an example of the specific operation of FIG. 119. FIG. 121 is a signal waveform showing another example of the specific operation of FIG. 119.

The equivalent circuit and effects of the structure shown in FIG. 119 are substantially the same as those of the structure shown in FIG. 111. The difference lies in that a result of amplification of the signal of the sub-bitline is read to the bitline which is the bitline with which rewriting to the sub-bitline is performed. Also the operations of the structures shown in FIGS. 120 and 121 are substantially the same as those of the structure shown in FIGS. 112 and 113. The difference lies in that the potential VSE and the portion to which the amplifying transistor reads data.

(Forty-Sixth Embodiment)

Figure 122:
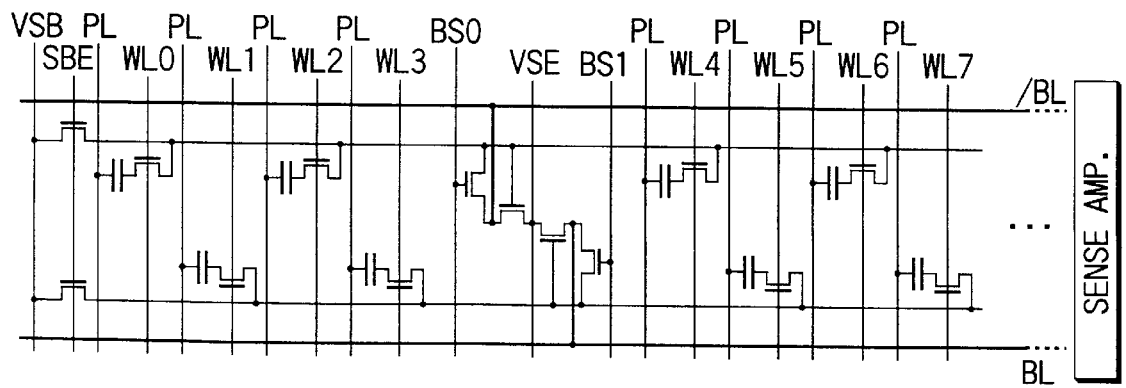

FIG. 122 is a circuit diagram showing a semiconductor memory device according to a forty-sixth embodiment of the present invention, in which particularly the gain cell block structure of a DRAM is illustrated. The structure shown in FIG. 122 has substantially the same structure, operation and effects as those of the structure shown in FIG. 119. The difference from the structure shown in FIG. 119 lies in that the sub-block selection precharge transistor is disposed at only one end of the sub-bitline.

(Forty-Seventh Embodiment)

Figure 123:
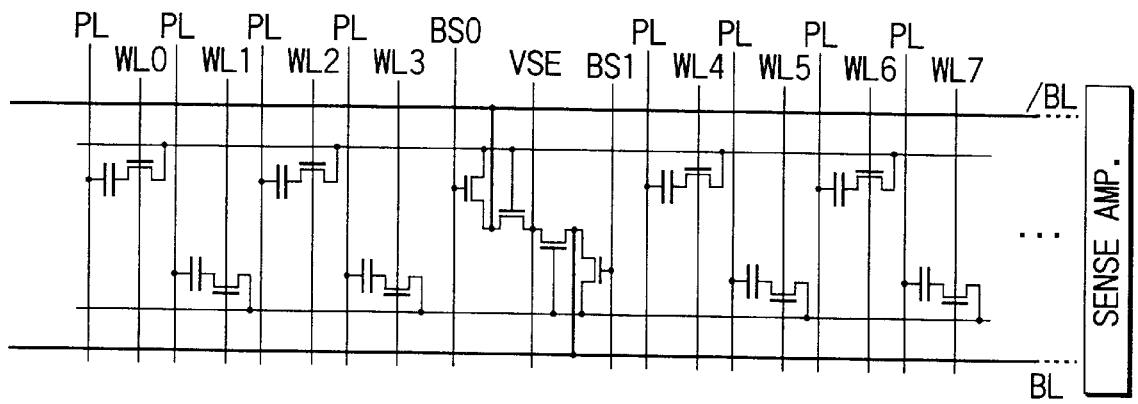

FIG. 123 is a circuit diagram showing a semiconductor memory device according to a forty-seventh embodiment of the present invention, in which particularly the gain cell block structure of a DRAM is illustrated. The structure shown in FIG. 123 has substantially the same structure, operation and effects as those of the structure shown in FIG. 119. The difference from the structure shown in FIG. 119 lies in that the sub-block selection precharge transistors are omitted from both the ends of the sub-bitline.

Figure 124:
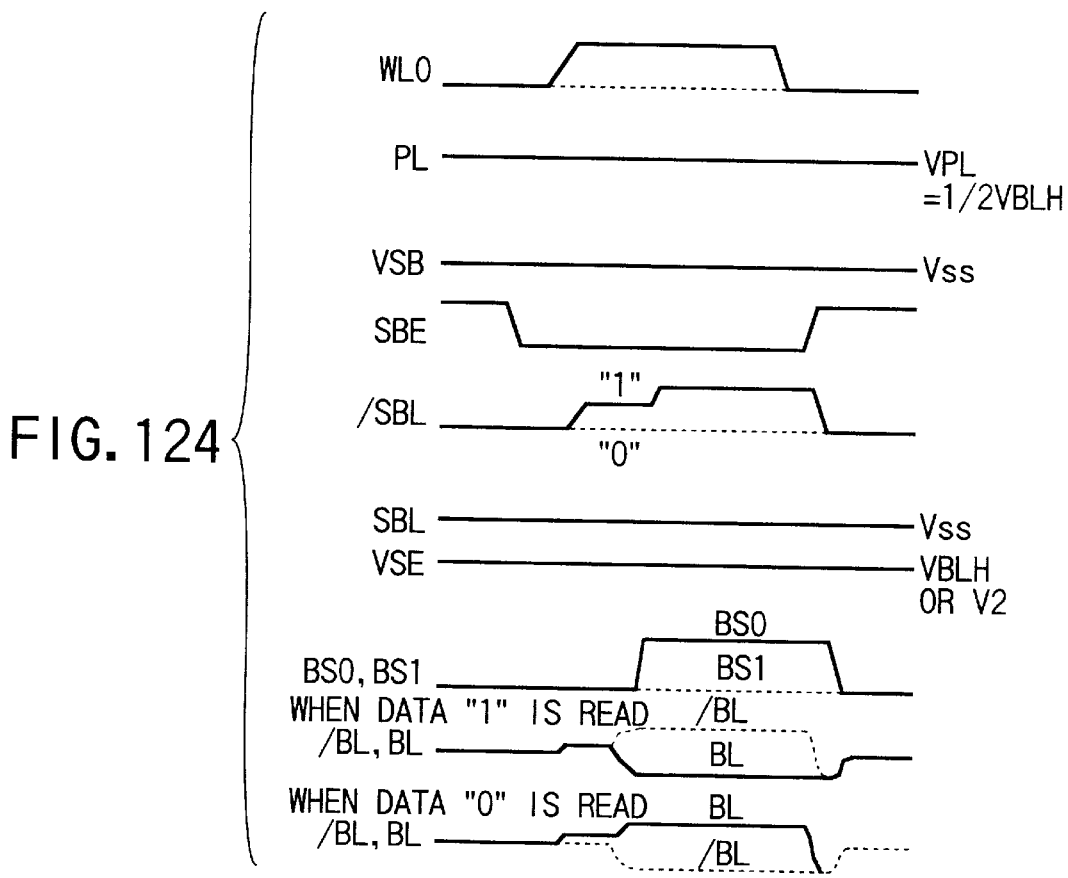

FIG. 124 is a signal waveform showing an example of the specific operation of FIG. 123. The operation for precharging the sub-bitline to 0V is performed similarly to the method of the structure shown in FIG. 101.

(Forty-Eighth Embodiment)

Figure 125:
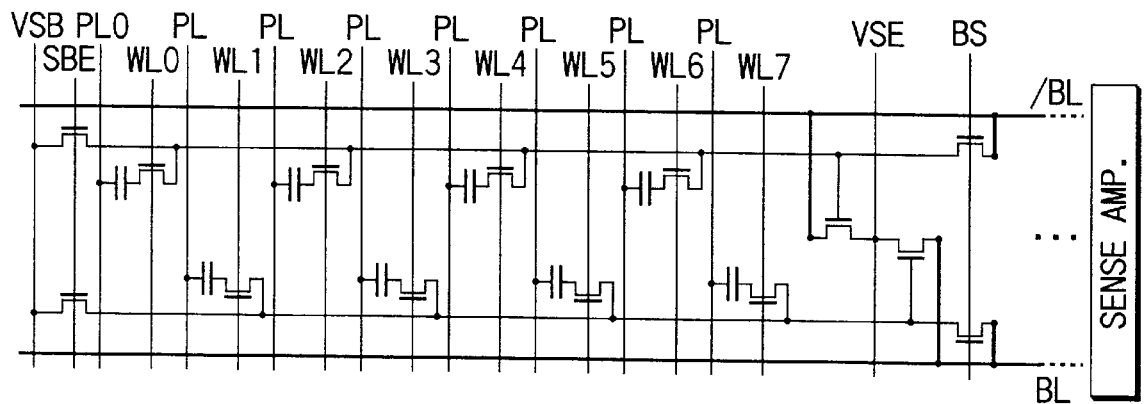
Figure 126:
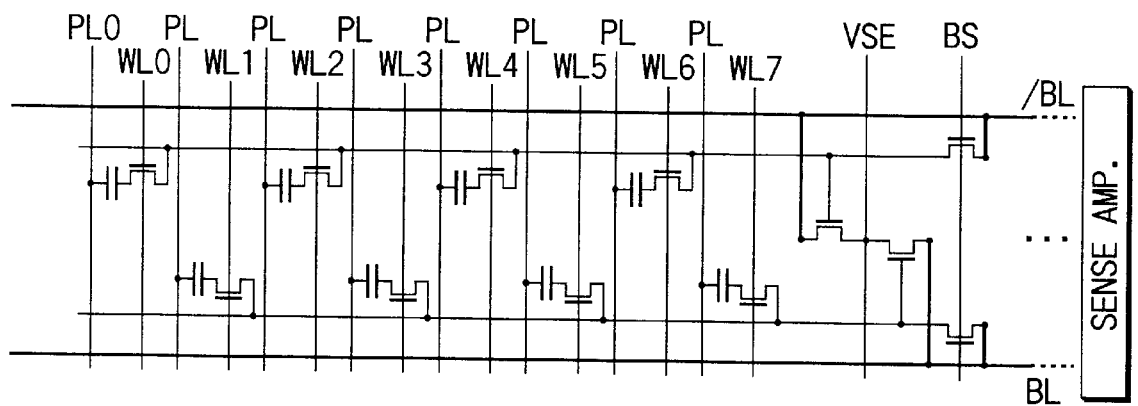

FIGS. 125 and 126 are circuit diagrams showing a semiconductor memory device according to a forty-eighth embodiment of the present invention, in which particularly the gain cell block structure of a DRAM is illustrated.

The equivalent circuit and effects of the structure shown in FIG. 125 are the same as those of the structure shown in FIG. 122. The difference lies in only the topology of the position of the transistors or the like. The operation is the same as those of the structures shown in FIGS. 120 and 121. The equivalent circuit and effects of the structure shown in FIG. 126 are the same as those of the structure shown in FIG. 123. The difference lies in only the topology of the position of the transistors pr the like. The operation is the same as those of the structures shown in FIG. 124.

(Forty-Ninth Embodiment)

Figure 127:
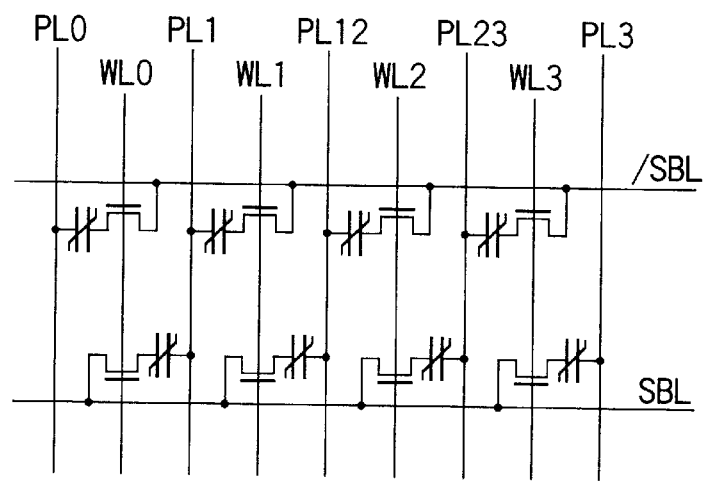

FIG. 127 is a circuit diagram showing a semiconductor memory device according to a forty-ninth embodiment of the present invention, in which memory cell structure of a ferroelectric memory is illustrated.

FIG. 127 shows the structure and positions of ferroelectric memories of a new 1-transistor+1-ferroelectric capacitor type which can be applied to a method with which the self-amplifying function is imparted in block units. The foregoing cell has a small size, which is $6F^2$ size. Moreover, the cell is a ferroelectric memory cell which is able to realize the folded BL method. The characteristic lies in that two memory cells connected to both of the sub-bitline pair /SBL and SBL are connected to the same word line and the plate line is connected to a different plate line.

(Fiftieth Embodiment)

Figure 128:
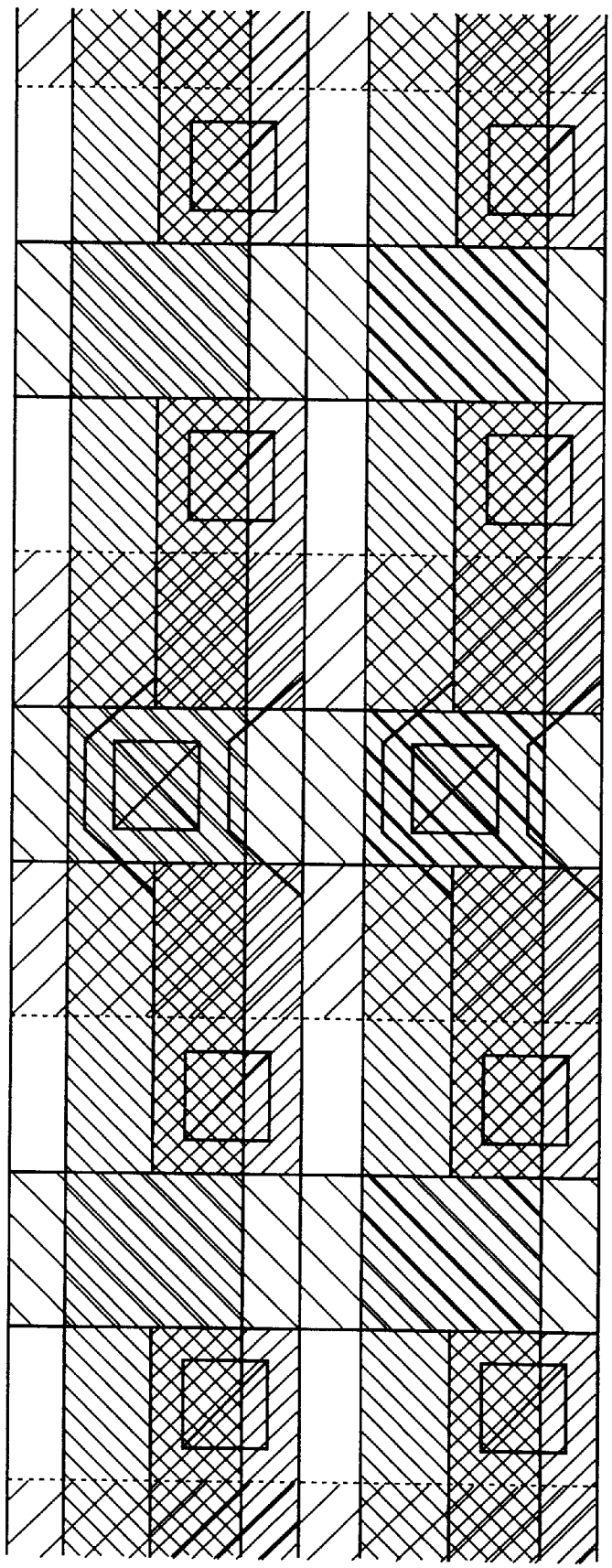

FIG. 128 is a plan view showing a semiconductor memory device according to a fiftieth embodiment of the present invention, in which the layout of the memory cell structure of a ferroelectric memory is illustrated.

Figure 129:
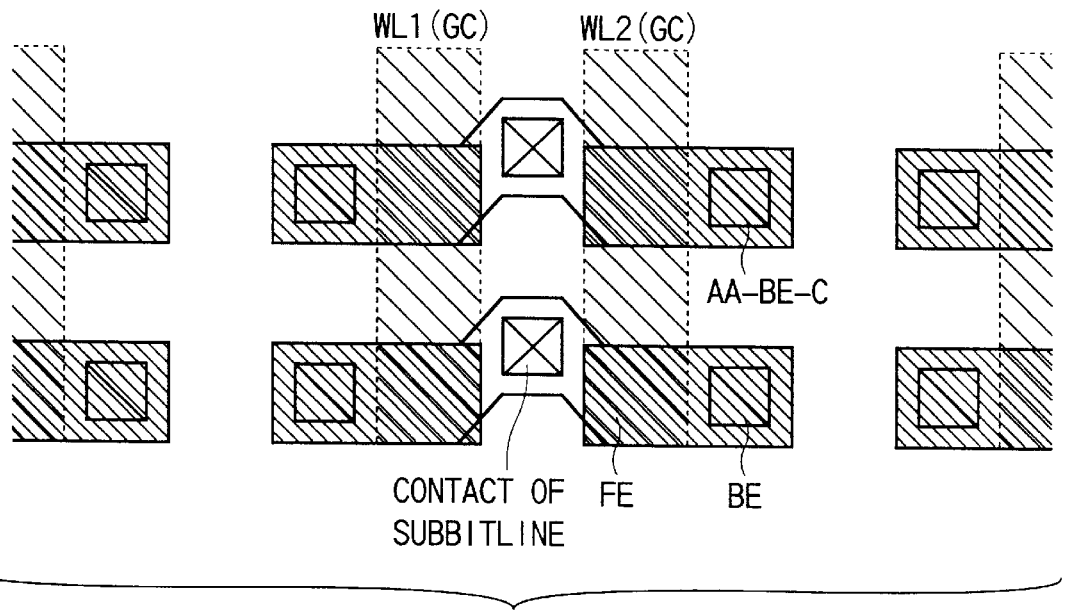
Figure 130:
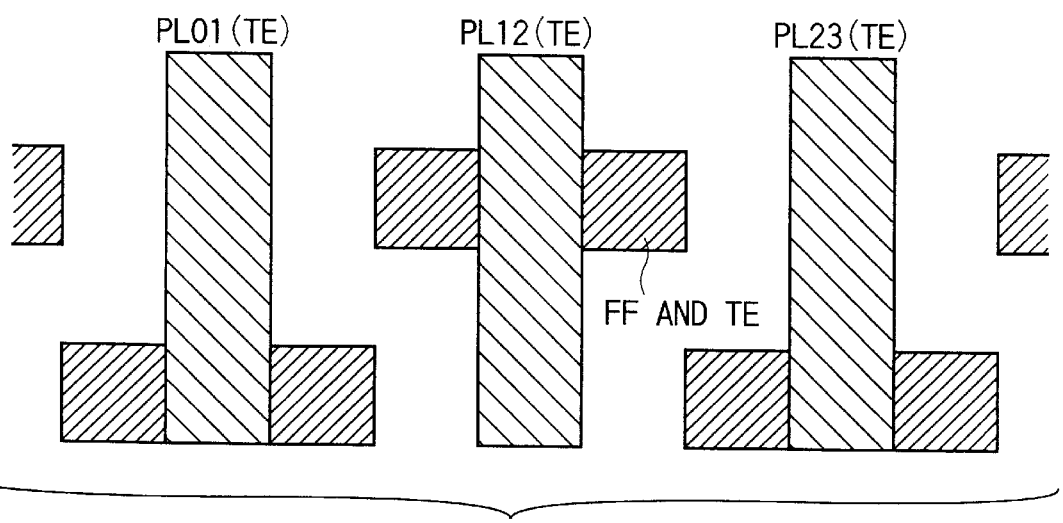

FIGS. 129 and 130 are diagrams showing a portion of layers in the layout shown in FIG. 128 which is a plan view. A capacitor-over-bit-line (COB) structure having a size of $6F^2$ cell can be realized.

(Fifty-First Embodiment)

FIG. 131 is a circuit diagram showing a semiconductor memory device according to a fifty-first embodiment of the present invention, in which the gain cell block structure of a ferroelectric memory is illustrated. FIG. 132 is a signal waveform showing an example of the specific operation of FIG. 131.

FIG. 131 shows the structure of the gain cell block when the cell shown in FIG. 127 is employed. The structure shown in FIG. 131 is the same as that shown in FIG. 97 except for the cell. Also the operation is substantially the same as the structure shown in FIG. 98. As shown in FIG. 132, the word line WL1 is selected so that two cells are selected. Thus, the sub-bitline /SBL and SBL and the cell nodes are connected to one another. Even in the foregoing state, only PL01 is made to be High level. Therefore, PL2 is maintained at 0V. Also SBL is maintained at 0V during the active state. Therefore, data in the unselected cell memory cell Q51 is not destroyed and, therefore, a normal operation can be performed. Therefore, an effect can be obtained in that the size of the cell can be reduced in addition to the effect obtained from the structure shown in FIG. 97.

(Fifty-Second Embodiment)

FIG. 133 is a circuit diagram showing a semiconductor memory device according to a fifty-second embodiment of the present invention, in which particularly the gain cell block structure of a ferroelectric memory is illustrated.

The circuit shown in FIG. 133 has substantially the same structure and effects as those of the structure shown in FIG. 131. The difference lies in that the sub-block selection precharge transistor is disposed at only one end of the sub-bitline.

(Fifty-Third Embodiment)

FIG. 134 is a circuit diagram showing a semiconductor memory device according to a fifty-third embodiment of the present invention, in which particularly the gain cell block structure of a ferroelectric memory is illustrated. The circuit shown in FIG. 134 has substantially the same structure, operation and effects as those of the structure shown in FIG. 131. The difference lies in that the sub-block selection precharge transistors are omitted from both the ends of the sub-bitline.

FIG. 135 is a signal waveform showing an example of the specific operation of FIG. 134. The operation for precharging the sub-bitline to 0V is performed by an operation similar to that of the structure shown in FIG. 101.

(Fifty-Fourth Embodiment)

FIG. 136 is a circuit diagram showing a semiconductor memory device according to a fifty-fourth embodiment of the present invention, in which particularly the gain cell block structure of a ferroelectric memory is illustrated. The circuit shown in FIG. 136 has substantially the same structure and effects as those of the structure shown in FIG. 97. The difference lies in that the plurality of cells share the plate line, Moreover, the potential of the plate line is fixed or made to be (½)VBLH to correspond to the foregoing structure. Since the plate line is made to be 0V or higher, data "1" is destroyed if the storage node is lowered to 0V owning to a leakage current. Therefore, a refreshing operation is required. However, a high-speed operation can be performed because the plate is fixed.

FIG. 137 is a signal waveform showing an example of the specific operation of FIG. 136. Since the sub-bitline is precharged to 0V, only selection of the word line WL1 is required to cause the voltage of (½)VBLH to be applied to the ferroelectric capacitor in a case where the potential of the plate is (½)VBLH. Thus, data in the cell can be read. Then, data is amplified by the amplifying transistor so as to be transferred to the bitline.

FIG. 138 is a signal waveform showing an example of the specific operation of FIG. 136. The foregoing structure is a modification of the structure shown in FIG. 137, in which data is rewritten on the cell. Then, the cell node is made to be (½)VBLH, and then the word line WL1 is closed.

FIG. 139 is a signal waveform showing another example of the specific operation of FIG. 136. A state of a DRAM mode operation is illustrated which incorporates the ferroelectric capacitor. After supply of power is started, recalling is performed as shown in FIG. 137. The paraelectric component of the ferroelectric capacitor causes the potential VBLH or 0V to be stored in the ferroelectric capacitor. Then, the same operation as that of the DRAM is performed as shown in FIG. 139 during a period in which power is supplied. As a matter of course, the refreshing operation is required.

(Fifty-Fifth Embodiment)

FIGS. 140 and 141 are circuit diagrams showing a semiconductor memory device according to a fifty-fifth embodiment of the present invention, in which particularly the gain cell block structure of a ferroelectric memory is illustrated.

The circuit shown in FIG. 140 has substantially the same structure and effects as those of the circuit shown in FIG. 136. The difference lies in that the sub-block selection precharge transistor is disposed at only one end of the sub-bitline. The circuit shown in FIG. 141 has substantially the same structure, operation and effects as those of the circuit shown in FIG. 136. The difference lies in that the sub-block selection precharge transistors are omitted from both the ends of the sub-bitline.

(Fifty-Sixth Embodiment)

FIG. 142 is circuit diagram showing a semiconductor memory device according to a fifty-sixth embodiment of the present invention, in which particularly the gain cell block structure of a ferroelectric memory is illustrated. FIG. 143 is a signal waveform showing an example of the specific operation of FIG. 142.

The circuit shown in FIG. 142 has substantially the same equivalent circuit and effects as those of the circuit shown in FIG. 136. The difference from FIG. 136 lies in that amplified data is transmitted to the bitline on which data is written.

(Fifty-Seventh Embodiment)

The following embodiment shown in FIGS. 144 to 171 is structured such that the foregoing method of causing the self-amplifying function to be provided for block unit and a structure 2-transistor+2-capacitor (2T-2C) is employed with which one bit information is stored in two capacitors.

FIG. 144 is a circuit diagram showing a semiconductor memory device according to a fifty-seventh embodiment of the present invention, in which particularly the gain cell block structure of a ferroelectric memory is illustrated. The equivalent circuit and effects are the same as the circuit shown in FIG. 9 except for the 2T-2C structure. The difference from the circuit shown in FIG. 9 lies in that the 2T-2C structure causes the plates separated into /PLA and PLA according to the structure shown in FIG. 9 to be integrated into one PLA. Moreover, the plates separated into /PLB and PLB are integrated into one PLB.

FIG. 145 is a signal waveform showing an example of the specific operation of FIG. 144. The potential of WLA0 is lowered, the PSB of the opposite block unit is lowered and PLA is raised so that data "0", data "1" or data "1" and data "0" are read to both the bitlines /SBL and SBL of the sub-bitline pair. Data of /SBL is transferred to BL through the amplifying transistor, while data of SBL is transferred to /BL through the amplifying transistor. A result of the foregoing reading operation is amplified and the two block writing select signals BS shown in FIG. 144 are raised to High. As a result, data of /BL is rewritten on /SBL and data of BL is rewritten on SBL. Then, PLA is changed from High→Low so that data is rewritten on the cell.

(Fifty-Eighth Embodiment)

FIG. 146 is a circuit diagram showing a semiconductor memory device according to a fifty-eighth embodiment of the present invention, in which particularly the gain cell block structure of a ferroelectric memory is illustrated. The circuit shown in FIG. 146 is substantially the same equivalent circuit as that shown in FIG. 144 and, therefore, same effects can be obtained. The difference from FIG. 144 lies in that a stabilizing paraelectric capacitor is connected to the sub-bitline. As a result, the load capacity is changed owning to the position of the selected word line and thus the problem of the movement of the operation point can be prevented.

FIG. 147 is a signal waveform showing an example of the specific operation of FIG. 146. The foregoing structure performs an operation similar to that of the circuit shown in FIG. 145. The difference from FIG. 145 lies in that the amount of signals read to the sub-bitlines is changed because the load capacity is increased.

(Fifty-Ninth Embodiment)

FIG. 148 is a circuit diagram showing a semiconductor memory device according to a fifty-ninth embodiment of the present invention, in which particularly the gain cell block structure of a ferroelectric memory is illustrated. The circuit shown in FIG. 148 is substantially the same equivalent circuit as that shown in FIG. 144 and, therefore, same effects can be obtained. The difference from FIG. 144 lies in that the stabilizing ferroelectric capacitor is connected to the sub-bitline. As a result, the load capacity is changed owning to the position of the selected word line and thus the problem of the movement of the operation point can be prevented.

(Sixtieth Embodiment)

FIG. 149 is a circuit diagram showing a semiconductor memory device according to a sixtieth embodiment of the present invention, in which particularly the gain cell block structure of a ferroelectric memory is illustrated.

The structure has the same equivalent circuit and effects as those of the structure shown in FIG. 61 except for the 2T-2C structure. The difference from FIG. 61 lies in that the plates shown in FIG. 9 separated into /PL and PL are integrated into one PL and the block writing select signals are integrated into only BS because of the 2T-2C structure.

(Sixty-First Embodiment)

FIG. 150 is a circuit diagram showing a semiconductor memory device according to a sixty-first embodiment of the present invention, in which particularly the gain cell block structure of a ferroelectric memory is illustrated.

The circuit shown in FIG. 150 is substantially the same equivalent circuit as that shown in FIG. 149 and, therefore, the same effects can be obtained. The difference from FIG. 149 lies in that the stabilizing paraelectric capacitor is connected to the sub-bitline. As a result, the problem of movement of the operation point, because the load capacity is changed owing to the position of the selected word line, can be overcome.

(Sixty-Second Embodiment)

FIG. 151 is a circuit diagram showing a semiconductor memory device according to a sixty-second embodiment of the present invention, in which particularly the gain cell block structure of a ferroelectric memory is illustrated.

The circuit shown in FIG. 151 is substantially the same equivalent circuit as that shown in FIG. 149 and, therefore, the same effects can be obtained. The difference from FIG. 149 lies in that the stabilizing paraelectric capacitor is connected to the sub-bitline. As a result, the problem of movement of the operation point, because the load capacity is changed owing to the position of the selected word line, can be overcome.

(Sixty-Third Embodiment)

FIG. 152 is a plan view showing a semiconductor memory device according to a sixty-third embodiment of the present invention, in which particularly the layout of the memory cell structure of a ferroelectric memory is illustrated. The foregoing layout is able to realize the circuit shown in FIG. 149.

FIGS. 153 and 154 are diagrams showing a portion of layers in the layout shown in FIG. 152 which is a plan view. The self-amplifying functions can be properly disposed in the cell array having small pitches. Note BS is integrated in the layout.

(Sixty-Fourth Embodiment)

FIG. 155 is a circuit diagram showing a semiconductor memory device according to a sixty-fourth embodiment of the present invention, in which particularly the gain cell block structure of a ferroelectric memory is illustrated.

The circuit shown in FIG. 155 is equivalent to the structure shown in FIG. 149. The difference lies in that the two BS for the same signal are integrated into one BS. The topology is the same as that in the layout shown in FIG. 152.

(Sixty-Fifth Embodiment)

FIG. 156 is a circuit diagram showing a semiconductor memory device according to a sixty-fifth embodiment of the present invention, in which particularly the gain cell block structure of a ferroelectric memory is illustrated. In this embodiment, the conventional FRAM having the 2T-2C structure is employed to constitute the gain cell block.

FIG. 157 is a signal waveform showing an example of the specific operation of FIG. 156. When WL0 is selected, the two ferroelectric capacitors are connected to the sub-bitline /SBL and SBL. When PL0 is raised, polarization information of the two ferroelectric capacitor is transferred to /SBL and SBL. Then, the two amplifying transistors transfer information to /BL and BL.

(Sixty-Sixth Embodiment)

FIGS. 158 to 161 are circuit diagrams showing a semiconductor memory device according to a sixty-sixth embodiment of the present invention, in which particularly the gain cell block structure of a ferroelectric memory is illustrated.

The circuit shown in FIG. 158 has substantially the same structure as that of the circuit shown in FIG. 156. The difference lies in that the sub-block selection precharge transistor is disposed at only one end of the sub-bitline. The circuit shown in FIG. 159 has substantially the same structure, operation and effects as those of the circuit shown in FIG. 156. The difference from FIG. 156 lies in that the sub-block selection precharge transistors are omitted from both the ends of the sub-bitline.

The circuit shown in FIG. 160 has substantially the same structure as that of the circuit shown in FIG. 157. The difference lies in the topology of the positions of the transistors. The circuit shown in FIG. 161 has substantially the same structure as that of the circuit shown in FIG. 159. The difference lies in the topology of the positions of the transistors.

(Sixty-Seventh Embodiment)

FIGS. 162A and 162B are plan views showing a semiconductor memory device according to a sixty-six embodiment of the present invention, in which particularly the layout of the memory cell structure of a ferroelectric memory is illustrated. FIG. 162A shows a layout for realizing the structure of the circuit and the topology shown in FIG. 160. FIG. 162B shows a layout showing the circuit and topology shown in FIG. 158.

FIGS. 163A and 163B are diagrams showing a portion of layers in the layout shown in FIGS. 162A and 162B which are plan views. Note that FIG. 162A shows an example in which WL0 to WL3 and PL0 to PL3 are provided.

(Sixty-Eighth Embodiment)

FIG. 164 is a circuit diagram showing a semiconductor memory device according to a sixty-eighth embodiment of the present invention, in which particularly the gain cell block structure of a ferroelectric memory is illustrated. FIG. 164 shows the circuit having substantially the same structure as that of the circuit shown in FIG. 75 and, therefore, the same effects can be obtained. The difference from FIG. 75 lies in that the plate lines separated into two types which are /PLA and PLA are integrated into PLA and the cell block select signals BSA0 and BSA1 are integrated into BSA because of employment of the 2T-2C structure.

FIG. 165 is a signal waveform showing an example of the specific operation of FIG. 164. Since data in the cells is read to both of the sub-bitlines, both of BSX0 and BSX1 are selected.

(Sixty-Ninth Embodiment)

FIG. 166 is a circuit diagram showing a semiconductor memory device according to a sixty-eight embodiment of the present invention, in which particularly the gain cell block structure of a ferroelectric memory is illustrated. FIG. 167 is a signal waveform showing an example of the specific operation of FIG. 166.

FIG. 166 shows the circuit having substantially the same structure as that of the circuit shown in FIG. 164 and the same effects can be obtained. The difference from FIG. 164 lies in that amplified data is transferred to the bitline on which data is written.

(Seventieth Embodiment)

FIG. 168 is a circuit diagram showing a semiconductor memory device according to a seventieth embodiment of the present invention, in which particularly the gain cell block structure of a ferroelectric memory is illustrated. FIG. 169 is a signal waveform showing an example of the specific operation of FIG. 168.

FIG. 168 and FIG. 169 showing the operation show the circuit having substantially the same structure as that of the circuit shown in FIGS. 164 and 165 and the same effects and operation can be obtained. The difference lies in that a plurality of cell groups connected in series are folded along the direction of the word line so that the plate line is shared.

(Seventy-First Embodiment)

FIG. 170 is a circuit diagram showing a semiconductor memory device according to a seventy-first embodiment of the present invention, in which particularly the gain cell block structure of a ferroelectric memory is illustrated. FIG. 171 is a signal waveform showing an example of the specific operation of FIG. 170.

FIG. 170 shows the circuit having substantially the same structure as that of the circuit shown in FIG. 168 and the same effects and operation can be obtained. The difference from FIG. 168 lies in that amplified data is transferred to the bitline on which data is written.

(Seventy-Second Embodiment)

FIGS. 172 and 173 are circuit diagrams showing a semiconductor memory device according to a seventy-second embodiment of the present invention, in which particularly the gain cell block structure of a ferroelectric memory is illustrated. This embodiment is different from the above-mentioned embodiment in that an amplifying transistor select transistor is inserted between the amplifying transistor and the bitline. When the sub-bitline is precharged to (½)VBLH, the amplifying transistor of the unselected gain cell block is turned on to change the potential of the bitline, causing a malfunction to occur. The foregoing problem can be prevented by the structure according to this embodiment.

The circuit shown in FIG. 172 is different from the structure shown in FIG. 9 in that the amplifying transistor select transistor is inserted between the amplifying transistor and the bitline.

The circuit shown in FIG. 173 is different from the structure shown in FIG. 97 in that the amplifying transistor select transistor is inserted between the amplifying transistor and the bitline.

(Seventy-Third Embodiment)

FIG. 174 is a circuit diagram showing a semiconductor memory device according to a seventy-third embodiment of the present invention, in which particularly the gain cell block structure of a DRAM is illustrated. The drawing shows a structure different from that shown in FIG. 136 in that the amplifying transistor select transistor is inserted between the amplifying transistor and the bitline.

FIG. 175 is a signal waveform showing an example of the specific operation of FIG. 174. The VAC signal is made to be High in only the selected gain cell block so that data of the sub-bitline is read to the bitline. Thanks to the foregoing stable operation, VSE can be set to 0V regardless of the selection/non-selection of the gain cell block even if the method of precharging the sub-bitline to (½)VBLH is employed.

(Seventy-Fourth Embodiment)

FIG. 176 is a plan view showing a semiconductor memory device according to a seventy-fourth embodiment of the present invention, in which particularly the layout of the gain cell block structure of a DRAM is illustrated.

The foregoing drawing shows a layout corresponding to the structure of the circuit shown in FIG. 174. Transistors each having the gate which is VAC are, in series, connected to the amplifying transistors. An estimation can be made that the foregoing example of the layout may be applied to the structures shown in FIGS. 172 to 233. The foregoing layout drawing shows an example in which the number of cells connected to the sub-bitlines is doubled as compared with the number in the structure shown in FIG. 174.

FIGS. 177 to 180 show a portion of layers in the layout shown in FIG. 176 which is a plan view. Note that PA represents an extending wiring layer, AA-PA-C represents a contact between the diffusion layer-extending wiring layer and PA-BL-C represents a contact between the extending wiring layer-bitline layer.

The foregoing structures may arbitrarily be combined and the number may easily be changed in the modifications and variety of examples. As for the structure, a variety of example of the cell structures according to the previous suggestion performed by the inventors of the present invention may be applied to the present invention in a case of the cells which are, in series, connected as is employed in the previous suggestion performed by the inventors of the present invention. A structure in which multi-bit information items are provided for one cell and a multi-level structure can easily be realized. When the self-amplifying function of the block according to the present invention is applied to the conventional FRAM or DRAM cell having the 1T - TC structure, a variety of memory cell structures of the conventional FRAM and DRAM can be employed.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
    a block unit wherein a plurality of nonvolatile memory cells, each formed by connecting a cell transistor and a ferroelectric capacitor in parallel, are connected in series;
    an amplifying circuit having an input end connected to one end of the block unit and an output terminal connected to a bitline, wherein the block unit and the amplifying circuit constitute a cell block, and
    a plurality of cell blocks are disposed to constitute a memory cell array.

2. A semiconductor memory device according to claim 1, wherein said amplifying circuit has an amplifying transistor, and the amplifying transistor has a gate terminal connected to one end of the block unit and a drain terminal connected to the bitline.

3. A semiconductor memory device according to claim 2, further comprising a write transistor having a source terminal connected to one end of the block unit and a drain terminal connected to the bitline.

4. A semiconductor memory device comprising:

first and second block units in which a plurality of nonvolatile memory cells, each comprising a cell transistor and a ferroelectric capacitor connected in parallel, are connected in series;

a first amplifying transistor having a gate terminal connected to one end of the first block unit and a drain terminal connected to a second bitline;

a first write transistor having a source terminal connected to one end of the first block unit and a drain terminal connected to a first bitline;

a second amplifying transistor having a gate terminal connected to one end of the second block unit and a drain terminal connected to the first bitline; and a second write transistor having a source terminal connected to one end of the second block unit and a drain terminal connected to the second bitline, wherein the first and second block units, the first and second amplifying transistors and the first and second write transistors constitute a cell block, and a plurality of cell blocks are disposed to constitute a memory cell array.

5. A semiconductor memory device comprising:

first, second, third and fourth block units in which a plurality of nonvolatile memory cells, each comprising a cell transistor and a ferroelectric capacitor connected in parallel, are connected in series;

a first amplifying transistor having a gate terminal connected to a first terminal commonly connected to the first and third block units and a drain terminal connected to a second bitline;

a first write transistor having a source terminal connected to the first terminal commonly connected to the first and third block units and a drain terminal connected to a first bitline;

a second amplifying transistor having a gate terminal connected to a second terminal commonly connected to the second and fourth block units and a drain terminal connected to a first bitline; and a second write transistor having a source terminal connected to the second terminal commonly connected to the second and fourth block units and a drain terminal connected to a second bitline, wherein the first, second, third and fourth block units, the first and second amplifying transistors and the first and second write transistors constitute a cell block, and a plurality of cell blocks are disposed to constitute a memory cell array.

6. A semiconductor memory device comprising:

first and second block units in which a plurality of nonvolatile memory cells, each comprising a cell transistor and a ferroelectric capacitor connected in parallel, are connected in series;

an amplifying transistor having a gate terminal connected to a terminal connected to a common node of the first and second block units and a drain terminal connected to a bitline; and a write transistor having a source terminal connected to the terminal connected to the common node of the first and second block units and a drain terminal connected to the bitline, wherein the first and second block units, the amplifying transistor and the write transistor constitute a cell block, and a plurality of cell blocks are disposed to constitute a memory cell array.

7. A semiconductor memory device comprising:

a nonvolatile memory cell in which a cell transistor having a gate terminal to which a word line is connected and a ferroelectric capacitor are connected in parallel;

a plurality of cell blocks, each comprising a block unit having a plurality of the memory cells connected in series and at least one select transistor, are connected in series;

a cell segment incorporating the plurality of cell blocks, a sub-bitline connected to one end of each of the cell blocks and an amplifying circuit having an input end connected to the sub-bitline and an output terminal connected to a bitline; and a memory cell array in which a plurality of bitlines and a plurality of cell segments connected to the plurality of bitlines are disposed along a direction of the word line.

8. A semiconductor memory device comprising:

a nonvolatile memory cell in which a cell transistor having a gate terminal to which a word line is connected and a ferroelectric capacitor are connected in parallel;

a plurality of first cell blocks and a plurality of second cell blocks, each comprising a block unit having the plurality of memory cells connected in series and at least one select transistor are connected in series;

a cell segment incorporating the first and second cell blocks, a first sub-bitline connected to one end of each of the first cell blocks, a second sub-bitline connected to one end of each of the second cell blocks, a first amplifying transistor having a gate terminal connected to the first sub-bitline and a drain terminal connected to a second bitline, a first write transistor having a source terminal connected to the first subbitline and a drain terminal connected to the first bitline which forms a pair with the second bitline, a second amplifying transistor having a gate terminal connected to the second sub-bitline and a drain terminal connected to the first bitline and a second write transistor having a source terminal connected to the second sub-bitline and a drain terminal connected to the second bitline; and a memory cell array in which a plurality of pairs of first and second bitlines and the plurality of cell segments connected to the plural bitline pairs are disposed along a direction of the word line.

9. A semiconductor memory device comprising:

a nonvolatile memory cell in which a cell transistor having a gate terminal to which a word line is connected and a ferroelectric capacitor are connected in parallel;

a plurality of first cell blocks and a plurality of second cell blocks, each comprising a block unit having a plurality of memory cells connected in series and at least one select transistor, are connected in series:

a cell segment incorporating the first and second cell blocks, a first sub-bitline connected to one end of each of the first cell blocks, a second sub-bitline connected to one end of each of the second cell blocks, a first amplifying transistor having a gate terminal connected to the first sub-bitline and a drain terminal connected to a first bitline, a first write transistor having a source terminal connected to the first sub-bitline and a drain terminal connected to the first bitline, a second amplifying transistor having a gate terminal connected the second sub-bitline and a drain terminal connected to the second bitline which forms a pair with the first bitline and a second write transistor having a source terminal connected to the second sub-bitline and a drain terminal connected to the second bitline; and a memory cell array in which a plurality of pairs of first and second bitlines and a plurality of cell segments connected to the plurality of bitline pairs are disposed along a direction of the word line.

10. A semiconductor memory device comprising:

a nonvolatile memory cell incorporating a cell transistor having a gate terminal connected to a word line and a drain terminal connected to a sub-bitline and a ferroelectric capacitor having one end connected to the source terminal of the cell transistor and another end connected to a plate line;

a cell segment incorporating the sub-bitline, the plural memory cells connected to the sub-bitline and an amplifying circuit having an input end connected to the sub-bitline and an output terminal connected to the bitline; and a memory cell array in which a plurality of bitline and a plurality of cell segments connected to the bitlines are disposed along a direction of the word line.

11. A semiconductor memory device comprising:

a nonvolatile memory cell incorporating a cell transistor having a gate terminal connected to a word line and a drain terminal connected to a sub-bitline and a ferroelectric capacitor having one end connected to the source terminal of the cell transistor and another end connected to a plate line;

a cell segment incorporating a first and second sub-bitlines; a plurality of memory cells connected to the first sub-bitlines; a plurality of memory cells connected to the second sub-bitline; a first amplifying transistor having a gate terminal connected to the first sub-bitline and a drain terminal connected to the second bitline; a first write transistor having a source terminal connected to the first sub-bitline and a drain terminal connected to the first bitline which forms a pair with the second bitline; a second amplifying transistor having gate terminal connected to the second sub-bitline and a drain terminal connected to the first bitline; and a second write transistor having a source terminal connected to the second sub-bitline and a drain terminal connected to the second bitline; and a memory cell array in which a plurality pair of first and second bitlines and a plurality of cell segments connected to the bitline pairs are disposed along a direction of the word line.

12. A semiconductor memory device comprising:

a nonvolatile memory cell incorporating a cell transistor having a gate terminal connected to a word line and a drain terminal connected to a sub-bitline and a ferroelectric capacitor having one end connected to the source terminal of the cell transistor and another end connected to a plate line;

a cell segment incorporating first and second sub-bitlines; a plurality of memory cells connected to the first sub-bitlines; a plurality of memory cells connected to the second sub-bitline; a first amplifying transistor having a gate terminal connected to the first sub-bitline and a drain terminal connected to the first bitline; a first write transistor having a source terminal connected to the first sub-bitline and a drain terminal connected to the first bitline; a second amplifying transistor having a gate terminal connected to the second sub-bitline and a drain terminal connected to the second bitline forming a pair with the first bitline; and a second write transistor having a source terminal connected to the second sub-bitline and a drain terminal connected to the second bitline; and a memory cell array in which a plurality pair of first and second bitlines and a plurality of cell segments connected to the bitline pairs are disposed along a direction of the word line.

13. A semiconductor memory device comprising:

a volatile memory cell incorporating a cell transistor having a gate terminal connected to a word line and a drain terminal connected to a sub-bitline and a paraelectric capacitor having one end connected to the source terminal of the cell transistor and another end connected to a plate line;

a cell segment incorporating the sub-bitline, a plurality of memory cells connected to the sub-bitline and an amplifying circuit having an input end connected to the sub-bitline and an output terminal connected to the bitline; and a memory cell array in which a plurality of bitline and a plurality of cell segments connected to the bitlines are disposed along a direction of the word line.

14. A semiconductor memory device comprising:

a volatile memory cell incorporating a cell transistor having a gate terminal connected to a word line and a drain terminal connected to a sub-bitline and a paraelectric capacitor having one end connected to the source terminal of the cell transistor and another end connected to a plate line;

a cell segment incorporating first and second sub-bitlines; a plurality of memory cells connected to the first sub-bitlines; a plurality of memory cells connected to the second sub-bitlines; a first amplifying transistor having a gate terminal connected to the first sub-bitline and a drain terminal connected to the second bitline; a first write transistor having a source terminal connected to the first sub-bitline and a drain terminal connected to the first bitline forming a pair with the second bitline; a second amplifying transistor having a gate terminal connected to the second sub-bitline and a drain terminal connected to the first bitline and a second write transistor having a source terminal connected to the second sub-bitline and a drain terminal connected to the second bitline; and a memory cell array in which a plurality pair of first and second bitlines and a plurality of cell segments connected to the paired bitline are disposed along a direction of the word line.

15. A semiconductor memory device comprising:

a volatile memory cell incorporating a cell transistor having a gate terminal connected to a word line and a drain terminal connected to a sub-bitline and a paraelectric capacitor having one end connected to the source terminal of the cell transistor and another end connected to a plate line;

a cell segment incorporating first and second sub-bitlines; a plurality of memory cells connected to the first sub-bitline; a plurality of memory cells connected to the second sub-bitlines; a first amplifying transistor having a gate terminal connected to the first sub-bitline and a drain terminal connected to the first bitline; a first write transistor having a source terminal connected to the first sub-bitline and a drain terminal connected to the first bitline; a second amplifying transistor having a gate terminal connected to the second sub-bitline and a drain terminal connected to the second bitline forming a pair with the first bitline; and a second write transistor having a source terminal connected to the second sub-bitline and a drain terminal connected to the second bitline; and a memory cell array in which a plurality pair of first and second bitlines and a plurality of cell segments connected to the bitline pairs are disposed along a direction of the word line.

* * * * *